(12) United States Patent
Rayner

(10) Patent No.: US 9,300,344 B2
(45) Date of Patent: *Mar. 29, 2016

(54) PROTECTIVE ENCASEMENT FOR MOBILE COMPUTING DEVICE

(75) Inventor: Gary Rayner, San Diego, CA (US)

(73) Assignee: TREEFROG DEVELOPMENTS, INC., San Diego, CA (US)

( * ) Notice: Subject to any disclaimer, the term of this patent is extended or adjusted under 35 U.S.C. 154(b) by 427 days.

This patent is subject to a terminal disclaimer.

(21) Appl. No.: 13/517,583

(22) Filed: Jun. 13, 2012

(65) Prior Publication Data

US 2012/0314354 A1    Dec. 13, 2012

Related U.S. Application Data

(60) Provisional application No. 61/496,503, filed on Jun. 13, 2011, provisional application No. 61/497,479, filed on Jun. 15, 2011.

(51) Int. Cl.
  *G06F 1/16*   (2006.01)
  *H05K 5/00*   (2006.01)
  (Continued)

(52) U.S. Cl.
  CPC .......... *H04B 1/3888* (2013.01); *G06F 1/1613* (2013.01); *G06F 1/1626* (2013.01);
  (Continued)

(58) Field of Classification Search
  CPC ...... H01L 23/10; G06F 1/1628; G06F 1/1679
  USPC ............ 361/679.01, 679.02, 679.21, 679.26, 361/679.29, 679.3, 747, 801, 803; 174/50.5, 50.51, 50.52, 560, 561, 563, 174/564
  See application file for complete search history.

(56) References Cited

U.S. PATENT DOCUMENTS 3,023,885 A    3/1962  Kindseth
3,482,895 A    12/1969 Becklin
(Continued)

FOREIGN PATENT DOCUMENTS

DE    296 12 454 U1    9/1996
EP    1018680 A2       7/2000
(Continued)

OTHER PUBLICATIONS

PCT International Search Report and Written Opinion for corresponding PCT application No. PCT/US2011/056040.
(Continued)

*Primary Examiner* — Hoa C Nguyen
*Assistant Examiner* — Binh Tran

(57) ABSTRACT

This disclosure relates generally to an apparatus and/or system for housing a device. The apparatus includes a housing that is configured such that a device may be fitted within the housing and thereby be protected, such as from shocks and/or liquid. The housing may include top and bottom members that may be removably coupled together so as to form the housing. Each top and bottom member includes a perimeter portion defined by proximal and distal ends and opposing sides. The top and bottom members may include respective clasping mechanisms that extend along the perimeter of the top and bottom members and may be configured for engaging a third clasping mechanism, such as a locking comb or wedge feature. The clasping mechanisms are configured for coupling the top and bottom members with one another thereby sealing the housing, for instance, in a shock-proof and/or water tight seal.

36 Claims, 126 Drawing Sheets

(51) Int. Cl.

| | | |
|---|---|---|
| *H05K 5/06* | (2006.01) | |
| *H04B 1/3888* | (2015.01) | |
| *H01L 23/10* | (2006.01) | |
| *H05K 7/00* | (2006.01) | |
| *H05K 1/11* | (2006.01) | |
| *H05K 1/14* | (2006.01) | |
| *H01J 5/00* | (2006.01) | |
| *H01J 15/00* | (2006.01) | |
| *H01R 13/502* | (2006.01) | |
| *H01L 23/02* | (2006.01) | |

(52) U.S. Cl.
CPC ............ *G06F1/1628* (2013.01); *G06F 1/1633* (2013.01); *G06F 1/1656* (2013.01); *G06F 1/1679* (2013.01); *H01L 23/10* (2013.01); *H05K 5/0004* (2013.01); *H05K 5/0017* (2013.01); *H05K 5/061* (2013.01); *Y10T 29/49826* (2015.01)

(56) References Cited

U.S. PATENT DOCUMENTS

| | | |
|---|---|---|
| 3,665,991 A | 5/1972 | Gillemot et al. |
| 4,097,878 A | 6/1978 | Cramer |
| 4,298,204 A | 11/1981 | Jinkins |
| 4,312,580 A | 1/1982 | Schwomma et al. |
| 4,375,323 A | 3/1983 | Inagaki et al. |
| 4,383,743 A | 5/1983 | Nozawa et al. |
| 4,418,830 A | 12/1983 | Dzung et al. |
| 4,420,078 A | 12/1983 | Belt et al. |
| 4,546,874 A | 10/1985 | Kirchhan |
| 4,584,718 A | 4/1986 | Fuller |
| 4,649,453 A | 3/1987 | Iwasawa |
| 4,658,956 A | 4/1987 | Takeda et al. |
| 4,686,332 A | 8/1987 | Greanias et al. |
| 4,712,657 A | 12/1987 | Myers et al. |
| 4,733,776 A | 3/1988 | Ward |
| 4,762,227 A | 8/1988 | Patterson |
| 4,803,504 A | 2/1989 | Maeno et al. |
| 4,836,256 A | 6/1989 | Meliconi |
| 4,942,514 A | 7/1990 | Miyagaki et al. |
| 4,963,902 A | 10/1990 | Fukahori |
| 4,977,483 A | 12/1990 | Perretta |
| 4,994,829 A | 2/1991 | Tsukamoto |
| 5,002,184 A | 3/1991 | Lloyd |
| D316,932 S | 5/1991 | Escher, Jr. |
| 5,025,921 A | 6/1991 | Gasparaitis et al. |
| D322,165 S | 12/1991 | Lloyd |
| 5,087,934 A | 2/1992 | Johnson |
| 5,092,458 A | 3/1992 | Yokoyama |
| 5,092,459 A | 3/1992 | Uljanic et al. |
| 5,175,873 A | 12/1992 | Goldenberg et al. |
| 5,177,515 A | 1/1993 | Tsukamoto |
| 5,219,067 A | 6/1993 | Lima et al. |
| 5,231,381 A | 7/1993 | Duwaer |
| 5,233,502 A | 8/1993 | Beatty et al. |
| 5,239,323 A | 8/1993 | Johnson |
| 5,239,324 A | 8/1993 | Ohmura et al. |
| 5,285,894 A | 2/1994 | Kamata et al. |
| 5,294,988 A | 3/1994 | Wakabayashi et al. |
| 5,305,032 A | 4/1994 | Arai |
| 5,360,108 A | 11/1994 | Alagia |
| 5,368,159 A | 11/1994 | Doria |
| 5,383,091 A | 1/1995 | Snell |
| 5,386,084 A | 1/1995 | Risko |
| 5,388,691 A | 2/1995 | White |
| 5,388,692 A | 2/1995 | Withrow et al. |
| D365,927 S | 1/1996 | Cho |
| 5,518,802 A | 5/1996 | Colvin et al. |
| 5,541,813 A | 7/1996 | Satoh et al. |
| RE35,318 E | 8/1996 | Warman |
| 5,548,306 A | 8/1996 | Yates, IV et al. |
| 5,583,742 A | 12/1996 | Noda et al. |
| 5,584,054 A | 12/1996 | Tyneski et al. |
| 5,590,760 A | 1/1997 | Astarb |
| 5,610,655 A | 3/1997 | Wakabayashi et al. |
| 5,613,237 A | 3/1997 | Bent et al. |
| D378,634 S | 4/1997 | LaPere |
| 5,636,101 A | 6/1997 | Bonsall et al. |
| 5,669,004 A | 9/1997 | Sellers |
| 5,707,757 A | 1/1998 | Lee |
| 5,713,048 A | 1/1998 | Hayakawa |
| 5,713,466 A | 2/1998 | Tajima |
| 5,845,803 A | 12/1998 | Saito et al. |
| 5,850,915 A | 12/1998 | Tajima |
| 5,907,721 A | 5/1999 | Schelling et al. |
| 5,946,501 A | 8/1999 | Hayakawa |
| 5,956,291 A | 9/1999 | Nehemiah et al. |
| 5,982,520 A | 11/1999 | Weiser et al. |
| 5,990,874 A | 11/1999 | Tsumura et al. |
| D419,297 S | 1/2000 | Richardson et al. |
| D419,768 S | 2/2000 | Richardson et al. |
| 6,031,524 A | 2/2000 | Kunert |
| 6,041,924 A | 3/2000 | Tajima |
| D424,035 S | 5/2000 | Steiner et al. |
| 6,068,119 A | 5/2000 | Derr et al. |
| 6,092,707 A | 7/2000 | Bowes, Jr. |
| 6,094,785 A | 8/2000 | Montgomery et al. |
| 6,128,441 A | 10/2000 | Kamata et al. |
| 6,132,367 A | 10/2000 | Adair |
| 6,201,867 B1 | 3/2001 | Koike |
| D447,634 S | 9/2001 | Snider |
| 6,311,017 B1 | 10/2001 | Mori |
| 6,313,982 B1 | 11/2001 | Hino |
| 6,317,313 B1 | 11/2001 | Mosgrove et al. |
| 6,349,824 B1 | 2/2002 | Yamada |
| 6,396,769 B1 | 5/2002 | Polany |
| 6,415,138 B2 | 7/2002 | Sirola et al. |
| 6,456,487 B1 | 9/2002 | Hetterick |
| D464,196 S | 10/2002 | Parker |
| 6,471,056 B1 | 10/2002 | Tzeng |
| 6,519,141 B2 | 2/2003 | Tseng et al. |
| 6,525,928 B1 | 2/2003 | Madsen et al. |
| 6,532,152 B1 * | 3/2003 | White et al. .................. 361/692 |
| 6,536,589 B2 | 3/2003 | Chang |
| 6,574,434 B2 | 6/2003 | Matsuoto et al. |
| 6,594,472 B1 | 7/2003 | Curtis et al. |
| 6,595,608 B1 | 7/2003 | Minelli et al. |
| 6,597,865 B1 | 7/2003 | Negishi et al. |
| 6,614,423 B1 | 9/2003 | Wong et al. |
| 6,614,722 B2 | 9/2003 | Polany et al. |
| 6,616,111 B1 | 9/2003 | White |
| 6,625,394 B2 | 9/2003 | Smith et al. |
| 6,634,494 B1 | 10/2003 | Derr et al. |
| 6,636,697 B2 | 10/2003 | Smith et al. |
| 6,646,864 B2 | 11/2003 | Richardson |
| 6,659,274 B2 | 12/2003 | Enners |
| 6,665,174 B1 | 12/2003 | Derr et al. |
| 6,667,738 B2 | 12/2003 | Murphy |
| 6,698,608 B2 | 3/2004 | Parker et al. |
| 6,721,651 B1 | 4/2004 | Minelli |
| 6,751,552 B1 | 6/2004 | Minelli |
| 6,760,570 B1 | 7/2004 | Higdon, Jr. |
| 6,778,388 B1 | 8/2004 | Minelli |
| 6,785,566 B1 | 8/2004 | Irizarry |
| 6,822,640 B2 | 11/2004 | Derocher |
| 6,844,845 B1 | 1/2005 | Whiteside et al. |
| 6,913,201 B1 | 7/2005 | Wagner et al. |
| 6,914,774 B1 | 7/2005 | Albertini et al. |
| D507,871 S | 8/2005 | DiMarchi et al. |
| 6,954,405 B2 | 10/2005 | Polany et al. |
| 6,955,293 B1 | 10/2005 | Katsanevas |
| 6,975,888 B2 | 12/2005 | Buesseler et al. |
| 6,980,777 B2 | 12/2005 | Shepherd et al. |
| 6,995,976 B2 | 2/2006 | Richardson |
| 7,025,274 B2 | 4/2006 | Solomon et al. |
| 7,046,230 B2 | 5/2006 | Zadesky et al. |
| 7,050,712 B2 | 5/2006 | Shimamura |
| 7,050,841 B1 | 5/2006 | Onda |
| 7,069,063 B2 | 6/2006 | Halkosaari et al. |
| 7,082,264 B2 | 7/2006 | Watanabe et al. |
| 7,106,959 B2 | 9/2006 | Sato |
| 7,158,376 B2 | 1/2007 | Richardson et al. |

(56) References Cited

U.S. PATENT DOCUMENTS

| | | |
|---|---|---|
| 7,180,735 B2 | 2/2007 | Thomas et al. |
| 7,194,202 B2 | 3/2007 | Funahashi et al. |
| 7,194,291 B2 | 3/2007 | Peng |
| 7,230,823 B2 | 6/2007 | Richardson et al. |
| 7,255,228 B2 | 8/2007 | Kim |
| 7,263,032 B2 | 8/2007 | Polany et al. |
| 7,312,984 B2 | 12/2007 | Richardson et al. |
| 7,341,144 B2 | 3/2008 | Tajiri et al. |
| 7,352,961 B2 | 4/2008 | Watanabe et al. |
| 7,362,570 B2 | 4/2008 | Su |
| 7,365,281 B2 | 4/2008 | Yamaguchi et al. |
| 7,369,881 B2 | 5/2008 | Tsujimoto |
| 7,409,148 B2 | 8/2008 | Takahashi et al. |
| 7,436,653 B2 | 10/2008 | Yang et al. |
| 7,464,813 B2 | 12/2008 | Carnevali |
| 7,495,895 B2 | 2/2009 | Carnevali |
| 7,511,956 B2 | 3/2009 | Tomioka et al. |
| 7,525,792 B2 | 4/2009 | Yokote |
| 7,535,799 B2 | 5/2009 | Polany et al. |
| 7,594,576 B2 | 9/2009 | Chen et al. |
| 7,609,512 B2 | 10/2009 | Richardson et al. |
| 7,613,386 B2 | 11/2009 | Shimamura |
| D605,850 S | 12/2009 | Richardson et al. |
| 7,663,879 B2 | 2/2010 | Richardson et al. |
| 7,697,269 B2 | 4/2010 | Yang et al. |
| 7,733,642 B2 | 6/2010 | Liou et al. |
| 7,755,975 B2 | 7/2010 | Pettersen et al. |
| 7,772,507 B2 | 8/2010 | Orr et al. |
| 7,775,354 B2 | 8/2010 | Latchford et al. |
| 7,789,228 B2 | 9/2010 | Zenzai |
| 7,789,696 B2 | 9/2010 | Umei et al. |
| 7,801,425 B2 | 9/2010 | Fantone et al. |
| 7,850,032 B2 | 12/2010 | Carnevali et al. |
| 7,854,434 B2 | 12/2010 | Heiman et al. |
| 7,889,489 B2 | 2/2011 | Richardson et al. |
| 7,907,394 B2 | 3/2011 | Richardson et al. |
| 7,926,818 B2 | 4/2011 | Isono |
| 7,933,122 B2 | 4/2011 | Richardson et al. |
| 7,941,196 B2 | 5/2011 | Kawasaki et al. |
| 7,975,870 B2 | 7/2011 | Laule et al. |
| 7,993,071 B2 | 8/2011 | Clawson |
| D644,636 S | 9/2011 | Richardson et al. |
| 8,031,472 B2 | 10/2011 | Bicket et al. |
| 8,068,331 B2 | 11/2011 | Sauers et al. |
| 8,101,859 B2 * | 1/2012 | Zadesky ............... G06F 1/1626 174/17 R |
| 8,164,899 B2 | 4/2012 | Yamaguchi et al. |
| 8,167,126 B2 | 5/2012 | Stiehl |
| 8,191,706 B1 | 6/2012 | Liu |
| 8,204,561 B2 | 6/2012 | Mongan et al. |
| 8,245,842 B2 | 8/2012 | Bau |
| 8,269,104 B2 | 9/2012 | Choraku et al. |
| 8,286,789 B2 | 10/2012 | Wilson et al. |
| 8,342,325 B2 | 1/2013 | Rayner |
| 8,531,834 B2 * | 9/2013 | Rayner .................... 361/679.56 |
| 2001/0040109 A1 | 11/2001 | Yaski et al. |
| 2002/0003584 A1 | 1/2002 | Kossin |
| 2002/0071550 A1 | 6/2002 | Pletikosa |
| 2002/0079244 A1 | 6/2002 | Kwong |
| 2002/0085709 A1 | 7/2002 | Hsu |
| 2002/0090212 A1 | 7/2002 | Shimamura et al. |
| 2002/0122353 A1 | 9/2002 | Polany et al. |
| 2002/0136557 A1 | 9/2002 | Shimamura |
| 2002/0137475 A1 | 9/2002 | Shou et al. |
| 2002/0175096 A1 | 11/2002 | Linihan |
| 2002/0175901 A1 | 11/2002 | Gettemy |
| 2002/0193136 A1 | 12/2002 | Halkosaari et al. |
| 2002/0195910 A1 | 12/2002 | Hus et al. |
| 2003/0080947 A1 | 5/2003 | Genest et al. |
| 2003/0095374 A1 | 5/2003 | Richardson |
| 2003/0111366 A1 | 6/2003 | Enners |
| 2003/0118332 A1 | 6/2003 | Smith et al. |
| 2003/0118334 A1 | 6/2003 | Smith et al. |
| 2003/0128397 A1 | 7/2003 | Smith et al. |
| 2003/0223577 A1 | 12/2003 | Ono |
| 2004/0014506 A1 | 1/2004 | Kemppinen |
| 2004/0076415 A1 | 4/2004 | Da Silva |
| 2004/0089570 A1 | 5/2004 | Chien et al. |
| 2004/0120219 A1 | 6/2004 | Polany et al. |
| 2004/0188120 A1 | 9/2004 | Komatsu et al. |
| 2004/0195783 A1 | 10/2004 | Akagi et al. |
| 2004/0203502 A1 | 10/2004 | Dietrich et al. |
| 2004/0226836 A1 | 11/2004 | Schreiber et al. |
| 2005/0052425 A1 | 3/2005 | Zadesky et al. |
| 2005/0094024 A1 | 5/2005 | Sato |
| 2005/0110768 A1 | 5/2005 | Marriott et al. |
| 2005/0115852 A1 | 6/2005 | Funahashi et al. |
| 2005/0123161 A1 | 6/2005 | Polany et al. |
| 2005/0139498 A1 | 6/2005 | Goros |
| 2005/0167304 A1 | 8/2005 | Shimamura |
| 2005/0174727 A1 | 8/2005 | Thomas et al. |
| 2005/0181843 A1 | 8/2005 | Tsujimoto |
| 2005/0224508 A1 | 10/2005 | Tajiri et al. |
| 2005/0247584 A1 | 11/2005 | Lu |
| 2005/0279661 A1 | 12/2005 | Hodges |
| 2006/0008261 A1 | 1/2006 | Watanabe et al. |
| 2006/0110146 A1 | 5/2006 | Ariga |
| 2007/0040931 A1 | 2/2007 | Nishizawa |
| 2007/0071423 A1 | 3/2007 | Fantone et al. |
| 2007/0074473 A1 | 4/2007 | Yamaguchi et al. |
| 2007/0086273 A1 | 4/2007 | Polany et al. |
| 2007/0109730 A1 | 5/2007 | Shigyo et al. |
| 2007/0110416 A1 | 5/2007 | Yamaguchi et al. |
| 2007/0115387 A1 * | 5/2007 | Ho ........................ A45C 11/38 348/375 |
| 2007/0138920 A1 | 6/2007 | Austin et al. |
| 2007/0139873 A1 * | 6/2007 | Thomas ................ G06F 1/1626 361/679.03 |
| 2007/0158220 A1 | 7/2007 | Cleereman et al. |
| 2007/0215663 A1 | 9/2007 | Chongson et al. |
| 2007/0241012 A1 | 10/2007 | Latchford et al. |
| 2007/0261978 A1 | 11/2007 | Sanderson |
| 2007/0280053 A1 | 12/2007 | Polany et al. |
| 2007/0297149 A1 | 12/2007 | Richardson et al. |
| 2008/0081679 A1 | 4/2008 | Kawasaki et al. |
| 2008/0157485 A1 | 7/2008 | Isono |
| 2008/0164267 A1 | 7/2008 | Huber |
| 2009/0009945 A1 | 1/2009 | Johnson et al. |
| 2009/0017884 A1 | 1/2009 | Rotschild |
| 2009/0028535 A1 | 1/2009 | Funahashi et al. |
| 2009/0032420 A1 | 2/2009 | Zenzai |
| 2009/0087655 A1 | 4/2009 | Yamada et al. |
| 2009/0090532 A1 | 4/2009 | Lai et al. |
| 2009/0109635 A1 | 4/2009 | Chen et al. |
| 2009/0117957 A1 | 5/2009 | Araki et al. |
| 2009/0167545 A1 | 7/2009 | Osaka |
| 2009/0211775 A1 | 8/2009 | Yamaguchi et al. |
| 2009/0215412 A1 | 8/2009 | Liu et al. |
| 2009/0260844 A1 | 10/2009 | Tseng |
| 2010/0006314 A1 | 1/2010 | Wilson, II et al. |
| 2010/0044198 A1 | 2/2010 | Tang et al. |
| 2010/0053355 A1 * | 3/2010 | Iwase et al. ................ 348/222.1 |
| 2010/0085691 A1 | 4/2010 | Yeh et al. |
| 2010/0104814 A1 | 4/2010 | Richardson et al. |
| 2010/0144194 A1 | 6/2010 | Umei et al. |
| 2010/0181108 A1 | 7/2010 | Hata et al. |
| 2010/0200456 A1 | 8/2010 | Parkinson |
| 2010/0203931 A1 | 8/2010 | Hynecek et al. |
| 2010/0206601 A1 | 8/2010 | Choraku et al. |
| 2010/0238119 A1 | 9/2010 | Dubrovsky et al. |
| 2010/0251827 A1 * | 10/2010 | Bourbeau ............ H05K 5/0017 73/756 |
| 2010/0311475 A1 | 12/2010 | Takatsuka et al. |
| 2010/0313485 A1 | 12/2010 | Kuo |
| 2011/0002106 A1 | 1/2011 | Bentley et al. |
| 2011/0017620 A1 | 1/2011 | Latchford et al. |
| 2011/0024315 A1 | 2/2011 | Kim |
| 2011/0073608 A1 | 3/2011 | Richardson et al. |
| 2011/0157055 A1 * | 6/2011 | Tilley et al. ................. 345/173 |
| 2011/0157800 A1 | 6/2011 | Richardson et al. |
| 2011/0228460 A1 | 9/2011 | Kim et al. |
| 2012/0018325 A1 | 1/2012 | Kim |
| 2012/0031914 A1 | 2/2012 | Liu |
| 2012/0043235 A1 | 2/2012 | Klement |

(56) References Cited

U.S. PATENT DOCUMENTS

| | | |
|---|---|---|
| 2012/0099261 A1 | 4/2012 | Reber |
| 2012/0099262 A1 | 4/2012 | Reber et al. |
| 2012/0099265 A1 | 4/2012 | Reber |
| 2012/0099266 A1 | 4/2012 | Reber et al. |
| 2012/0103844 A1 | 5/2012 | Piedra et al. |
| 2012/0118773 A1 | 5/2012 | Rayner |
| 2012/0168336 A1 | 7/2012 | Schmidt et al. |
| 2012/0261289 A1 | 10/2012 | Wyner et al. |
| 2012/0314354 A1 | 12/2012 | Rayner |
| 2013/0220841 A1 | 8/2013 | Yang |
| 2013/0242481 A1* | 9/2013 | Kim .......... H05K 5/06 361/679.01 |

FOREIGN PATENT DOCUMENTS

| | | |
|---|---|---|
| JP | 3066786 U | 3/1991 |
| JP | 05-061069 U | 8/1993 |
| JP | H0818637 A | 1/1996 |
| JP | 08-288990 A | 11/1996 |
| JP | 3060175 U | 7/1999 |
| JP | 2000125916 A | 5/2000 |
| JP | 2000-341383 A | 12/2000 |
| JP | 2001-046132 A | 2/2001 |
| JP | 2002280757 A | 9/2002 |
| JP | 2003-164316 A | 6/2003 |
| WO | WO-94/00037 A1 | 1/1994 |
| WO | WO-99/41958 A1 | 8/1999 |
| WO | WO-00/51315 | 8/2000 |
| WO | WO-02/11161 A2 | 2/2002 |
| WO | WO-2012074151 A1 | 6/2012 |

OTHER PUBLICATIONS

Results for Invalidity Search for U.S. Pat. No. 6,995,976.
BodyGloveMobile—Apple iPhone 4 & 4S Zero 360 Case-Clear-Flat Back (no clip) [Retrieved from http://bodyglovemobile.com/product/apple-iphone-4-amp-4s-zero-360deg-case-clear-flat-back-no-clip,338,63.htm. Dated Apr. 9, 2012].
Casemate Chrome with Mirror Screen Protector for iPhone 4/4S Case-Mate [Retrieved from http://www.case-mate.com/iPhone-4-Cases/Case-Mate-iPhone-4-4S-Chrome-with-Mirror-Screen-Protector.asp. Dated Apr. 9, 2012].
Hard Candy Cases—Bubble 360 Case for the new iPAD [Retrieved from http://www.hardcandycases.com/bubble-360-case--for-new-ipad.html. Dated Apr. 9, 2012].
Eaglecell, Inc.—Eaglecell Phone Accessories—iPhone 4(AT&T/Verizon)/4S(AT&T/Verizon/Sprint) [Retrieved from http://www.eaglecell.com/Ecommerce/general/BrowsrCategory.aspx?C . . . Dated Apr. 9, 2012].
Gadgetmac—CaseMate Phantom Case for iPhone 4/S Review [Retrieved from http://www.gadgetmac.com/reviews/case-mate-phantom-case-for-iphon . . . Dated Apr. 9, 2012].
Griffin cases & covers for iPhone 4 and iPhone 4s [Retrieved from http://www.griffintechnology.com/iphone/cases Dated Apr. 9, 2012].
OtterBox Commuter Series Cases OtterBox.com [Retrieved from http://www.otterbox.com/commuter-series,default,pg. html. Dated Apr. 9, 2012].
TakTik—iPhone Case [Retrieved from http://articlesdownload.com/2012/08/16taktik-premiumprotection-system . . . Dated Apr. 9, 2012].
Drafahl, Jack; Drafahl, Sue, A Supremely Compact Video Housing, Ikelite's Sony TR-5, Skin Diver Magazine New Product Series, Nov. 1990.
Drafahl, Jack; Drafahl, Sue, Aqua Video Housing for the Sony CCD-V99, Skin Diver Magazine, Dec. 1989.
Drafahl, Jack; Drafahl, Sue, Hypertech Pro-40 an U/W video housing that is tough as nails, Skin Diver Magazine, Jun. 1989.
Drafahl, Jack; Drafahl, Sue, Hypertech's Pro-9A Housing Tough as a Tank in Battle, Skin Diver Magazine, Apr. 1989.
Drafahl, Jack; Drafahl, Sue, Ikelite Video Housing for the Sony CCD-V9 Diving's First Hybrid Video Case, Skin Diver Magazine, May 1989.
Drafahl, Jack; Drafahl, Sue, Ikelite's CCD-V101 a Sony Housing That Allows Access to 25 Camera Functions, Skin Diver Magazine, Jun. 1991.
Drafahl, Jack; Drafahl, Sue, Ikelite's JVC GR-A1U Housing, Full Range Auto Focus Video from Macro to Infinity, Skin Diver Magazine, Jun. 1990.
Drafahl, Jack; Drafahl, Sue, Sea & Sea VX-1000 Digital Video Goes Underwater, Skin Diver Magazine, Mar. 1998.
Drafahl, Jack; Drafahl, Sue, Sea & Sea's CX-600, Skin Diver Magazine, Dec. 1997.
Drafahl, Jack; Drafahl, Sue, The Delux PRO-PAK6, Equinox's Answer to the Ideal Video Housing, Skin Diver Magazine, Oct. 1989.
Sony Corporation, MPK-F40/F340 Service Manual Handycam Marine Pack Sony, Published by A/V Engineering Service Department, 1988.
Sony Corporation, MPK-TR, Operating Instructions, Handycam Marine Pack, Downloaded from www.Manualslib.com manuals search engine, 1990.

* cited by examiner

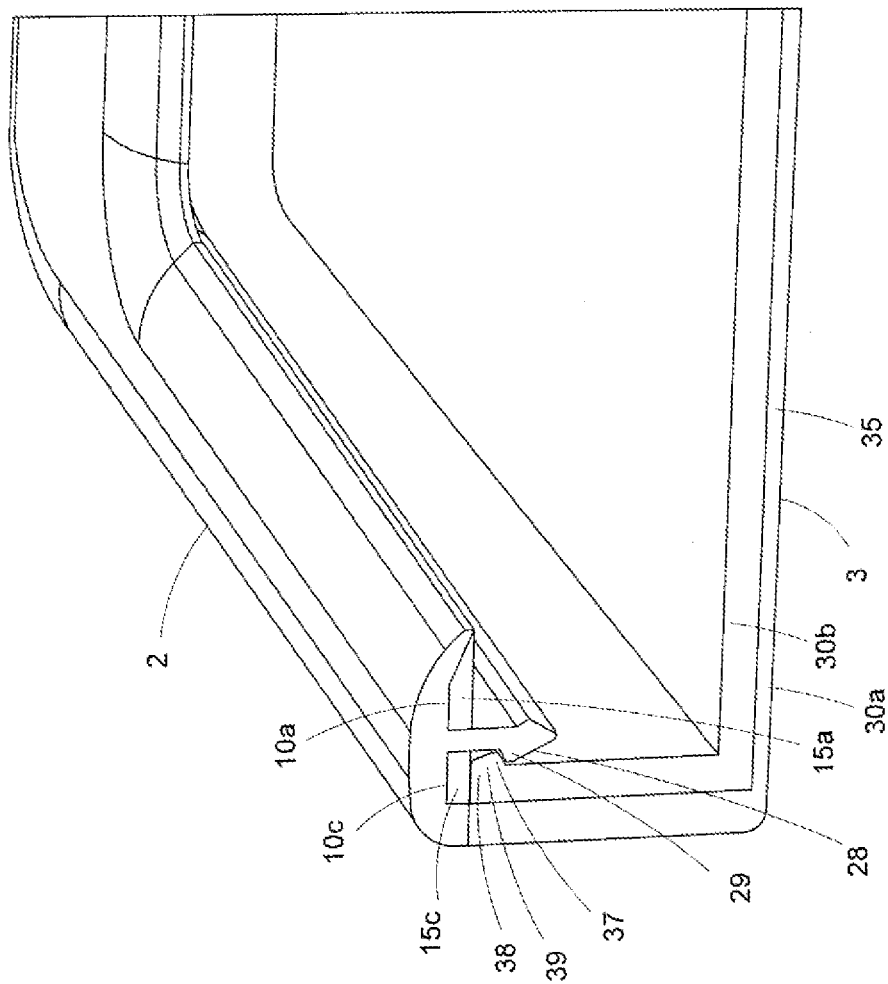

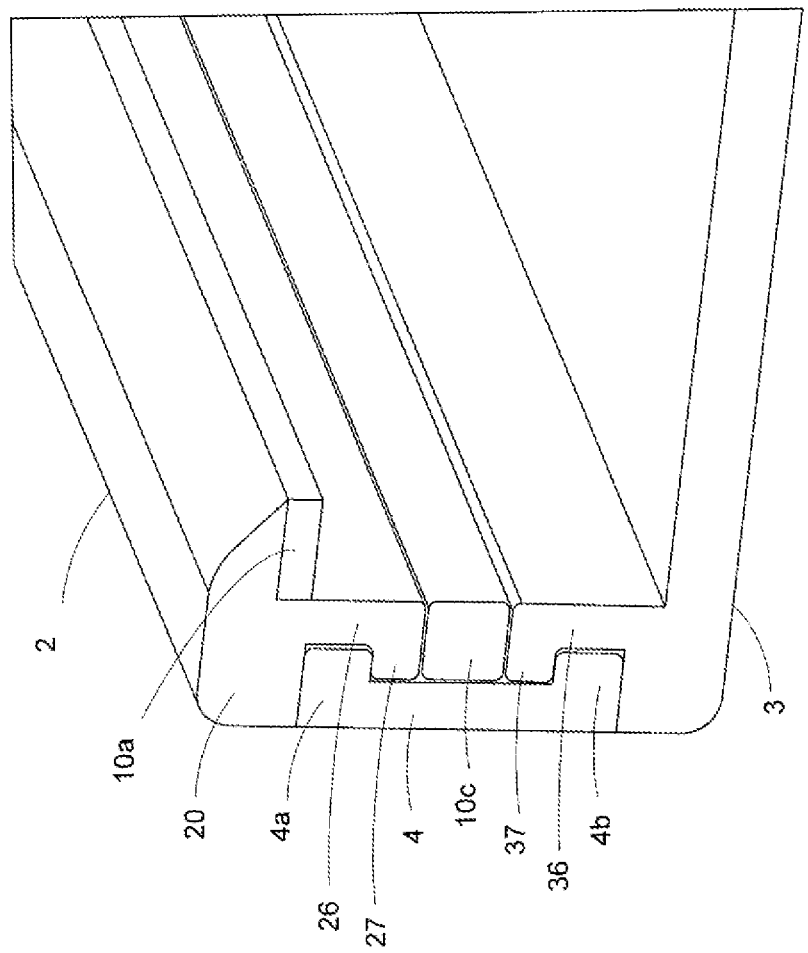

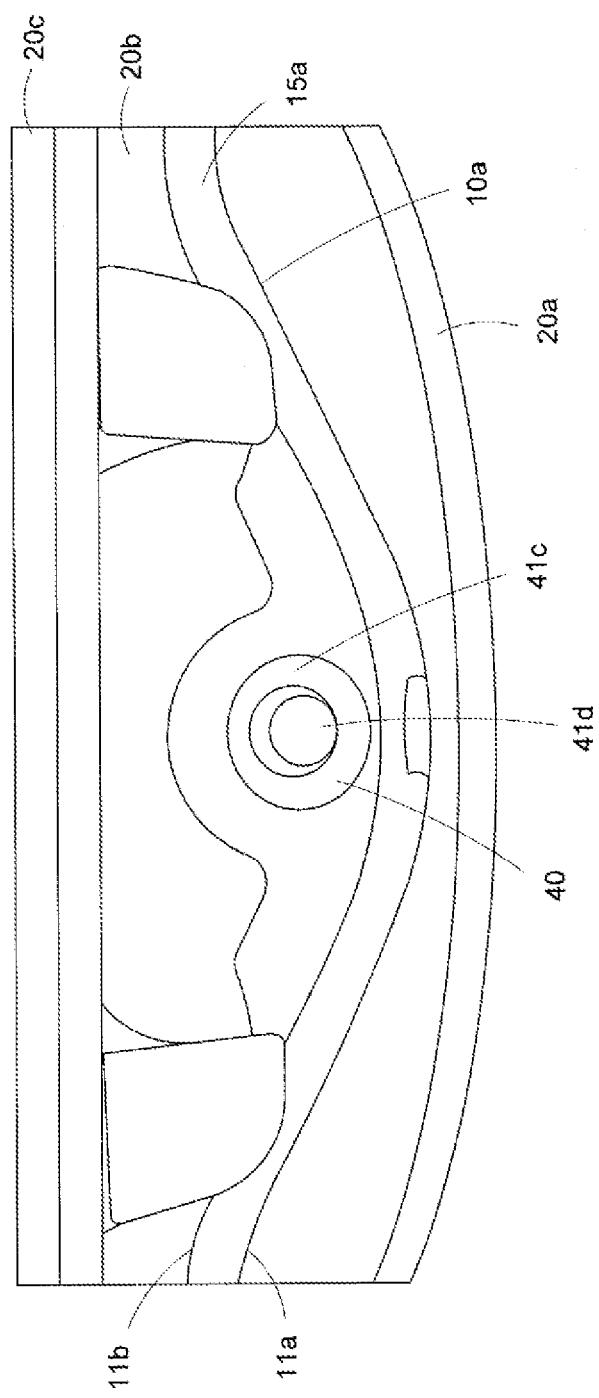

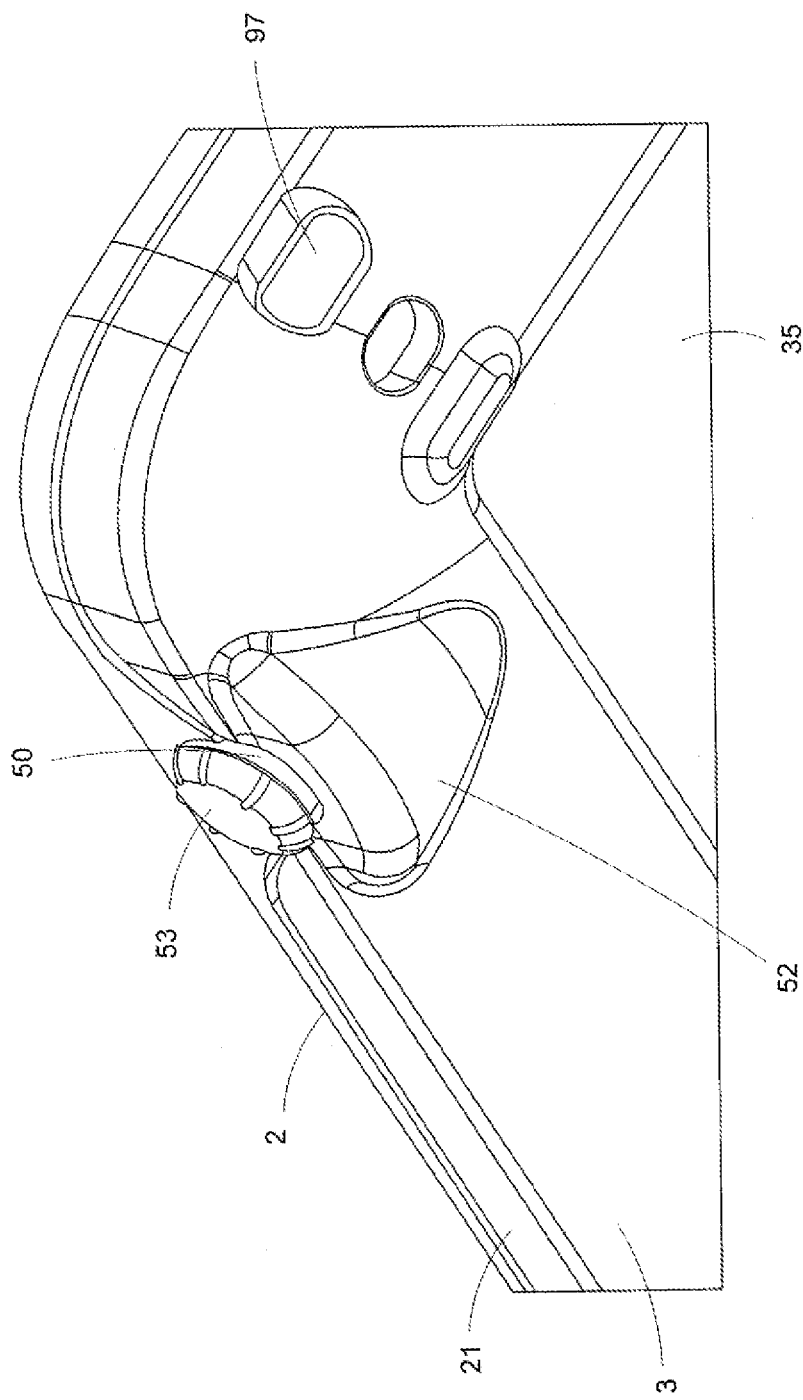

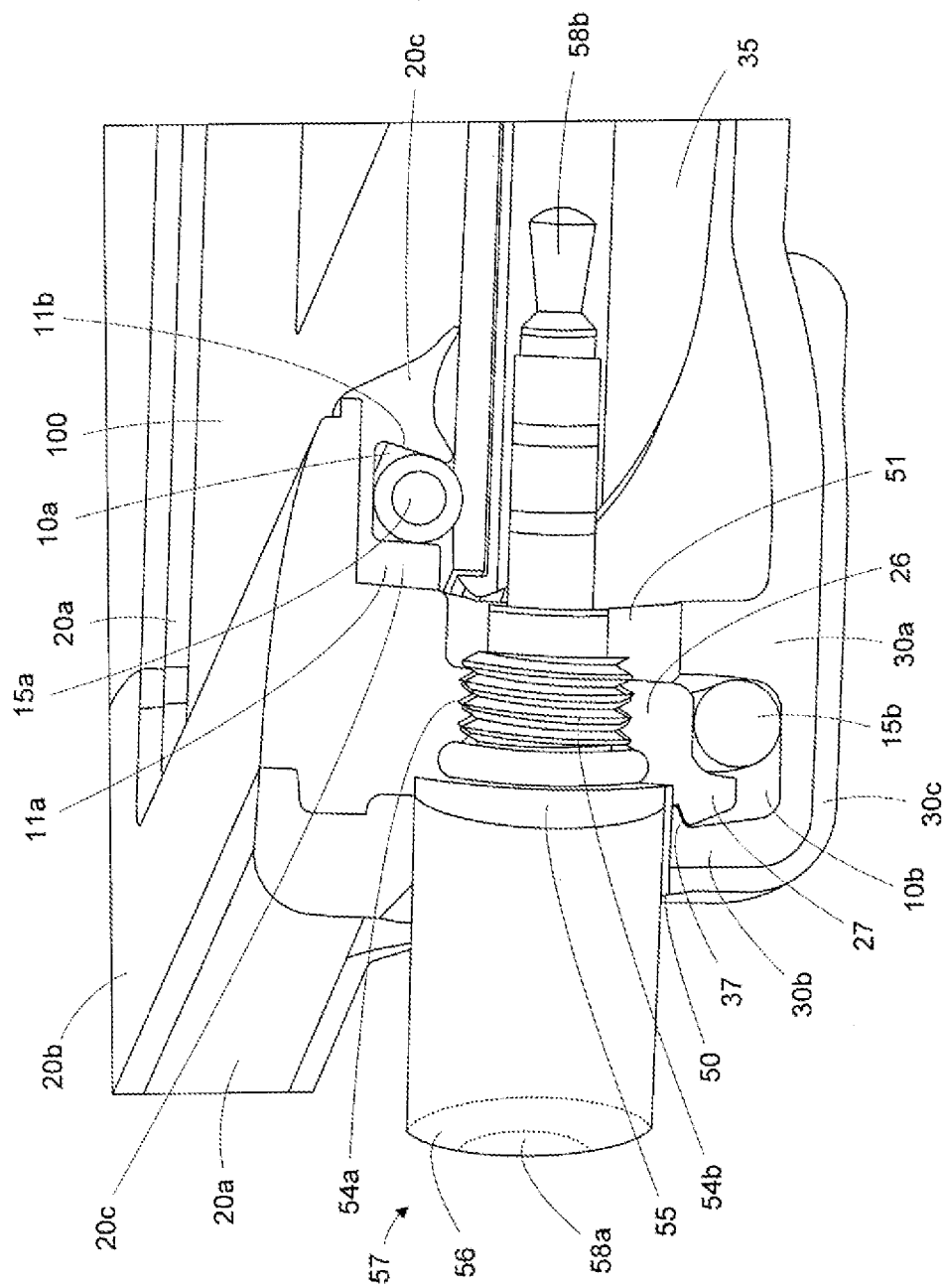

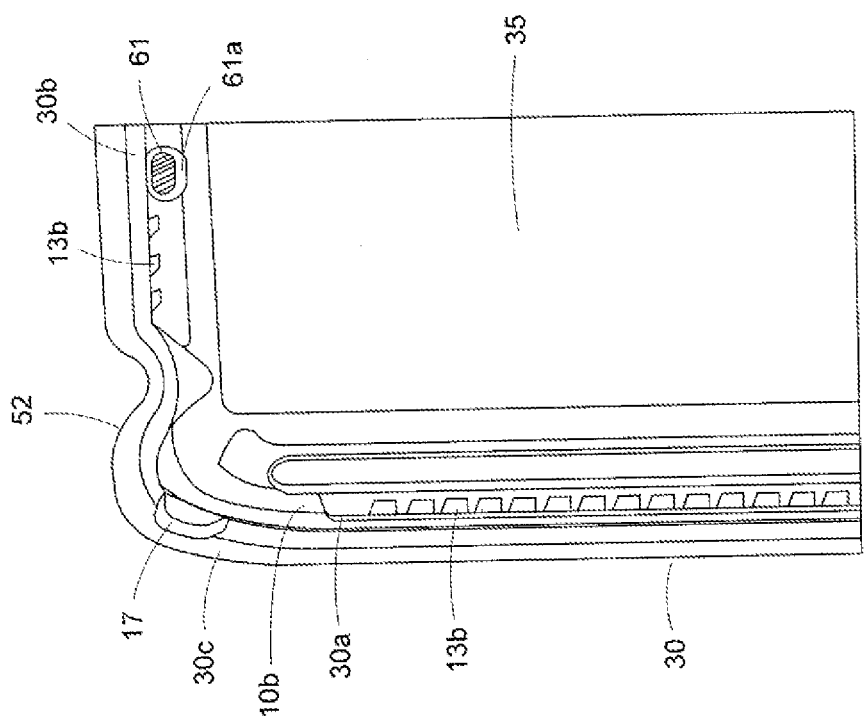

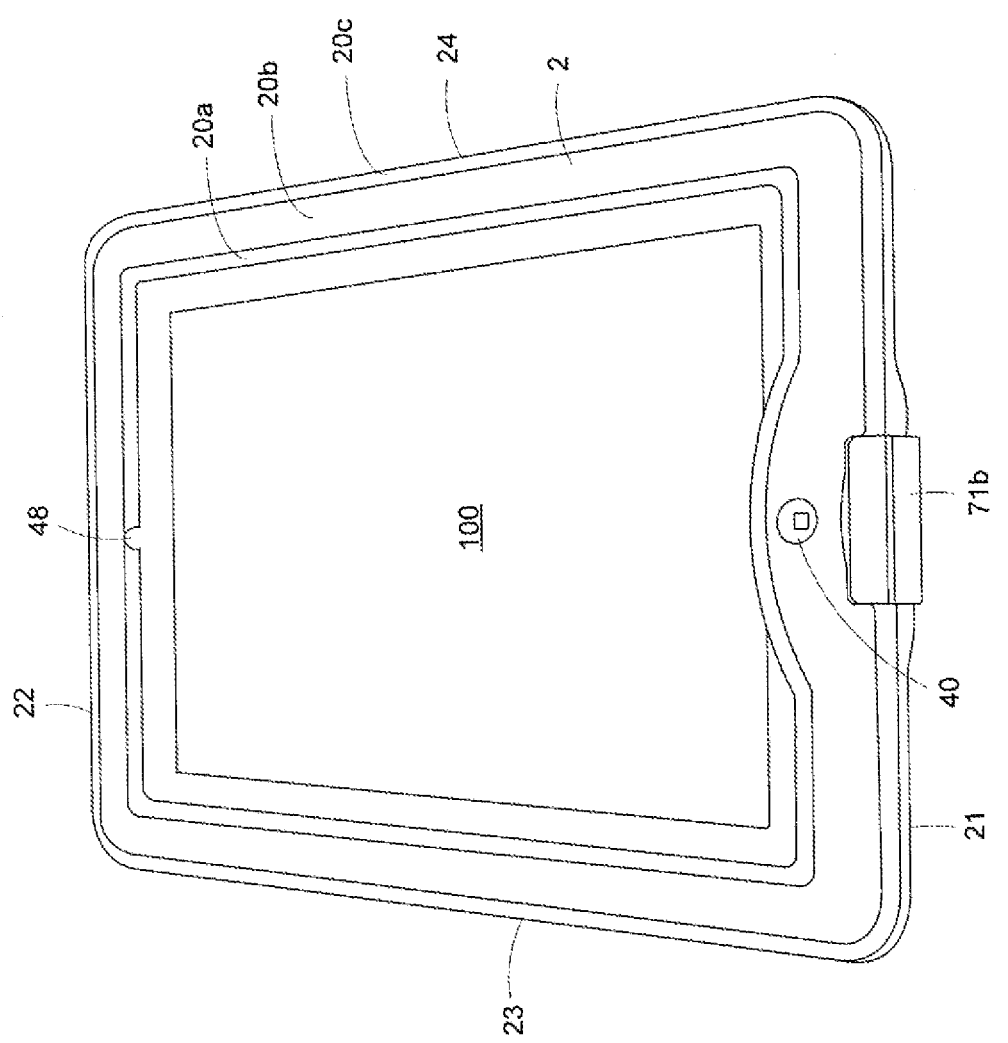

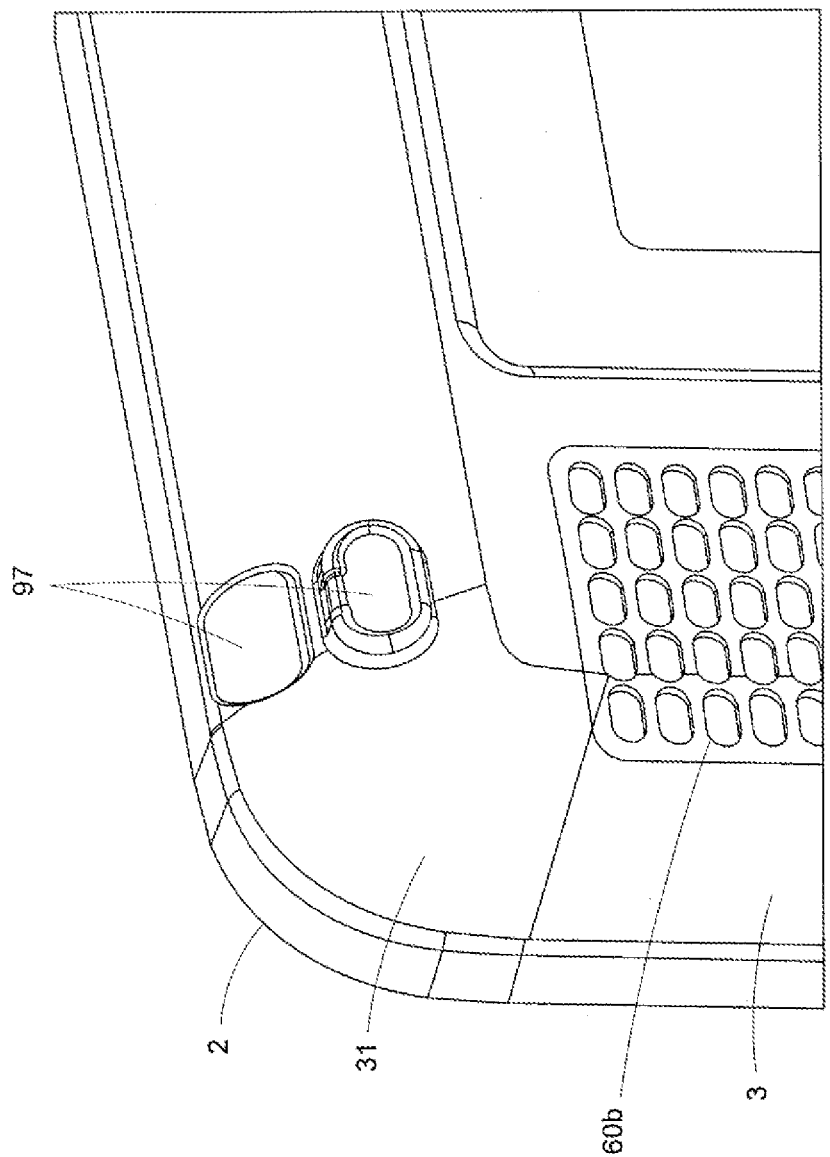

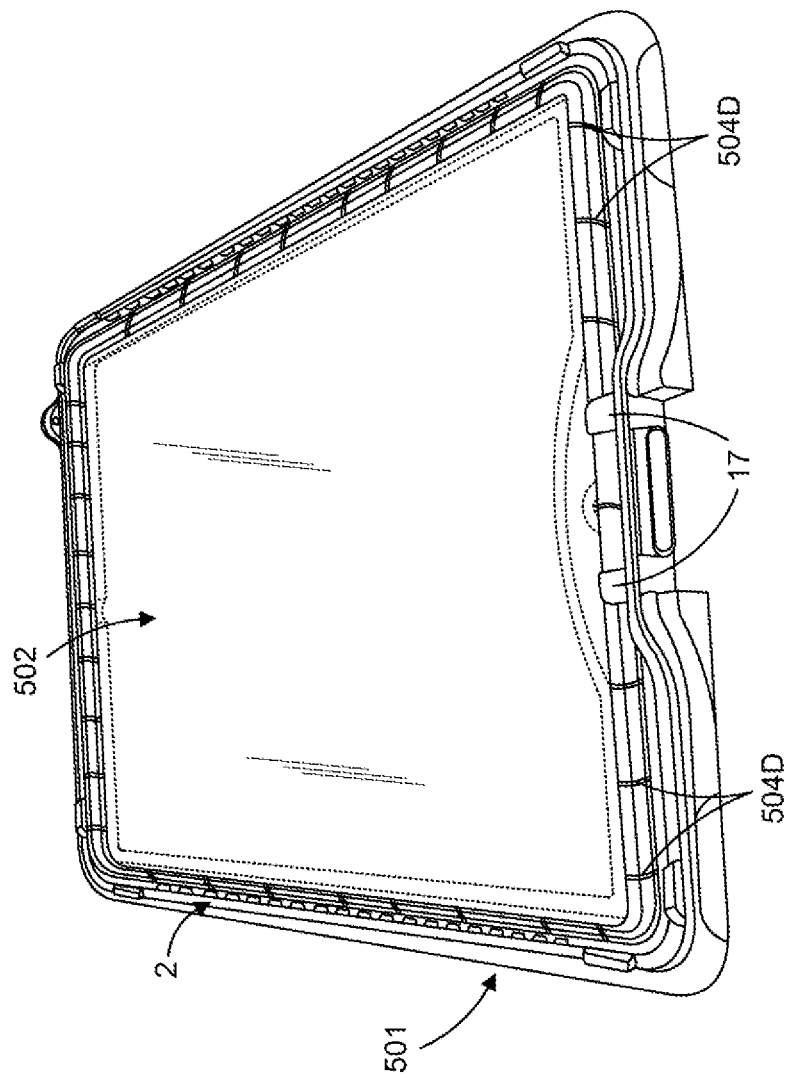

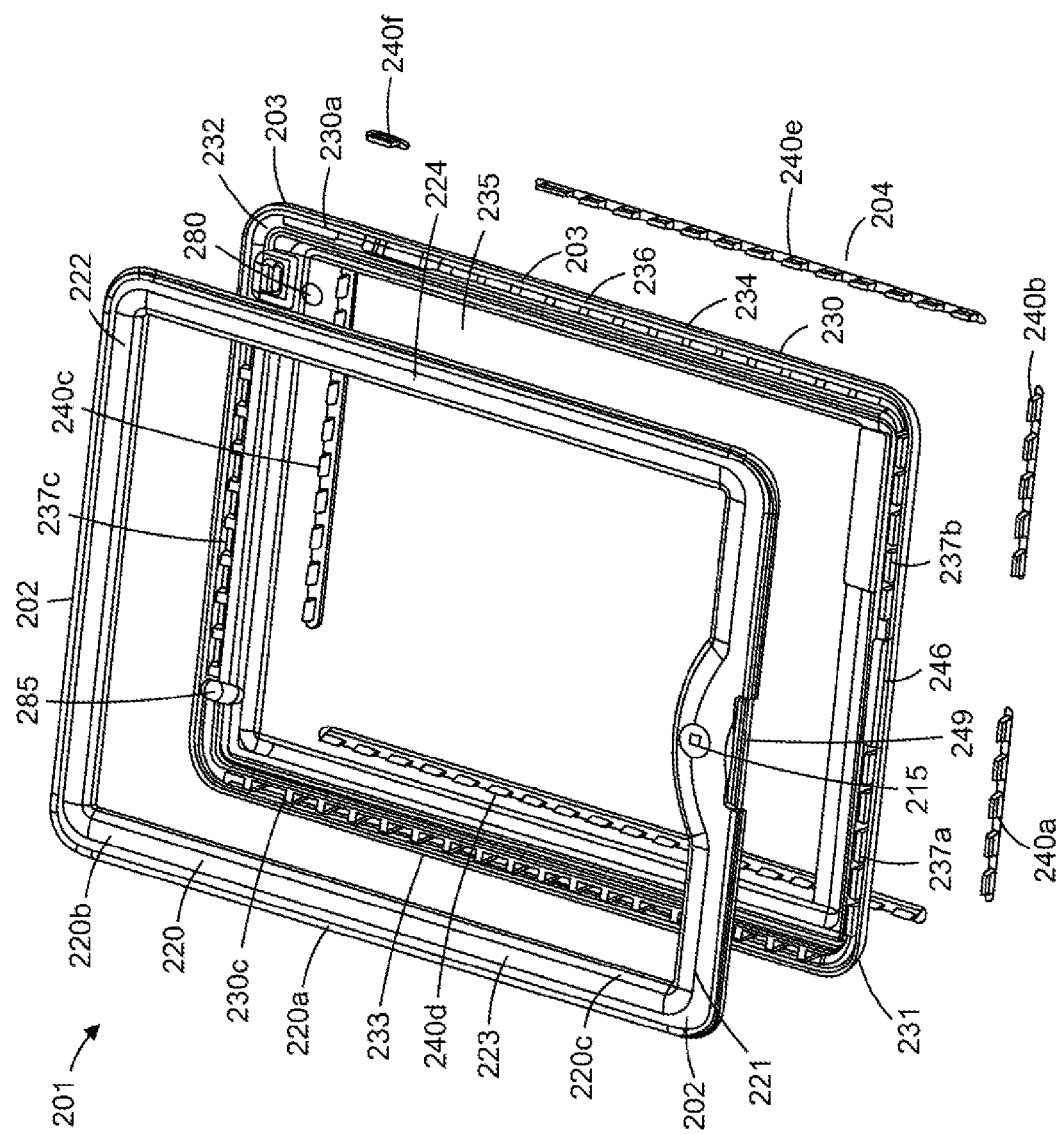

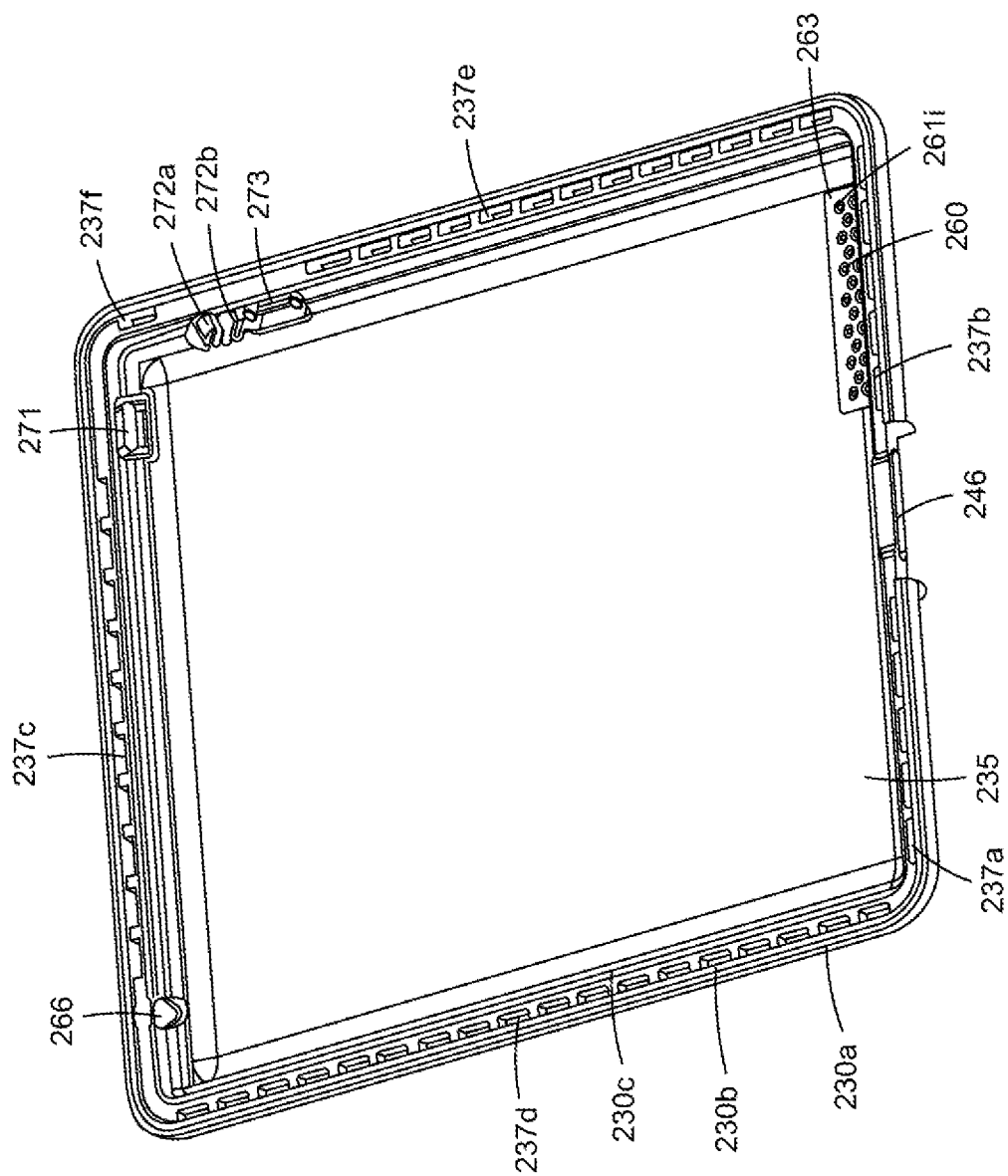

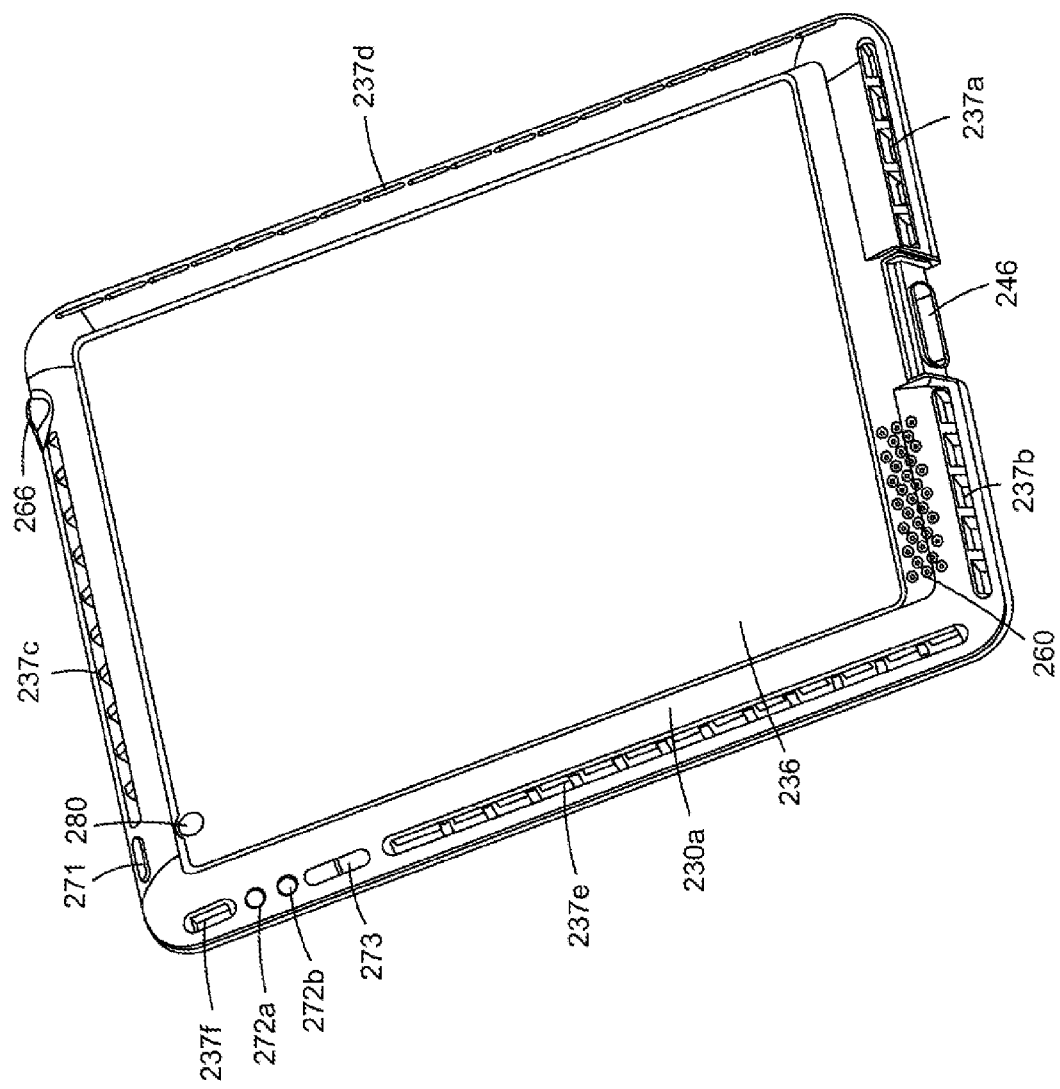

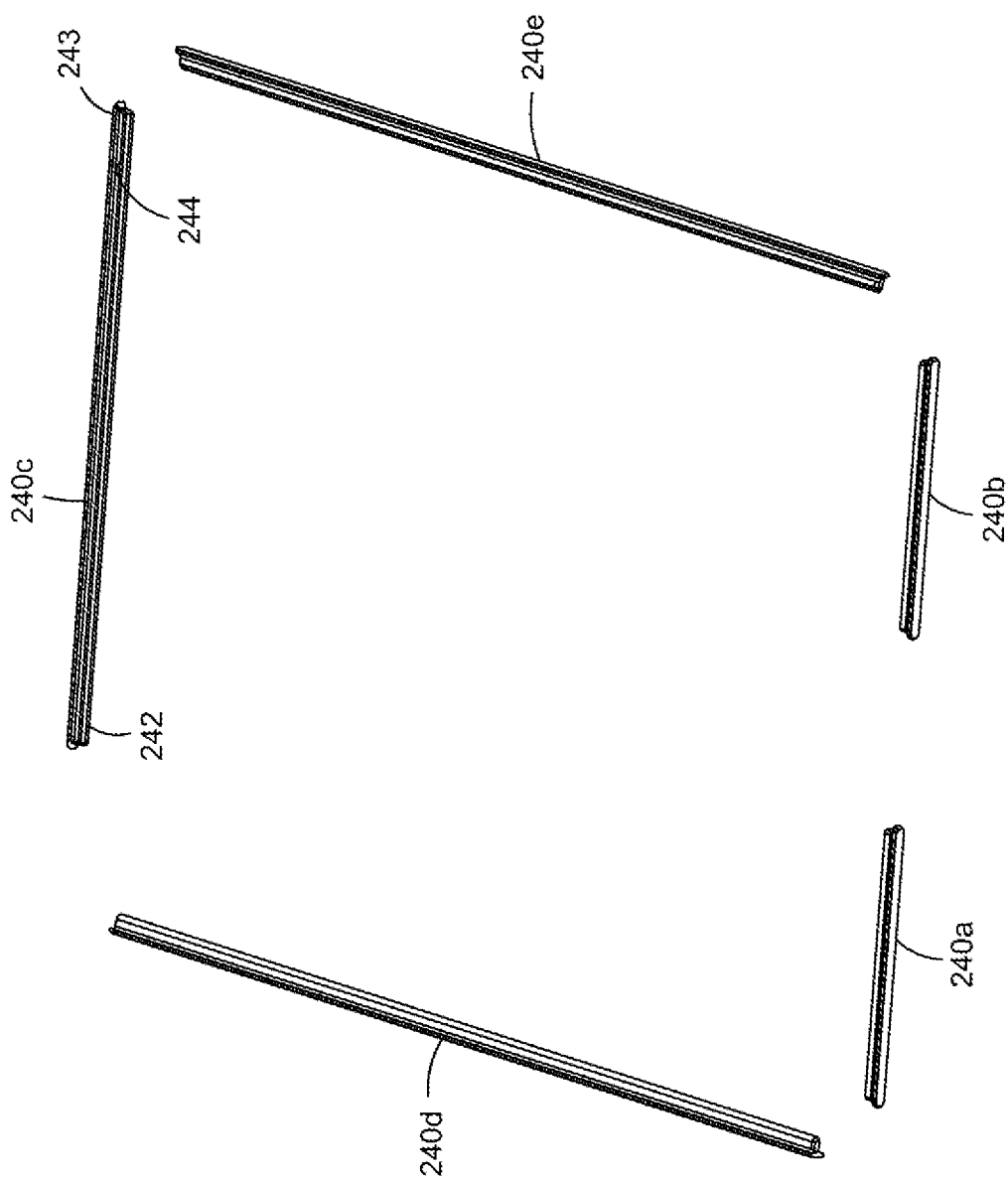

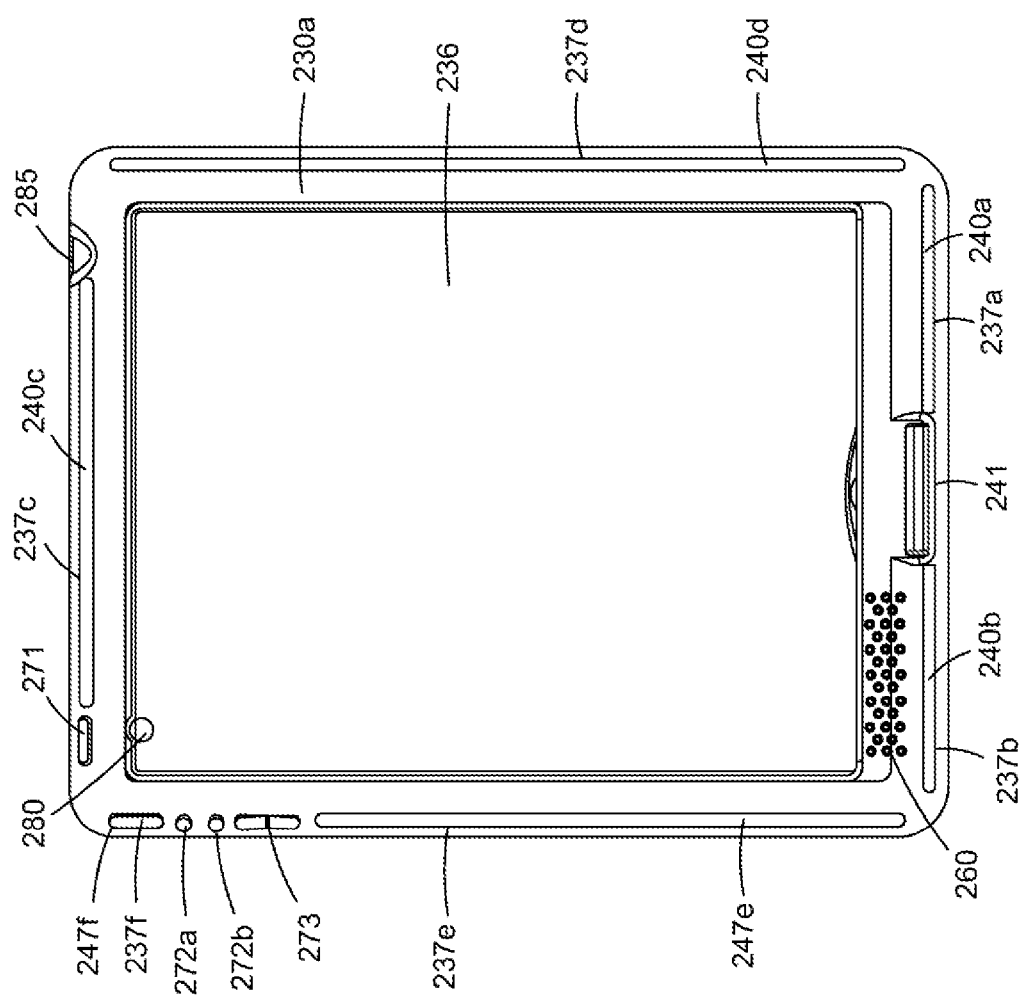

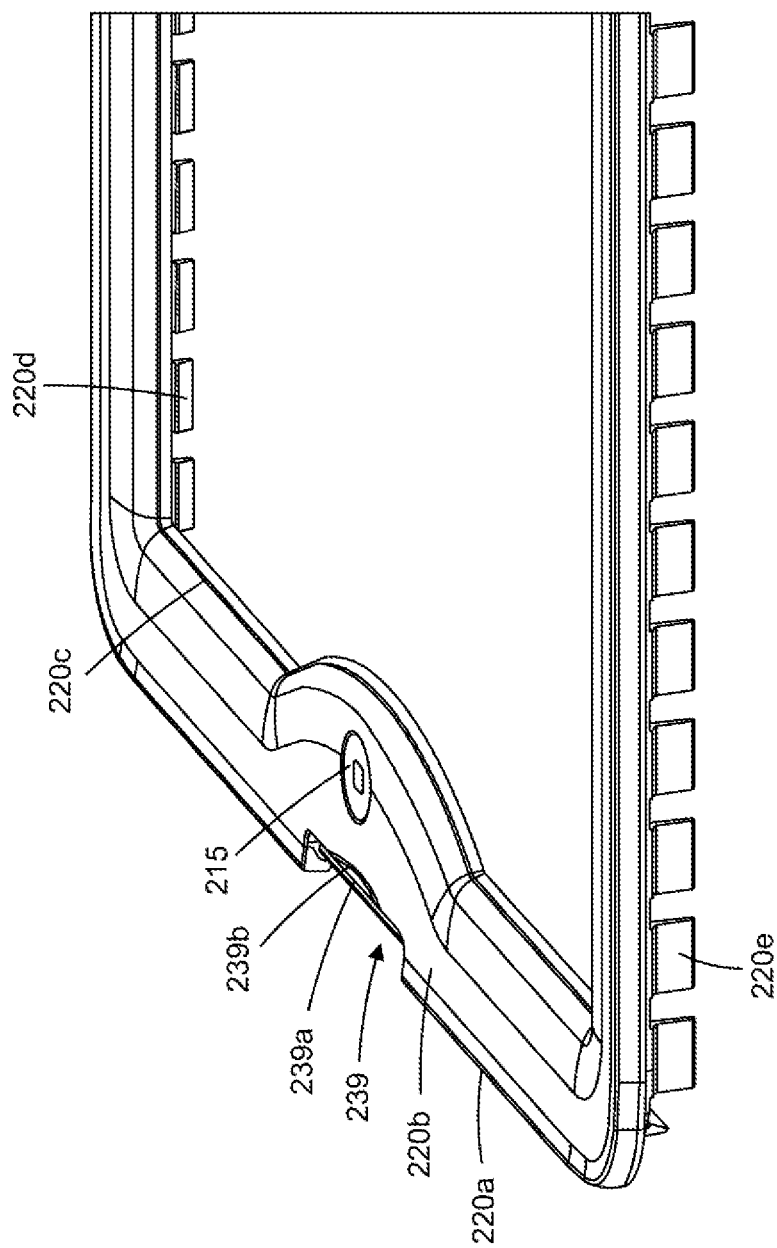

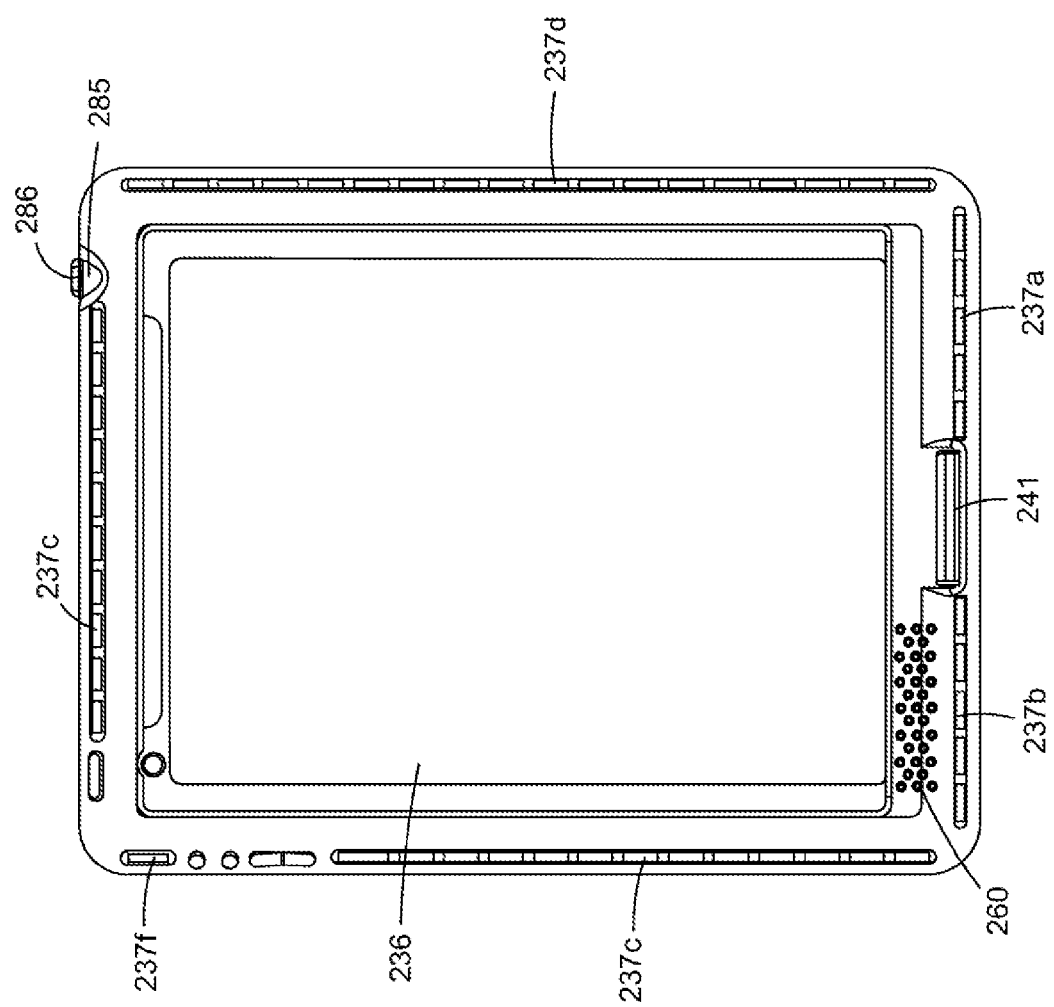

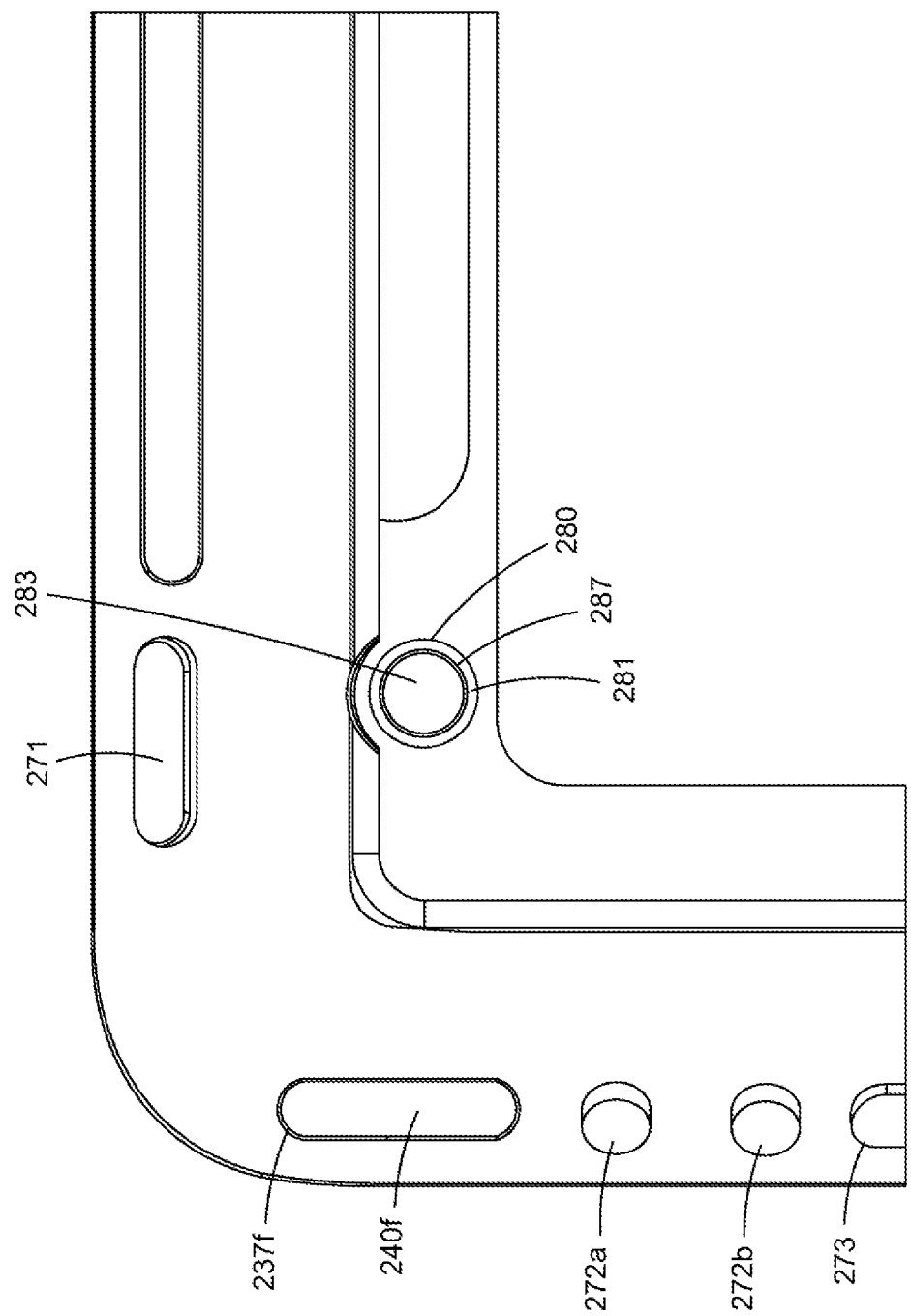

PROTECTIVE ENCASEMENT FOR MOBILE COMPUTING DEVICE

CROSS-REFERENCE TO RELATED APPLICATIONS

The current application claims priority under 35 U.S.C. §119(e) to U.S. Provisional Application No. 61/496,503, entitled "Housing For Encasing A Tablet Computer" which was filed on Jun. 13, 2011 and Provisional Application No. 61/497,479, entitled "Housing For Encasing A Tablet Computer" which was filed on Jun. 15, 2011, the entire disclosures of which are incorporated by reference herein.

FIELD

This disclosure relates generally to a housing for protecting one or more objects, such as an object in need of protection from the elements, mistreatment, and/or other unfortunate handling. For instance, in one aspect, the disclosure relates to a housing for protecting one or more components of a device or a device itself, such as an electronic device, for example, a mobile computer, for instance, a digital tablet computer, or the like.

BACKGROUND

Dirt, mud, rain, snow, and water in all of its forms can be damaging to various objects. Additionally, objects that are fragile or otherwise breakable can be damaged by mistreatment and/or other unfortunate handling. It is, therefore, useful to have a housing within which an object of need of protection may be housed so as to protect it from inclement conditions, mistreatment, and/or unfortunate handling. Types of objects in need of such protection are electronic devices, such as a mobile computer, for instance, a digital tablet computer, personal digital assistant, electronic reader, mobile telephone device, and the like.

Specifically, desktop computers are well known in the art. Mobile computers are also well known and allow all the same general functionality as standard desktop computers, albeit often with less memory and/or processing power. For instance, mobile digital computers are capable of performing word processing tasks, spread sheet production, power-point generation, and typically possess mobile broadband connectivity. However, often for general use, one need not engage extensive processing power, nor employ many of the programs often run on typical desktop and/or mobile laptop computers, such as word processing, spread sheet production, and power point generation and presentation. Often for general use all that is required is a moderate processing power and memory as well as broadband internet connectivity. Accordingly, mobile digital tablet computers and mobile telephones having computing functionality have been developed.

Mobile digital tablet computers serve the same basic functions as their counterpart desk and laptop computers, however, typically with less processing power and memory as well as less word processing, etc. Nevertheless, for general use all that is needed is internet connectivity as well as the ability to obtain e-mail and read electronic data, such as e-books. This functionality is perfect for tablet style computers and even mobile telephones having such functionality, which by their nature are designed to be thin and light weight. Mobile digital tablet computers and computing telephones, therefore, have become increasingly popular with the general user.

With respect to tablet computers and mobile telephones with computing functionality, such electronic devices are well known and widely used. Tablet computers and mobile telephones with computing functions are electronic devices that are convenient tools which allow continual access to the internet, make reading electronic books easy, and facilitates peoples communications with one another, e.g., via phone, e-mail and/or various social media modalities, while on the go and away from traditional telephone landlines. For instance, mobile tablet and telephone devices allow people to connect to the internet, download and read or watch books and movies, as well as to communicate with others via voice, text message, sms, im, social media modalities, and the like. Electronic readers are devices that are similar to tablet computers, but with even more limited computing functionality yet nevertheless allow a user to easily store, view and read various print media. However, while tablet computers, mobile telephones, and electronic readers may be portable and handy to use, they suffer from some drawbacks. For example, they are often expensive and contain fragile electronic components that make them prone to damage due to inclement weather and/or mishandling.

Accordingly, there is a need in the art for a mechanism whereby an object, such as a portable tablet computer, mobile telephone, or an electronic reader device, may be protected from inclement weather and/or errant handling and/or other damage that may result from contacting a fluid, such as water, dirt, mud, and the like. The present disclosure is directed to an apparatus and system for housing or encasing an object, such as a tablet computer, mobile telephone, or electronic reader and/or the components thereof, as well as methods for using the same, in a manner that offers protection for the device from adverse environmental conditions, inclement weather, mishandling and/or damage, such as from contacting a fluid, such as water. Systems for the same are also provided.

SUMMARY

In one aspect, a housing for encasing an object is provided. The object may be any object that is in need of protecting from one or more adverse environmental conditions, inclement weather, mishandling and/or damage, such as from contacting a fluid, such as water. The object may be a device, e.g., an electronic device, and the housing a casing within which the electronic device is housed; or the object may be a single component or several components of which the device, e.g., the electronic device is comprised, and the housing may make up the outer bounds, e.g., casing, of the electronic device. The housing may be of any appropriate size and dimension so long as it is capable of housing the object and protecting it, for instance, from adverse environmental conditions and/or rough treatment.

In certain embodiments, the object to be contained is an electronic device, such as a mobile computing and/or display device, for instance, a tablet computer, mobile telephone, electronic reader, personal digital assistant, electronic/digital camera, or the like; and the housing is configured for protecting the electronic device. In certain embodiments, the object to be contained is one or more, e.g., a plurality, of electronic components, such as electronic components that are configured for functioning together so as to perform a particular function, such as computing and/or receiving or transmitting telephone calls, and the housing is configured for both containing the electronic component(s) and protecting them. For example, where the electronic device is a tablet computer or mobile telephone, etc. the components may be the components contained within the tablet computer or telephone device that allow it to function in an appropriate manner. The housing, therefore, could be the actual housing of the tablet computer, mobile telephone, etc. that typically houses the components, however, modified in the manner described herein below so as to be liquid proof and/or shock proof as described herein.

In one aspect a container is provided, wherein the container is configured for containing a device, such as an electronic device, e.g., a mobile tablet style computer, mobile telephone, electronic reader, personal digital assistant, electronic/digital cameras, pager, and the like. For ease and clarity, the use of the term tablet computer will be understood to include all such mobile devices having various computing functionalities and includes, but is not hereby limited to: mobile tablet computers, mobile telephones, electronic readers, electronic personal assistants, electronic/digital cameras, pagers, and the like. Accordingly, use of the term "tablet computer" or any derivation thereof should be understood to mean any of these devices having computing functionalities unless the context indicates otherwise.

In various instances, the container includes a housing wherein the housing is adapted for housing the device. It is to be understood that although the following description is set forth with respect to describing the shape and size of a particular container for housing a particular device, i.e., a mobile tablet computer device, the shape, size, and/or configuration of the container and/or the object to be contained, e.g., a tablet device, can vary, for instance, as described herein. Therefore, in one instance, a housing for housing a device, such as an electronic device, for instance a tablet computer, is provided.

The housing is configured such that the device may be fitted within the housing and be protected thereby. In certain instances, the housing may include a top member and a bottom member that may be removably coupled together so as to form the housing. In certain instances, the top and bottom members are separate components capable of being separably coupled together. In other instance, a single component forms both the top and bottom member, which in such an instance, is configured for being folded upon itself and subsequently being unitarily coupled together.

Accordingly, the housing includes a coupling mechanism, which coupling mechanism may have any of a number of configurations that include any of a number of components which collectively function to couple, mate, connect, or abut a top and/or a bottom portion of the housing whether or not the top and bottom portions are two or more separate individual members or a single member having two or more distinct portions. A coupling member, therefore, may incorporate anything or everything that couples, mates, connects, or abuts a top member portion with a bottom member portion. As an example, a coupling member would include any intervening member such as a peripheral member or border that is sandwiched between a top member portion and a bottom member portion.

In certain particular instances, the coupling mechanism includes a clasping mechanism. Accordingly, the top and bottom member portions may include a clasping mechanism, which clasping mechanism is configured for coupling the top and bottom members together such as to form a liquid proof seal thereby. The clasping mechanism may be any suitable clasping mechanism, such as that described in corresponding U.S. patent application Ser. No. 13/272,156, hereby incorporated in its entirety by reference. For instance, the top and bottom member may include individual clasping members that are capable of interacting with one another in such a manner so as to couple the top and bottom member portions together, e.g., in a waterproof and/or shockproof manner. In such an instance, the top member portion may include a first clasping member, and the bottom member portion may include a second clasping member, wherein the first and second clasping members are configured for interacting with one another in such a manner so as to couple the top and bottom member portions together.

In certain embodiments, a third member, e.g., a locking element, may be provided and the top and bottom members may be configured for interacting with the third member, e.g., locking element, so as to couple the top and bottom members together in a waterproof seal. For example, a locking element may be provided as part of the clasping mechanism wherein the locking element is configured for assisting the clasping members of the top and bottom member portions to couple together and thereby function to lock the top and bottom member portions into place. In certain instances, as described below, the locking element may be one or more slide members, comb members, wedge members, bolt and nut members, ball and joint members, hinge members, external clasping and/or latching members, and/or the like. In certain instances, the third, e.g., locking, member may include one or more elements and/or may be employed in lieu of the first and second clasping members.

In certain instances, as indicated above, the top member portion may include a clasping member, e.g., a first clasping member, and the bottom member portion may include a corresponding clasping member, e.g., a second clasping member. In one instance, the corresponding clasping members of the top and bottom member portions are configured for interacting with one another in such a manner so as to securely couple the top and bottom member portions together so as to thereby form a secured liquidproof and/or shockproof housing. For instance, the clasping members of the top and bottom member may be configured for engaging one another in such a manner as to couple each other together and thereby produce a liquid and/or shockproof seal between the top and bottom members.

Hence, in various instances, a housing of the disclosure may include at least a top portion and a bottom portion which portions may form a top and a bottom member, wherein the top and bottom members may be two portions of the same member or separate individual members. One or both of the top and bottom members of the housing may include a front and a back surface member surrounded by a periphery or perimeter portion. In certain instances, however, a top or bottom member may simply include a periphery, e.g., a perimeter portion, wherein a front and back surface member of the top or bottom member is not included or provided separately as a distinct element of its own. In any instance, however, a perimeter portion is included. The periphery, e.g., perimeter portion, may be defined by a proximal and a distal end portion as well as opposing side portions. The peripheral portion may include a plurality of perimeter portions, such as an interior, middle, and/or an exterior perimeter portion, as described herein below.

Accordingly, in one aspect, a protective housing for an electronic device, such as an electronic device having a touch-sensitive display is provided. Such an electronic device may be a tablet computing device, such as: a tablet computer, mobile telephone, electronic reader, personal digital assistant, pager, electronic/digital camera, or the like. Where the housing is intended to house an electronic device having a touch-sensitive display, the touch-sensitive display may be a screen, such as an interactive touch-sensitive display screen, e.g., an interactive flat panel touch sensitive control display screen, for instance, a display screen having capacitive and/or tactile input capabilities, or the touch-sensitive display may be a holographic representation of a screen or a portion thereof, which representation is sensitive to touch or the appearance of touch.

The protective housing may at least include a top and bottom member portions, such as wherein at least the bottom member portion is configured to house, frame, hold, or otherwise contain at least a first portion of the electronic device, e.g., a bottom portion of the electronic device. The protective housing may additionally include a top member portion, which top member portion is configured to house, frame, hold or otherwise contain at least a second portion of the electronic device, e.g., a top portion of the electronic device, such as the portion of the electronic device having the touch-sensitive electronic display. It is to be understood that although the touch-sensitive display is described presently as being positioned on a top portion of the electronic device, the touch sensitive display may be included in a bottom portion of the electronic device, with the corresponding changes being made to the protective housing to accommodate such a configuration. Hence, the top and/or bottom member of the protective housing may have an inner edge to frame at least a portion of the touch-sensitive display, such as to allow touch access to the portion of the touch-sensitive display. Such touch access may be direct or indirect touch access unless the context dictates otherwise.

Where such a touch-sensitive display is provided as part of an electronic device, e.g., a tablet computing device, the peripheral portion of the top and/or bottom member (dependent upon where the touch-sensitive display interface(s) is positioned in or on the electronic device) of the housing may be configured for interfacing with the touch-sensitive display and/or edges of the electronic device to be housed. Hence, in certain embodiments, the peripheral portion of the top and/or bottom member may be configured in such a manner that a top and/or bottom member front and back surface member is not necessary. Rather, a portion of the touch-sensitive display of the electronic device, e.g., a screen portion, or other top or bottom portion of the electronic device, may serve the function of a top and/or bottom member front and back surface member and the top and/or bottom peripheral portion creates a liquidproof and/or shockproof seal therewith. Thus, a top or bottom member of the housing may be configured such that a peripheral portion thereof interfaces with the back surface and/or edges of the electronic device to be housed in such a manner that a top and/or bottom member front and back surface member is not necessary. Rather, a surface of the electronic device itself serves this function and the top and/or bottom peripheral portion creates a liquidproof and/or shockproof seal therewith and may further provides shockproof protection for the device.

The protective housing may additionally include one or more coupling mechanisms that is configured to couple the top member with the bottom member so as to house the first and second portions, e.g., bottom and top portions, of the electronic device. In various instances, the coupling mechanism functions to seal the top member with the bottom member, and may further function to seal the inner edge of the top or bottom member with a region proximate at least the portion of the touch-sensitive display (such as where a front and back surface member of a top or bottom member is not provided.

Accordingly, in certain instances, the coupling mechanism may include a first seal between a top member and a bottom member, which first seal may be configured to provide at least a first liquid and/or shock proof seal between the outer periphery of the top member and the bottom member such as when the top member is coupled with the bottom member. In various particular instances, the first seal is provided proximate an outer periphery of one or both the top member and the bottom member.

In certain instances, the coupling mechanism may include a second seal, for instance, between the inner edge of a top and/or bottom member and a region proximate at least a portion of the top or bottom of the electronic device to be housed, such as a portion containing a touch-sensitive display. For instance, such a second seal may be provided where the top and/or bottom member is configured as merely a frame surrounding a portion, such as a touch-sensitive display, of a top and/or bottom portion of an electronic device. In certain instances, this second seal may be configured to provide a second liquid and/or shock resistant seal, such as between the inner edge of the top and/or bottom member and the region proximate at least the portion of the top or bottom member containing a touch-sensitive display, when the top member is coupled with the bottom member. In such an instance, the protective housing may additionally include a flexible ridge, such as a wiper portion, that is proximate an inner edge of the top or bottom member, which wiper portion may function to interface with the top or bottom portion of the electronic device at the interior interface where the top and/or bottom member frame the electronic device in such a manner to prevent liquid or particulate matter from substantially intruding upon said interface.

In certain instances, the coupling mechanism may include one or more clasping mechanisms, such as a latching mechanism, which latching mechanism(s) may function to latch a portion of the top member with a portion of the bottom member when the top member is coupled with the bottom member. A suitable clasping mechanism may have any suitable configuration so long as it functions to facilitate the coupling of the top member portion with the bottom member portion of the housing. Accordingly, in various instances, the clasping mechanism may include one or a plurality of latching mechanisms that are configured for functioning independently by themselves or cooperatively in conjunction with one another so as to couple the top member with the bottom member.

A latching mechanism of the protective housing may be positioned anywhere along a top and/or bottom member of the housing so long as it is possible of performing its function of facilitating the coupling of a top member portion with a bottom member portion. In one embodiment, a first and a second latching mechanisms are provided, wherein the first latching mechanism is provided at a periphery, e.g., an outer periphery, of the bottom member; and a second latching mechanism is provided at a corresponding periphery, e.g., an outer periphery, of the top member. The first and second latching mechanisms may be configured to engage one another in a manner sufficient to clasp or latch or otherwise couple the top member with the bottom member when the top member is coupled with the bottom member.

For instance, the top and bottom members may include respective clasping members, e.g., first and second latching mechanisms, that extend along at least a portion of the perimeter of the top and/or bottom member, which clasping members are configured for interfacing with one another and/or an additional, e.g., third locking member, in such a manner so as to facilitate the coupling of the top and bottom members of the housing with one another thereby sealing the housing, such as in a liquidproof and/or shockproof seal. In certain embodiments, the clasping mechanism circumscribes the entire perimeter portion of the housing. In other embodiments, the clasping mechanism is positioned along a perimeter portion of the housing but does not circumscribe the entire perimeter portion.

In certain embodiments, the clasping mechanism is an entirely internal latching mechanism. By "entirely internal latching mechanism" is meant that the latching mechanism is entirely contained within the bounds that form an interior or cavity of the housing when the top and bottom members are coupled together so as to form the housing. In certain embodiments, the clasping mechanism is an entirely external latching mechanism. By "entirely external latching mechanism" is meant that the latching mechanism is positioned entirely on an exterior portion of the top and/or bottom member such that when the top and bottom members are coupled together so as to form the cavity of the housing into which the electronic device is fitted, the clasping mechanism is positioned exteriorly to the bounds that form the cavity of the housing. In certain embodiments, the clasping mechanism is a hybrid clasping mechanism that is partially internal and partially external to the bounds that form the cavity of the housing.

Accordingly, in certain instances, the peripheral portion may include one or more clasping mechanisms, such as internal, external, and/or hybrid latching mechanisms that are configured so as to secure the coupling and/or sealing of the top and bottom members together. The clasping mechanisms may be separate elements added on to the peripheral portion of the housing, e.g., where the clasping mechanism is an external latching mechanism; or may be an integral member therewith, e.g., where the clasping mechanism is an internal latching mechanism; or may include elements that are integral with the perimeter portion of the top and bottom members and include elements that are not integral therewith but added thereto to interact therewith, e.g., where the clasping mechanism is a hybrid clasping mechanism.

Hence, in certain embodiments, the clasping mechanism may include a plurality of latching mechanisms and may include one or more internal and/or one or more external and/or one or more hybrid latching mechanisms. For instance, in various embodiments, the housing may include a plurality of internal latching mechanisms and/or may include one or more external and/or hybrid latching mechanisms. For example, the housing may include a first entirely internal clasping mechanism, e.g., one that circumscribes a portion or an entire perimeter of the interior of the housing; and may include a second entirely internal clasping mechanism, e.g., a second internal clasping mechanism that circumscribes an additional portion or entire perimeter of the interior of the housing. A further, external or hybrid clasping mechanism may also be provided to more securely couple the top and bottom members together.

In other embodiments, only a single clasping mechanism is provided. For instance, in various embodiments, a single internal, external, or hybrid clasping mechanism may be provided. For instance, in certain embodiments, a single internal clasping mechanisms may be provided, wherein the clasping mechanism includes a plurality of latching mechanisms. The latching mechanisms are configured such that when the top and bottom members are coupled together a liquidproof seal is provided thereby which seal protects an encased device or components thereof from liquid, such as water. In some embodiments, an external locking element may also be included, which locking element interacts with the internal clasping mechanism to firmly lock the top and bottom members together.

As indicated above, the top and bottom members of the housing at least include a peripheral portion and may or may not include a front and a back surface member that is surrounded by the peripheral portion. The peripheral portion of the top and bottom member may include a plurality of perimeter portions, such as an interior, middle, and/or an exterior perimeter portion. The peripheral portion therefore may include a multiplicity of various features and perform a multiplicity of various functions. For instance, one or more of an interior, middle, and/or exterior perimeter portions may be included, one or more of which may be fabricated from the same or different materials and/or otherwise be configured for giving the distinct peripheral portions additional functionality. For example, the exterior perimeter portion may be configured in such a manner that it provides the top or bottom member with a soft outer edge with respect to a stiffer, more rigid middle perimeter portion. Further, the interior perimeter portion may be configured in such a manner that it provides the top or bottom member with a soft inner edge with respect to a stiffer, more rigid middle perimeter portion. As described in greater detail below, one or more of these softer edge perimeter portions may give the top or bottom member additional functionality, such as shockproof ability and/or liquidproofability.

One or more of the perimeter portions of a top or bottom member may include one or more further elements, such as portions of a clasping mechanism. For instance, where the perimeter portion includes a stiff, rigid member, e.g., surrounded by one or a plurality of softer, pliable interior and/or outer edge members, the stiff rigid member may be configured to include one or a plurality of latching mechanisms, which latching mechanisms collectively form the clasping mechanism(s) of the disclosure. A suitable latching mechanism may include one or a plurality of latching members. A latching member may have any suitable configuration so long as it is capable of interacting with one or more corresponding latching members on the opposing top or bottom member and thereby facilitating the coupling of the top and bottom members together, such as in a liquidproof and/or shockproof sealing.

For example, the protective housing may include a clasping mechanism positioned on the peripheral portion of the top and bottom member. The clasping mechanism may include a first and/or a second, and/or more latching mechanism that may be internal, external, or hybrid latching mechanisms. In certain instances, a latching mechanism is provided wherein the latching mechanism includes a plurality of latching members, such as a first and a second latching members. In various embodiments, a first latching member of the first latching mechanism may be positioned on a bottom member and a second latching member of the first latching mechanism may be positioned on a top member of the housing. The first and second latching members may be configured for engaging one another in a manner sufficient to couple the top and bottom members together thereby forming the housing. The latching members may be positioned at an interior or exterior portion of the peripheral member, such as at an interior, middle, or exterior perimeter portion, and may further form internal, external, or hybrid latching mechanisms.

Accordingly, in various embodiments, the housing includes a first clasping mechanism having a first internal latching mechanism wherein a first latching member of the first latching mechanism includes a first wall extending up from the outer peripheral portion of the bottom member. The extended first wall of the bottom member includes an outer face, e.g., a face abutting an exterior perimeter portion of the peripheral member, and an inner face, e.g., a face proximate to an interior portion of the peripheral member. The inner face of the first extended wall of the bottom member may include a first latching element, such as a catch, a ridge, a groove, a detent, an opening, an extended protrusion, a tab, a tooth, or the like that is configured for engaging a corresponding second latching element of a corresponding element of a top member of the housing. In one particular embodiment, the inner face includes a ridge or groove that protrudes inwardly along at least a portion of the inner face of the first wall of the bottom member.

The first latching mechanism additionally includes a second latching member wherein the second latching member includes a second wall extending down from the outer peripheral portion of the top member. The extended wall of the top member includes an outer face, e.g., a face proximate to an exterior perimeter portion of the peripheral member, and an inner face, e.g., a face proximate to an interior portion of the peripheral member. The inner face of the extended wall of the top member may include a first latching element, such as a catch, a ridge, a groove, a detent, an opening, an extend protrusion, a tab, a tooth, or the like. In one embodiment, the inner face includes a ridge or extended protrusion, e.g., a catch that protrudes outwardly along at least a portion of the inner face of the wall of the top member to engage with the first ridge or groove of the first latching member of the bottom member when the top member is latched with the bottom member.

In various instances, the protective housing includes an additional, e.g., a second latching mechanism, which second latching mechanism may be internal or external to the first latching mechanism. For instance, in certain embodiments, the second latching mechanism may include a second internal latching mechanism that is positioned near the first internal latching mechanism. The second internal latching mechanism may include a third latching member, such as on the bottom member, which may be positioned near the first latching member of the first internal latching mechanism; and the second internal latching mechanism may include a fourth latching member, such as on the top member, which may be positioned near the second latching member of the second latching mechanism, where the third and fourth latching members are configured to engage with one another so as to further latch the top member with the bottom member when the top member is coupled with the bottom member.

For instance, in one particular embodiment, the third latching member of the second latching mechanism includes a second wall extending up from an outer peripheral portion of the bottom member and distanced from the first extended wall of the outer peripheral portion of the bottom member. The second wall is spaced apart from the first wall so as to form a first channel along at least a portion of the peripheral portion of the bottom member. The extended second wall of the bottom member includes an outer face, e.g., the face closest to but spaced apart from the interior face of the first wall, and an inner face, e.g., a face proximate to an interior portion of the housing. The second extended wall of the bottom member may also include a latching element, such as a catch, a ridge, a groove, a detent, an opening, an extended protrusion, a tab, a tooth, or the like that is configured for engaging a corresponding latching element of a corresponding element of a top member of the housing. In one particular embodiment, the third latching member includes a plurality of detents or apertures spaced apart in the second wall. The fourth latching member may also include a latching element, such as a catch, a ridge, a groove, a detent, an opening, an extended protrusion, a tab, a tooth, or the like that is configured for engaging a corresponding latching element of a corresponding element of the bottom member of the housing. In this embodiment, fourth latching member may include a plurality of tabs or teeth that protrude from the inward face of the second wall extending down from the periphery of the top member. Each of the plurality of tabs or teeth are configured to engage with corresponding detents or apertures of the plurality of detents of the third latching mechanism when the top member is coupled and latched with the bottom member.

In various instances, one or both of the top and bottom members may include a channel, such as a channel that extends along either the entire or a portion of the peripheral portion of the top and/or bottom member. If included, a channel running along a peripheral portion of a top or bottom member may include an interior perimeter portion, e.g., an interior bounding member, and an exterior perimeter portion, e.g., an exterior bounding member, which bounding members at least partially define the bounds of the channel. The channel may further be configured to include a sealing member, such as a gasket member or O-ring or the like. In various instances, the function of the channel is to house a sealing member. However, in some instances, a channel is not included. Rather, a sealing member, such as a gasket, is coupled or integrally molded directly with the top or bottom member. Hence, a peripheral portion of a top or bottom member may additionally include a sealing member, or other suitable gasket or foam sealing member, such as an O-ring or other form in place gasket, such that when the top member is coupled to the bottom member a liquidproof and/or dust proof seal is formed. The sealing member, e.g., gasket member, may circumscribe the entire perimeter or a portion thereof. In certain instances, it is particularly useful to have the gasket circumscribe the entire perimeter portion of the top or bottom member.

Accordingly, in various instances, a protective housing of the disclosure may include a first gasket, such as a gasket disposed in a first channel such as a channel that is formed from the extended first and second walls of the bottom member. The gasket may be positioned so as to abut the first wall that extends down from the periphery of the top member when the top member is latched with the bottom member. The first gasket may be configured so as to provide a first water resistant seal between the top member and the bottom member when the top member is coupled with the bottom member.

In various other instances, the protective housing may additionally be configured to include a second gasket, which gasket may be coupled to the housing in any suitable manner. For instance, the housing, such as a top member of the housing may be configured to include a second channel, which second channel may be adapted to include the second gasket. For example, a top member of the protective housing may be adapted to include a second channel, such as a channel that is positioned proximate an inner edge of the peripheral portion. The second gasket in the second channel may function to provide a second seal for the housing. The second gasket may be disposed in the second channel in such a manner so as to abut a region proximate at least a portion of a touch-sensitive display when the top member is coupled with the bottom member around an electronic device having a touch-sensitive display. Like the first gasket, the second gasket may be adapted to provide a second liquid and/or dust resistant seal between the top member and the bottom member when the top member is coupled with the bottom member.

It is to be understood that although the clasping mechanism of the coupling mechanism has been described with respect to various particular embodiments, said embodiments are exemplary and not meant to be critically limiting. Accordingly, in various instances, the clasping mechanism includes one or more of a bolt, a screw, a nut, a ratchet, a snap, a button, a ball-and-socket connector, a ridge, a protrusion, a detent, a concave region, a convex region, a groove, an opening, an aperture, a hole, a tab, a tooth, a tang, a mushroom snap, or the like or a combination of the same. Hence, in various particular instances, a suitable clasping mechanism may include a ledge member, a catch, a groove, a tooth, an aperture, a snap-tooth member, a snap tooth receiving member, an interdigitated member, a wedge, and the like. More particularly, where a top or a bottom member includes a tab, a tooth, or a snap-tooth member, for instance, the opposing member may include a detent, an aperture, an opening, a snap-tooth receiving member, and where the top and bottom members include interdigitating members, these members may be configured for interdigitating with one another and may further be configured for being locked in place by a suitable locking element, such as a wedge member.

Hence, in various instances, the corresponding latching members of the top and bottom members may be configured for engaging a third member, e.g., a locking element, which locking element functions to further lock the coupled top and bottom members together. In one embodiment, the clasping members of the top and bottom member are capable of interlocking with one another and the third locking element further engages these clasping members to more firmly lock them in place; and in another embodiment, the clasping members of the top and bottom member are configured for being interdigitated with one another and the locking member is configured for being inserted between the interdigitations of the top and bottom members to thereby firmly lock the top and bottom members securely into place.

As indicated above, in various embodiments, a top or bottom member may or may not include a top and/or bottom surface member. For instance, in some instances, the top and/or bottom member need not include a surface member that spans from one side of the peripheral portion to the other. Rather, the peripheral perimeter portions are specifically configured to engage the various surfaces of the device to be housed in such a manner that by such engagement with the peripheral perimeter portions the underlying device is made liquidproof and/or shockproof.

In such instances, a top and/or bottom surface member is not required as the peripheral portion may be configured for interfacing with the device itself to generate a liquidproof and/or shockproof seal, albeit, a top and/or bottom surface member may be included if desired. Accordingly, in various embodiments, a top and/or bottom surface member is not provided in conjunction with a top and/or bottom member, rather a sole peripheral portion(s) is provided.

For example, in one particular embodiment, a housing is provided wherein the housing includes a top member portion and a bottom member portion wherein the bottom member portion may include a peripheral portion or inner edge that is configured to frame at least a portion of a back surface of an electronic device to be housed opposite a touch-sensitive display of the device so to allow touch access to the back surface. In such an instance, the coupling mechanism may be configured to seal the inner edge of the bottom member with a region proximate at least the portion of the back surface of the electronic device. Such a configuration is useful, such as where a back portion of an electronic device includes a touch feature, such as a touch-sensitive display. In such an instance, the coupling mechanism may be configured to include an additional seal between the inner edge of the bottom member and the region proximate at least the portion of the back surface of the electronic device. It is to be noted that although the forgoing was described with respect to a bottom member of the housing, the same is equally applicable with respect to a top member of the housing as herein described throughout the disclosure.

In other various embodiments, one or more top and/or bottom surface members are provided in conjunction with a top and/or bottom peripheral portion. For instance, in various embodiments, one or both of the top and bottom members may include front and back surface members spanning from one side of the peripheral portion to the other, left to right and/or proximal to distal. In such an instance, the front and back surface member of the top and/or bottom member of the housing may be fabricated from any suitable material and may be co-extensive with the perimeter portion or adjoined or otherwise attached therewith, as described in greater detail herein below.

For example, in one particular embodiment, the top member may include a front and back surface member that is comprised of a transparent membrane that is separate from the peripheral portion but capable of being coupled therewith, and/or the bottom member may include a front and back surface member that is comprised of a clear or opaque polycarbonate or nylon screen that may be separate from the peripheral portion but capable of being coupled therewith or it may be of one unit such that the same member that forms the front and back surface member also forms at least a portion of the peripheral member. Hence, a top and/or bottom front and back surface member may be fabricated from the same materials and may therefore be co-extensive with one or more portions of the perimeter portion. Of course, the front and back surface member of the bottom and/or top member may be made from a different material than the perimeter portions with which it is adjoined.

Where a top and/or bottom member includes a front and back surface member, e.g., spanning from one portion of the peripheral portion to the other, the top or bottom member may include a membrane, such as a membrane that is configured for interfacing with a touch sensitive interactive display, e.g., a touch screen, of an housed device in such a manner that when a user touches the membrane one or more characteristics of that touch are transferred to the touch-sensitive display of the underlying device, and in this manner a user is able to manipulate the screen of the housed device. Obviously, where a front and back surface member is not included, the user would be interacting directly with the touch-sensitive display of the underlying device or an attached cover thereof.

Accordingly, as described herein below, one or more membranes or portions thereof may be included herein as part of the front and/or back surface of the top or bottom member, or a front and/or back surface need not be provided as apart of the top and/or bottom member. If a front and back surface member, such as a membrane, is included as part of a top or bottom member, the membrane should be configured for interfacing with a perimeter portion of the peripheral member. In such an instance, the membrane portion may be configured so as to be coupled with the perimeter portion, such as an inner and/or outer perimeter portion, of the top or bottom member in such a manner as to maintain a liquidproof and/or shockproof and/or dirtproof seal therewith.

For instance, the peripheral portion of a top and/or bottom member, such as a peripheral portion of a top member, may include a plurality of sub-portions, such as a first sub-portion, e.g., an interior perimeter portion, that includes an interior membrane interfacing portion, and a second sub-portion, e.g., an exterior perimeter portion, that includes an exterior membrane interfacing portion, which one or more interfacing portions may be configured for interfacing with a front and/or back surface of a perimeter portion of the membrane.

Accordingly, in certain embodiments, where a front and back surface member, e.g., a membrane, is provided, the membrane may be configured such that it spans from one side of the perimeter, e.g., of a top or bottom member, to another side of the perimeter in such a manner that the back surface of the membrane associates with at least the interior membrane interfacing portion of the interior perimeter portion, and the front surface of the membrane associates with the exterior membrane interfacing portion of the outer perimeter portion. Of course, where the front and back surface member is made of the same material as at least a portion of the perimeter portion, such as with respect to a bottom member, the front and back surface member may be coextensive with the perimeter portion and therefore form a single, solitary unit.

Hence, in various embodiments, included with a peripheral portion of a top or bottom member peripheral portion of the protective housing is a removable front and back surface member. For instance, in certain embodiments, a front and back surface member is provided wherein the front and back surface member is configured for removably associating with an associated peripheral member. It is to be noted, that where the peripheral member is configured for producing a liquid-proof and/or shockproof and/or dirtproof seal in association with another peripheral member or the device itself, the inclusion or exclusion of the front and back surface member does not affect the patency of the liquidproof and/or shockproof and/or dirtproof seal of the associated peripheral member.

In one embodiment, a front and back surface member is provided, such as to be removably associated with a peripheral portion, such as a top member peripheral portion, wherein the front and back surface member is configured as a removable membrane. It is understood that although the membrane is described as being capable of removable association with the peripheral portion, in certain instances, the membrane may be configured for fixed association with one or more portions of the peripheral portion, such as through overmoulding therewith.

Where a membrane is provided, such as for association with a top member, the membrane may be adapted for fixed placement on or at least adjacent to at least a portion of the touch-sensitive display. In such an instance the membrane may extend over the region proximate at least a portion of the touch sensitive display to associate with and in certain instances seal against the inner edge, e.g., interior perimeter portion, of the top member when the top member is coupled with the bottom member. Accordingly, in certain instances, a removable membrane for fixed placement on a region of the electronic device is provided wherein the removable membrane is adapted to be framed and sealed by the top member and/or the bottom member such as when the top member is coupled with the bottom member. In various instances, the membrane may be at least partially translucent and may include one or more indicia printed on a surface of the removable membrane, such as for alignment purposes.

Where a membrane is included the membrane may have one or more features, such as additional membrane features, for instance, an acoustic membrane feature and/or a home button feature. For example, the membrane may include an acoustic membrane feature, which acoustic membrane feature may include an aperture spanning from the front to the back surface of the membrane. The aperture may be covered by a second membrane, such as an acoustically transmissive membrane that is offset from the first membrane. The acoustic membrane may be permeable to sound but impermeable to liquid, such as water, and/or dust, and dirt, and the like, and it may be offset from the first membrane by any suitable element, such as by the addition of a spacer member or an adhesive layer. Accordingly, the two or more membranes may be attached to one another via a suitable adhesive.

The front and back surface membrane may additionally include a button feature. The button feature may include an indented region. The indented region may simply be an indented region in the first membrane or it may be a cut-out region that has been overlaid with an additional material, such as an additional membrane. In various instances, the indented region is at least partially circumscribed by a ridge region. For instance, in one embodiment, the perimeter portion of the button feature may include a raised deformable perimeter portion that surrounds the indented region. The raised deformable perimeter portion may be configured so as to allow a measure of travel for the indented region of the button feature such that when the indented region is depressed the raised portion is deformed thereby allowing the indented region to travel without causing significant stretching of the first membrane.

Hence, in certain instances, the protective housing includes a removable membrane wherein the membrane includes at least one button region formed of a depression provided on a top surface of the removable membrane and positioned to correspond with a position of a button on a housed electronic device. In other instances, the removable membrane may include a protrusion provided on a surface of the removable membrane, the protrusion region being positioned to correspond with a position of a button on the electronic device.

The first membrane may also include one or more optically opaque regions and/or optically transmissive regions, such as an optically transmissive region coincident with a proximity sensor or camera, e.g., video camera, portion of an underlying device meant to be housed by the housing. Additionally, as described below with respect to the bottom member, a top member front and back surface member may include a lens feature, such as a camera or video or flash lens feature.

Accordingly, in an additional embodiment, the bottom member may include a front and back surface member that includes one or more additional features. For instance, where the bottom member includes a bottom front and back surface member, the surface member may include a lens feature, such as a feature that includes one or more lenses, for instance, a camera lens and/or a flash lens feature. The lens feature may additionally include an optical skirt, such as a skirt that surrounds the one or more lenses and prevents the transmission of light there through from one lens region to the other lens region. The lens feature may be coextensive with the back surface member or may be adjoined thereto such as through pressing, moulding, and the like.

As described above, in various instances, a top and bottom member peripheral portion is provided. The top and bottom member peripheral portions may from a frame that circumscribes at least a portion of an electronic device and may be configured for interfacing with the electronic device and/or one another so as to form a liquidproof and/or shockproof and/or dirtproof seal therewith. In various instances, a front and back surface member may be associated with either or both of the top and bottom peripheral member, such as in a removable or fixed association. For instance, in certain embodiments, a front and back surface member may be an independent unit, such as a membrane, that is configured for being removably coupled with the peripheral portion and/or device to be housed, such as where the top member is simply a peripheral frame that frames the electronic device; and in certain embodiments, the front and back surface member may be an integral unit with the peripheral portion, such as where the front and back surface, e.g., of a bottom member, is fabricated in conjunction with and/or from the same material as the peripheral portion, for example, where the front and back surface form a single unit into which a surface, e.g., a bottom surface, of the electronic device is fitted. Hence, a top or bottom member may be fabricated as a rigid frame member that includes one or both of a front and back surface member and/or a perimeter portion.

Accordingly, in various embodiments, a perimeter portion of the top or bottom member is provided either simply as an independent peripheral portion or a peripheral portion in conjunction with a front and back surface member, wherein the peripheral portion includes a plurality of perimeter portions. For instance, the peripheral portion may include a central perimeter portion, e.g., composed of one material, that is surrounded by an interior and/or exterior perimeter portion, wherein the interior and/or exterior perimeter portions may be composed of the same material or different materials and/or may serve the same or different functions as the middle perimeter portion. For example, in certain instances, the middle perimeter portion may be composed of a rigid or semi-rigid frame material, such as a material that is coextensive with a corresponding front and back surface member, and an interior and/or exterior perimeter portion may be coupled therewith, such as where a flexible interior and/or exterior perimeter portions are to the more rigid middle perimeter portion. In such an instance, the more flexible perimeter portions may be configured for providing shock absorbance to the housing as a whole, e.g., both interiorly and exteriorly, and/or the more rigid middle perimeter portion may be configured for providing a firm, rigid or semi-rigid backbone and structure to the top or bottom member.

In a further instance, a peripheral portion, such as a distal end portion, may include a latch feature, for instance, a latch feature for enclosing an opening, such as a port opening. The latch feature may include corresponding lower latch interfaces, a latch, and corresponding upper latch interfaces, such that the latch is configured for moving from a closed position surrounding an opening, wherein the latch is in contact with both the lower and upper latch interfaces, to an open position, wherein the latch is in contact with only one of the lower or upper latch interfaces and the opening is exposed. In certain instances, that latch feature may be positioned entirely on a top or bottom member, and in other instances, portions of the latch feature are included on both top and bottom members. In various embodiments, the latch feature is liquid-proof and/or dust-proof and may include a gasket so as to provide a liquid and/or dust proof seal when the latch is in the closed position. In certain embodiments, the latch cover itself includes an opening that itself includes a separate, independent latch cover and/or gasket.

In another instance, the perimeter portion, such as a distal or proximal end portion, may include one or more acoustic vent features for transmitting and/or channeling sound. For instance, an acoustic vent feature may include a sound channel having a liquidproof but sound permeable acoustic vent material positioned therein. The acoustic vent material may span the sound channel at an angle from 0 to 180 degrees in a forward or reverse direction. The sound channel may extend from an exterior portion of the peripheral member to an interior portion of the peripheral member so as to permit the ingress and egress of sound therethrough but substantially prevent the transmission of liquid, such as water there through. The acoustic vent material may transect the sound channel, e.g., at an angle with respect to a centerline therethrough, so as to prevent the ingress (or egress) of water therethrough.

In one instance, the peripheral portion, such as one of the opposing side portions, may include a button, toggle, or switch feature for engaging a corresponding button, toggle, or switch mechanism of a housed device. The switch feature may include a switch housing(s) and one or more actuators having switch interface(s). The switch feature may additionally include one or more rotating members configured for being coupled to the switch housing(s) and/or the switch interface and adapted for converting rotation motion into lateral motion thereby actuating a corresponding switch of a housed device, such as a view orientation switch of a housed device. The switch feature may be configured such that as an actuator moves, such as rotates about a centerline, from a first position to a second position within the switch housing, the switch interface causes the switch of a housed device to move, e.g., laterally, from a first to a second position, such as from an "on" to an "off" position, or from one "orientation" to another "orientation".

Additionally, the perimeter portion may include one or more other switch or button or toggle features, such as one or more volume control buttons. Such button-like features may have any suitable configuration so long as the button-like feature is capable of interfacing with one or more buttons present on an underlying housed device. For instance, a representative button feature may have a two part configuration, such as a perimeter portion user interface, and an interior portion button or switch interface. For example, such a button switch feature could be included so as to manipulate the sound emitted from an encased device. Where included as part of a peripheral portion, a perimeter portion of the top or bottom member, such as a rigid or semi-rigid frame perimeter member, may have an opening into which a switch or button feature is positioned, and the frame member and/or corresponding switch or button components may then be covered by additional perimeter portions, such as covered by more flexible interior and/or exterior perimeter portions in a substantially liquid and/or shockproof manner.

In another embodiment, an outer perimeter portion of the peripheral member may include a slot feature, such as a tool or coin slot feature, for assisting in separating the top member of the housing from the bottom member of the housing. The slot feature may include an indented or cut out portion of the peripheral portion. The cut out portion may be positioned in one or both of the top and bottom members at one or a plurality of locations. Accordingly, the cut out portion may be positioned on a top and/or bottom portion and may further be bounded by one or a plurality of overhang regions, which overhang region may be positioned in one or both of the top and bottom members thereby bounding the cut out portion. For instance, in one embodiment, the top member includes the cutout portion, and both the top and bottom member include corresponding overhang portions.

In a further embodiment, the peripheral portion or a front and back surface member may include a noise cancelling feature for assisting in the cancelling of ambient noise. The noise cancelling feature may include one or more of an aperture, e.g., positioned in one or both of the top and bottom member, an acoustic membrane, and/or a sound guide channel. The sound guide channel may traverse from the exterior of the housing to the interior of the housing and may be configured for directing sound from the aperture toward a noise cancelling feature, such as a microphone, present on a housed electronic device. The sound channel may be intersected by an acoustic membrane feature, which acoustic membrane may be positioned so as to intersect the sound guide channel at an angle with respect to a centerline therethrough. In certain embodiments, the acoustic membrane is transmissive for gas, e.g., sound waves, but not substantially permeable to liquid, dirt, dust, and the like.

In one embodiment, a perimeter portion of a front and back surface portion may include an additional sound transmission portion. The sound transmission portion may have any suitable configuration so long as it is capable of allowing sound to pass through the bounds of the housing, such as from an interior to an exterior of the housing (or vice versa), but not allowing liquid, such as water, or dust or dirt, to substantially pass therethrough. For instance, the sound transmission portion may include one or more apertures, which apertures pass through the peripheral or surface portion from the interior to the exterior of the housing. The one or more apertures may further include a sound transmissive membrane, such as a Gore-Tex™ membrane, which membrane covers the aperture thereby allowing sound to pass through but not liquid or dirt or dust, and the like. The sound transmissive, liquid impermeable membrane may be attached to the housing component in any suitable manner, such as via adhesive, molding, overmoulding, and the like. If desired, the sound transmission portion may additionally include a sound, e.g., echo, blocking member that surrounds at least a portion of the sound transmission portion thereby isolating the sound transmission portion positioned within the interior of the housing from the remainder of the interior of the housing. Such a blocking member may be a separate member, such as a gasket, that is coupled to the housing or it may be formed integral with the housing so as to surround at least a portion of the aperture and prevent the internal transmission of sound. Where the echo blocking element is a separate member, such as a gasket, to be added to the housing so as to circumscribe the sound inlet/outlet feature, the housing component to which the gasket is to be added may include a preformed member, such as a gasket seat, that is configured for accommodating and/or facilitating the functioning of the echo blocking member.

In an additional embodiment, the peripheral portion may include a port feature such as a headphone port feature, for instance, for receiving either a jack (such as a jack of a headphone or speaker assembly) or a closure device or the like. The port feature may include an aperture positioned in one or both of the top and/or bottom members. The aperture extends from the exterior of the housing to the interior of the housing. The aperture may be bounded by one or both of a gasket, such as an o-ring, and a threaded or cammed region, which threaded or cammed region may be configured for receiving a corresponding threaded or cammed region present on either the jack or the closure device to be inserted therein. The threaded region may be configured as a typical thread feature or may be configured as a cam feature, plug, or the like. In various embodiments, such a port and closure feature may be positioned on one or more latch door features, as described above, so as to allow access to an underlying sound port that is covered by a latch door (as described above).

Accordingly, in certain embodiments, a protective housing of the disclosure includes one or more electrical interconnection ports, such as a charge port, headphone port, usb port, sim port, disk drive port, memory card port, and the like. In various the one or more electrical interconnection ports includes a sealing member, such as a plug, a bung, a latch door, a latch door that itself has an aperture that is closable via another sealing member, etc. In particular instances, the sealing member includes a water-resistant feature like a gasket, such as an O-ring, so as to provide a liquid resistant sealing of the electrical interconnection port.

Accordingly, in one embodiment, the housing includes an electrical interconnection ports that is configured as a data and charge port, wherein the sealing member includes a latching door. For instance, the data and charge port may be through a top member, and the latching door may be coupled to the bottom member, such as by a pivot, and may be configured to latch over and seal, e.g., via an attached gasket, the data and charge port. In another embodiment, the one or more electrical interconnection ports may include a threaded earphone jack aperture, and a sealing member that includes a threaded bung to occupy and seal the threaded earphone jack aperture. In various embodiments, the one or more electrical interconnection ports may sealable by one of a number of sealing members that may include one or more of: a latching door, a plug, a screw with a gasket, a bayonet, a sliding door, and a latching door with a sealable aperture, and the like.

In various instances, a top or a bottom member may include one or more external accessory ports configured for allowing one or more external accessories to be coupled to the housing, such as for ease of using, carrying, and/or mounting the housing. The accessory port may be one or more openings positioned in or attached to a top or bottom member. In certain instances, an accessory port includes two corresponding openings in a top or bottom member, wherein the openings are aligned relative to one another such that a central line intersecting each opening intersects. Hence, the various lumens of the openings may be configured for form an "L" shape. In a manner such as this an accessory adapter may be positioned in the accessory and via the adapter the housing may be coupled to one or more accessories. For example, the accessory port adapter may include two elements an accessory slide element and an accessory locking element, where the accessory slide element includes a locking interface that is configured for being inserted into one of the lumens of one of the openings of the accessory port and adapted for engaging a corresponding locking interface of the accessory locking element as it is inserted into the lumen of the other accessory port opening, thereby locking the accessory slide element in place. In such an instance, the accessory slide element may also include an accessory connection interface that is adapted for interfacing with a portion of an accessory so as to couple the accessory to the housing. The accessory to be coupled or otherwise attached to the housing may be any suitable accessory such as a belt clip, hand mount, leg mount, hand strap, arm strap, should strap, arm mount, bike mount, car mount, floatie, portrait view mount, landscape view mount, etc. Accordingly, in certain embodiments, a top or bottom member may include one or more, e.g., two, three, four, five, or more external accessory physical interconnections that may be positioned on an outer surface of the top or bottom member for connecting the housing with an external accessory.

Additionally, in certain embodiments, a top or bottom member may include a sound transmission aperture that is overlayed with a grille feature. For instance, a member of the housing may include a speaker aperture that allows access from the inside of the housing to the outside of the housing so as to allow sound from a speaker portion of a housed device to pass through the bounds of the housing. The speaker grille may be configured as horizontal and/or vertical bars or a plurality of smaller openings such as in the shape of circles or squares or the like. The speaker sound transmission port may additionally include a sound passable but liquid-impermeable membrane, such as a membrane that overlays the speaker grille, allowing the transmission of sound but not the substantial transmission of liquid, such as water, and/or dirt and/or dust, and the like.

In certain embodiments, a top or a bottom member may include a lens feature, such as a feature that at least includes a camera lens and may include a flash feature. For instance, a camera lens feature having a camera lens may be provided in a top member and/or bottom member of the housing. The camera lens feature may include a lens skirt that at least partially surrounds a lens, e.g., an optical grade camera lens, of the housing, so as to substantially prevent interfering light, e.g., from a flash feature, from impinging on or through the camera lens, e.g., via the internal or external transmission of light. The optical skirt may be positioned around the camera lens, a flash feature or both.

In certain embodiments, a top or bottom member of the housing may include one or more positioning and/or securing elements that may function to position and/or secure the electronic device within the housing, especially with respect to a top and/or a bottom member. For instance, in one embodiment, a top or a bottom member may include one or more internal protrusions, such as teeth, extending inward from an inner surface of the top or bottom member, e.g., an interior perimeter portion, wherein the one or more teeth are adapted to receive and/or position and/or secure the electronic device relative to the top and/or bottom member.

Additionally, in certain embodiments, the housing of the disclosure may include one or more sealed actuators, switches, buttons, or toggles to operate a corresponding one or more corresponding elements of a housed electronic device. In various embodiments, the housing includes an actuator wherein the actuator is configured for operating a corresponding linear switch of a housed electronic device. In various instances, the actuator is configured for rotating from a first to a second position and is adapted such that by said rotation a linear switch of a housed device is actuated from a first to a second position. In certain embodiments, the switch of the housed device is a silence switch, an orientation switch, a control switch or know, a volume switch or knob, and the like.

In one aspect, a housing of the disclosure is a substantially liquidproof and/or shockproof housing, wherein the housing includes a top member portion, a bottom member portion and a coupling mechanism configured for coupling the two portions together so as to form the housing. In certain instances, the top member comprises an outer peripheral portion that bounds and thereby frames a touch-sensitive display of an electronic device, wherein a front and back surface member spanning the interior bounds of the peripheral portion is not included. Rather, a liquidproof seal is generated by the peripheral portion's interaction with the housed device, such as a front and back surface member, e.g., top member membrane, is not included. In such an instance, it may be useful to include a test element or simulant that can act as a sealing member for the top member that may be used in conjunction with the housing such as to test the liquidproofability of the housing when the electronic device is not housed within the housing.

Accordingly, in one aspect the disclosure is directed to a simulant for use in establishing a liquidproof seal with a top or a bottom member of a housing, such as a top and/or bottom member of a housing as described herein when the housing is assembled with the simulant. Hence, in certain instances, a system and/or kit is provided wherein the system and/or kit includes a simulant and a housing wherein the simulant is to be coupled to the housing so as to make the housing liquidproof when the simulant is coupled to the housing, such as where the housing contains a portion that absent the simulant would allow the ingress of water into the housing. In such a manner as this a housing for an electronic device, such as a housing as described herein, may be tested to determine the liquidproofability of the housing in the absence of an electronic device being housed within the housing. Such a simulant is useful at least in this context because as described above the top member in various instances of the present housing does not include a front and back surface, rather the interior portion bounded by the peripheral member is open. However, the top member is configured for producing a liquidproof seal when the top member is coupled to the electronic device and/or further coupled to the bottom member of the housing. Nevertheless, it is useful to test the liquidproofability of this seal when the electronic device is not present so as to not put the electronic device at risk during the testing process. In such an instance, the simulant or mule as herein described is useful for performing this function.

Hence, in certain embodiments, an electronic device simulant or mule having a plurality of dimensions, such as sealing dimensions, corresponding with the dimensions of a top member and/or an electronic device is provided. In various instances, the simulant functions to simulate at least the sealing if not the entire electronic device being housed and thereby sealed by the top member and the bottom member such as when the top member is coupled with the bottom member.

As described herein, in various instances, a top or bottom member does not include a front and back surface member. Rather, a peripheral portion is included wherein the peripheral portion is specifically adapted so as to interact with a surface, such as an edge surface, such as an edge surface proximate a touch-sensitive display, of the electronic device in such a manner as to generate a substantially liquidproof seal therewith. In such instances, a mule, as herein described is useful for testing the sealability of the front and back surfaceless member when the top or bottom member is coupled to the corresponding member and/or mule when the electronic device is not included. Additionally, in various instances, it may be useful to include an independent corresponding front and back surface that may be positioned between the surfaceless top or bottom member and the electronic device, such as at an interface where a surface, e.g., a top or bottom edge surface, of the electronic device contacts the relevant top or bottom member. Such a stand alone membrane for use in conjunction with a front and back surfaceless peripheral portion of a top or bottom member and/or an electronic device may be useful for increased protection of a top or bottom surface of an electronic device, such as a surface containing a touch-sensitive display, when the device is housed within the open-faced housing.

Accordingly, in an additional aspect a membrane is provided wherein the membrane is configured for being removably coupled to one or both of a top or bottom member or an electronic device. In such an instance, the membrane may be configured as a front or back screen membrane. For instance, in certain embodiments, the removable membrane is adapted for fixed placement on at least the portion of a touch-sensitive display of a housed device. In such an instance, the removable membrane may extend over a region proximate at least the portion of the touch sensitive display and may further function to seal against an inner edge of the top or bottom member such as when the top member is coupled with the bottom member. As described above, such a removable membrane may include: at least one button region, such as a region formed of a depression provided on a top surface of the removable membrane and positioned to correspond with a position of a button on the electronic device; and/or a protrusion provided on a surface of the removable membrane, wherein the protrusion region is positioned to correspond with a position of a button on the electronic device. In various instances, the membrane may be fully or partially transparent and/or opaque. For example, in certain instances, the removable membrane may include one or more indicia that may be formed or printed or adhered or otherwise associated on a surface of the removable membrane. In one embodiment, the removable membrane is adapted for fixed placement on a region of the electronic device so as to be framed and sealed by the top member and/or the bottom member when the top member is coupled with the bottom member.

The details of one or more variations of the subject matter described herein are set forth in the accompanying drawings and the following description.

BRIEF DESCRIPTION OF THE DRAWINGS

These and other aspects will now be described in detail with reference to the appended drawings. Like reference symbols in the various drawings indicate like elements.

FIGS. 5A-D provide perspective views of the top front portion of a protective housing of the disclosure.

FIGS. 7A-E provide perspective views of the protective housing showing various accessory and control features.

FIGS. 8A-B provide perspective views showing various clasping mechanisms of the protective housing.

FIGS. 10A-F provide perspective views of the front portion of the protective housing, including a latch feature and various accessory and control features.

FIGS. 12A-C provide perspective views of the protective housing, including accessory ports.

FIGS. 13A-E provide perspective views of a test simulant, e.g., a mule for use in water testing a housing of the disclosure.

FIGS. 14A-I provide exploded perspective views of the protective housing and its clasping mechanisms.

FIGS. 15A-D provide perspective views of the protective housing.

FIGS. 15G-K provides perspective views of an alternate wedge-locking version of the top member of the protective housing.

FIGS. 15L-Q provide perspective and side cutaway views of a charge port door and button feature of the protective housing.

FIGS. 16A-D provide perspective views of the protective housing, with and without an enclosed device.

FIGS. 21A-C provide perspective views of the noise cancelling feature on the distal end of the protective housing.

FIGS. 23A-B provide close up elevational views of the lens feature and optical skirt of the protective housing.

DETAILED DESCRIPTION

Figure 1A:
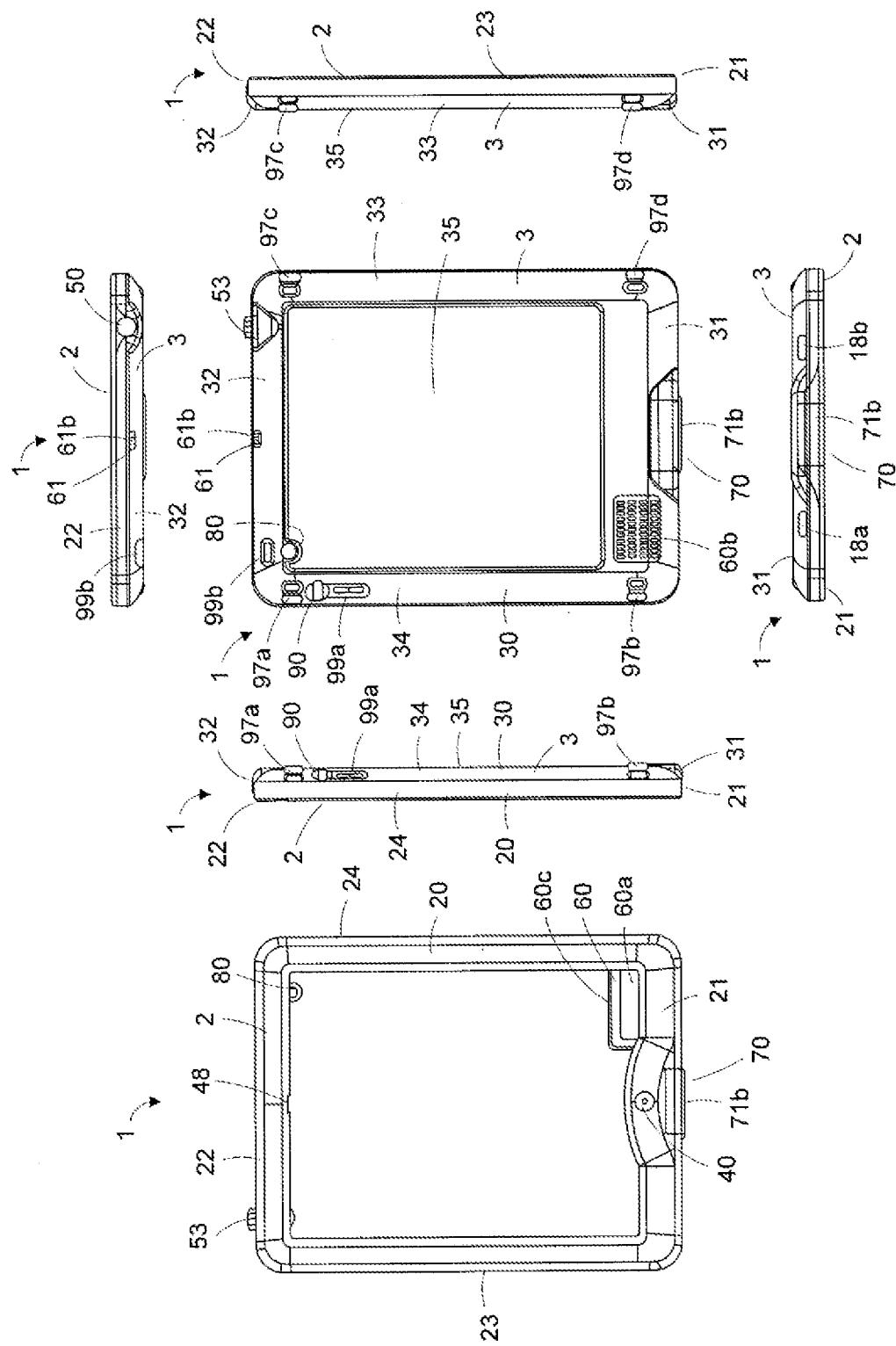
FIGS. 1A-D provide various perspective views of the front, back, and side surfaces of a protective housing of the disclosure.

The subject matter described herein relates generally to a housing for housing an object. It is to be understood that although the singular "object" is used herein, the term encompasses one or more objects. The object or objects may be any object that is capable of being fit within the housing and/or in need of protecting from one or more adverse environmental conditions, inclement weather, mishandling and/or damage, such as damage from contacting a liquid, such as water. The housing may be of any appropriate size and dimension so long as it is capable of housing the object and protecting it, for instance, from adverse environmental conditions and/or rough treatment. The object may be a single object, like an electronic device, or may be a plurality of objects, such as components that make up an electronic device.

In various embodiments, the object may be an electronic device, such as a computer, for instance, a mobile tablet computing device, such as a tablet computer, mobile telephone, an electronic reader, personal digital assistant, or other electronic device such as a digital camera, pager, and the like. In particular embodiments, as described in detail herein below, the object is a mobile tablet computing device, such as a tablet computer, mobile telephone device, or digital reader. It is to be understood that although the following is described with respect to a particular embodiment, e.g., where the object is a tablet computing device, this is for exemplary purposes only as the object to be encased may be any suitable object capable of being encased within a housing, such as any mobile electronic device, e.g., scanner, reader, video game, and the like.

Accordingly, the housing may be in the form of any typical container known and used in the art for containing the particular object. For example, the container can be a housing configured for opening and closing around the object, such as around a mobile tablet computer, mobile phone with computing functionalities, digital assistant, camera, gaming device, and the like, and thereby providing liquid and shockproof protection therefore. So being, the housing may form any suitable container meant to contain particular object and prevent it from being damaged due to environmental factors and/or mishandling.

In certain embodiments, the housing may form case configured for at least partially encasing a device, such as an electronic device, for example, a mobile tablet computer, mobile telephone, and/or electronic reader device, etc. In other instances, the housing is part of a device, such as an electronic device, which housing encases various components of the electronic device. For example, the housing may be the housing of a mobile tablet computer or telephone or reader device, or other electronic device, that encases the electronic components of the mobile device (or other electronic device).

Accordingly, in various aspects, a housing for at least partially encasing an object, such as a tablet computer, mobile telephone, or electronic reader, methods of using the encased object, e.g., device, and/or systems for the same are provided. For instance, in one particular embodiment, a housing for housing a device, such as a tablet computer device, mobile telephone, or electronic reader, is provided. The housing may be configured such that the electronic device may be fitted within the housing and be substantially protected thereby, such as from liquid, shock, dirt, dust, and the like. The housing may include a plurality of separate members or separate portions of the same member, such as a top member portion and a bottom member portion that are designed to be coupled together to from a housing. In various embodiments, the top and bottom members may be separate members that may be associated via a third element, such as a hinge element, and/or may include two members that are to be locked together by a common third member, e.g., a locking element. In such instances, the top and bottom member portions are designed to come together around an object, e.g., electronic device, to be encased so as to form a liquid-tight seal.

There are several advantages achieved by the housings provided herein. For instance, in certain instances, a housing of the disclosure may provide a measure of shock absorbance for the protection of a housed device or components thereof. In certain instances, the housing may be configured to provide a measure of liquid-resistance for the protection of the encased device and/or components thereof. For example, in various instances, the housing may be at least substantial shock and/or liquid proof. A housing as disclosed herein can also provide protection against the scratching, marring, chipping, breaking, fracturing, and the like of the underlying device or components thereof. In certain instances, the shock and/or liquid, e.g., water, resistance is provided while at the same time as maintaining the unique technical or design features of the encased device. In various instances, the housing is designed to increase the sound transmission qualities of the underlying device, e.g., for amplifying or clarifying sound and/or sound quality. In some instances, these advantages are provided by the housing without substantially increasing the size and/or the weight of the underlying device.

For instance, in some embodiments, the dimensions of the housing fall within the following ranges. The thickness of the various members, e.g., a top and/or bottom and/or locking members, which members may be separate individual top and bottom members joined by a common locking element, and may have a thickness as a whole of more or less than about 50 mm or about 40 mm or less, such as about 35 mm or 30 mm or less, such as about 25 mm or about 20 mm or about 18 mm or less, for instance, about 17 mm or about 15 mm or less, such as 13 mm or less, such as about 10 mm, for instance, about 8 mm or less, including about 5 mm or about 3 mm or less, or even 2.5 mm or less. It is noted that the thickness of the housing will depend proportionately to the thickness of the device to be encased.

The length of the various members of the housing may also vary. In certain instances, the length of a top and/or bottom member may be more or less than about 800 mm or about 750 mm or less, such as about 700 mm or 650 mm or less, such as about 500 mm or about 450 mm or about 400 mm or less, for instance, about 350 mm or about 300 mm or less, such as 250 mm or less, such as about 200 mm, for instance, about 150 mm or less, including about 100 mm or about 75 mm or less, or even be about 50 mm or about 25 mm or less. The width of the various members of the housing may also vary. In certain instances, the width of a top and/or bottom member may be more or less than about 600 mm or about 550 mm or less, such as about 450 mm or 400 mm or less, such as about 350 mm or about 300 mm or about 250 mm or less, for instance, about 200 mm or about 150 mm or less, such as 100 mm or less, such as about 75 mm, for instance, about 50 mm or less, including about 40 mm or about 30 mm or less, or even be about 20 mm or about 15 mm or less. The total mass of the housing may also vary and may be more or less than about 800 g or about 750 g or less, such as about 700 g or 650 g or less, such as about 500 g or about 450 g or about 400 g or less, for instance, about 350 g or about 300 g or less, such as 250 g or less, such as about 200 g, for instance, about 150 g or less, including about 100 g or about 75 g or less, or even about 50 g or about 25 g or less.

For example, in various instances, the thickness of an individual top and/or bottom member may vary and may be more or less than about 15 mm or less than about 13 mm, for instance, less than about 12 mm or about 11 mm, such as less than about 10 mm or about 9.5 mm, for instance, less than about 9 mm or about 8 mm, such as less than about 7 mm or about 6 mm, for example, less than about 5 mm or about 4 mm, including less than 3 mm or about 2.5 mm or even less than about 2 mm thick, dependent on how the individual members are fabricated, the size of the device to be encased, and where on the top or bottom member the measurement is taken. The individual mass of a top or a bottom member may also vary and may be more or less than about 400 g or about 350 g or less, such as about 300 g or 250 g or less, such as about 200 g or about 150 g or about 100 g or less, for instance, about 90 g or about 80 g or less, such as 75 g or less, such as about 70 g, for instance, about 65 g or 60 g or less, including about 55 g or about 50 g or less, or even about 40 g or about 30 g or about 25 g or less, dependent on the rigidity of the particular embodiment.

Accordingly, due to the design features described herein, a housing of the disclosure is capable of providing liquid and shock proof resistance to a housed device, while only having a thickness, weight, length, and width in the range recited above. Specifically, in certain instances, the length and/or width of the top or bottom member may be such that it is no longer or wider than about 50 mm or about 45 mm, such as about 40 mm or about 35 mm, for instance, about 30 or about 25 mm, including about 20 or 15 mm of the underlying device it is designed to encase, such as, in various embodiments, no longer or wider than about 10 mm or about 8 mm or about 5 mm, for instance, no longer or wider than about 4 mm, including no longer or wider than about 3 mm or about 2 mm than the device the housing is designed to encase. For example, in various instances, the length and/or width of a top and/or bottom member may be less than about 4.5 mm or about 3.5 mm or about 2.5 mm, such as less than 2.0 mm, less than 1.5 mm, for example, less than 1 mm more than the length and/or width of the device the housing is designed to house.

In certain particular embodiments, a housing of the disclosure may have a width from about 150 mm to 250 mm, such as from 175 mm to about 225 mm for instance from about 200 to about 210 mm, such as 208 mm. In certain particular embodiments, a housing of the disclosure may have a length from about 150 mm to 300 mm, such as from 175 mm to about 275 mm for instance from about 200 to about 250 mm, such as 225 mm. In certain instances, the length is about 265 mm. In certain particular embodiments, a housing of the disclosure may have a thickness from about 10 mm to 50 mm, such as from 20 mm to about 40 mm for instance from about 30 mm to about 35 mm. In certain embodiments, the thickness of the housing may be about 21 mm. In certain particular embodiments, a housing of the disclosure may have a thickness from about 150 g to 400 g, such as from 200 g to about 350 g for instance from about 250 to about 300 g. In certain instances the weight may be about 320 g. In certain instances a component of the housings may differ from one another. For instance, in certain instances, an internal rigid frame is included, to which rigid frame is coupled one or more relatively flexible members. Accordingly, where a rigid member is included, in various exemplary embodiments, the component may be fabricated from one or more of nylon and polycarbonate and the like. Other semi-rigid materials may include polyester, polypropylene, ABS, Acrylic, polyetherimide, ionomer, acetal, polyurethane or blends thereof, and the like. Where a more flexible member is included, exemplary materials for fabricating such member may include, silicone, TPE, TPU, TPV, thermoset rubbers, and the like. Where a sealing member such as a gasket is included, the gasket may be fabricated from an exemplary material such as silicone, thermoplastic elastomer, theromoplastic urethane, nitrile, EPDM, viton, urethane, SBR, or vulcanized rubber, combinations thereof, and the like. Accordingly, these are simply exemplary materials actual materials employed may be selected to be more or less stiffer than this, likewise the actual materials selected may be more or less flexible than the lists herein provided.

The housings of the disclosure are configured such that dependent on the configuration more or less of a degree of waterproofness and/or shockproofness may be provided. Accordingly, depending on the context a housing of the disclosure may be waterproof whereby is meant that a housed electronic device is protected against the effects of continuous or temporary immersion in water. Substantially waterproof would mean that the device is essentially protected against the effects of continuous or temporary immersion in water, and water-resistant would mean the housed device is protected against the effects of falling water drops, blowing water drops, spraying water, splashing water, or water jets. Additionally, depending on the context a housing of the disclosure may be shockproof whereby is meant that a housed electronic device is protected such that an item can physically and functionally withstand the relatively infrequent, non-repetitive shocks encountered in handling, transportation, and service environments. Substantially shockproof would mean that the housing provides a degree of protection such that an item essentially can physically and functionally withstand the relatively infrequent, non-repetitive shocks encountered in handling, transportation, and service environments. Shock resistant would mean that the housing could provide a degree of protection so that an item can likely physically and functionally withstand the relatively infrequent, non-repetitive shocks encountered in handling, transportation, and service environments. Such shocks could be defined as mechanical perturbations of the item generally limited to a frequency range not to exceed 10,000 Hz and a time duration of not more than 1.0 second.

Accordingly, in one embodiment, due to the design features described herein, a housing of the disclosure is capable of providing substantial liquid and shock resistance to a housed device, while only having a relative thickness, length and/or width in the ranges recited above. Several formulas may be employed for determining an adequate thickness, width and/or length of a particular housing, and thus, may be easily determined by determining the thickness, width and/or length of the underlying device, x, and providing a housing that has a dimension, y, such as one of the dimensions recited above, that is in addition to the dimension of the underlying device. Specifically, if the dimension of the device is x, then the dimension of the housing will be (x+y), where y is one of the dimensions set forth above. An alternative formula for determining an adequate thickness, width, and/or length of a housing may be to measure the distance y from the interior of the housing, which contacts the encased device, to the exterior of the housing, wherein y is within one of the ranges recited above.

To ensure the appropriate thickness, width, and/or length and/or weight of the housing have been provided, the device to be encased may be fitted within the housing, then the housing closed, and the housing and/or seal thereof may be tested for its ability to provide shock and/or liquid resistance, such as by experimentally dropping the housed device and/or exposing it to wet conditions. See, for instance, the examples section below. The thickness, width, and/or length and/or weight of the housing should be provided in such dimensions so that the encased device is not broken, cracked, or otherwise damaged by the dropping and/or exposure to liquid, e.g., water in all its forms.

It is to be noted that in certain instances, the housing may be larger, e.g., substantially larger, than the object the housing is configured to house, such as where there is little or no utility for having the size of the housing tied to the object it is configured to house. For instance, where it is determined that it would be beneficial to have a housing that is substantially thicker, wider, longer, and/or heavier than an underlying device, than the dimensions of the housing may be thicker, wider, and longer than those dimensions recited herein, such as greater than 800 mm or more and/or have a mass that is greater than 800 g or more. In other instances, the housing is not substantially larger and/or heavier than the device it is designed to encase. Accordingly, in certain instances, the housing protects the device from one or more of a shock, such as that caused by dropping the device, and/or from liquid, such as that caused from contact with a liquid, such as water.

Accordingly, with respect to FIG. 1A, a housing 1 is provided. The protective housing is configured for housing an object. The object may be any object that may be housed in accordance with the description provide herein. For instance, in certain embodiments, the object to be housed is a device, such as an electronic device, for example, a tablet computing device, for instance, a digital tablet computer, such as a tablet PC, mobile telephone with computing functionality, an electronic reader, or the like. In certain instances, the electronic device to be encased may be a handheld mobile electronic device, for example, a tablet PC, mobile telephone, or other such device, for instance, an electronic reader, personal digital assistant, electronic game device, organizer, and the like. It is to be noted that based on the configuration of the individual components of the housing, the housing may at least partially encase the electronic device. The encasement can be an entire encasement, or a less than entire encasement. For example, in certain instances, a portion of the top or bottom member that form the protective housing may be open, such as where the top or bottom member does not include a front or back surface, e.g., where the top or bottom member is membraneless, or the encasement may be entire, where the top and bottom member fully surround and encase the entire electronic device, or the encasement may be partial, where the top and bottom member encase the electronic device except for those portions substantially adjacent a display, such as a touch-sensitive display of the electronic device. In such instances, the housing (e.g., top and/or bottom member) may have an open aperture, such as adjacent the display, thereby allowing direct touch access to the display; or the housing may have an aperture that is spanned by a permanently or removably fixed membrane, which membrane may be affixed to the housing or to the device, e.g., over the display, so as to provide indirect touch access to the display, e.g., touch sensitive display.

In particular embodiments, the protective housing 1 may include a top member 2 and a bottom member 3 that when removably or fixedly coupled together form the protective housing 1. FIG. 1A provides a top-down view of the top member 2, a bottom-up view of the bottom member 3, as well as a profile view of all four sides of the protective housing 1. As depicted with respect to FIG. 1A, the protective housing includes a plurality of members, such as top member 2 and bottom member 3 that, in various embodiments, are configured for being removably coupled together so as to form the protective housing 1. It is to be understood, however, that although a particular embodiment is presented herein, such as a protective housing 1 for housing an electronic device, such as a tablet PC or mobile phone or electronic reader, etc., therein, the object to be housed may be any of a number of different objects, and the protective housing may, therefore, have a number of different members having a number of different shapes, sizes, and configurations without departing from the nature of the disclosure.

For instance, as herein depicted below, the protective housing may include two separate members, e.g., separate individual top and bottom members 2 and 3, that are configured for being removably or permanently coupled together so as to surround an electronic device and thereby house the device. However, in certain instances, (not shown) the top and bottom members may not be separate members, but rather may be members that are joined, for instance, by a common hinge element, or may be fabricated from a single member configured for being folded upon itself and thereby forming the protective housing. In other instances, the protective housing 1 may include more than two separate members, such as separate top 2 and bottom 3 members as well as a separate clasping and/or locking element (not shown) that when assembled together form the protective housing 1. Hence, the scope of the housings and systems described herein with respect to the particular embodiments set forth in reference to the figures is not intended to be unduly limiting.

The top member 2 of the protective housing 1 may include a top front and back surface, such as a membrane spanning the peripheral portion (not included in this embodiment), and a top member peripheral portion 20. However in this embodiment, the top member 2 does not include a top member front and back surface. Rather, in the depicted embodiment, the top member 2 simply includes a top member peripheral portion 20. The top member peripheral portion 20 of the top member 2 may be defined by a top member proximal end portion 21 and a top member distal end portion 22 as well as opposing side portions termed the top member left hand side portion 23 and top member right hand side portion 24. The top member peripheral portion 20 may include a plurality of additional features, such as a headphone port 50 (not shown), having a headphone port sealing port member 53 positioned therein, as well as a charge port opening 71a (not shown). The top member 2 may additionally include one or more button features, such as a home button feature 40.

The bottom member 3 of the protective housing 1 includes a bottom member front and back surface ("surface") 35 surrounded by a bottom member peripheral portion 30. The bottom member peripheral portion 30 is defined by a proximal and a distal bottom end portions termed the bottom member proximal end portion 31 and the bottom member distal end portion 32 as well as opposing side portions termed the bottom member right hand side member 33 and bottom member left hand 34 respectively. The bottom member peripheral portion 30 may include a plurality of additional features, such as one or more button or switch features, like volume buttons 99a, an on/off button 99b, an orientation switch 90, and sound transmission features, like microphone transmission port 61 and speaker transmission port 60.

The microphone transmission port 61 includes an opening, e.g., inlet aperture 62a (not shown) that spans from the exterior to the interior of the bottom member 3. An interior portion of the microphone inlet aperture is surrounded by a microphone waterproof gasket 61a (not shown), which gasket spans and covers the inlet aperture and functions to seal the microphone port aperture in a waterproof sealing thereby protecting the housing, but at the same time allowing the efficient transmission of sound into the housing and toward the microphone portion of a housed device. The microphone waterproof gasket may be affixed to the housing over the microphone transmission inlet aperture by any suitable means, such as by an adhesive, thermal coupling, and/or by overmoulding in conjunction with forming the microphone transmission port 61. An exterior portion of the microphone transmission port 61 has a microphone grille 61b which functions as a protective enforcement spanning a portion of the inlet aperture 62a.

The bottom member 3 may additionally include a latch feature 70 that includes a latch door 71b that may be positioned so as to cover and enclose an electrical transmission port, such as charge port opening 71a (not shown), which charge port opening is included on a corresponding top member 2. The latch feature 70 of this embodiment is liquid-proof and/or dust proof and includes a gasket 78 (not shown) to facilitate such a sealing. The bottom member 3 may include one or more accessory connection ports 97a, 97b, 97c, and 97d which may be positioned anywhere on the bottom member 3, such as in the corners of the bottom perimeter portion 30 of the bottom member 3. The one or more accessory ports 97a, 97b, 97c, and 97d can be used for connecting one or more accessories to the protective housing 1. In certain embodiments, the bottom member surface 35 may additionally include a lens feature 80.

In this embodiment, the bottom member 3 includes a bottom member surface 35. The bottom member surface 35 of the bottom member 3 may be composed of one or more materials which materials may be the same material or different materials and which materials may be the same or different from the material or materials of the bottom member peripheral portion 30. In certain embodiments, the bottom member surface 35 of the bottom member 3 may be comprised of at least one screen or membrane. In other instances, the bottom surface 35 of the bottom member 3 is formed of a rigid or semi-rigid material, such as polycarbonate, nylon, Plexiglas, or the like; or a more semi-flexible material such as polypropylene; or a more flexible material such as a rubber, for instance, TPE. Where a semi-rigid material is employed, the bottom surface may have a rigidosity that is selected so as to allow the back surface to vibrate in such a manner that it amplifies the sound characteristics emitted from a housed device.

In accordance with a particular configuration of the protective housing 1, and as can be seen with respect to FIG. 1A, the top member 2 and a bottom member 3 may be configured for being removably coupled together so as to form the protective housing 1. The protective housing 1, therefore, includes one or more sets of clasping mechanisms (not shown) that are adapted for coupling the top 2 and bottom 3 members together in such a manner so as to produce at least a substantially waterproof and/or shockproof seal there between.

By water-resistant or waterproof seal is meant that a seal is formed by the coupling of the top member with the bottom member which seal does not substantially allow the passage of liquid, e.g., water, from one side of the protective housing (e.g., outside of the protective housing) to the other side of the protective housing (e.g., inside of the protective housing) in various predetermined conditions.

The coupling mechanism(s) may have any suitable configuration so long as it is capable of participating in the coupling of one member of the protective housing to another member of the protective housing, such as the top member 2 to the bottom member 3. For example, in certain embodiments the coupling mechanism may function to produce a waterproof and/or shockproof seal. For instance, in certain instances, the coupling mechanism may include a clasping mechanism, which clasping mechanism may function to seal the top member and the bottom member together in a waterproof and/or shockproof seal. In certain instances the clasping mechanism may include an internal or external locking element, as described herein.

Figure 1B:
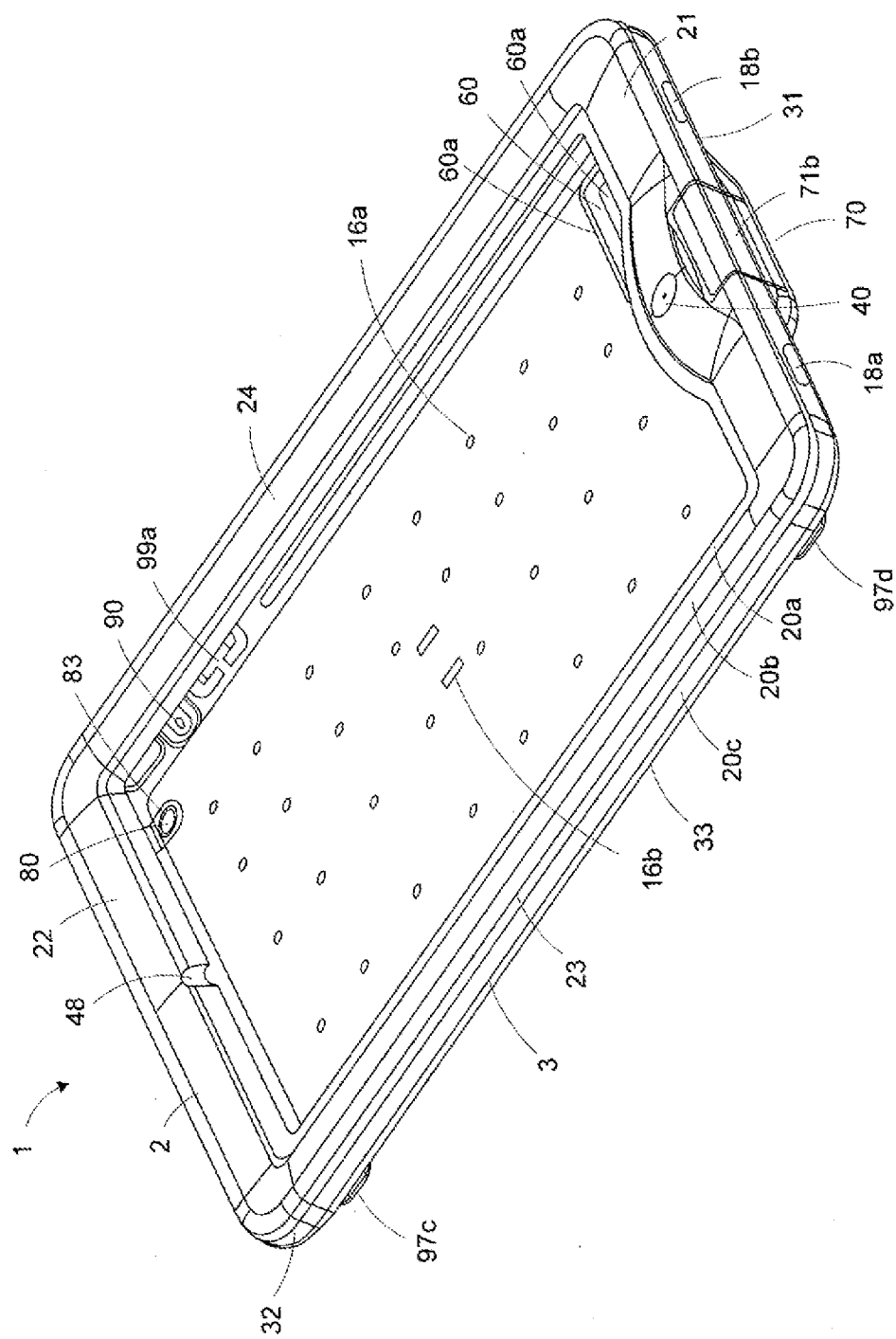

FIG. 1B provides a perspective view of the protective housing 1 of FIG. 1A. Accordingly, in particular embodiments, the housing 1 may include a top member 2 and a bottom member 3 that when removably coupled together form the protective housing 1. As depicted in FIG. 1B the top member 2 simple includes a peripheral portion 20, it does not include a front surface member. Rather, the top member 2 is made up simply of the top member peripheral portion 20. The top member 2, however, is configured for producing a substantially waterproof and/or water resistant seal when coupled to an electronic device (not shown) such as when the top member 2 is coupled to the bottom member 3 to form the housing 1.

The top member peripheral portion 20 is defined by a proximal and a distal top member end portions 21 and 22 as well as opposing top member right hand and left hand side portions 23 and 24 respectively. The top member peripheral portion 20 also includes a home button 40. As depicted, the top member peripheral portion 20 is further defined by top member interior perimeter portion 20a, top member middle perimeter portion 20b, and top member exterior perimeter portion 20c. A proximity sensor portion 48 is disposed in the top member interior perimeter portion 20a, which proximity sensor portion is configured as a cutout portion allowing a proximity sensor of an underlying housed device to determine the proximity of an object, such as a user.

The bottom member peripheral portion 30 is defined by a proximal and a distal bottom member end portions 31 and 32 as well as opposing bottom member right hand and left hand side portions 33 and 34 respectively. The bottom member includes a bottom member surface 35, which bottom surface 35 may have one or more risers, such as standoffs 16a and/or bridges 16b, which bridges 16b together may form a standoff channel, positioned on an interior portion of the bottom surface 35. The standoffs 16 may be configured to raise a housed device above the plane of the bottom member surface 35. In certain embodiments, the interior portion of the bottom member surface 35 do not have such standoffs, rather, the interior surface is substantially planar.

The bottom member surface 35 may also include a lens feature 80, which lens feature 80 includes an optical grade lens 83 that is positioned to align with a camera lens of a housed electronic device so as to enhance the photographic features of the housed electronic device.

The bottom member 3 may additionally include a bottom peripheral portion 30, wherein the peripheral portion includes an orientation control switch 90, a volume control element 99a, a liquid-proof latch cover 71b, and a sound transmission feature, like speaker transmission port 60. In this embodiment, the speaker port 60 is enclosed by a speaker waterproof seal (e.g., gasket) 60a that provides a seal that is waterproof but which also permits the transmission of sound from an electronic device outwards from the protective housing 1. The peripheral portion 30 of the protective housing 1 may additionally have one or more tool slot features 18a and 18b incorporated therein to allow the coupled top 2 and bottom 3 members of the protective housing 1 to be disengaged from one another and the housing 1 opened, for example with a tool, such as a screwdriver, coin, or the like when inserted into the slot feature(s) 18 between the top member 2 and the bottom member 3 and rotated or twisted.

In certain embodiments, the top and bottom members may be composed of various different components and therefore may be fabricated from a plurality of different materials. Suitable materials from which the top and bottom member may be fabricated include rigid, semi-rigid, semi-flexible, and flexible materials that may be fabricated together or separately and combined together so as to provide shock and/or liquid proof resistance to the protective housing. Such materials may include but are not hereby limited to plastics, polycarbonates, nylons, liquid crystal polymers, metals, and/or rubber, thermal plastic urethanes, polyethylenes, and/or polypropylenes, TPEs, mixtures thereof and the like. In certain embodiments, the materials may be a composite of materials and may include one or more reinforcing elements such as glass, ceramics, carbon fiber (e.g., graphite), and the like.

Figure 1C:
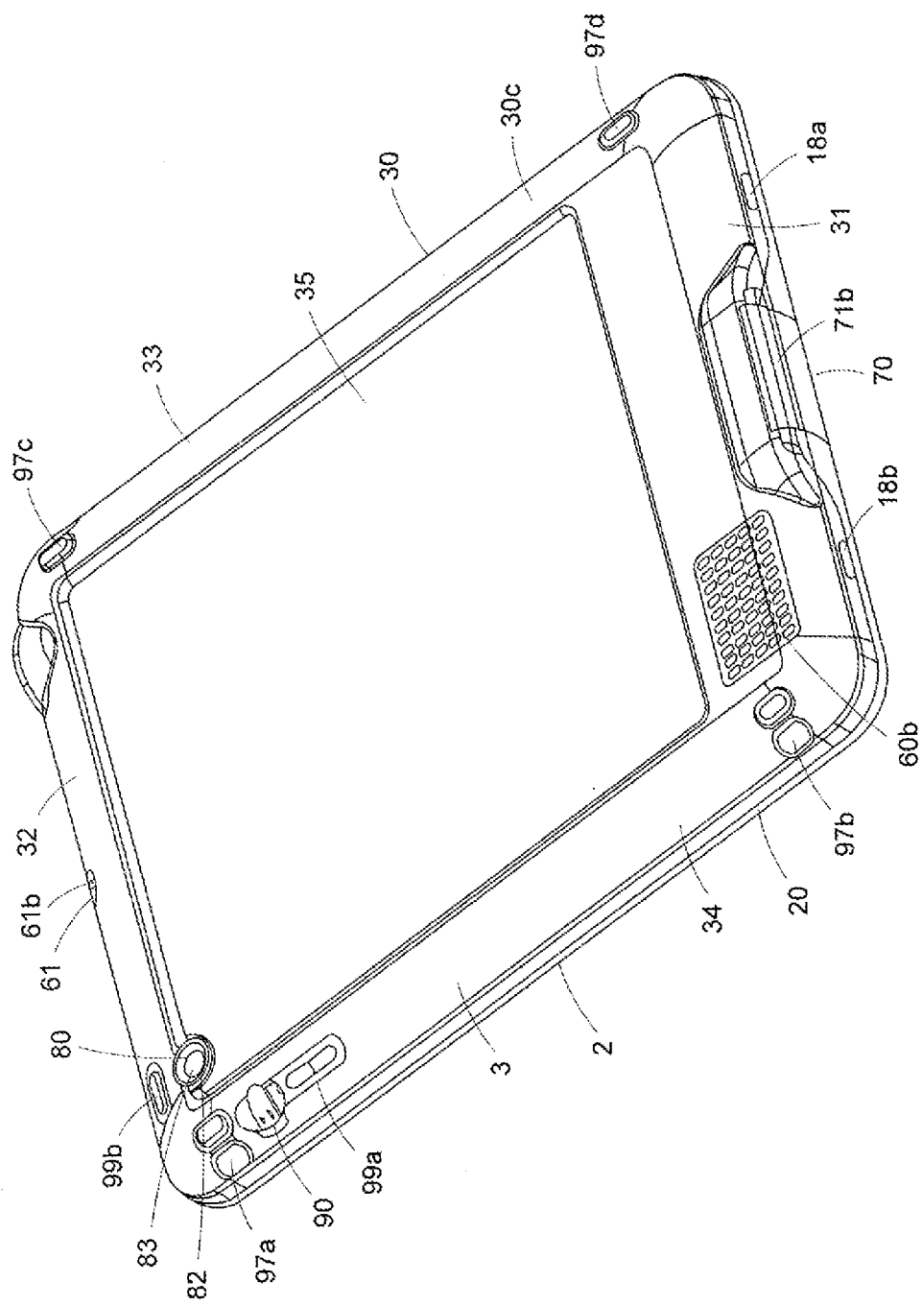

FIG. 1C is a perspective illustration of a top-down view of the bottom member 3 of the protective housing 1. Depicted are the bottom member back surface 35, peripheral portion 30 of the bottom member 3, as well as portions of the peripheral portion 20 of the top member 2. The bottom member perimeter 30 portion is defined by opposing proximal and distal bottom member end portions 31 and 32 and opposing bottom member right hand and left hand side portions 33 and 34 respectively. The bottom member peripheral portion 30 may further be defined by interior perimeter portion 30a (not shown), middle perimeter portion 30b (not shown), as well as exterior perimeter portion 30c.

The bottom member peripheral portion 30 includes an orientation switch 90, one or more button features such as volume switch 99 a, and on/off button 99b, as well as latch door 71b and tool slot features 18a and 18b. As depicted, the orientation switch 90, volume switch 99, on/off button feature 99b, and tool slot features 18a and 18b are positioned on the bottom member 3. The latch feature door 71b spans from the bottom member 3 to the top member 2. As depicted here, the orientation control switch 90 and volume control switch 99a are located on the bottom member left hand side member 34 and the on/off button feature 99b is located on the bottom member distal end portion 32.

A lens feature 80 including a camera lens 83 and optical skirt 82 is shown on the bottom member distal end portion 32 of the bottom member peripheral portion 30. A speaker grille 60b is depicted here on the bottom peripheral portion 30 of the bottom member 3 covering a portion of the proximal bottom member end portion 31 of the bottom perimeter portion 30. A microphone transmission port having a microphone protective grille 61b are depicted here covering a portion of the proximal bottom member end portion 31 of the bottom peripheral portion 30 of the bottom member 3. Also depicted are accessory connection ports 97a, 97b, 97c, and 97d, positioned on a bottom portion of the peripheral portion 30 of the bottom member 3. In other embodiments, one or more of the positions of various features described in this Figure may be reversed or repositioned.

Figure 1D:
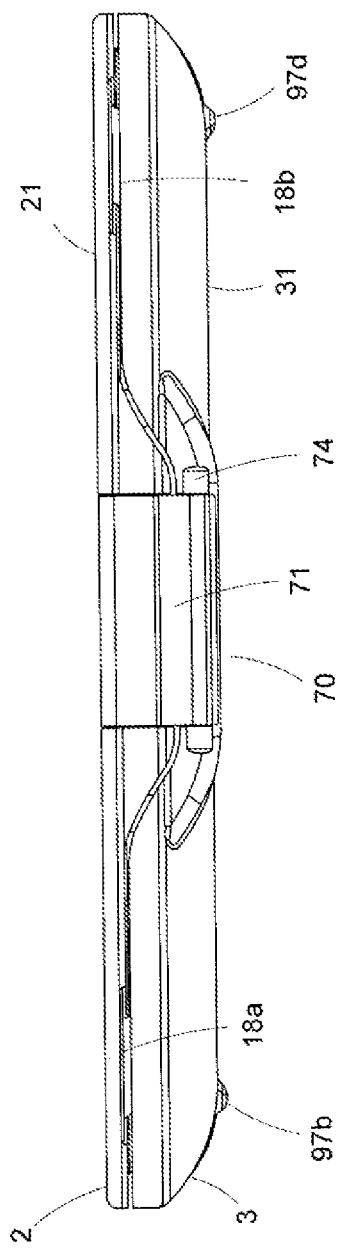

FIG. 1D provides a front view of the of the protective housing 1 showing the top member 2 looking toward the top member proximal end portion 21 and the bottom member 3 looking towards the bottom member proximal end portion 31. The latch door 71b and tool slot features 18a and 18b span from the bottom member 3 to the top member 2. The latch door axle 74 allows the latch door 71 to swing to open and closed positions about the axle 74.

Figure 2A:
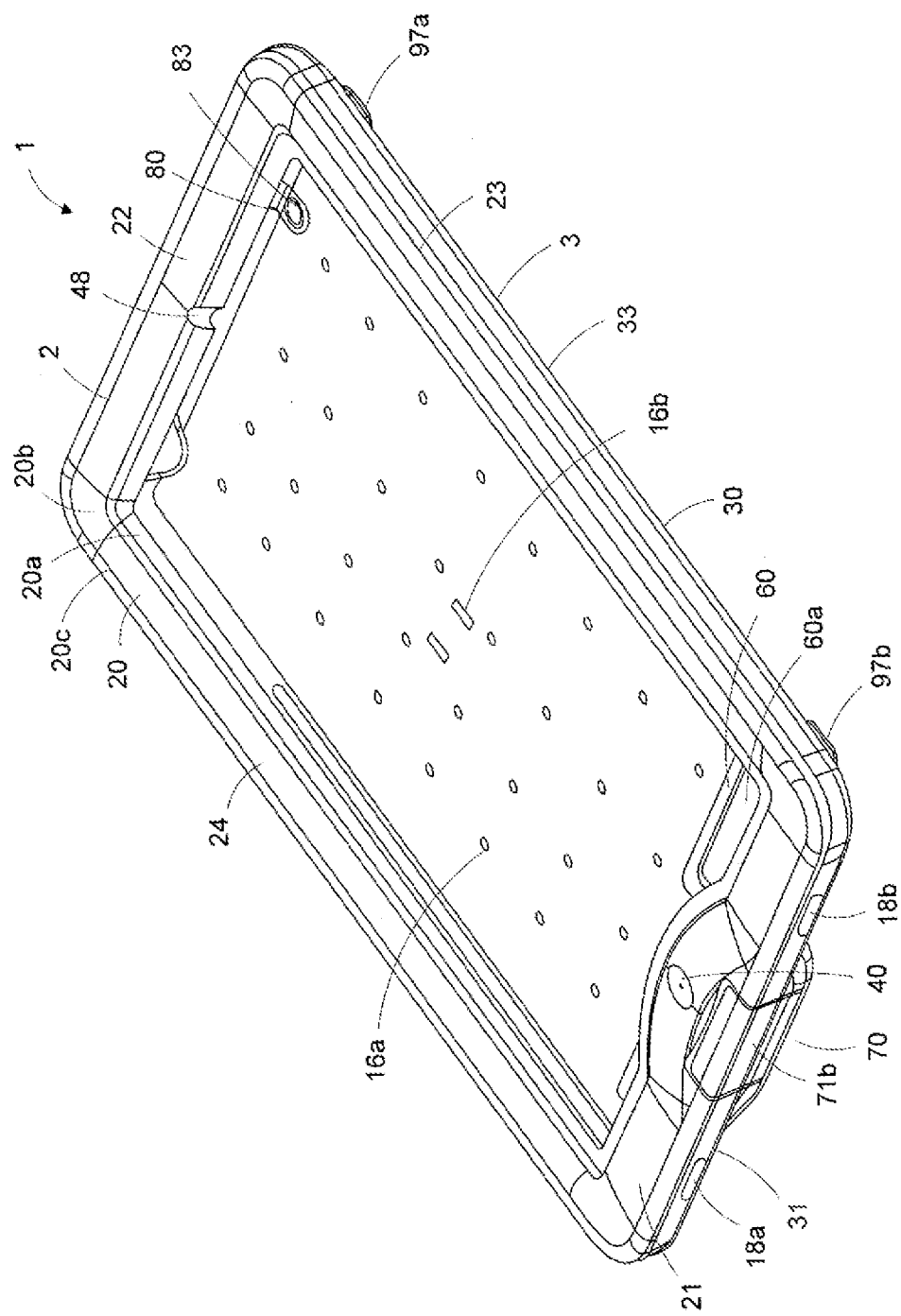
FIGS. 2A-C provide perspective views of a protective housing of the disclosure including a front top and front bottom view.

FIG. 2A provides a perspective view of a top-down view of the top member 2 and a bottom-up view of the bottom member 3 of the housing 1, as they would be when coupled together to form the housing 1. As depicted, the top member peripheral portion 20 includes a top member interior perimeter portion 20*a*, a top member middle perimeter portion 20*b*, and a top member exterior perimeter portion 20*c*, any of which portions may be composed of the same materials or of different materials or a combination of the same. The top member peripheral portion 20 includes a home button 40 disposed on the top member proximal end portion 21. A proximity sensor portion 48 is depicted as an indent in the top member interior perimeter portion 20*a*. A latch feature 70 including a latch cover 71*b* for covering an electric transmission port 71*a*, e.g., charge port (not shown), as well as tool slot features 18*a* and 18*b* are shown spanning the top member 2 and the bottom member 3.

The bottom peripheral portion 30 of the bottom member 3 includes a speaker sound transmission feature 60. The speaker sound transmission port 60 may include one or more apertures (not shown) that extend from an interior of the housing to an exterior of the housing so as to facilitate the transmission of sound from a speaker portion of a housed device through the interior of the housing to the exterior of the housing. The speaker port aperture(s) may be enclosed by a substantially liquidproof and/or liquid resistant speaker gasket 60*a* that provides both a covering over the apertures and a seal with the bottom member that is at least substantially water resistant and/or waterproof but which permits the transmission of sound from an electronic device outwards from the protective housing 1.

A lens feature 80 is also shown proximal to the bottom member surface 35. Also depicted are risers 16*a* and 16*b* which may be included on the bottom front surface 35 which may form a standoff channel so as to allow separation between a housed device and the bottom member front and back surface member 35, for instance, for greater shock absorbance and enhanced sound transmission.

Figure 2B:
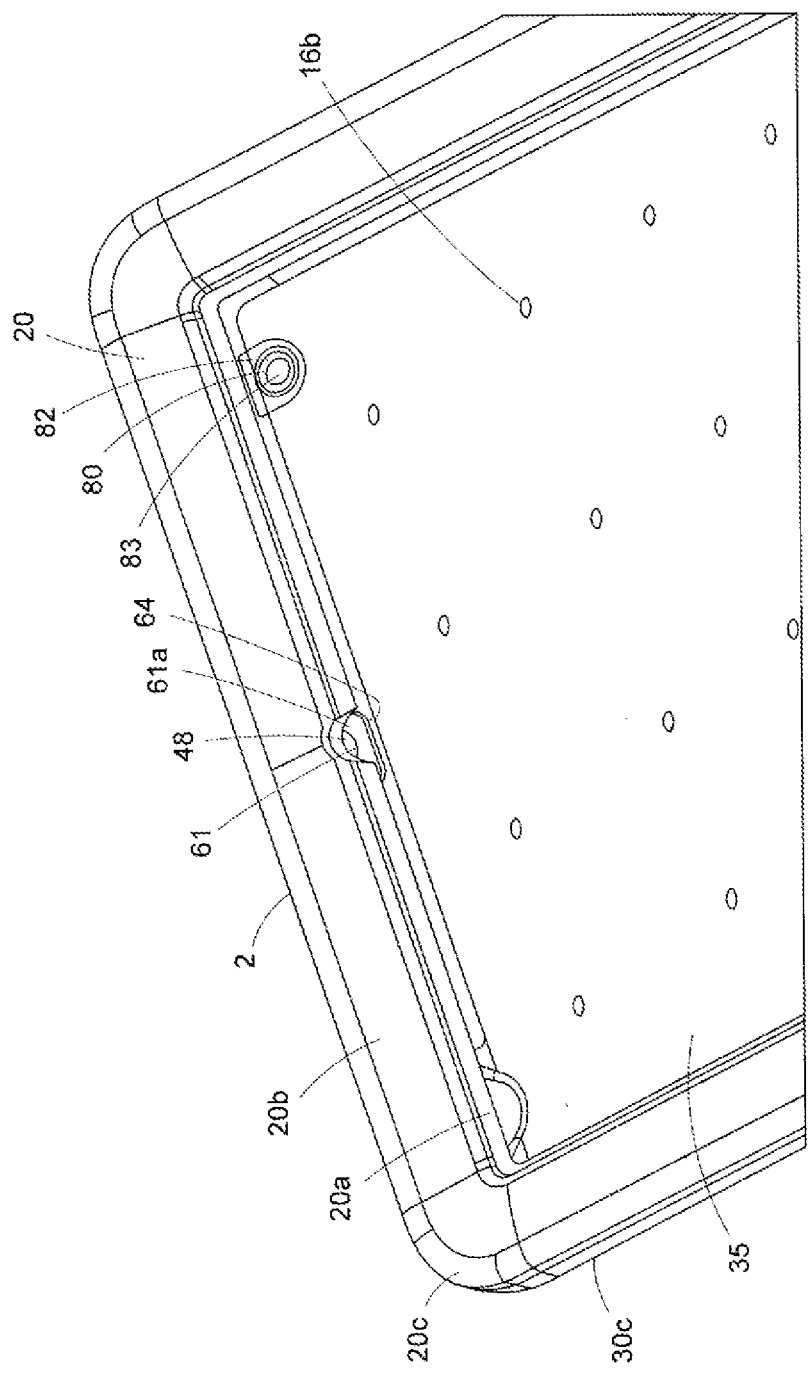

FIG. 2B provides an up close view of the front top portion of the protective housing 1 of FIG. 2A. The top member peripheral portion 20 includes a top member interior perimeter portion 20*a*, a top member middle perimeter portion 20*b*, and a top member exterior perimeter portion 20*c* which are shown with the proximity sensor portion 48 as well as the microphone transmission port 61. The microphone transmission port 61 includes a microphone waterproof gasket 61*a* which is shown on the top member interior perimeter portion 20*a* covering the microphone transmission port inlet aperture 62*a* (not shown). In this embodiment, the interior portion of the microphone transmission port 61 includes an echo cancelling feature 64 that is formed as a raised ridge the circumscribes the interior portion of the inlet aperture 62*a* and functions to substantially prevent the internal transmission of sound from within the interior of the housing (such as from the speaker portion) from entering the microphone portion of a housed electronic device.

A lens feature 80, optical skirt 82, and optical grade camera type lens 83 are visible in this view proximal to the bottom member surface 35 and the bottom peripheral portion 30 (not shown) of the bottom member 3. Also depicted are stand-offs 16*b* which may be included on the bottom front surface 35 and which may form one or more standoff channels.

Figure 2C:
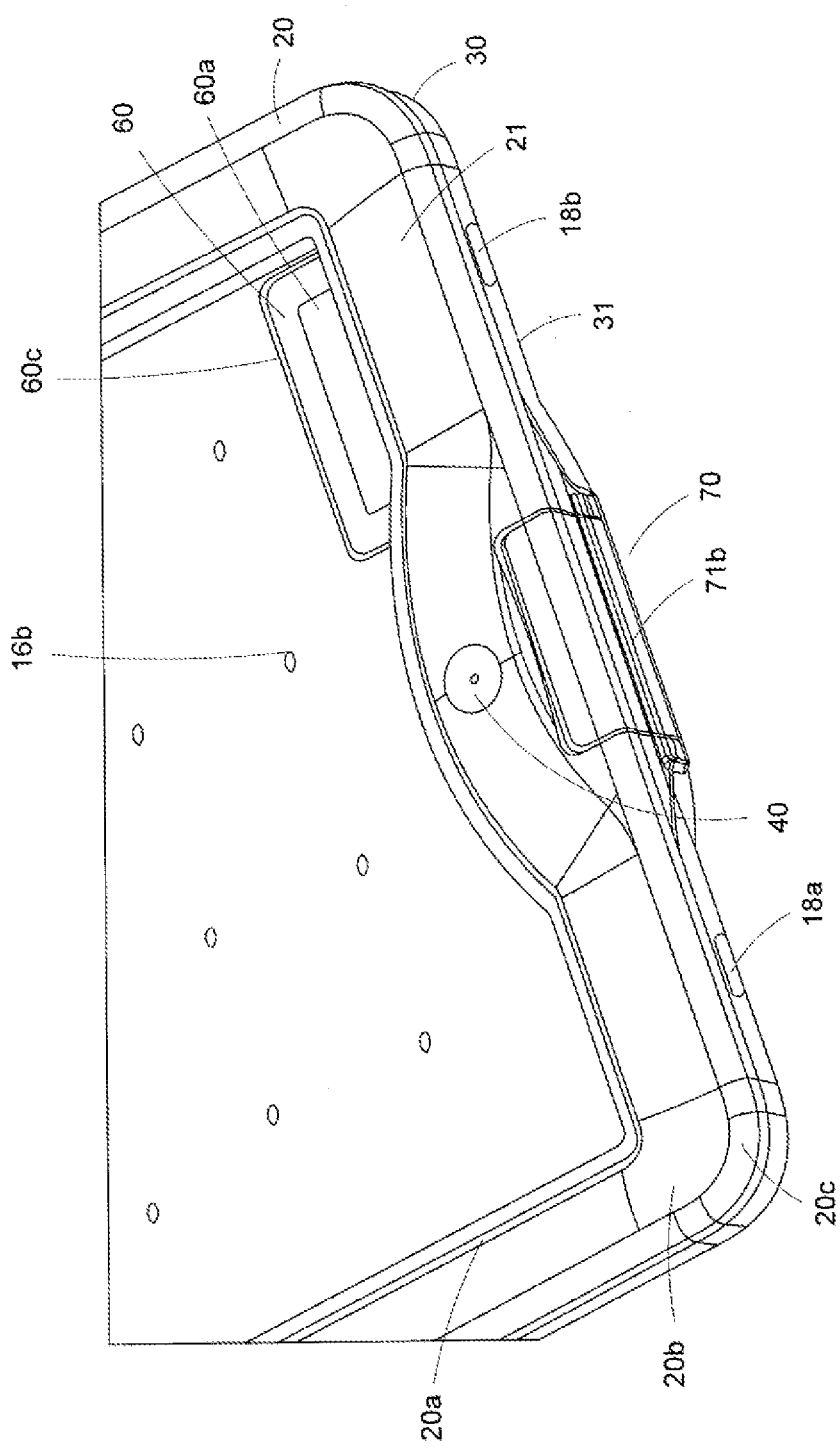

FIG. 2C provides an up close view of a front bottom portion of the protective housing 1 of FIG. 2A showing the top member peripheral portion 20 including the top member interior perimeter portion 20*a*, a top member middle perimeter portion 20*b*, and a top member exterior perimeter portion 20*c*, wherein the top member interior perimeter portion 20*a* is configured as a wiper portion, which wiper portion is configured to function in part as a seal and partly as a particle catch preventing or otherwise reducing the ingress of liquid or particulate matter from ingressing beneath the wiper when the top member 2 is coupled to the electronic device, such as when the top member 2 is coupled to the bottom member 3 to form the housing 1.

The home button 40 is visible on the top member proximal end portion 21 of the top member middle perimeter portion 20*b*. A latch door 71*b* for covering a charge port opening (not shown) as well as tool slot features 18*a* and 18*b* are shown spanning the top member 2 and the bottom member 3. The interior portion of the bottom member surface 35 of the bottom member 3 includes a sound transmission feature 60, including the speaker waterproof gasket 60*a* and speaker port gasket overmoulding 60*c* shown in this view. The overmoulding 60*c* functions to further attach and seal the gasket 60*a* to the interior of the bottom member surface 35.

Figure 3A:
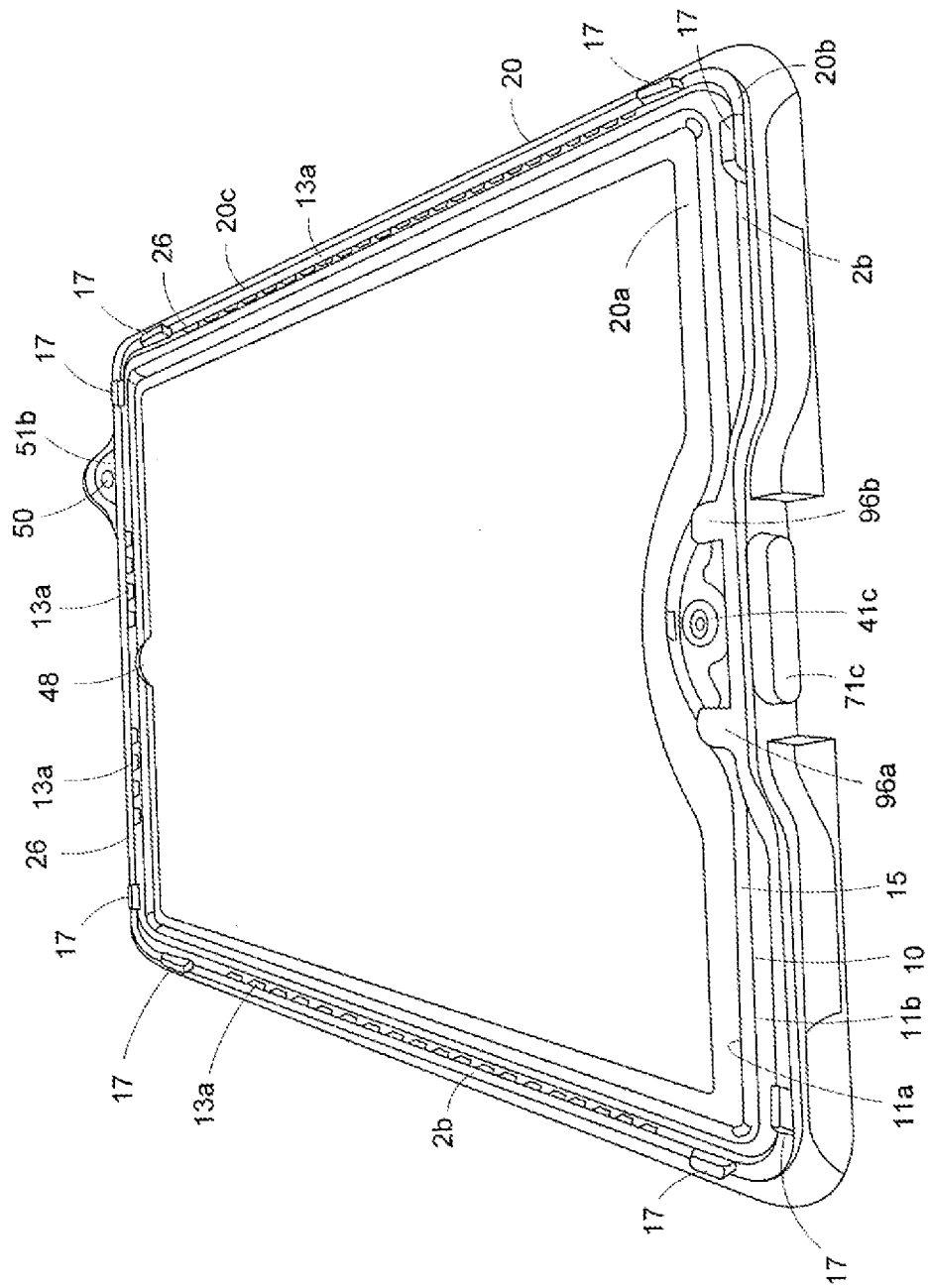
FIGS. 3A-C provide perspective views of the top member and bottom member of a protective housing of the disclosure including a front top and front bottom view.

FIG. 3A provides a perspective view of the back surface of a peripheral portion 20 of a top member 2 of the protective housing 1. The peripheral portion 20 of the top member 2 defines an opening for the placement of a touch-sensitive display screen of an electronic device, for example by at least substantially of not fully circumscribing the outer perimeter of the electronic device to be housed. The top member peripheral portion 20 includes an interior perimeter portion 20*a*, a middle perimeter portion 20*b*, and an exterior perimeter portion 20*c*.

The top member middle perimeter portion 20*b* is substantially rigid or semi-rigid material and is configured as a rigid or semi-rigid framework that is adapted to circumscribe the perimeter of an electronic device to be coupled therewith thereby defining the peripheral portion 30 of the top member 2. The top member interior perimeter portion 20*a* and a top member exterior perimeter portion 20*c* are comprised of semi-flexible or softer materials that are more flexible or pliable so as to allow these portions to form a softer inner and/or outer edge suitable for forming a seal with a corresponding surface of an electronic device or other members of the housing 1. Suitable rigid, semi-rigid, semi-flexible, and flexible materials that may be fabricated to make these various perimeter portions that may then be coupled together using means well known in the art, so as to provide suitable shock and/or liquid resistance to the protective housing include but are not hereby limited to plastics, polycarbonates, nylon, liquid crystal polymers, metals, and/or rubber, thermal plastic urethanes, polyethylenes, and/or polypropylenes, mixtures and composites thereof and the like described herein.

Hence, in various instances, such as when there are one or more of an interior, middle, and exterior perimeter portion, such as on a top member 2, the middle perimeter portion may be fabricated from a rigid material, such as a rigid plastic, e.g., polycarbonate, nylon, or the like, so as to provide structural integrity to the housing, whereas the inner and/or outer perimeter portions may be fabricated from a more flexible, e.g., semi-rigid or flexible material, such as a polyethylene or polypropylene or TPE (thermoplasticelastomer) material, or the like, so as to provide the interior and/or exterior perimeters of the housing with a measure of shock absorbance and protection.

Thus, in certain instances, a the top member 2 includes a more rigid middle perimeter portion 20*b* that may be coupled with a more flexible interior and/or exterior perimeter portion 20a and/or 20b, respectively. The rigid middle perimeter portion 20b is composed of a stiffness so as to provide structural integrity to the top member of the housing, while the flexible interior and/or exterior perimeter portions 20a and 20b of the housing provide measures of liquidproofability and/or shock absorbance.

In various instances, the interior 20a, middle 20b, and/or exterior 20c perimeter portions may be integrally formed together, such as in the manufacturing process, but in other instances they may be formed as two or three or more separate elements that are capable of being coupled together after the manufacturing process. Accordingly, in some embodiments, the top member 2 may include a middle perimeter portion 20b that is composed of a rigid skeletal frame, such as a polycarbonate or nylon frame, which frame is further associated with, e.g., is overmoulded with, a more flexible material, such as a rubber or a urethane material such as a polyethylene, TPE, or the like, so as to form an interior 20a and/or exterior 20c perimeter portion(s).

Accordingly, the rigid or semi-rigid top member middle perimeter portion 20b may be fabricated and formed, such as via moulding, which once formed may be coupled with one or both of the more flexible interior 20a and/or exterior 20c top member perimeter portions such as through an overmoulding process. In other embodiments, one or more of the interior, middle, and/or exterior perimeter portions may be attached together or otherwise coupled using different means, such as by thermal moulding, welding, suitable adhesives, and the like, and in other instances, one or more of these perimeter portions may be fabricated so as to be integral with one or more of the other perimeter portions. It is to be noted that although the preceding was described with respect to the peripheral perimeter portions of a top member 2, the same holds true for the peripheral perimeter portions of a bottom member 3 as well.

The top member middle perimeter portion 20b forms an outer raised ridge member 26 that protrudes away from the inner surface of the peripheral portion 20 of top member 2. In this embodiment the raised ridge member 26 circumscribes the entire perimeter of the peripheral portion 20, however, in other embodiments, the raised ridge member 26 may only circumscribe a substantial portion or less of the perimeter portion of the peripheral portion 20.

Also in this embodiment, the raised ridge member 26 includes a first clasping mechanism 27 that is formed as an extended lip or protruding ridge member (not shown) that extends from the outer surface (upper) edge of the raised ridge member 26 such that it protrudes away from the top member middle perimeter portion 20b and toward the top member exterior perimeter portion 20c. In operation, the extended portion of this lip or ridge forms a catch 27. The catch 27 protrudes outward along at least a portion of the exterior face of the raised ridge and is configured for being received within a corresponding clasping mechanism 37 of the bottom member 3, such as a corresponding opening or groove 37 (not shown) positioned within a corresponding raised exterior bounding wall 30b (not shown) of a peripheral portion 30 of bottom member 3 (not shown). It is to be noted that although the top member 2 is herein described as including a protruding lip 27 and the bottom member 3 is described as including a corresponding elongated groove 37, these configurations may be switched. The extended catch 27 may circumscribe the entire or a substantial portion or less than substantial portion of the raised ridge member 26 and therefore may be configured to engage an entire or a substantial portion or less than substantial portion of the corresponding clasping mechanism 37, e.g., elongated groove, positioned at a peripheral portion 30 of the bottom member 3.

In this embodiment, the raised ridge member 26 further includes a second clasping mechanism 13a. It is to be noted that in certain embodiments only one of these two clasping mechanisms may be included, whereas in other embodiments these two and additional clasping mechanisms may be provided. As depicted, the second clasping mechanism 13a is depicted as a plurality of teeth 13a. Further, as depicted here, this second clasping mechanism 13a is internal to the first clasping mechanism 27, however, in other embodiments these positions may be reversed.

The teeth 13a are disposed on the interior edge of the raised ridge member 26 on the surface opposing the first clasping mechanism 27. It is noted that in this embodiment, the two clasping mechanisms 27 and 13 are positioned on the same raised ridge member 26, however, in other embodiments, each of these clasping mechanisms may be positioned on different raised ridge members or otherwise split between two or more raised ridge members. The teeth 13a extend outward from and may be declined with respect to the raised ridge member 26. The teeth 13 are further configured for being at least partially received within a corresponding clasping mechanism 13b of bottom member 3, such as detents, openings, or apertures of a corresponding raised wall member, such as raised interior bounding wall 30a of the bottom member 3. The number of teeth and their spacing may differ as desired with respect to the strength of the sealing sought to be produced. Likewise, their relative circumferential coverage may vary from substantial to less than substantial circumferential coverage.

In this embodiment, the extended and raised ridge member 26 of the peripheral portion 20 of the top member 2 is configured for extending, e.g., downwards with respect to the bottom member, into a corresponding receiving member of the peripheral portion 30 of the bottom member 3, such as into bottom member channel 10b (described herein below) when the top member 2 is coupled to the bottom member 3 so as to form the housing 1. This action accomplishes several different results. As the raised ridge member 26 impinges within the bottom member channel 10b, the top member clasping mechanism 27a engages its corresponding bottom member clasping mechanism 37; the top member second clasping mechanism 13a engages its corresponding bottom member clasping mechanism 13b; and a top surface of the raised ridge member 26 contacts and compresses or otherwise engages a gasket, such as O-ring 15b, positioned in the bottom member channel 10b, thereby generating a secure, substantially waterproof and/or water resistant and/or substantially shockproof and/or substantially shock resistant seal between the top 2 and bottom 3 members.

Also depicted are device retention teeth 96a and 96b which teeth may function for one or more of aligning, orientating, and/or securing the placement of an electronic device as it is coupled to the top member 2. Retention teeth 96a and 96b may also be disposed on a portion of the raised ridge member 26 such as proximal to the interior front surface of the protective housing 1.

The top member 2 may additionally include an interior perimeter portion 20c that may be configured with a plurality of features that may serve one or more complementary functions. For instance, the interior perimeter portion 20c may be configured to form a top member channel 10a, which channel 10a may be bounded by a top member channel interior bounding wall 11a and a top member channel exterior bounding wall 11b. These bounding walls may be spaced apart from one another a distance sufficient to adequately retain a top member seal, such as a gasket, for instance, an O-ring 15a therein.

The top member gasket 15a positioned within the top member channel 10a may function such that as the top member 2 is coupled to an electronic device the gasket 15a contacts a surface, such as a top surface, of an electronic device and is thereby compressed against the surface of the electronic device forming a seal therewith, which seal is further secured by the top member 2 being coupled to the bottom member 3 so as to form the housing 1. The seal generated by the coupling of the top member 2 with the electronic device and/or the further coupling of the top member 2 with the bottom member 3 is a secure, substantially waterproof and/or water resistant and/or substantially shockproof and/or substantially shock resistant seal between the member 2 and the top surface of the electronic device, such as a top surface of a touch-sensitive display.

It is to be noted that the top member gasket (or bottom member gasket for that matter) may have any suitable configuration so long as it is capable of being compressed, such as when it contacts a surface, such as a top surface, of an electronic device to be housed within the housing 1. The extent of this compression of the top (or bottom member gasket) will depend on the type of the gasket employed and in certain embodiments the gasket may have a compressibility of greater than 5%, greater than 10%, greater than 15%, greater than 20%, greater than 25%, greater than 30%, greater than 35%, greater than 40%, greater than 45%, greater than 50% of its non-compressed diameter. In certain embodiments the top member gasket (or bottom member gasket) may be hollow or substantially hollow). As the top member 2 is coupled to the bottom member 3, the clasping force is sufficient to compress the gasket 15a between the top member interior perimeter portion 20a and the front surface, e.g., touch-sensitive display, of a housed electronic device thereby generating a liquid and dirt proof seal there between. The gasket 15a may be attached to the top member 2, e.g., to the top surface interior or middle perimeter portions 20a and/or 20b by any sufficient mechanism, such as by cohesion, the addition of an adhesive, or being moulded therewith.

The interior perimeter portion 20c of the top member 2 may also be configured to include a further top surface interface, such as a wiper section. The wiper portion of interior perimeter portion 20c may be configured to interface with a top surface of an electronic device when the device is coupled to the to member 2. The interface between the wiper portion and the top surface of the housed electronic device is such that liquid and/or particulate matter such as dirt or dust is substantially prevented from intruding through the interface, and further prevented from entering into the interior of the housing by the presence of the top member gasket 10a within top member channel 15a. In this manner, the top member wiper portion and top member channel 15a and gasket 10a portions all function to enhance the waterproof and/or water resistant seal between the top member 2 and the electronic device. It is further noted that the gasket 10a may be a separate member from the channel 15a but insertable therein, or the gasket may be formed as an integral portion of the top member interior perimeter portion 20a, or otherwise attached therewith out the presence of a channel 15a (the same applies equally to the bottom member gasket 10b and channel 15b).

In certain embodiments, the raised ridge member 26 of the top member interior middle perimeter portion 20b may form a top member exterior channel bounding member. In such an embodiment, an interior surface of the raised ridge member 26 in conjunction with a raised portion of the top member interior perimeter portion 20a of the wiper may define the top member channel 10a. Specifically, in this embodiment this raised ridge member 26 of the top member middle perimeter portion 20b in conjunction with a top member interior channel bounding member 11a disposed on the top member inner interior perimeter portion 20a may define the interior perimeter portion channel 10a into which the waterproof seal is positioned.

In other embodiments (not shown), the ridge member 26 may have other features or may be configured differently so as to facilitate the engagement of the top and bottom member clasping mechanisms, such as the engagement of the ridge member 26 with a corresponding raised ridge member, e.g., wall, of bottom member 3, said wall having a corresponding clasping element. Such different or additional configurations may include for example differently configured latching elements, catches, ridges, lips, grooves, extended protrusions, or the like.

Further in respect to FIG. 3A, the top member interior perimeter portion 20a of the top member peripheral portion 20 also includes a home button 40 (not shown) that includes a home button user interphase 40a (not shown) and a home button device interface 40b (not shown), which as depicted is covered by a home button sealing member 41c. Additionally, as depicted, the top member peripheral portion 20 also includes a proximity sensor portion 48, a headphone port 50 surrounded by a headphone port bounding member 51b disposed on the top member interior perimeter portion 20a, and an electrical transmission interface port 71b, e.g., charge port aperture.

Figure 3B:
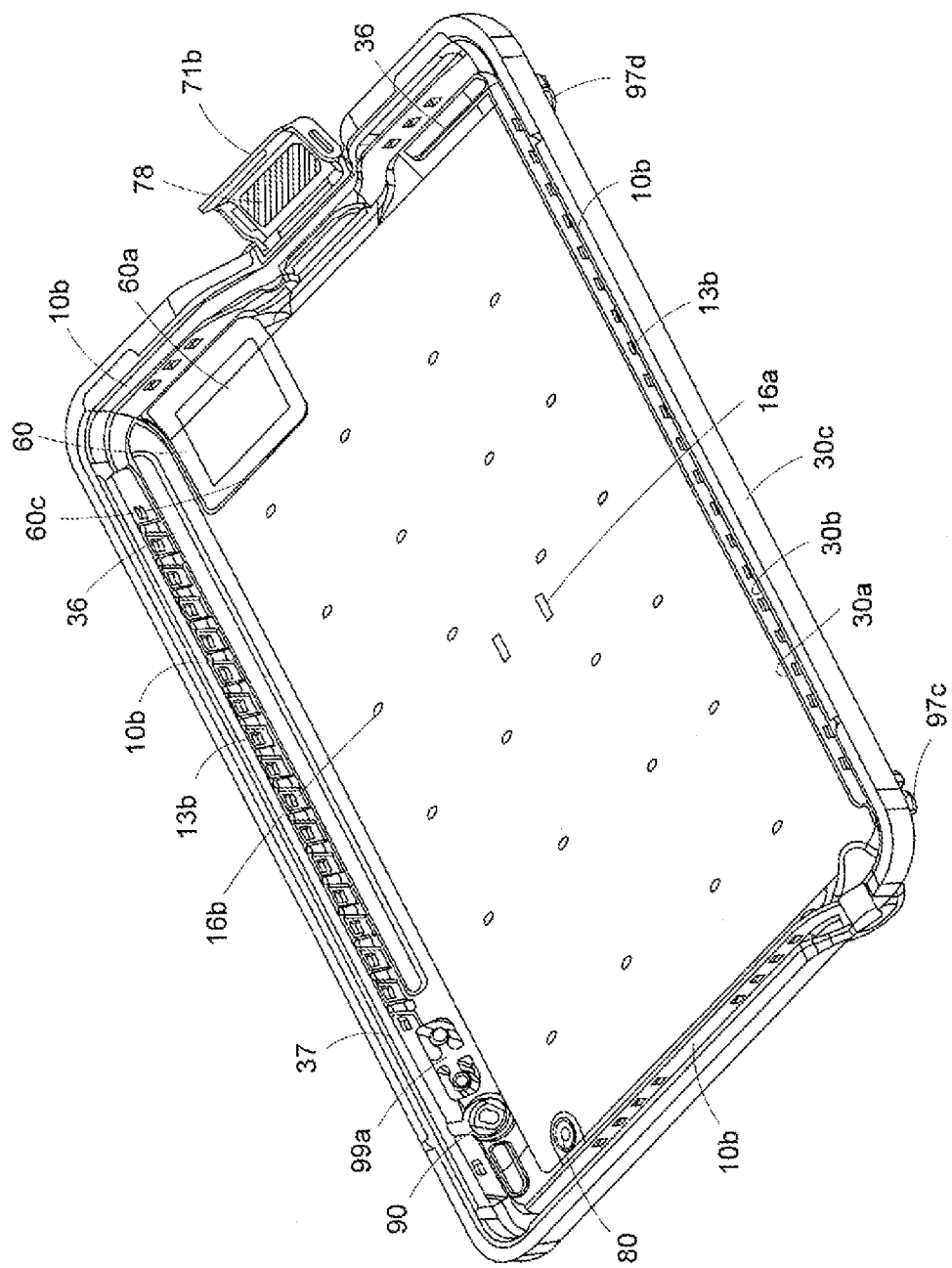

FIG. 3B provides a perspective view of the front (interior) surface 35a of the bottom member 3 of the protective housing 1. As depicted, the bottom member peripheral portion 30 defines the perimeter portion of the bottom member 3, and includes a bottom member interior perimeter portion 30a, a bottom member middle perimeter portion 30b, and a bottom member exterior perimeter portion 30c.

The bottom member interior perimeter portion 30a in conjunction with the bottom member middle perimeter portion 30b form a bottom member channel 10b, into which channel a bottom member sealing member 15b (not shown) may be positioned, such as a gasket, for instance, an O-ring. As indicated above, the gasket can be an independent member removably positioned within the channel, or it may be integrally formed with or otherwise attached to the bottom member peripheral portion. Additionally, the gasket can have any of a number of different configurations and/or compressabilities, as discussed above. In certain instances the bottom member gasket may be an O-ring, which O-ring may be hollow or semi-hollow.

Accordingly, the bottom member interior perimeter portion 30a forms a bottom member channel interior bounding member, e.g., interior bounding wall; and the bottom member middle perimeter portion 30b forms a bottom member channel exterior bounding member, e.g., exterior bounding wall, that together define the channel 10b. The interior and exterior bounding walls may be fabricated from the same or different materials, such as a rigid material, like a rigid plastic, e.g., nylon, polycarbonate, or the like, or a semi-rigid material, such as a polypropylene material, so as to provide structural integrity to the channel positioned between the interior and exterior bounding walls of the bottom member 3 of the housing 1. In certain instances, the interior and exterior bounding walls (of the bottom and/or top member) may run along a portion or the entire perimeter of the top and/or bottom member of the housing, likewise, a top or bottom member channel may circumscribe a portion or the entire perimeter of the top and/or bottom member.

The bottom member middle perimeter portion ("exterior bounding wall") 30b of the bottom member 3 includes a first clasping mechanism 37, which clasping mechanism is configured for engaging a corresponding first clasping mechanism 27 of the top member 2 that when engaged with one another function to both couple the top 2 and bottom 3 members together to form the housing 1, but further function, in conjunction with the one or more housing seals, to produce a substantially waterproof and/or substantially water resistant seal between the top 2 and bottom 3 members when coupled together.

Additionally, the bottom member interior perimeter portion ("interior bounding wall") 30a of the bottom member 3 includes a second clasping mechanism 13b, which clasping mechanism is configured for engaging a corresponding second clasping mechanism 13a of the top member 2 that when engaged with one another also function to both couple the top 2 and bottom 3 members together to form the housing 1, but further function, in conjunction with the one or more housing seals, to produce a substantially waterproof and/or substantially water resistant seal between the top 2 and bottom 3 members when coupled together. It is to be noted that one or both of the interior or exterior bounding walls may or may not include a clasping mechanism or may include different types of clasping mechanisms than presently described, which clasping mechanisms may run along a portion or the entire perimeter of the top and/or bottom member. For instance, the one or more clasping mechanism(s) may extend around about 99% or more, about 95%, about 90%, about 85%, about 80%, about 75%, about 70%, about 65%, about 60%, about 55%, about 50%, about 40%, about 30%, about 25%, about 20%, about 10%, or less of the perimeter, such as where the top and bottom members are joined by a suitable axle element along an entire side or portion thereof.

Further, as indicated above, the clasping mechanisms of the top and bottom member may have any suitable configuration so long as they are capable of interacting with one another in such a manner so as to couple the top member of the housing with the bottom member of the housing. In certain instances, this coupling is in such a manner so as to provide a liquid-proof and/or shockproof seal between the top and bottom members of the housing.

In certain embodiments, the clasping mechanisms may be configured such that they lessen and/or remove the deflection that would be typical when coupling the two top and bottom members of the housing together such as when employing a classic latching mechanism known in the art. For instance, when employing a typical latching mechanism known in the art, e.g., one that clasps at single point along an exterior perimeter portion of the housing, deflection often occurs as a result of a latching mechanism that only exerts a closing force on discrete locations on the opposed latching surfaces. Such a latching mechanism leaves substantial gaps between the various tensioning points. A configuration such as this results in deflection as the two parts of the housing work against each other, because these tensioning points between the gaps are where the opposing forces get integrated and therefore are maximized.

In certain instances, the present housing and features thereof are configured for constraining these oppositional forces. For instance, the top or bottom members of the housing may include opposing clasping mechanism that are configured for dispersing these oppositional forces along the length of the housing thereby minimizing the deflection that may be caused by the sealing of the two members of the housing. In certain instances, one or both of the top or bottom member may include a channel, such as a channel that contains a gasket, a portion of which channel may include a clasping mechanism, as described herein, that is configured for dispersing the opposing forces throughout the channel.

Accordingly, in certain instances, the bottom member 3 includes a channel 10b that is formed by two bounding members, an interior wall bounding member 30a (comprised of the bottom member interior perimeter portion) and an exterior wall bounding member 30b (comprised of the bottom member middle perimeter portion), which bounding members are spaced apart from one another so as to form the bottom member channel 10b. The bottom member channel 10b is further configured for receiving both a sealing gasket 15b and a raised ridge member 26 of the top member 2.

Gaskets of different sizes may be included so as to facilitate a liquid-tight sealing of the housing. A gasket may be positioned wherever a watertight sealing is beneficial, such as within channels 10a and/or 10b. It is to be noted, however, that the inclusion of such a gasket may create additional opposing forces as the gasket resists the compression caused by the coupling together of the two members of the housing. The one or more clasping mechanisms, therefore, may be configured to be substantially continuous along a substantial circumference of the perimeter so as to better disperse these oppositional forces. Such a continuous, circumferential clasping system may wrap around the entire or a substantial portion of the circumference of the device, minimizing transitional gaps and dispersing the oppositional forces that build up in gaps between tensioning points. However, since the top member gasket is not part of a latching system requiring greater compressibility to establish an appropriate sealing, the top member gasket may be a hollow gasket that allows for greater compressability with less force needed to generate an effective seal.

For example, as depicted in FIG. 3B, a channel 10b is included within bottom member 3, which channel 10b includes a gasket 15b which are configured together so as to constrain the oppositional forces caused by clasping the top 2 and bottom 3 members together, e.g., via clasping mechanisms 27 and 37. In such an instance, the oppositional forces can be constrained to the small space of the channel and further be minimized by a tight coupling of the clasping mechanisms of the top and bottom members 27 and 37, respectively. This is especially beneficial where a less compressible gasket 15, such as an O-ring, is included in the channel 10 so as to further compress the gasket and thereby generate a liquid-tight seal.

Accordingly, the raised ridge member 26 of the top member 2 includes a plurality of clasping mechanisms, e.g., first 27 and second clasping mechanisms 13a, that engage corresponding clasping mechanisms, e.g., 37 and 13b, respectively, of the bottom member 3, when the top member 2 and the bottom member 3 are coupled together to form the housing 1. These corresponding clasping mechanisms are configured, therefore, to effectuate a strong coupling, such as a substantial shockproof coupling, of the top member 2 with the bottom member 3. Additionally, the top member raised ridge member 26 further includes a top surface that is configured for engaging and compressing the bottom member gasket 15b in the bottom member channel 10b, in such a manner that as the top member 2 and the bottom member 3 are coupled together to form the housing 1, a substantially waterproof and/or substantially water resistant seal is produced between the top and bottom members of the housing.

Additionally, as an be seen with respect to the clasping mechanism 13 of the bottom member 3, the interior bounding wall 30a includes detents or openings that form teeth receptacles 13b, which teeth receptacles are configured for engaging with corresponding the teeth 13a of a top member 2. Accordingly, when teeth 13a and teeth receptacles 13b are engageably aligned together as the top member 2 and bottom member 3 are coupled to form the protective housing 1, the teeth 13a of the second clasping mechanism 13, disposed on an interior surface of the raised ridge member 26 of the top member 2 reversibly interphase with the teeth receptacles 13b disposed in the interior bounding wall 30a of the bottom member 3. Further, in this embodiment, as the engagement of the teeth 13a with the teeth receptacles 13b occurs, the first clasping mechanism 27 of the top member reversibly engages with the first clasping mechanism 37 of the bottom member 3.

As depicted, the teeth and receptacle clasping feature 13 of FIGS. 3A and 3B may include one or more sections of one or more teeth 13a, and likewise, the clasping feature 13 may also include one or more sections of one or more teeth receiving members 13b. The tooth or teeth 13a are configured for interfacing with the tooth or teeth receiving members 13b in such a way that as the teeth 13a are coupled with the teeth receiving members 13b, the top member 2 and bottom member 3 are coupled together so as to form the housing 1. In certain embodiments, the teeth 13a may be positioned along a peripheral portion of a top 2 or bottom 3 member, and the corresponding top or bottom member will have the corresponding teeth receiving members 13b. In this instance, the teeth 13a are positioned along a middle perimeter portion 20b of the top member 2, and the teeth receiving members 13b are positioned along an interior perimeter portion 30a of the bottom member 3. However, in other instances, the teeth 13a may be positioned along a peripheral portion 30 of the bottom member 3, and the teeth receiving members 13b may be positioned along a peripheral portion 20 of the top member 2.

As depicted with respect to FIGS. 3A and 3B, there are six teeth regions positioned along the perimeter portion 20b of the top member 2. Each teeth region may include one or a plurality of teeth. In this instance, each teeth region 13a includes a plurality of teeth. The teeth 13a extend laterally and internally toward the internal cavity of the housing away from the longitudinal length of the interior perimeter member 20b of the top member 2. The teeth 13a are configured for being received within corresponding teeth receiving members 13b of the bottom member 3.

Consequently, as depicted, there are six teeth receiving regions 13a, positioned along the interior perimeter, e.g., interior bounding member, 30a of the bottom member 3. However, it is noted that not all teeth need to have a corresponding tooth receiving receptacle within which to fit, so long as a substantial portion do. As depicted, the teeth receiving members 13b are configured as apertures within which the teeth 13b may be fitted. Accordingly, as the top member 2 is coupled to the bottom member 3 the teeth 13a of the six teeth regions interface and engage with the corresponding teeth receiving members 13b of the six teeth receiving member regions of the bottom member 3.

Hence, the housing 1 is therefore formed by the coupling of the top member 2 with the bottom member 3 and sealed by the clasping mechanisms 27 and 37 as well as clasping mechanisms 13a and 13b joining together. It is noted that in various embodiments, either clasping mechanisms 27 and 37 or 13a and 13b may be provided individually by themselves or in combination. Additionally, although clasping mechanisms 13a and 13b have been described herein as being positioned around the perimeter portion in 6 different regions, they can be so positioned in more or less than six regions, so long as they are capable of providing a liquid proof and shock proof sealing thereby.

Accordingly, it is to be noted that the teeth and teeth receiving members may have any suitable configuration so long as they are capable of interacting with one another so as to couple the top and bottom members of the housing together. Hence, the number, size, and location of the teeth and/or corresponding teeth receiving members may vary. For example, one long tooth or several short teeth may be included. The teeth and receptacles may be positioned along the entire perimeter portion or any number of sub-portions thereof. As depicted, there are six teeth regions positioned along all four sides of the top member. However, the teeth can be positioned on the bottom member instead of the top member and/or where desired one, two, three, four, five, six, or more teeth regions can be included along one, two, three, four, five, six, or more sides of the top or bottom member. It is also to be noted that the teeth and/or teeth receiving members can be positioned on either or both of the top or bottom members as well as on the interior or exterior perimeter portions, as desired.

Due to the unique clasping system of the disclosure, as described herein, a small latching cross section is provided, which small latching cross section solves the problems of: how to close/assemble the housing and keep it joined together, how to minimize the material necessary to make the housing (so thicker materials are not required in order to resist the band inflection), and ensuring the gasket, e.g., O-ring, is suitably compressed between the two case housings, thereby creating a liquid-proof and seamless seal. A unique feature of the small latching cross section of the perimeter portion clasping mechanisms herein depicted are that they are entirely internal to the housing 1.

By "entirely internal to the housing" is meant that the corresponding clasping mechanisms 27 and 37 and/or 13a and 13b are entirely within the bounds of the housing 1 such that when the top member 2 is coupled to the bottom member 3 the corresponding clasping mechanisms 27 and 37 and/or 13a and 13b are contained entirely within the inside of the housing and not exterior thereto, e.g., the clasping mechanisms may be positioned along the inside of the perimeter of the housing 1. Accordingly, in the embodiment of FIG. 3, the depicted clasping mechanisms are entirely internal clasping mechanisms. By "entirely internal clasping mechanisms" is meant that the clasping mechanisms are configured for being coupled together in such a manner that when the top and bottom members are coupled together and the housing formed, the clasping mechanisms are entirely internal to the outer bounds of the housing, e.g., they are internal to the housing, such as contained within an internal cavity within the housing. Such internal clasping mechanisms are internal to the housing and not observable by looking at the external perimeter portion. Additional latching elements, such as external latching mechanisms, of course can further be included, e.g., along an outside perimeter of the housing, so as to further ensure that a liquid-tight seal is provided, however they are not needed. Additional internal latching mechanisms may also be provided.

Hence, a plurality of clasping mechanisms both internal and/or external may be included as part of the housing. For instance, the housing may include one or a plurality of internal clasping mechanisms and/or one or a plurality of external clasping mechanisms. As explained below in greater detail with respect to FIG. 5, the clasping mechanisms may have a variety of different configurations. For example, the top and bottom members may each include an internal clasping mechanism that is configured as opposing catches or extended portions and grooves, and/or a rib with extended protrusion member and groove configuration, hooks and loops, etc., which clasping mechanisms may circumscribe an internal portion of the perimeter of the top and bottom members. Alternatively, or in addition to the opposing catch mechanisms, the top and bottom member may include an internal clasping mechanism that is configured as male and female counterparts, e.g., teeth and holes, as described above with respect to FIG. 3. Additionally or alternatively the housing may include an external clasping mechanism that may have any suitable configuration such as a clip or peg and slot configuration.

Also, as depicted with respect to FIG. 3B, the interior perimeter portion 30a of the peripheral portion 30 of the bottom member 3 may additionally include a further interior portion that is comprised of one or more flexible moulded areas, such as moulded areas 36 that have been configured to form right hand, left hand, top, and bottom bumper portions 36. Bumpers 36 may function to assist in the placement of an electronic device in the protective housing and/or so as to mitigate unwanted movement and/or potential damage of an electronic device within the protective housing 1.

An acoustic membrane feature 60 is also depicted. The acoustic membrane feature 60 is configured as a speaker transmission port having a plurality of speaker port transmission apertures or outlets (not shown), which in this embodiment are covered by a speaker transmission port waterproof gasket 60a. The waterproof gasket 60a may be permeable to sound but is impermeable to liquid, including water, as well as dust, dirt, and the like. The speaker out let apertures traverse from an interior to an exterior of the housing thereby facilitating the transmission of sound from a speaker transmission portion of a housed device through and out of the housing. The waterproof gasket, of course, prevents the ingress of water into the housing through said apertures.

Also depicted is a latch feature door 71b having a sealing gasket 78 attached thereto for covering a charge port feature 70, an inner view of the orientation switch 90 and the volume control portion 99a, as well as a lens feature 80 visible on the bottom surface member 35 of the bottom member 3. Standoffs 16a and/or bridges 16b are shown as configured to raise an encased device above the plane of the bottom member surface 35.

Figure 3C:
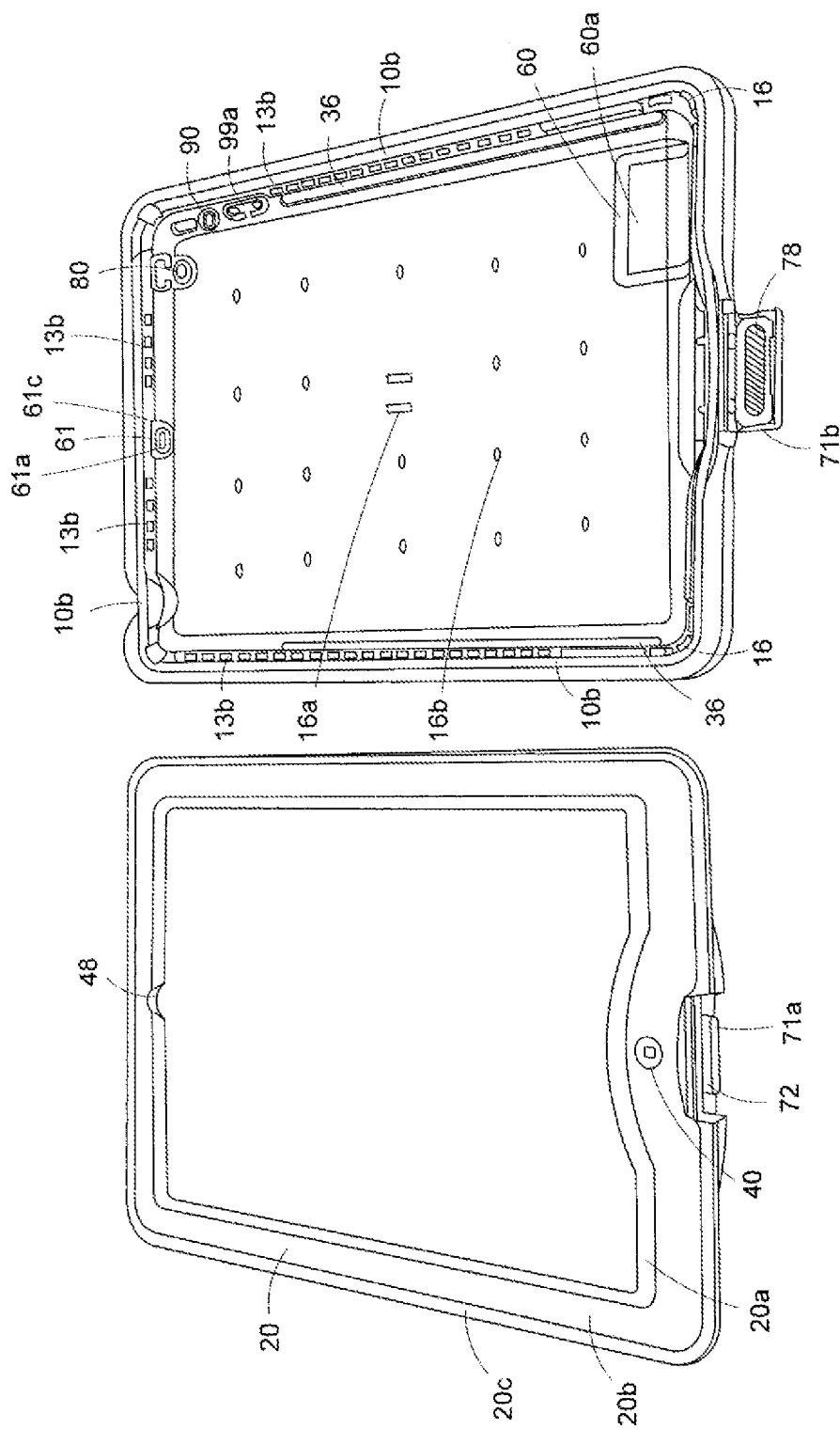

FIG. 3C shows a downward perspective view of the front surface of the top member 2 (left side) and a view of the front surface of the bottom member 3 (right side) depicting the two top and bottom members as they would be when placed together upon engagement of an electronic device in the protective housing. The home button 40 is depicted on the top peripheral portion 20 of the top member 2. Also visible in this view is the proximity sensor portion 48 on the top member interior perimeter portion 20a. The bottom member 3 (right side) comprises the bottom member peripheral portion 30, including a bottom member interior perimeter portion 30a, a bottom member middle perimeter portion 30b, and a bottom member exterior perimeter portion 30c, as well as bottom member front and back surface 35.

The bottom member interior 30a and middle 30b perimeter portions form a channel 10b into which a sealing member, such as a gasket, e.g., an O-ring may be fitted (not shown). The interior perimeter portion 30a includes a clasping mechanism 13b, which in this embodiment is configured as a plurality of regions of a plurality of openings or teeth receiving members, e.g., teeth receptacles. Accordingly, teeth receptacles 13b are depicted as openings passing interiorly from channel 10b towards the cavity of the housing 1 on the bottom member middle perimeter portion 30b, and the channel 10b is defined by the exterior bounding wall 30b and the interior bounding wall 30a. Upon joining the top member 2 with the bottom member 3, the teeth 13a of the top member 2 (not shown) reversibly interphase with the teeth receptacles 13b of the bottom member 3.

The bottom member front surface 35 of the bottom member includes right hand and left hand bumpers 36a and 36b respectively that assist in the placement of an electronic device in the protective housing so as to mitigate unwanted movement and/or potential damage of an electronic device within the protective housing. Also depicted is a latch door 71b, comprising gasket 78 for covering a charge port feature so as to provide a liquid-proof seal for the latch feature 70; a speaker transmission port 60 having a waterproof speaker gasket 60a; microphone transmission port 61, having a waterproof microphone gasket 61a, and microphone gasket overmoulding 61c, as well as a lens feature 80 visible on the top surface 35 of the bottom member 3. Standoffs 16a and/or bridges 16b, which bridges 16b together may form a standoff channel, are shown as configured to raise an encased device above the plane of the bottom member surface 35.

Figure 4A:
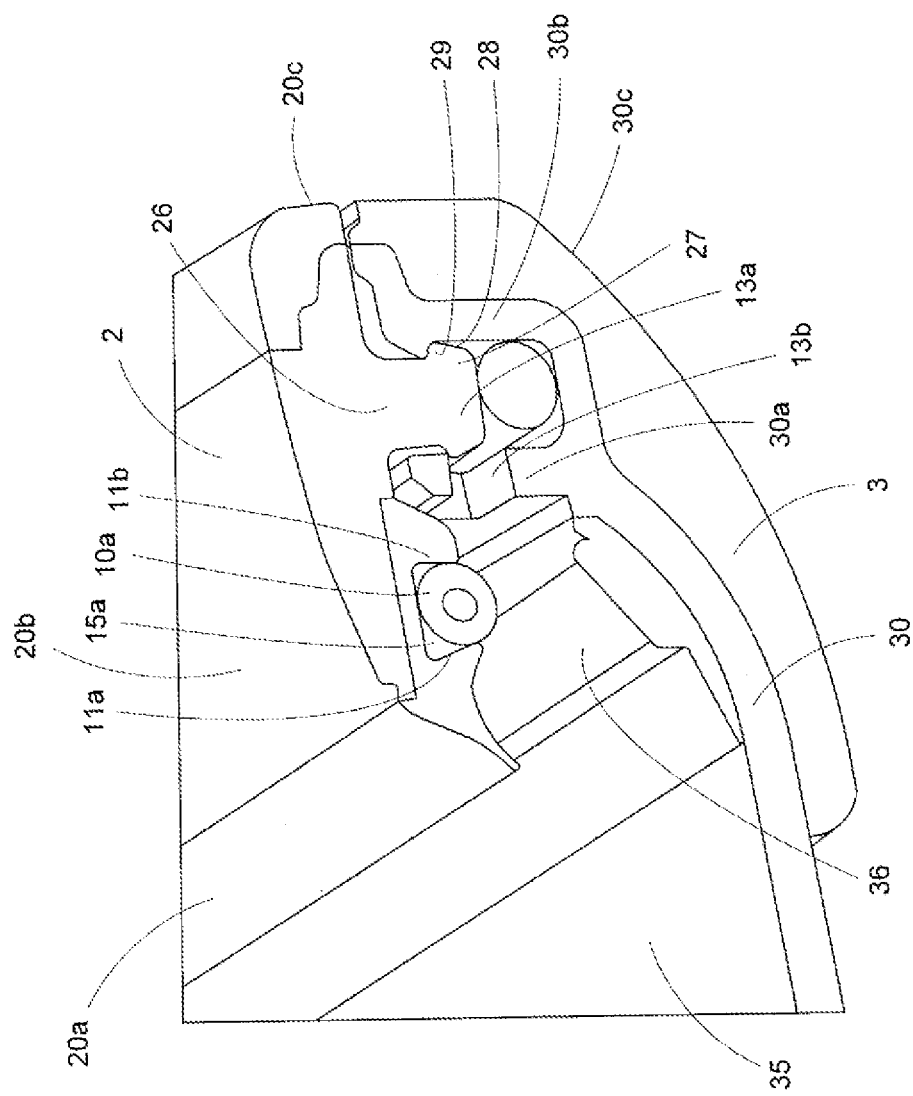
FIGS. 4A-N provide perspective views of different clasping mechanisms of the protective housing, including cross-sectional views of the clasping mechanism(s).

As can be seen with respect to FIG. 4A, a housing 1 is provided, wherein the housing includes a top member 2 and a bottom member 3, which are configured for being coupled together so as to form the waterproof and shockproof housing 1. In this embodiment, the top member 2 includes a peripheral portion 20 that further includes three sub-portions: an interior perimeter portion 20a, a middle perimeter portion 20b, and an exterior perimeter portion 20c. Likewise, the bottom member 3 includes a peripheral portion 30 that further includes three sub-portions: an interior perimeter portion 30a, a middle perimeter portion 30b, and an exterior perimeter portion 30c. The top member middle perimeter portion is fabricated from a rigid or semi-rigid material that forms a skeletal framework for the top member 2, which framework is adapted to model the contours of the electronic device to be housed therein.

The top member 2 is configured for forming a waterproof seal when coupled both to the electronic device 100 as well as when coupled to a corresponding bottom member 3. Accordingly, the top member 2 includes a plurality of features that facilitate these sealing functions. For instance, the top member interior perimeter portion 20c is made of a flexible or semiflexible material and is configured for including one or both of a wiper portion and a channel portion 10a.

The wiper portion is configured as a slanting edge that resembles a windshield wiper of an automobile and is adapted to perform a similar function. Specifically, the wiper section has a slanted edge portion that serves as an interface between a top surface of a housed device and the rigid frame of the middle perimeter portion. The slanted edge slants interiorly downwards from a top edge of the middle perimeter portion 20b until it meets with the top surface or edge of a housed device 100. The tip portion of the slanted edge is flexible enough to bend to conform to the top surface of the device, but rigid enough to retain its shape. Therefore, the interface between the wiper and the top surface is a tight, cohesive interface that substantially prevents the ingress of liquid and/or dust and/or dirt underneath the wiper.

The channel portion 10a is formed exteriorly to the wiper portion and is comprised of both interior and exterior channel walls 11a and 11b, which walls are configured for retaining a top member sealing member, e.g., gasket 15a, therein. The gasket may a separate member that is added to the channel or it may be preformed along with the channel so as to be one piece therewith. The gasket may be any suitable sealing member capable of performing the function of engaging a top or top edge surface of the electronic device to be housed, being compressed thereby, and consequently forming a waterproof and/or dustproof sealing therewith. In certain embodiments the gasket is an O-ring, such as a hollow O-ring that is capable of being compressed from a first expanded diameter to a second compressed diameter, such as from 1-50% of its original, non-compressed diameter. In some instances this compression may be from 1-75%.

The top member 2 is additionally configured for engaging a bottom member 3 in such a manner that as the housing 1 is formed, the interface between the top and bottom members forms a waterproof and/or dust and/or dirtproof seal. Accordingly, in one embodiment, the bottom member 3 includes a bottom member channel 10b that includes a bottom member gasket 15b. This gasket may have the same functionalities as that of the top member gasket 15a, however, it is typically not hollow and is typically less compressible. The compressibility of this gasket is from about 1% to 30%, but may range from 1% to 50%.

The bottom member 3 and/or its component parts may be comprised of the same or different materials. As depicted with reference to FIG. 4A the bottom member is composed of a bottom member that forms both a bottom member surface 35 that is configured for receiving the bottom-back surface of the device to be housed so as to cradle the device therein. Accordingly, in this embodiment the bottom member surface is adapted to the contours of the back surface of the device to be retained. Hence the back surface may be substantially flat and planar or may be curved, or the like. Further, in this embodiment, the back surface 35 has a peripheral portion 30 that is primarily contiguous with the back surface 35 and thus fabricated from the same material. The bottom member peripheral portion 30, however, may be configured to include various different features such as a bottom member channel 10b. The bottom member channel 10b is bounded by the bottom member interior perimeter portion 30a and the bottom member middle perimeter portion 30b.

In this embodiment, both the top member 2 and the bottom member 3 peripheral portions 20 and 30 both include flexible or semi-flexible exterior perimeter portions 20c and 30c, respectively, that are coupled to their respective frameworks such as by moulding, e.g., overmoulding. These flexible overmoulded portions function in part to provide a shockproof cushioning for the housing 1.

As indicated above, the coupling of the top member 2 with the bottom member 3 is such that a waterproof and/or dust and/or dirtproof sealing is accomplished by said coupling. To help effectuate this coupling the top member 2 middle perimeter portion 20b includes an elongated member that extends downwards from the plane of the top member surface. This extended member is formed as a raised ridge 26. In this embodiment, the raised ridge member 26 is configured for being received within the channel 10b of the bottom member 3 and for performing at least a plurality of functions therein.

First, it includes a top member first and a second clasping mechanism 27 and 13a, both of which are configured for engaging corresponding clasping mechanisms 37 and 13b on the bottom member 3. Secondly, it includes a bottom gasket interface surface that is configured for engaging and compressing a bottom member gasket 15b. Hence, as the top member raised ridge portion 26 impinges into the bottom member channel 10b, its top surface engages and compresses the bottom member gasket 15b, and its first and second clasping mechanisms 27 and 13a engage their corresponding bottom member clasping mechanisms 37 and 13b thereby generating the waterproof and/or dustproof and/or dirtproof sealing at the interface between the top member 2 and bottom member 3 when they are coupled together to form the housing 1. As indicated, to effectuate a firm and secure sealing the bottom member 3 includes both a first and a second clasping mechanism 37 and 13b. In this embodiment, the first clasping mechanism is positioned on the bottom member middle perimeter portion 30b and the second clasping mechanism is positioned on the bottom member interior perimeter portion 30a. However, as described herein, this positioning may differ where the first and second clasping mechanisms are positioned at different positions along the top and bottom members and/or have different configurations as described herein. It is also to be noted that although two clasping mechanisms are described, one, two, three or more clasping mechanisms may be included.

As indicated above, a top 2 and bottom 3 member of the housing 1 is configured to include one or more clasping mechanisms that may have one of a number of different configurations and may be positioned within the housing at a number of different places. Accordingly, the remainder of the description of FIG. 4 is directed to a number of different configurations for the referenced clasping mechanisms. It is to be understood that this description is for exemplary purposes only and is not meant to be unduly limiting. The various clasping mechanisms herein described may be employed individually or in combination with one another.

Accordingly, with respect to FIG. 4A, the top 2 and bottom 3 members include a first and a second clasping mechanism. The first clasping mechanism is configured as follows. The first clasping mechanism 27 of the top member includes a slanting surface 28 that is intersected by an intersecting surface 29. Together the slanting surface 28 and the intersecting surface 29 form an edge, or lip, or a groove, or catch that comprises the clasping mechanism 27 of the top member 2. The slanting surface 28 and intersecting surface 29 form an angle. Additionally, the first clasping mechanism 37 of the bottom member has a corresponding configuration that includes a slanting surface 38 that is intersected by an intersecting surface 39. Together the slanting surface 38 and the intersecting surface 39 form an edge, or lip, or a groove, or catch that comprises the clasping mechanism 37 of the bottom member 3. The slanting surface 38 and intersecting surface 39 form an angle. For instance, the slanting surfaces of the first clasping mechanism may slope with respect to the intersecting surface at a degree that ranges from 0 to about 90 degrees, such as from about 5 or about 10 degrees to about 80 or 85 degrees, for instance, from about 15 or 20 degrees to about 70 or 75 degrees, such as from about 30 or 40 degrees to about 50 or 60 degrees, including about 45 degrees.

Accordingly, the clasping mechanism 27 of the top member 2 is configured for engaging a corresponding clasping mechanism 37 of bottom member 3. The corresponding clasping mechanisms may have corresponding surfaces, e.g., lip or edge regions or may have different, but complimentary surfaces. In this instance, the top member 2 has a peripheral portion 20 having a clasping mechanism 27 that includes a lip or edge region that comprises a slanting surface 28 that is intersected by an intersecting surface 29. Likewise, the bottom member 3 has a peripheral portion 30 having a clasping mechanism 37 that also includes a lip or edge region that comprises a slanting surface 38 that is intersected by an intersecting surface 39. In this embodiment, the corresponding lip or edge regions are configured for being coupled together.

It is to be noted that although a particular configuration of clasping mechanisms 27 and 37 are depicted, e.g., as corresponding catch clasping mechanisms, other configurations may also be suitable, for instance, where the slanted surfaces are straight or substantially straight, etc. For example, in one embodiment, one of a top or bottom member may have a clasping member configured as described above, e.g., having a lip edge region, and the corresponding member may have a clasping member that is configured as a receiving element, such as a groove, e.g. a circumferential groove, that is adapted for receiving the corresponding lip edge of the opposing member.

In this instance, the slanting surface 28 and the intersecting surface 39 comprise the clasping mechanism 27 of the top member 2, which clasping mechanism is configured for engaging corresponding surfaces of the bottom member 3 clasping mechanism 37. Together the top and bottom clasping mechanisms 27 and 37 respectively form opposing snap closures that are configured for interacting with one another in such a manner that when they are coupled together, e.g., snapped together, they seal the housing, for instance, in a liquid-proof seal.

It is to be noted in this embodiment, the clasping mechanisms 27 and 37 are entirely internal clasping mechanism that circumscribe the entire perimeter of the housing. Although the top and bottom clasping mechanisms have been described herein with respect to one particular configuration, e.g., entirely internal and circumscribing the entire perimeter portion, it is to be understood that this configuration is a non-limiting example and may be modified in various ways so long as the clasping mechanisms are capable of being joined together in a manner sufficient to couple the top and bottom members together and thereby seal the housing.

The housing 1 additionally includes a second clasping mechanism, which clasping mechanism may be employed in addition or as an alternative to one or more of the clasping mechanisms set forth herein. In this embodiment, the second clasping mechanism 13 includes one or more sections of one or more teeth 13a. The corresponding clasping mechanism 13 of bottom member 3 includes one or more sections of one or more teeth receiving members 13b. The tooth or teeth 13 of top member 2 are configured for interfacing with the tooth or teeth receiving members 13b of the bottom member 3 in such a way that as the teeth 13a are coupled with the teeth receiving members 13b, the top member 2 and bottom member 3 are coupled together so as to form the housing 1.

For instance, in certain embodiments, the teeth 13a may be positioned along a perimeter portion of a top 2 or bottom 3 member, and the corresponding member will have the teeth receiving members 13b. In this instance, the teeth 13a of the top member 2 are positioned along an interior facing surface of the raised ridge member 26 of the top member middle perimeter portion 20b, and the teeth receiving members 13b of the bottom member 3 are positioned along an interior perimeter portion 30a of the bottom member 3. However, in other instances, the teeth may be positioned along a perimeter portion of the bottom member, and the teeth receiving members may be positioned along a perimeter portion of the top member.

The teeth 13a and teeth receiving members 13b may be included along several regions along the interior surface of the top and/or bottom members 2 and 3. Each teeth/receiving region may include one or a plurality of teeth/receiving openings. The teeth extend laterally and internally toward the internal cavity of the housing away from the longitudinal length of the raised ridge 26 of the top member 2. The teeth 13 are configured for being received within corresponding teeth receiving members 13b of the bottom member 3. Also, as depicted, the teeth receiving members 13b are configured as apertures within which the teeth 13a may be fitted. Accordingly, as the top member 2 is coupled to the bottom member 3 the teeth 13a of teeth regions interface and engage with the teeth receiving members 13b of the teeth receiving member regions of the bottom member 3 and the housing 1 is therefore formed by the coupling of the top member 2 with the bottom member 3 and sealed by the clasping mechanisms 27 and 37 as well as clasping mechanisms 13a and 13b joining together.

It is to be noted that the teeth and teeth receiving members may have any suitable configuration so long as they are capable of interacting with one another so as to couple the top and bottom members of the housing together. Hence, the number, size, and location of the teeth and/or corresponding teeth receiving members may vary. For example, one long tooth or several short teeth may be included. The teeth may be positioned along the entire perimeter portion or any number of sub-portions thereof. However, the teeth can be positioned on the bottom member instead of the top member and/or where desired one, two, three, or more teeth regions can be included along one, two, three, or more sides of the top or bottom member.

Likewise, one long tooth receiving member or several short teeth receiving members may be included. The teeth receiving members may be positioned along the entire perimeter portion or any number of sub-portions thereof. The teeth receiving members are configured so as to correspond to and interact with the teeth members so as to secure and seal the housing when the top and bottom members are coupled together. It is to be noted that the teeth and/or teeth receiving members can be positioned on either or both of the top or bottom members as well as on the interior or exterior perimeter portions, as desired.

Figure 4B:
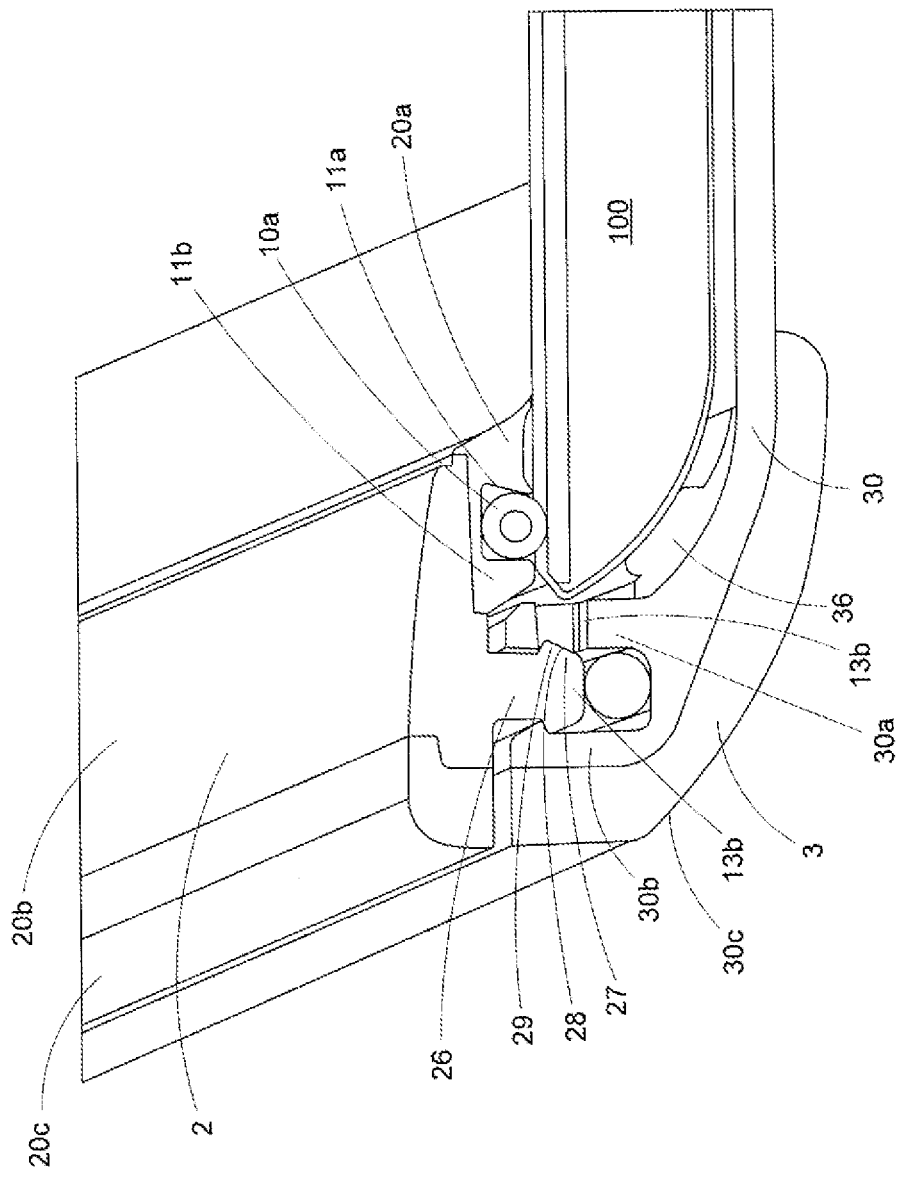

FIG. 4B depicts a left-hand cross section portion of the clasping mechanism of the housing 1 of FIG. 4A. The housing 1 includes a first interior clasping mechanism 27 and 37, as well as a second interior clasping mechanism 13 interiorly to the first. As depicted, the interior clasping mechanisms 27 and 37 as well as 13 are entirely internal clasping mechanisms. The entirely internal clasping mechanism 27 and 37 circumscribes the entire internal circumference of the perimeter of the housing 1. This entirely internal clasping mechanism 27 and 37 effectively seal the housing in such a manner that the seal is internal to the housing. As depicted, the entirely internal clasping mechanism is configured as a catch and groove clasping mechanism.

For instance, the top member includes an internal clasping mechanism configured as an extended lip or catch 27, and the bottom member includes a corresponding internal clasping mechanism configured as a groove 37, which groove runs circumferentially along an interior face of the bottom member middle perimeter portion. The top member lip or catch 27 and bottom member groove 37 are configured for being coupled together so as to seal the housing members 2 and 3 one with the other. Likewise, the top member includes an internal clasping mechanism configured as a plurality of regions of a plurality of teeth 13a, and the bottom member includes a corresponding internal clasping mechanism configured as a plurality of regions of a plurality of corresponding teeth receiving receptacles 13b, which regions run circumferentially along their respective peripheral portions. The top member teeth 13a and bottom member receptacles 13b are configured for being coupled together so as to seal the housing members 2 and 3 one with the other. It is to be noted that although the first and second clasping mechanisms are depicted as particular internal clasping mechanisms, in a certain embodiment, other variations to these entirely internal clasping mechanisms can be provided without departing from the nature of this disclosure. For instance, in certain instances, the clasping mechanism need not circumscribe the entire perimeter portion of the top and/or bottom member, need not be entirely internal, and may be configured differently from the catch and groove configuration set forth herein.

Figure 4C:
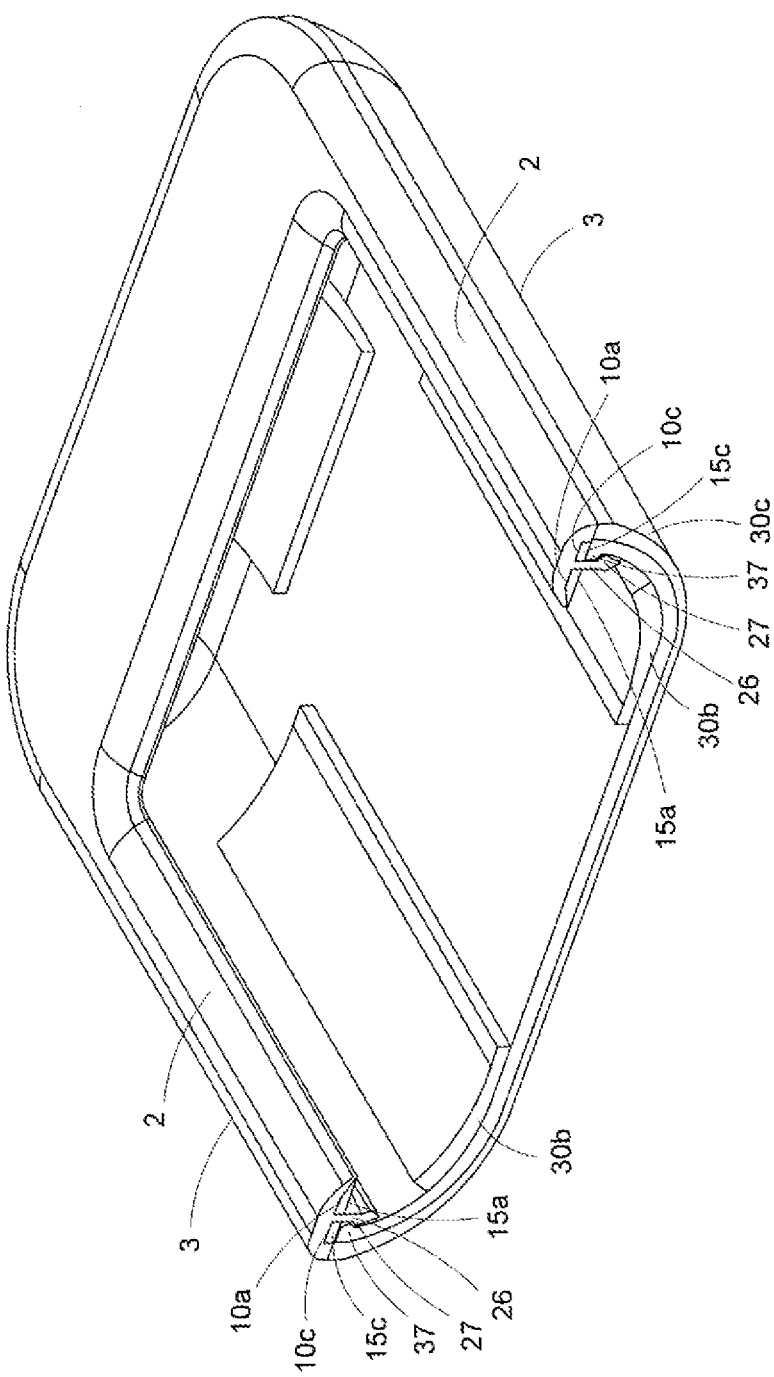

For instance, FIG. 4C provides a different configuration of a clasping mechanism 27 and 37 of the disclosure. In this embodiment, clasping mechanism is configured as either a "T" or a "J" shape, wherein the undersurfaces of the horizontal tines of the T or the J include sealing gaskets, which gaskets are configured for engaging corresponding surface of either a housed device or housing member. It is to be noted that although the horizontal surface of the "T" or "J" is depicted as flat, it could be curved or bent or otherwise slanted at an angle from 1-180 degrees dependent on the type of housing to be employed.

Accordingly, the housing 1 includes a single clasping mechanism that is designed to interface with a device to be inserted in the housing in such a manner that when inserted a surface of the device abuts the latching mechanism thereby serving as a supporting member that keeps the latching mechanism of the housing engaged, so long as the device is retained within the housing.

Accordingly, with respect to FIG. 4C, a housing 1 is provided, wherein the housing includes a top member 2 and a bottom member 3, which are configured for being coupled together so as to form the waterproof and shockproof housing 1. In this embodiment, the top member 2 includes a single perimeter portion 20, however, in various other instances, the top member may include a peripheral portion 20 that further includes three sub-portions: an interior perimeter portion 20a, a middle perimeter portion 20b, and an exterior perimeter portion 20c. In this embodiment, the peripheral portion 20 of the top member 2 is configured for framing and providing shock proof protection to the housing 1. The bottom member 3 includes a peripheral portion 30 that includes three sub-portions: an interior perimeter portion 30a, configured as a cushioning and/or spacing member; a middle perimeter portion 30b, configured as a rigid skeletal framing member, and an exterior perimeter portion 30c, configured as a cushioning bumper portion for providing shockproof protection to the housing 1. The top member perimeter portion 20 is fabricated from a rigid or semi-rigid material that forms a skeletal framework for the top member 2, which framework is adapted to model the contours of the electronic device to be housed therein.

The top member 2 is configured for forming a waterproof seal when coupled both to the electronic device 100 as well as when coupled to a corresponding bottom member 3. Accordingly, the top member 2 includes a plurality of features that facilitate these sealing functions. For instance, the top member includes a plurality of channel members 10a and 10c that are configured for receiving therein a plurality of sealing members, e.g., gaskets 15a and 15c, which channel and gasket members are adapted for forming a waterproof and/or dustproof and/or shockproof seal when the top member is coupled to both a housed electronic device and bottom member so as to form the housing 1 around the electronic device.

In particular, in this embodiment, the top member perimeter portion includes a raised ridge member 26 that bounds both the first channel 10a on one side and the second channel 10c on another side. With respect to the first channel 10a, the raised ridge member 26 forms an exterior channel bounding member; and with respect to the second channel 10c, the raised rigid member 26 forms an interior channel bounding member. The top member perimeter portion 20 may further be configured such that it includes a first channel interior bounding member, and further configured such that it also includes a second channel exterior bounding member, although it is noted that one or both of these bounding member need not be present.

The first channel 10a includes a first sealing member such as a gasket 15a. The gasket is configured for engaging a top surface of a device when the device is coupled to the top member, and which coupling results in a waterproof and/or shockproof and/or dirtproof sealing being generated between the first gasket 15a and a top surface or top edge of the electronic device. The interior perimeter edge of the top member perimeter portion 20 at this interface may be configured as a wiper portion, as described above. Also, as described above, this gasket may be hollow and compressible from 1 to 75%.

The second channel 10c includes a second sealing member such as a gasket 15c. The gasket is configured for engaging a gasket engaging surface 36 of a middle perimeter portion 30b of a bottom member 3 when the top member 2 is coupled to the bottom member 3, and which coupling results in a waterproof and/or shockproof and/or dirtproof sealing being generated between the top member 2 and the bottom member 3 when the two are coupled together so as to form the housing 1, such as by the compression of the second gasket 15c within the second channel 10c, via pressure asserted against it by the gasket engaging surface 36 of the bottom member middle perimeter member. This seal is further effectuated by the coupling of the top member clasping mechanism 27 engaging with the bottom member clasping mechanism 37, as described herein. As described above, this gasket may be hollow, but is typically not hollow and is typically compressible from 1 to 30%.

Accordingly, the top member 2 is configured for engaging a bottom member 3 in such a manner that as the housing 1 is formed, the interface between the top and bottom members forms a waterproof and/or dust and/or dirtproof seal. To effectuate this coupling the top member perimeter portion 20 includes an elongated member 26 that extends downwards from the plane of the top member surface. This extended member is formed as a raised ridge 26. In this embodiment, the raised ridge member 26 is configured for engaging an extended portion 36 of the bottom member middle perimeter portion 30b, which portion includes both a gasket abutting surface and a clasping mechanism 37 that is configured for engaging a corresponding clasping mechanism 27 of a top member 2.

The top member raised ridge includes a top member clasping mechanism 27. The top member clasping mechanism includes a surface 28, which surface is depicted as slanted. It is to be noted that although this surface is depicted as slanted, in certain embodiments, it may have a different configuration, for instance, it may be substantially straight. The top surface clasping mechanism 27 also includes an intersecting surface, which in this instance is also an interfacing surface 29. The interfacing surface 29 is depicted as a horizontal surface that intersects surface 28. However, this configuration may be modified so long as a suitable clasping mechanism is formed thereby. In this manner a lip or edge is formed, which edge is configured for interfacing with a corresponding clasping mechanism, e.g., a lip edge or groove member, of a bottom member so as to couple and seal the top and bottom members together.

The bottom member 3 also includes a raised ridge member 36. The bottom member raised ridge 36 includes a bottom member clasping mechanism 37. The bottom member clasping mechanism includes a surface 38, which surface is depicted as slanted. It is to be noted that although this surface is depicted as slanted, in certain embodiments, it may have a different configuration, for instance, it may be substantially straight. The bottom surface clasping mechanism 37 also includes an intersecting surface, which in this instance is also an interfacing surface 39. The interfacing surface 39 is depicted as a horizontal surface that intersects surface 38. However, this configuration may be modified so long as a suitable clasping mechanism is formed thereby. In this manner a lip or edge is formed, which edge is configured for interfacing with a corresponding clasping mechanism, e.g., a lip edge or groove member, of a bottom member so as to couple and seal the top and bottom members together.

It is to be noted, that in this embodiment, the top member raised ridge 26 further includes a device engaging surface that is configured so as to engage a to or side or edge surface of a housed device. This engagement acts as a bounding and supporting member for effectuating the sealing of the housing. For instance, a suitable surface of the housed device forms a bounding member against which the lateral, internal movement of the raised ridge member 26 is prevented by the presence of the device. Hence, the raised ridge member is prevented from moving inwards while the device is housed within the housing. First, the bottom member 3 would have to be decoupled from the top member 2, then the device removed before the raised ridge member could move inwardly. In this manner, a waterproof and shockproof sealing of the housing 1 around an electronic device is ensured.

As depicted with respect to FIG. 4C, the bottom member 3 includes a rigid middle perimeter portion that forms the framework for receiving the electronic device therein, and further includes an interior perimeter portion formed as an interior shock absorbing and/or cushioning portion, as well as an exterior perimeter portion forming an outer shockproof layer. These portions may be fabricated from the same materials or different materials from the rigid middle member, and in certain instances, the rigid middle perimeter portion is fabricated from nylon, polycobaornate, or other materials having a flexural modulus of 200 or greater 300 or greater or 350 and greater, and the interior and/or outer perimeter portions may be fabricated from a more flexible material such as rubber and/or TPE and/or polypropylene. Additionally, other clasping mechanisms may also be employed with respect to joining the top and bottom members of the housing together in addition to or in substitution for those detailed herein. For instance, the housing 1 may additionally include an external latch feature, such as a clip, buckle, lock, or the like. For example, the external latch feature may be an entirely external latch feature, such as one or more clamps or clamp regions. The one or more clamps can be positioned on the outside of the housing and configured for clamping down and thereby exerting a coupling force onto the top and bottom members so as to couple the two members together and seal the housing.

Figure 4D:
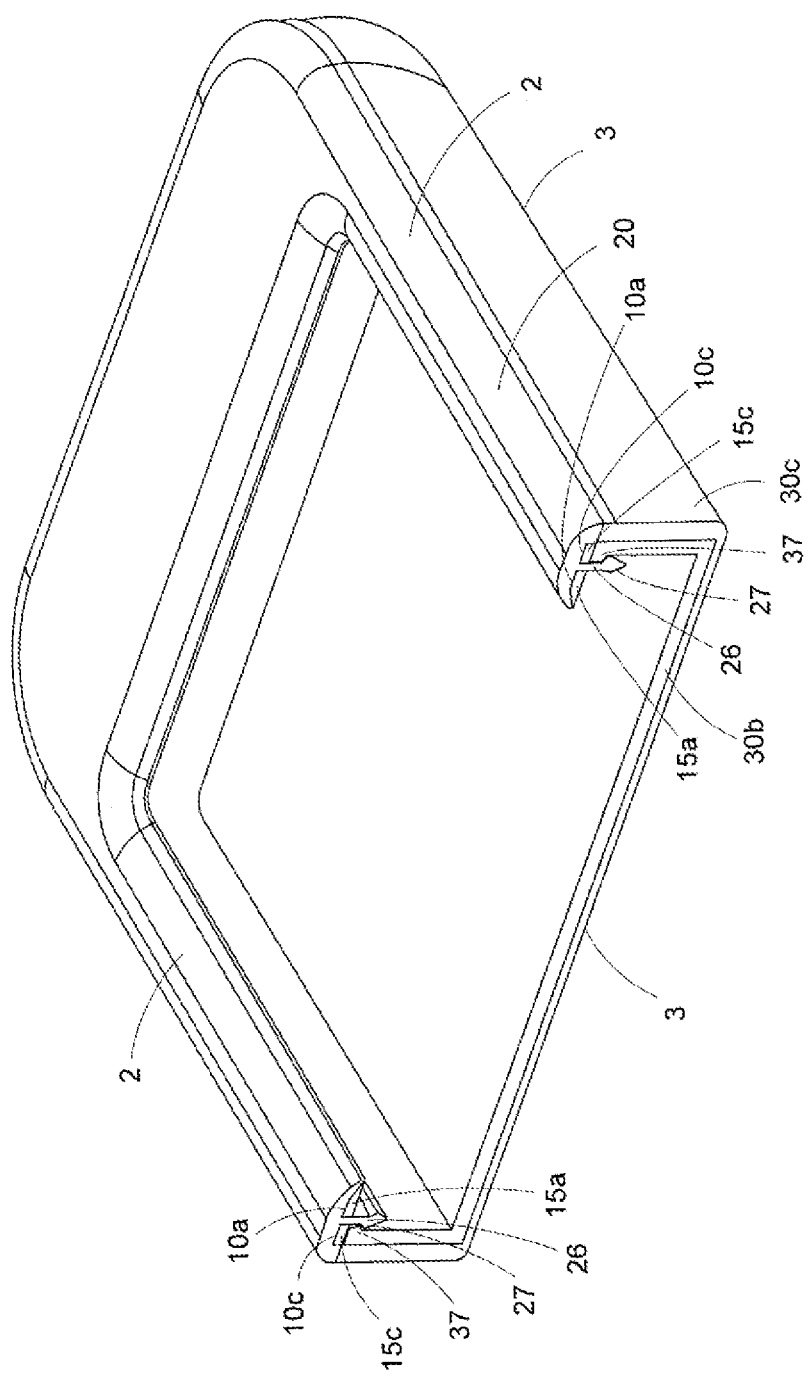

FIG. 4D provides a perspective view of the housing of FIG. 4C, however in this embodiment the device to be housed and retained within the housing comprises a square or rectangular configuration, wherein the device to be housed and/or retained in the housing described in FIG. 4C has a curved or rounded configuration, such as a curved back portion.

Figure 4E:
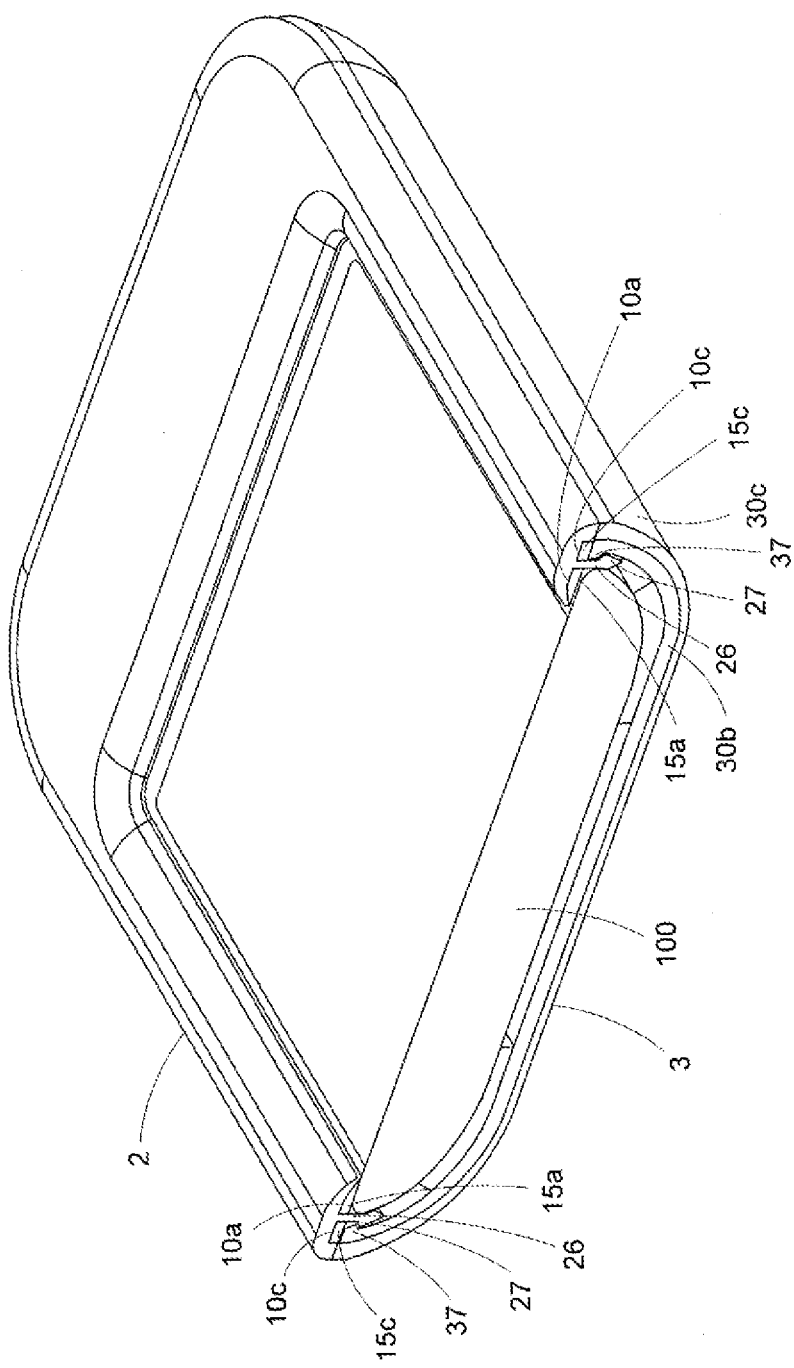

FIG. 4E provides a perspective view of the housing 1 of FIG. 4C, wherein a device 100 is actually housed and retained within the housing, and the top member extended ridge member 26 is engaged with a top corner edge and side of the device, which engagement prevents the lateral, internal movement of the ridge member 26 towards the interior of the housing. In this instance, the device 100 serves as a tensioning point and interior bounding member for the housing, especially with respect to the elongated ridge member 26 of the top member 2.

Figure 4F:
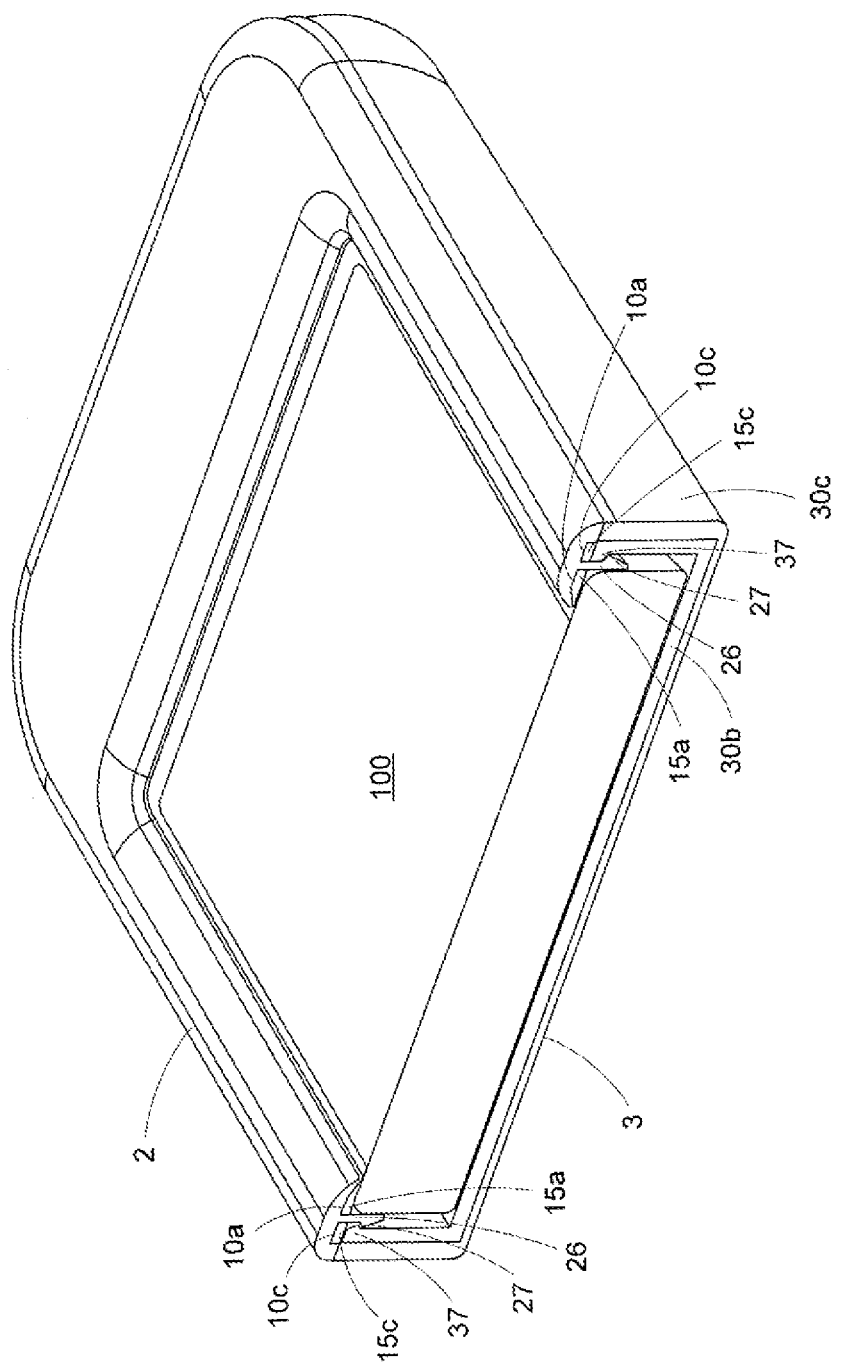
Figure 4G:
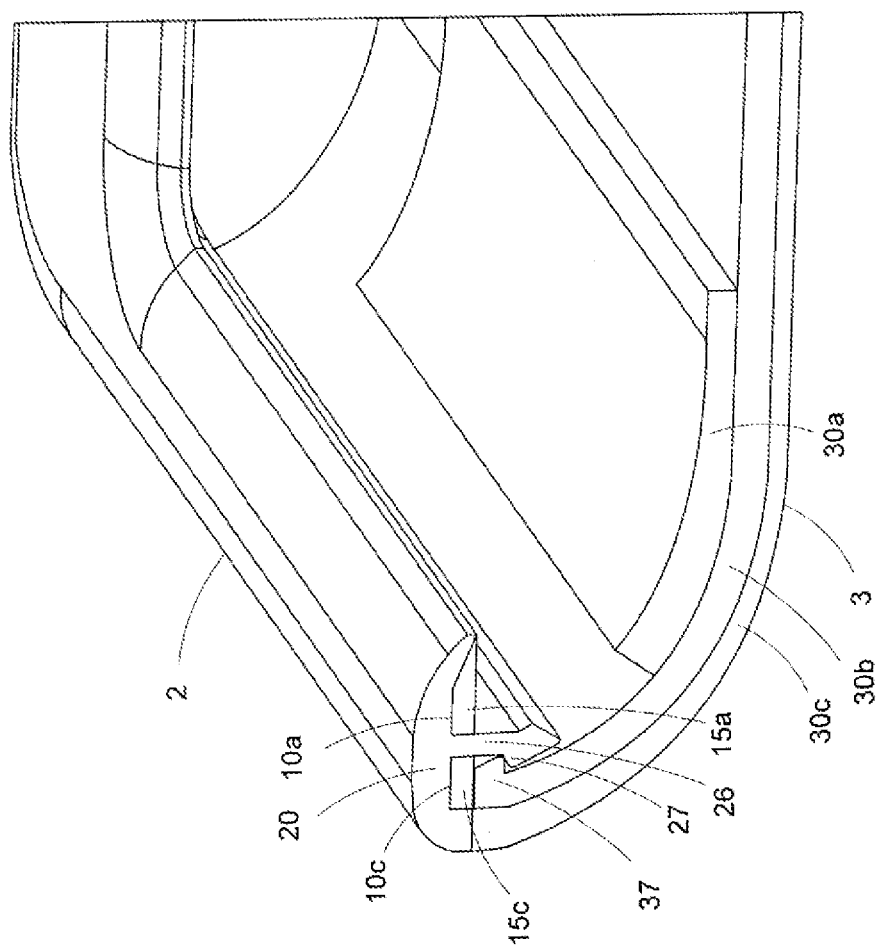
Figure 4I:
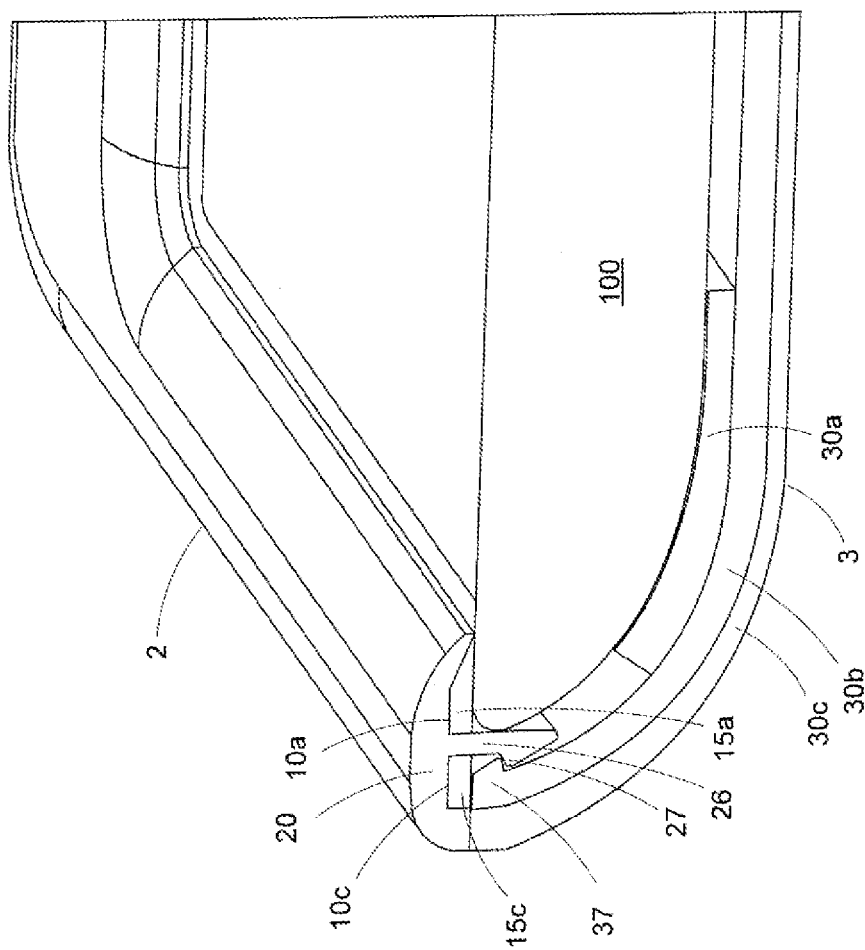
Figure 4J:
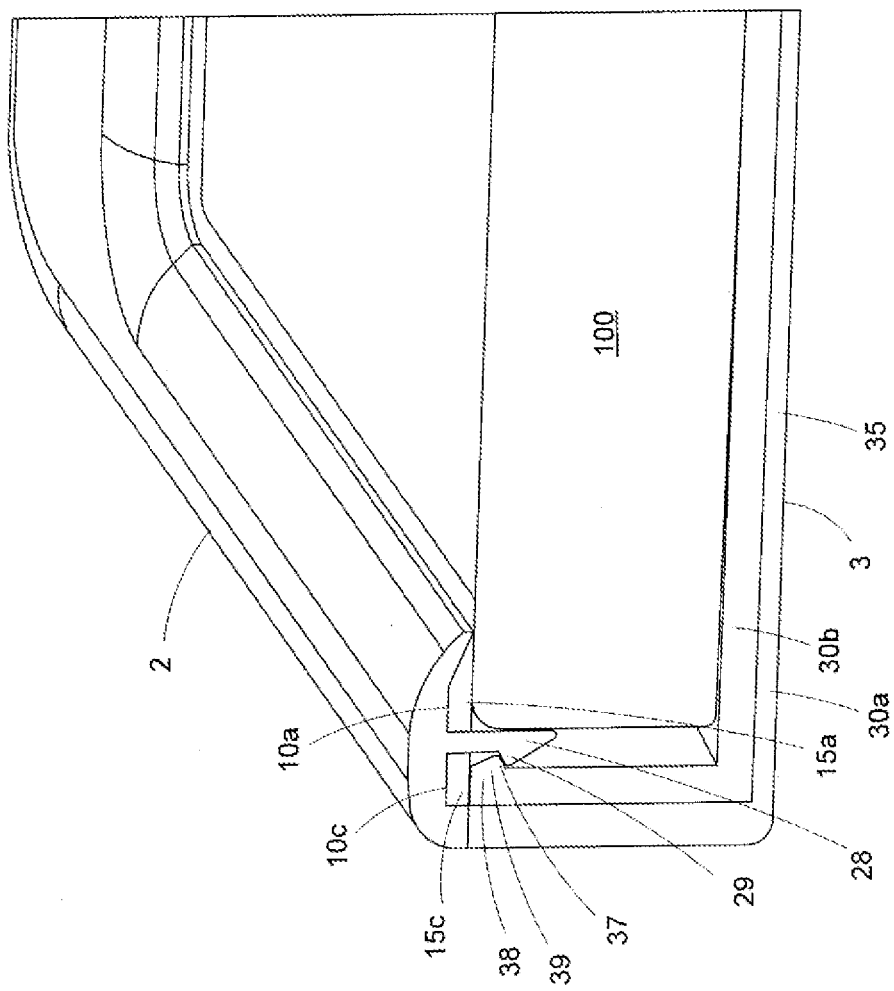

FIG. 4F provides the same view of a similar housing as provided in FIG. 4E, however, in this embodiment the device 100 housed and retained within the case has a square or rectangular configuration, where as the device 100 retained within the housing depicted in FIG. 4E has a rounded, or curved back configuration.

FIGS. 4G-4J provide different perspective views of the housings of FIGS. 4D and 4E.

Figure 4K:
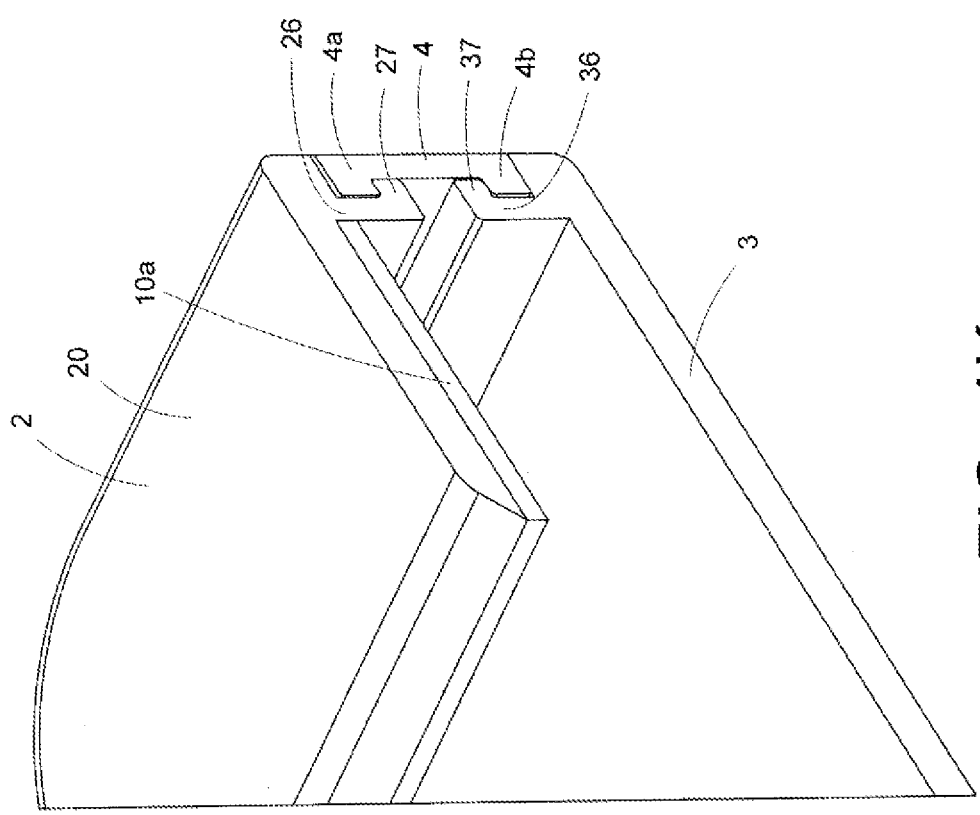
Figure 4M:
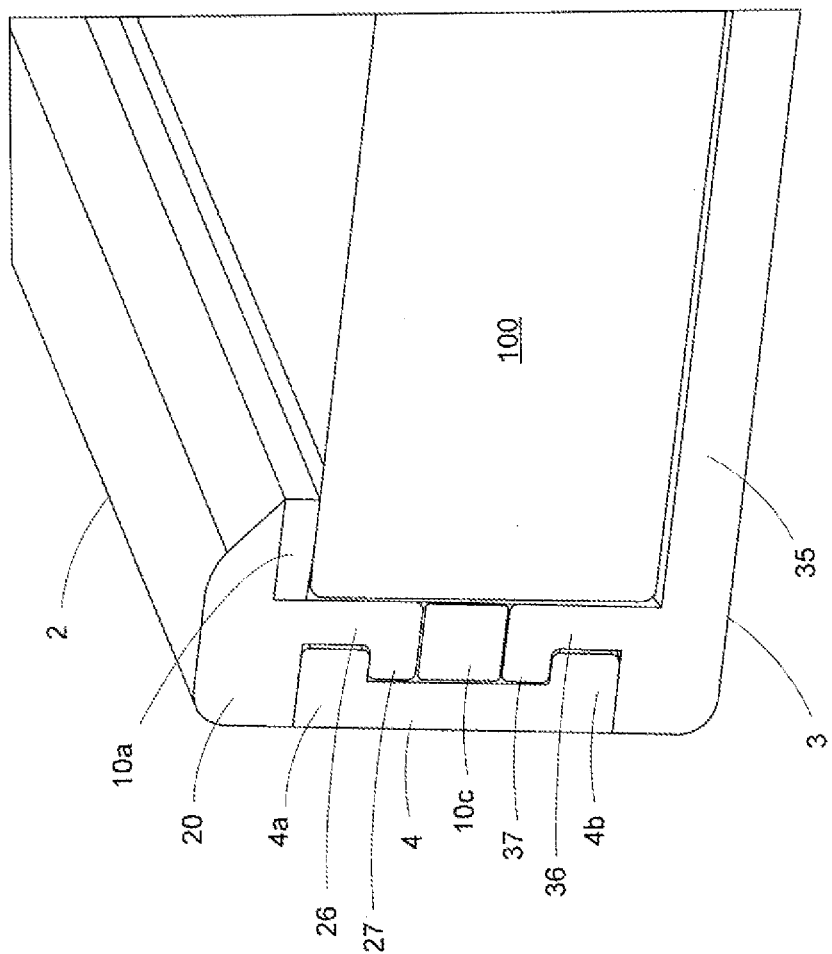

FIGS. 4K-4M provide different perspective views of an alternative clasping mechanism for a housing 1 of the disclosure. In this embodiment both the top 2 and bottom 3 member have a complementary configuration adapted for receiving a third locking element 4 therewithin so as to couple the top 2 and bottom 3 members together. For instance, the top member 2 includes a clasping configuration 26 that is configured as an "L" shaped ledge member extending downwards from the peripheral portion 20 of the top member 2.

As depicted, the bottom surface of the top member peripheral portion includes a gasket 10a configured for interfacing with a top surface of a housed device in the manner described above. Likewise, the bottom member 3 includes a clasping configuration 36 that is also configured as an "L" shaped ledge member extending upwards from the peripheral portion 30 of the bottom member 3.

As depicted, the bottom surface of the bottom member spans from one perimeter to the other thereby covering an entire back surface of the housed device, however, in other embodiments, the bottom member 3 may have a configuration that is substantially identical to the top member 2, in which case, the bottom member peripheral portion 30 would also include a gasket 10b (not shown) configured for interfacing with a top surface of a housed device in the manner described above. In such an instance, neither the top member 2 nor the bottom member 3 need include a surface, such as a membrane, spanning from one perimeter portion to the other, e.g., from one side the other.

As depicted, the top member clasping mechanism 26 and the bottom member clasping mechanism 36 are both configured for receiving corresponding clasping mechanisms 4a and 4b of the locking element 4. In this embodiment, the locking element 4 is configured as an elongated member that spans a substantial portion of the side perimeter portions of the top 2 and bottom 3 members. The elongated locking element 4 includes a clasping mechanism 4a that is configured for engaging its corresponding clasping mechanism 26 of top member 2, and further includes a clasping mechanism 4b that is configured for engaging its corresponding clasping mechanism 36 of bottom member 3. In this manner, the locking element 4 is capable of engaging top 2 and bottom 3 members together around a housed device and compressing the two around the device thereby forming and sealing the housing 1.

As depicted, the locking element 4 and corresponding clasping mechanism are configured as a slide member that may be slid into engagement with both the top 2 and bottom 3 members. However, it is understood that although particular clasping mechanism configurations have been described, these configurations may differ as described herein. Additionally, as depicted with respect to FIGS. 4L and 4M the locking element may additionally include a sealing element, e.g., a gasket 10c to better secure the waterproof sealing of the device within the housing. Other gaskets could also be included, such as at either of the lock engaging interfaces.

Figure 4N:
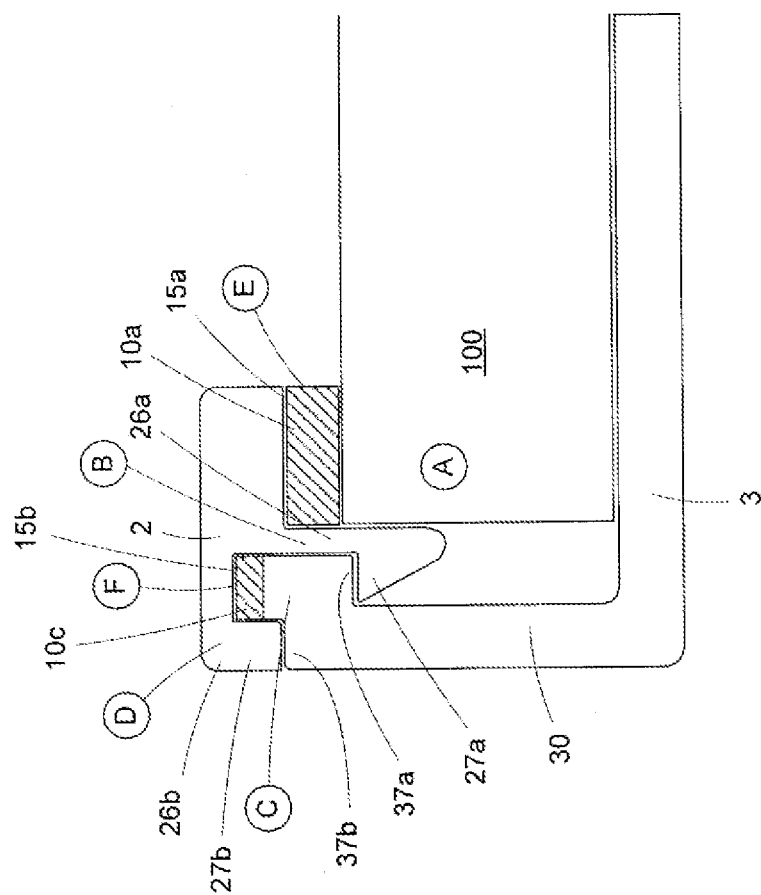

FIG. 4N provides a different perspective view of an alternative clasping mechanism for a housing 1 of the disclosure. The clasping mechanism of this embodiment is configured as an "F" latch. In this embodiment the top member 2 is figured so as to have an "F" configuration, wherein each tine of the "F" includes a top member clasping mechanism that is designed to engage a corresponding clasping mechanism of a corresponding bottom member 3.

Accordingly, in this embodiment, the top member 2 includes a relatively planar peripheral portion 20 that includes two elongated and extended raised ridge members 26a and 26b. Each of the raised ridge members 26a and 26b include a clasping mechanism 27a and 27b respectively on its distal portion, which clasping mechanism is configured for engaging corresponding clasping mechanisms 37a and 37b of bottom member 3. The top member 2 therefore can be considered to include an "F" like latch configuration, wherein it includes an exterior latching member 26b and an interior latching member 26b. It is noted that an interior surface of the interior latching member 26 engages a side edge or surface of a housed device, which interaction prevents the lateral movement of the raised interior raised ridge member 26 interiorly towards the center of the housing. Further, one or both of the interior facing surfaces of the "F" member may include a gasket, such as gaskets 10a and 10b, which gaskets function to provide a waterproof sealing between the various members of the housing and/or the housed electronic device as discussed herein. It is to be noted that each of the corresponding clasping mechanisms have been depicted as having slanted edge catch like configurations, such as like those described herein above with respect to FIG. 4A, one or both of these clasping mechanisms may configured differently, as described herein.

Figure 5A:
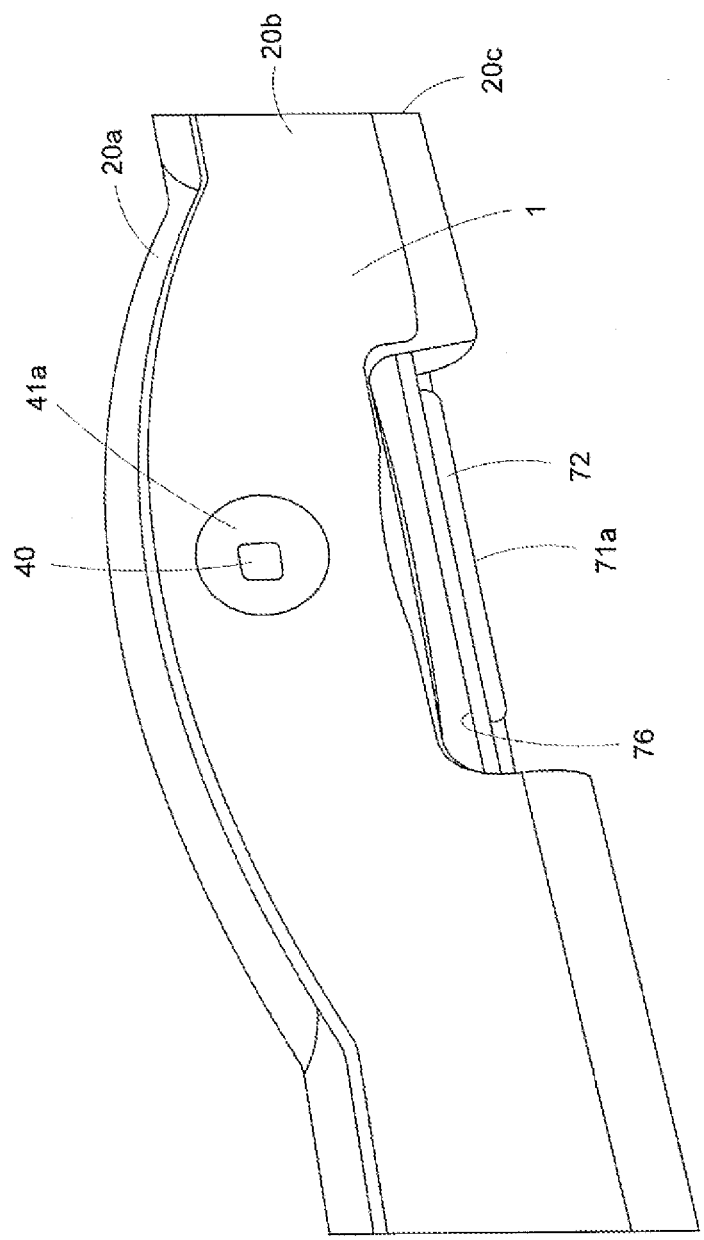

FIG. 5A is a close up perspective view of the top member proximal front portion 21 of the housing of FIG. 1A. The home button 40 and home button user interphase 41a are disposed on the top member middle perimeter portion 20b, which is shown with the top member interior perimeter portion 20a and the top member exterior perimeter portion 20c abutting the top member middle perimeter portion 20b. It is to be noted that the top member middle perimeter portion 20b may be fabricated from a more rigid, stiff material, e.g., polycarbonate, so as to provide a structural frame for the top member 2. Additionally, one or both of the interior 20a and exterior 20c perimeter portions may be fabricated from a relatively more flexible material, e.g., TPE, so as to provide a measure of waterresistant-waterproof protection and/or shock and/or drop proof protection. It is noted that the proximal portion of the proximal peripheral member 20 has a raised or convex circumferential profile in this region that surrounds and accommodates the home button 40 and provides an enlarged surface having the top member interior perimeter portion 20a the interior edge to facilitate a waterproof seal proximal to the home button of the top surface of a housed electronic device. A latch port opening 71a for covering a charge port, latch port bounding member 72 and a latch ramp receiving member 76 are also shown.

Figure 5B:
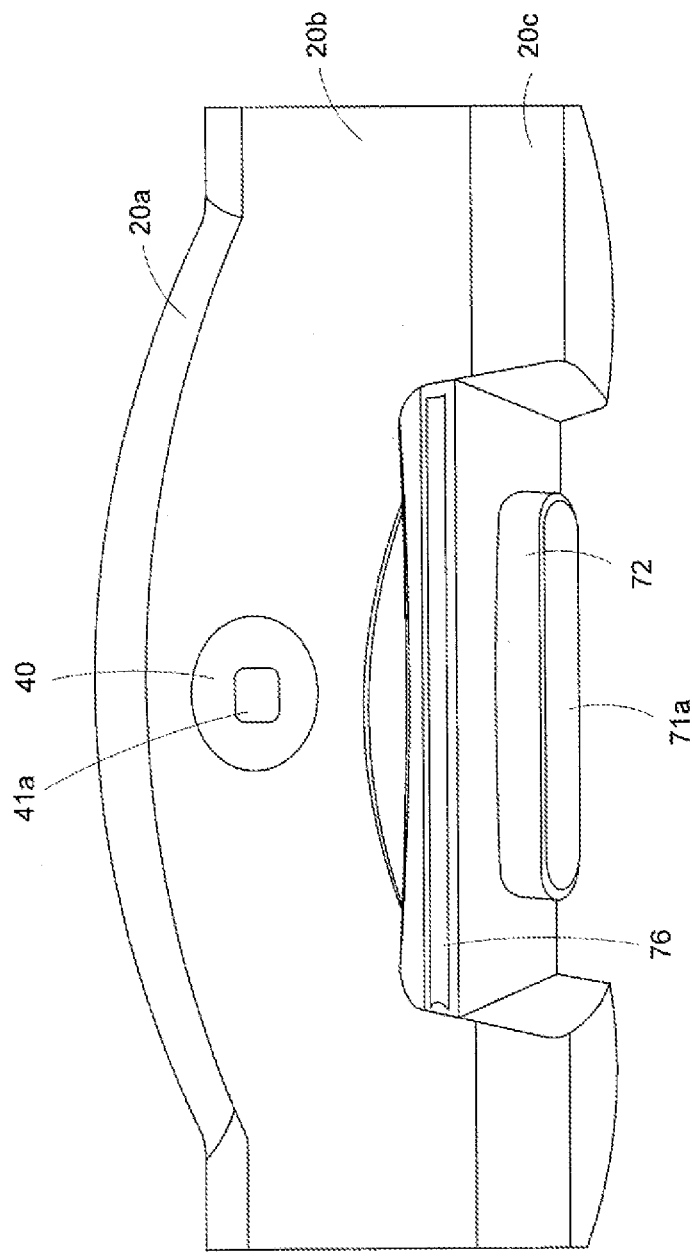

FIG. 5B is a close up perspective view looking down at the top front portion of the housing of FIG. 5A. Like FIG. 5A, the home button 40 and home button user interphase 41a are shown on the top member middle perimeter portion 20b, which is shown with the top member interior perimeter portion 20a and the top member exterior perimeter portion 20c adjacent to the top member middle perimeter portion 20b. Also depicted are the latch port opening 71a, a latch port bounding member 72, and a latch ramp receiving member 76 depicted with as a groove is also shown.

FIG. 5C is a close up perspective view looking down at the top member 2 back surface of the top peripheral portion 20 of the housing of FIG. 5A. As can be seen a profile of the home button 40 is depicted, with the home button seal 41c and home button device interface 41d clearly shown. Accordingly, the home button is sealed against the intrusion of water through the home button housing interface by the home button sealing member 41c. Additionally, the home button device interface 41d functions so as to transmit a downwards pushing force to an underlying home button of a housed electronic device having such a home button. The home button seal 41c and user interface 41d are disposed on an underside of the top member middle perimeter portion 20b. The top member middle perimeter portion is shown as being between the interior perimeter portion 20a and the top member exterior perimeter portion 20c. As can be seen, the proximal peripheral member 20 has a convex circumferential profile in this region that is configured to provide an enlarged surface area so as to surround a home button of a housed device and thereby facilitate a waterproof seal forming proximal to the home button of the top surface of a housed electronic device.

From top to bottom on the right side of this view, the top member exterior portion 20c, top member middle portion 20b, and top member interior portion 20a are contiguous, where a top member channel 10a is shown as a groove within the top member interior perimeter portion 20, which groove is bounded by interior and exterior top member channel bounding members 11a and 11b, respectively. A seal, such as an O-ring 15a is positioned within the channel 10a and configured for providing a waterproof and/or waterresistant seal when the top member is coupled to an electronic device to be housed and/or the top member 2 is coupled to the bottom member 3 to form the housing 1. Hence, the top member channel 10a gasket 15a facilitates a waterproof seal between the top member 2 and the bottom member 3 upon engagement. In this view, device retention teeth 96a and 96b which function to align, orientate, and/or secure an electronic device, protrude downward from the top member middle perimeter portion 20b.

Figure 5D:
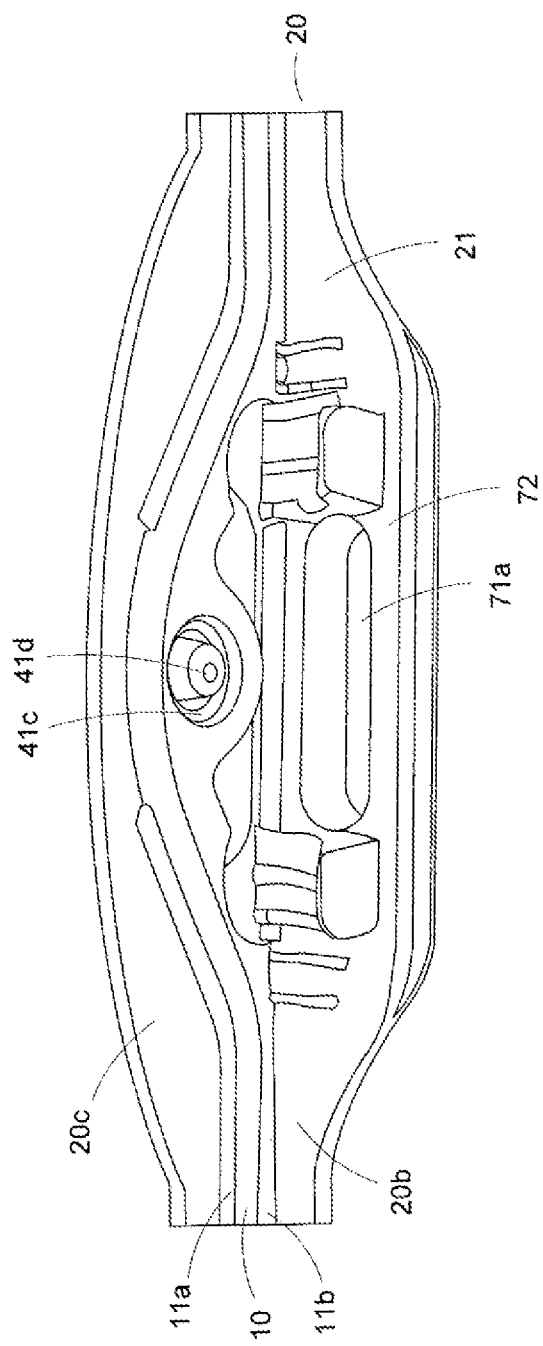

FIG. 5D is a close up perspective view looking at the top member 2 peripheral member 20 back surface of the front proximal portion 21 of the housing of FIG. 5A at a downward angular view. From top to bottom on the right side of this view, the top member middle perimeter portion 20b and top member interior perimeter portion 20a are contiguous, in which a top member channel 10a is shown positioned within the top member interior perimeter portion 20a bounded by interior and exterior top member channel bounding walls 11a and 11b, respectively. Gasket 15a is not shown. In this view, device retention teeth 96a and 96b are also shown. The device retention teeth 96 function in part to align, orientate, and/or secure an electronic device, protrude inward away from the top member middle perimeter portion 20b. A home button sealing member 41c and home button device interface 41d are formed as part of the top member middle perimeter portion 20b to provide a usable interface with an electronic device. A electrical transmission port, e.g., charge port, opening 71a is also shown, bounded by a rigid port bounding member 72.

Figure 6A:
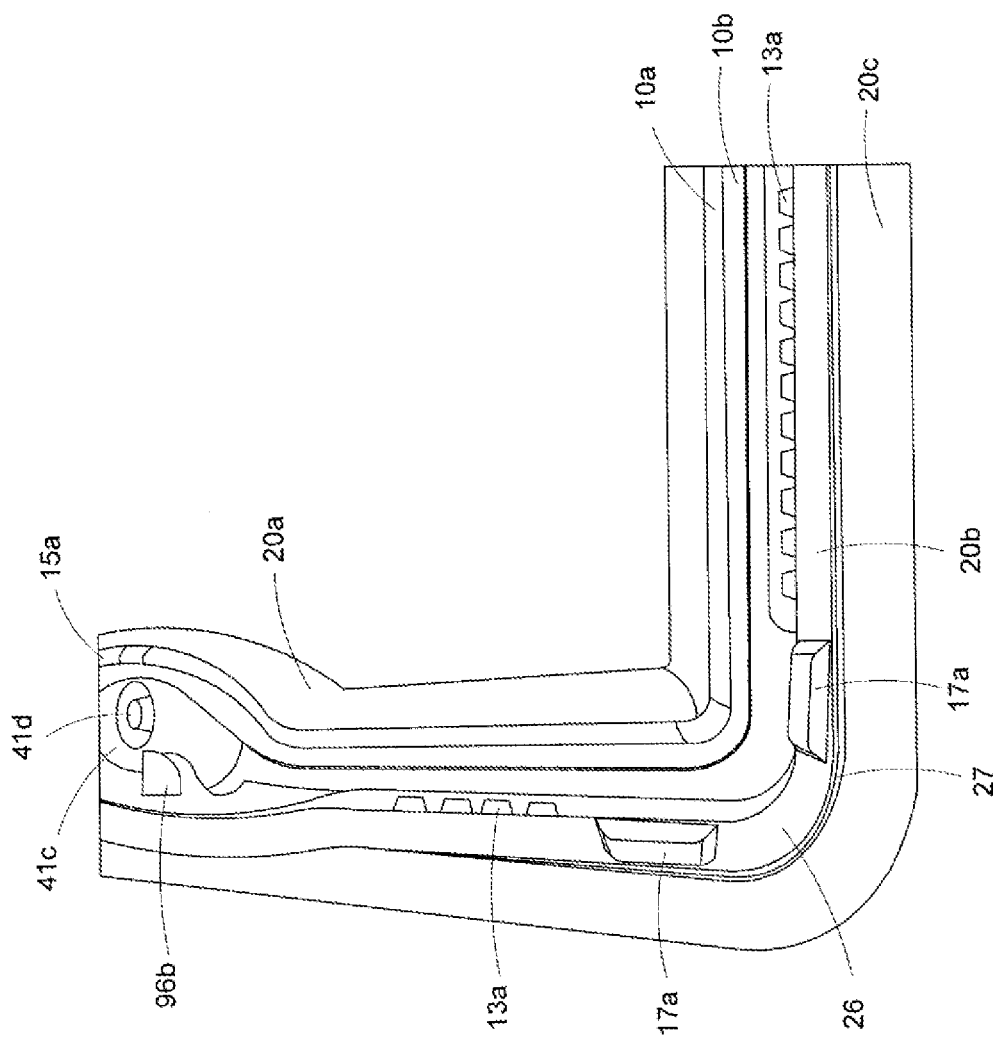
FIGS. 6A-F provide various close up perspective views of a protective housing, including views of various clasping mechanisms.

FIG. 6A is a close up perspective view looking at the top member 2 peripheral portion 20 back surface at the corner front portion of the housing of FIG. 1A at a downward angular view. From left to right on the upper left portion of this Figure, the top member exterior perimeter portion 20c, top member middle perimeter portion 20b, and top member interior perimeter portion 20a are shown.

The exterior perimeter portion 20c is configured as a shock-absorbing portion composed of a flexible or semi-flexible material, such as TPE. It forms an outer boundary for the top member 2 and housing 1, when the top member 2 is aligned with a corresponding boundary member of a bottom member 3 so as to form the housing 1.

The middle perimeter portion 20b is configured as a rigid framing member having an extended ridge 26 protruding therefrom at an angle substantially normal to the plane of an electronic device as it would be when fitted into the housing. It is to be understood that the recited angle may be more or less than 90 degrees. The raised ridge member 26 also includes a plurality of raised ridge alignment members 17 positioned on a top surface of the ridge and which function for the purpose of aligning and securing the top member 2 with the bottom member 3 when forming the housing 1. The raised ridge member 26 also includes a first and a second clasping mechanism 27 and 13a, respectively, wherein the first clasping mechanism is configured as a protruding lip member 27 extending outward away from an exterior side surface of the raised ridge 26, and the second clasping mechanism 13a is configured as a plurality of interiorly extended tabs or teeth elements 13a that protrude inwards from an interior side surface of the raised ridge 26.

The interior perimeter portion 20a is configured to include two distinct features that interact cooperatively with one another to generate a waterproof and/or water resistant sealing of the top member 2 such as when the top member is coupled to an electronic device and/or coupled to the bottom member 3 so as to form the housing 1. For instance, the interior perimeter portion 20a includes a channel member 10a having a sealable gasket 15a positioned therein, and the interior perimeter portion 20a includes a wiper portion adapted to interface with a top surface of an electronic device so as form a smooth interface therewith, which interface functions in part to reduce the impingement of water and/or dust and/or underneath the wiper and into the housing.

A single device retention member, e.g., tooth 96b, which may assist in aligning, orientating, and/or securing an electronic device, is depicted on the member middle perimeter portion 20b. A home button sealing member 41c and home button device interface 41d are also shown as part of the top member interior perimeter portion 20a, which together function to provide a waterproof seal and usable interface with an electronic device that is housed within the housing.

Two top member raised ridge member 17a are configured as teeth that protrudes above and away from the top surface of the raised ridged member 26 of the top member middle perimeter portion 20b such that each top member raised ridge tooth member 17a is capable on engaging with a corresponding bottom member raised ridge tooth or teeth 17b (not shown).

In addition to these tooth members 17a, also depicted in this embodiment are teeth 13a that comprise part of a second clasping mechanism 13 for the housing 1. The teeth 13a of the second clasping mechanism are configured for reversibly engaging with corresponding teeth receptacles 13b of a bottom member 3 (not shown), where each of the top member teeth 13a protrudes into corresponding bottom member 3 teeth receptacles 13b upon engagement of the top member 2 with the bottom member 3. The top member 2 also includes a first clasping mechanism 27 that is configured as a protruding lip member 27 that is configured for being received within a corresponding receiving member, e.g., groove 37 (not shown), of the bottom member 3 upon engagement of the top member 2 with the bottom member 3.

Additionally, given the configuration of the interior perimeter portion channel 10a, gasket 15a, and wiper portion, the top member interior perimeter portion 20a may function as seal against the surface of an electronic device in a manner that is functionally similar to that of a window wiper against a windshield, and as such is typically comprised of soft materials that are pliable so as to facilitate these portions in the formation of one or more seal with other members.

Figure 6B:
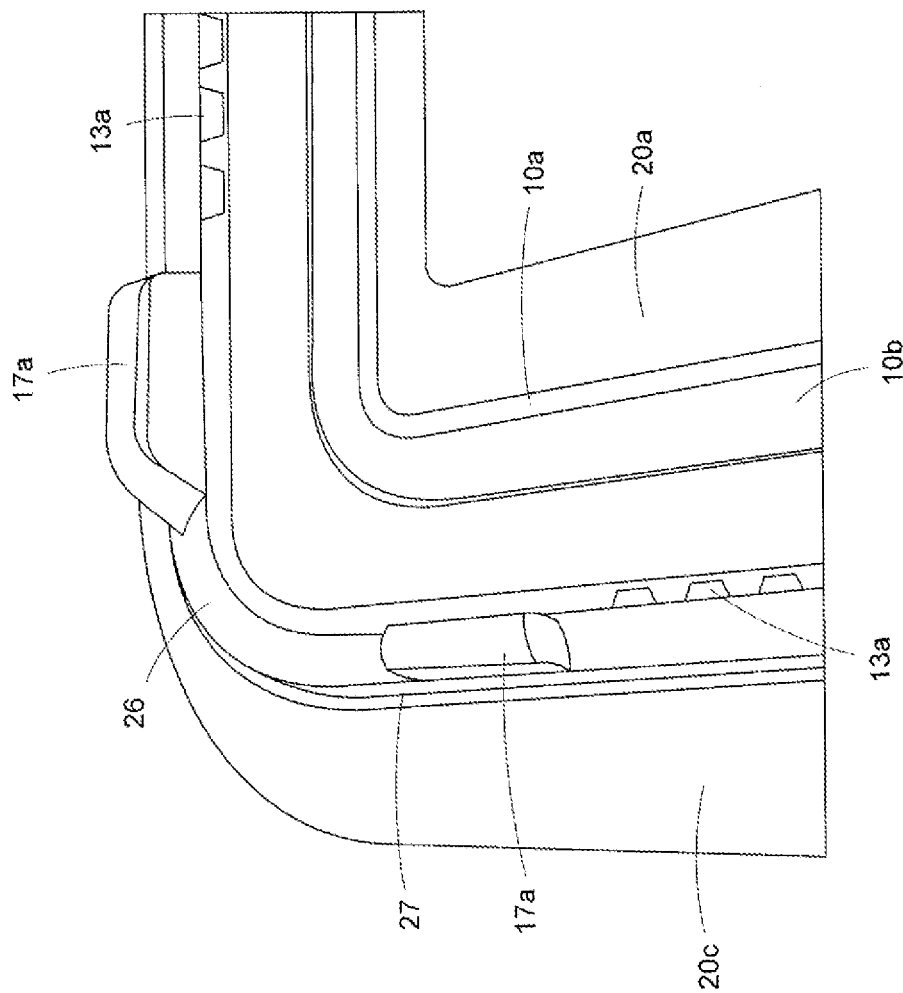

FIG. 6B is a close up perspective view looking at the top member 2 peripheral portion 20 back surface of the corner front portion of the housing of FIG. 1A. Depicted from the outer corner top member peripheral portion 20, the top member exterior perimeter portion 20c comprises the corner edge shown in this Figure, with the top member middle perimeter portion 20b shown immediately interior and adjacent, and the top member interior perimeter portion 20c immediately interior and adjacent so as to form the interior boundary of the corner section depicted in this Figure.

The exterior perimeter portion 20c is configured as a flat surface that forms an extended ledge upon which the raised ridge member 26 is positioned and extends away from. The raised ridge 26 has three surfaces shown, an exterior surface having a protruding lip 27 extending away exteriorly at an angle from 0-90 degrees from a center line extending parallel through the raised ridge. An exterior surface having a protruding lip 27 extending away exteriorly away from the housing 1 at an angle from 0-90 degrees from a center line extending parallel through the raised ridge. An interior surface having a extended teeth 13 extending away interiorly toward the center of the housing 1 at an angle from 0-90 degrees from a center line extending parallel through the raised ridge. And a top surface which as embodied is planar but includes to raised ridge teeth 17 that extend above the top surface of the raised ridged member 26 proximal to the corner of the top member middle portion 20b. Each of the two top member raised ridge teeth 17 is capable on engaging with a corresponding bottom member raised ridge tooth 17b (not shown). More or less of these tooth elements can be included on corresponding portions of the top and bottom members. The top member interior perimeter portion 20a defines an interior corner in this view that corresponds to the shape of an electronic device such that the top member interior perimeter portion 20a seals against the surface of an electronic device when placed in the protective housing.

Figure 6C:
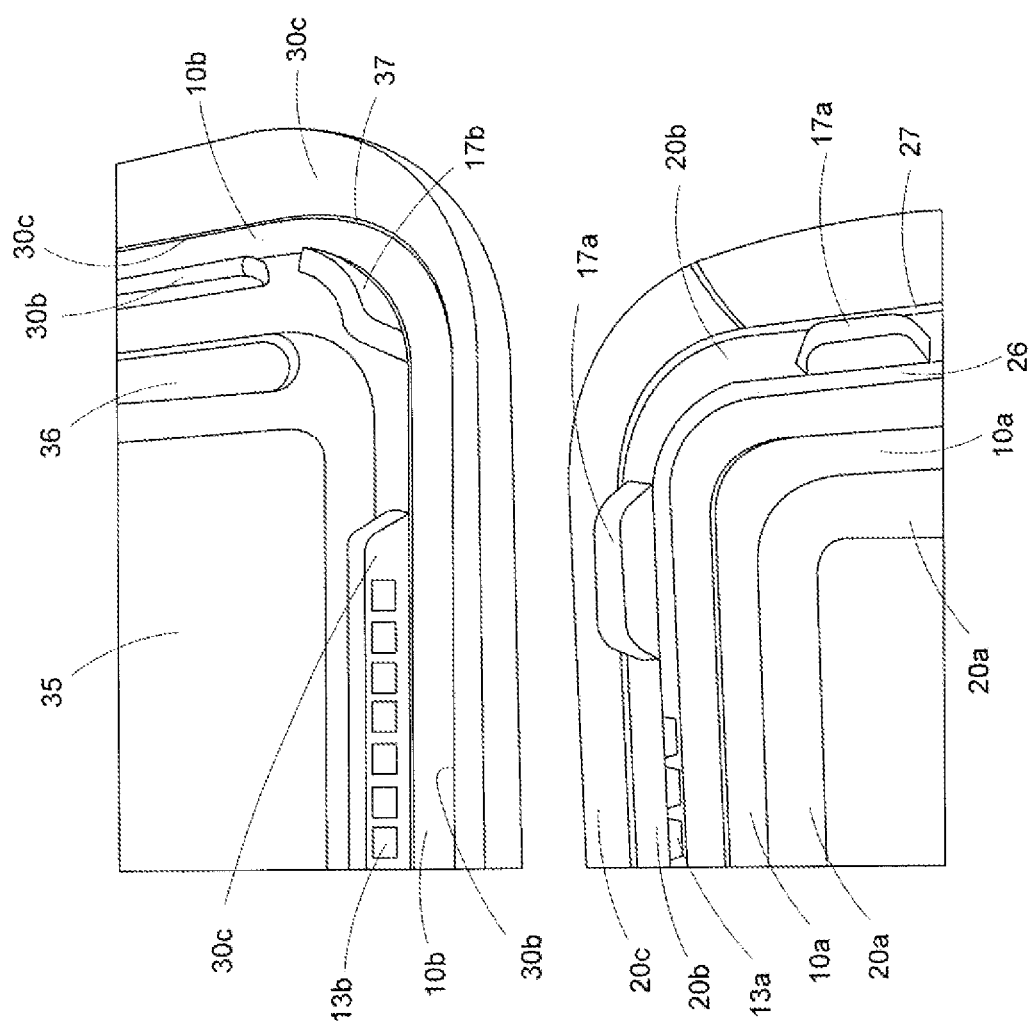

FIG. 6C is a close up perspective view looking at a corner of the protective housing 1 detailing the bottom member 3 peripheral portion 30 top surface (top) and the top member 2 peripheral member 20 bottom surface of the corner front portion of the housing of FIG. 6B, each member shown in alignment as the two would interact when one member is flipped over in orientation (not shown).

The bottom member 3 peripheral portion 30 includes an external perimeter portion 30c, a middle perimeter portion 30b, and an interior perimeter portion 30a. The exterior perimeter portion 30c is configured in conjunction with a flat surface that forms an extended ledge upon which ledge the middle and interior perimeter portions are positioned. The exterior perimeter portion 30c includes a flexible material that is configured so as to align and abut a corresponding exterior perimeter portion 20c of a top member 2, such as when the top 2 and bottom 3 members are aligned and coupled to form the housing 1. These portions may be fabricated from a semi-flexible or flexible material and configured for providing the housing with shock and/or drop proof protection.

The bottom member middle perimeter portion 30b and bottom member interior perimeter portion 30a are spaced apart from one another so as to from a bottom member channel 10b, which channel is configured for receiving a bottom member sealing gasket 15b (not shown) therein. The bottom member middle perimeter portion 30b is formed as a raised ridge that extends away from the bottom surface of the bottom member and is configured to form an exterior bounding wall for the channel 10b. This middle perimeter portion includes a clasping mechanism 37 that is configured as an extended groove that is adapted for receiving a corresponding clasping mechanism 27 of the top member 2, which is configured as a protruding lip, there within.

The bottom member interior perimeter portion 30a is also formed as a raised ridge that extends away from the bottom surface and is configured to form an interior bounding wall for the channel 10b. This interior perimeter portion includes a clasping mechanism 13b that is configured as a plurality of detents that are adapted for receiving a corresponding clasping mechanism 13a of the top member 2, which are configured as a plurality extended tabs or teeth, there within. Additionally, the bottom member middle perimeter portion 30b has a bottom member raised ridge tooth 17b depicted here as protruding upward from a top surface of the bottom member middle perimeter portion 30b.

The top member 2 (bottom) is configured to reversibly engage with the bottom member 3. The top member exterior perimeter portion 20c is depicted as a curving about the corner view so as to define the outer periphery of the corner, with the top member middle perimeter portion 20b being disposed internal and interconnected with the top member exterior perimeter portion 20c.

A raised ridge member 26 is depicted here as extending upward from a top surface of the middle perimeter portion 20b, with two top member raised teeth 17a disposed thereon surrounding the curved raised ridge member 26. As can be seen in this embodiment, the two top member raised teeth 17a are configured to align with a corresponding raised tooth (teeth) 17b of a bottom ember 3, so as to align and help maintain the coupling of the top 2 and bottom 3 members, especially during dropping such as at a corner of the housing.

The top member raised ridge member 26 of the top member 2 includes a plurality of clasping mechanisms 27 and 13a, which are configured as an protruding lip region 27, configured to engage a corresponding clasping mechanism, e.g., configured as an extended groove member 37, of a bottom member 3; and a series of extended teeth elements 13a, configured to engage a corresponding clasping mechanism, e.g., configured as corresponding teeth receptacles 13b, of bottom member 3. Accordingly, the raised ridge 26 of the top member 2 may include an interior surface having extended teeth 13 extending away interiorly toward the center of the housing 1 at an angle from 0-90 degrees from a center line extending parallel through the raised ridge. The raised ridge member 26 is configured to protrude into bottom member channel 10b upon engagement of the top member 2 and the bottom member 3 of the protective housing. Also depicted are top member channel 10a (gasket not shown), and top member wiper portion of interior perimeter member 20a.

Figure 6D:
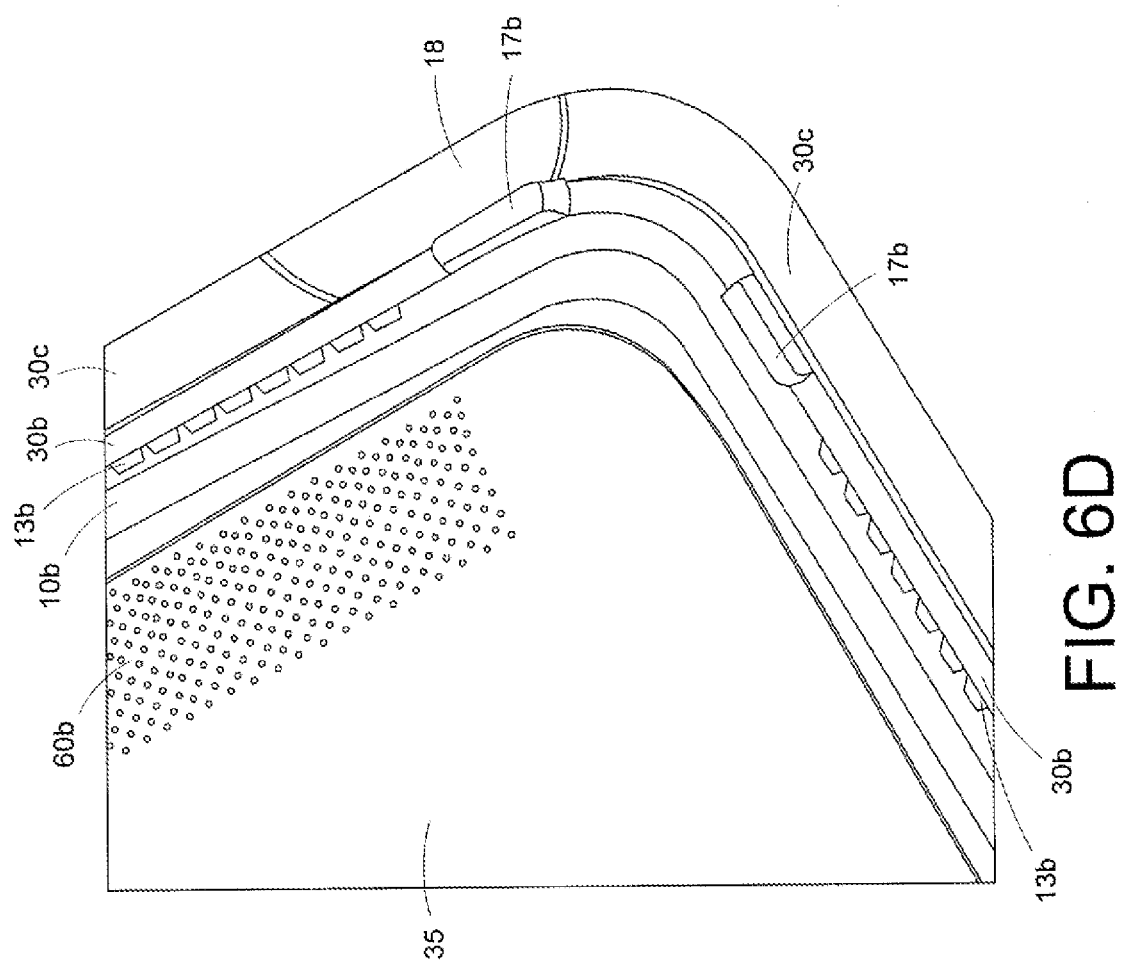

FIG. 6D is a close up perspective view looking at a corner of the protective housing detailing the bottom member 3 peripheral portion 30 top surface. In this embodiment, two bottom member raised ridge teeth 17b are depicted protruding upward from a bottom member middle perimeter portion (e.g., channel exterior bounding member) 30b disposed proximal to the corner of the bottom member exterior perimeter portion 30c illustrated in this view, and as such a corresponding top member includes one top member raised ridge tooth 17a (not shown). A bottom member interior perimeter portion 30a is also depicted offset from the middle perimeter portion 30b so as to form a channel 10b. A plurality of teeth receptacles 13b are disposed in on the inner surface of interior bounding member 30b. The bottom member back surface 35b, having speaker grille 60b, is shown abutting against bottom member interior perimeter portion 30a.

The two raised ridge teeth 17b that extend above the top surface of the channel exterior bounding member 30b proximal to the corner of the bottom member exterior portion 20c. Each of the two top member raised ridge teeth 17b is capable of engaging with a corresponding top member raised ridge tooth 17b (not shown). More or less of these tooth elements can be included on corresponding portions of the top and bottom members. The bottom member interior perimeter portion 30a defines an interior corner in this view that corresponds to the shape of an electronic device such that the bottom member interior perimeter portion 30a engages the surface of an electronic device when placed in the protective housing.

Figure 6E:
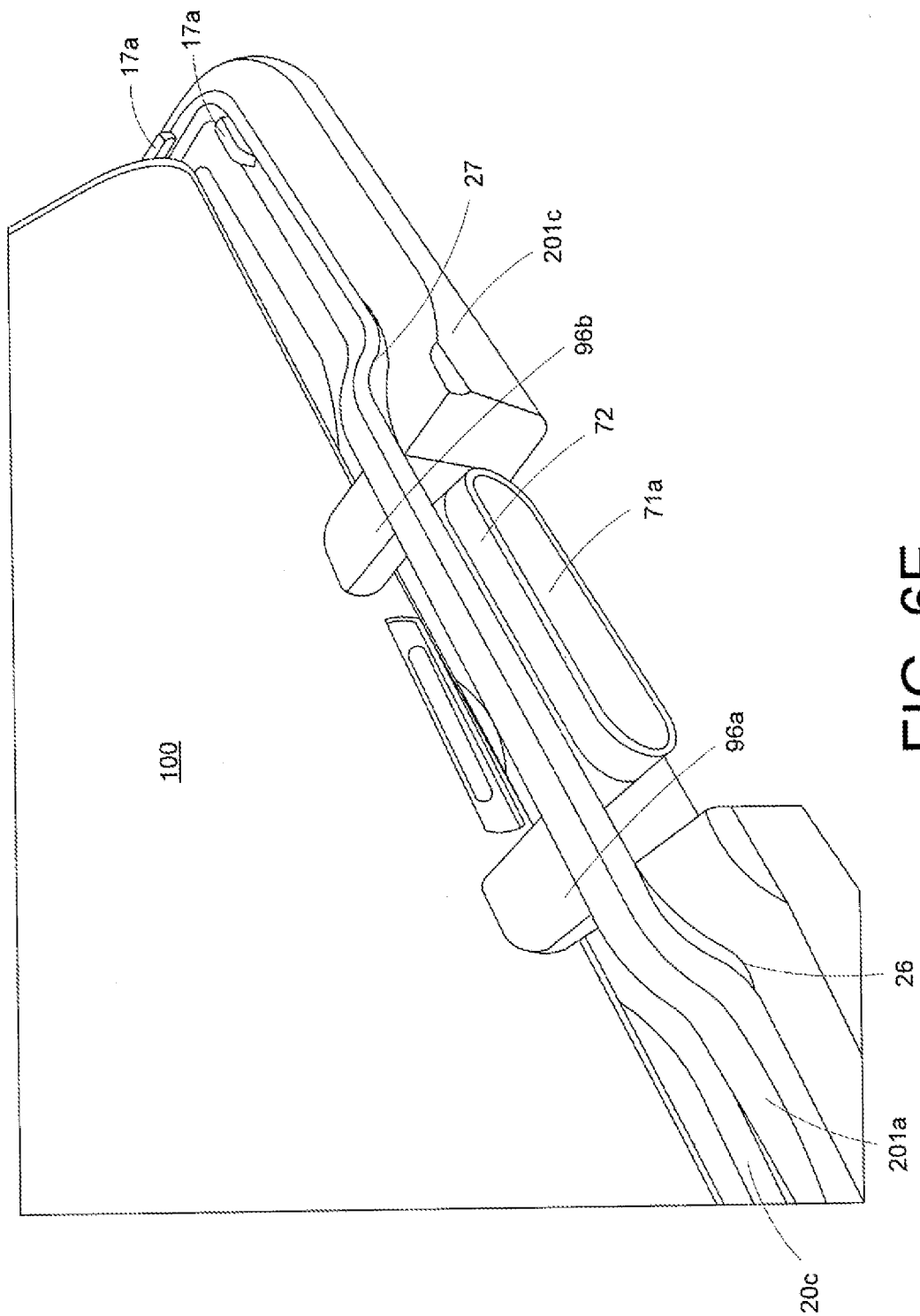

FIG. 6E is a close up perspective view looking down at the top front portion of the housing showing a portion of the top member 2 peripheral portion 20 back surface as it engages with an electronic device, and in particular with a proximal portion (e.g., a charging portion) of an electronic device. The top member interior perimeter portion 20a forms a shock and bump resistant portion at the top member proximal end portion 21 that is apparent in this view. The top member exterior perimeter portion 20c also forms a shock and drop resistant portion at the top member proximal end portion 21 that is also apparent in this view. Clasping mechanism 27 and two top member raised ridge teeth 17a are depicted protruding upward from the bottom member raised ridge member 26. Also depicted is a latch port opening 71a near the top member proximal end portion 21 bounded by stiffened and reinforced latch port bounding member 72, and device retention teeth 96a and 96b.

Figure 6F:
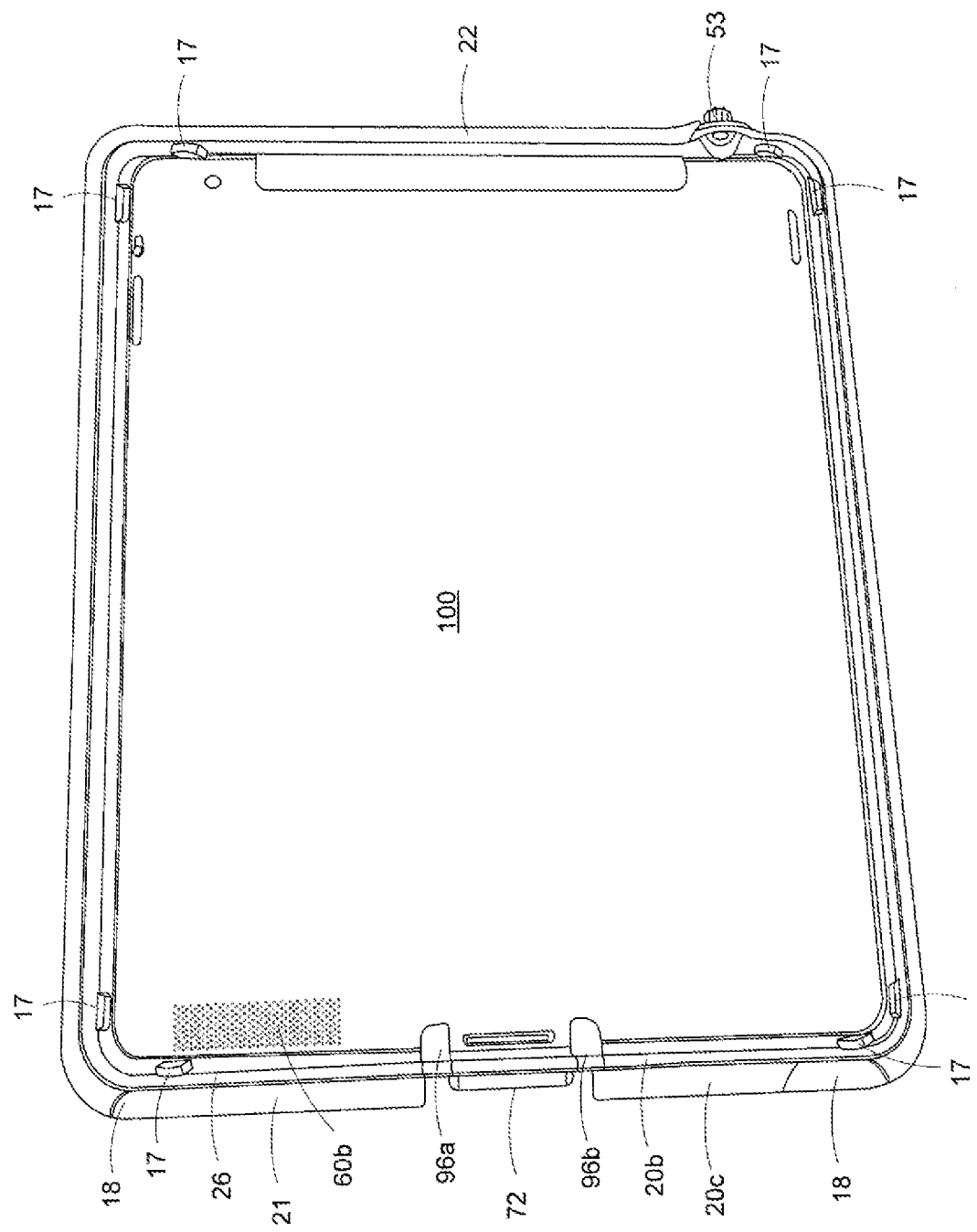

FIG. 6F is a bottom perspective view looking at the bottom of a protective housing 1 in which an electronic device 100 having a speaker output is depicted. The top member exterior perimeter portion 20c is depicted abutting against and integral with the raised ridge member 26 protruding upward from the top member middle perimeter portion 20b. The raised ridge member 26 can be seen to include four sets of paired top member teeth 17 protruding upward from the raised ridge member 26, with each set of two top member paired teeth 17 disposed proximal to the corner of the top member 2 of the protective housing. The bottom member 3 of a protective housing is not shown. An electronic device (e.g. an iPad) is illustrated engaging with the top member 2 such that device retention teeth 96a and 96b align, orientate, and assist in securing the electronic device with the top member 2. A headphone port sealing member 53 is depicted on the top member distal end portion 22 of the top member perimeter portion 20 and a latch port opening bounding member 72 located at the top member proximal end portion 21.

Figure 7A:
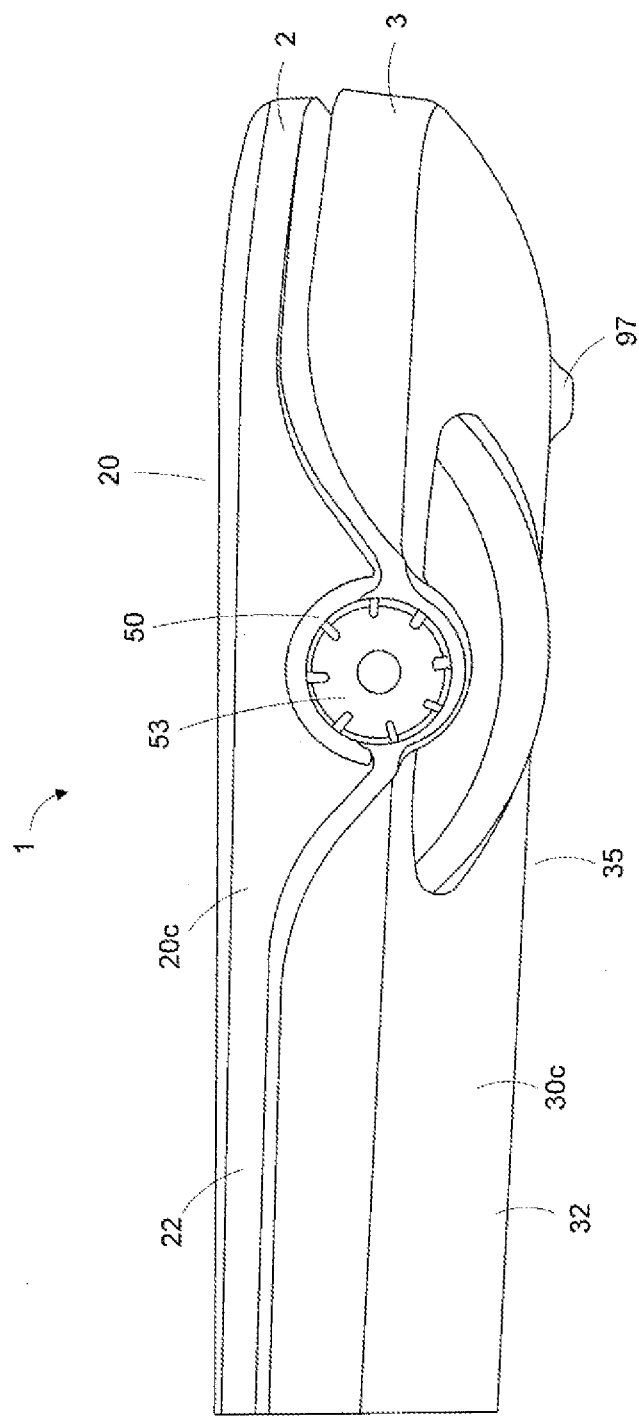

FIG. 7A is a close up front view of the distal end of a top member 2 and a bottom member 3 that as coupled together form the protective housing 1 as provided herein. The top member peripheral portion 20 and bottom member peripheral portion 30 are shown at the top of the top and bottom member distal end portions 22 and 32. An electrical transmission sealing member 53, e.g., headphone port bung, is shown on the top member 2 as it is engaged within an electrical transmission port aperture 50 of the top member. It is noted that in this embodiment, the bottom member 3 has a protruding rim that functions to protect the head phone sealing bung 53. A bottom member accessory port 97 is shown on the bottom member bottom surface 35.

Figure 7B:
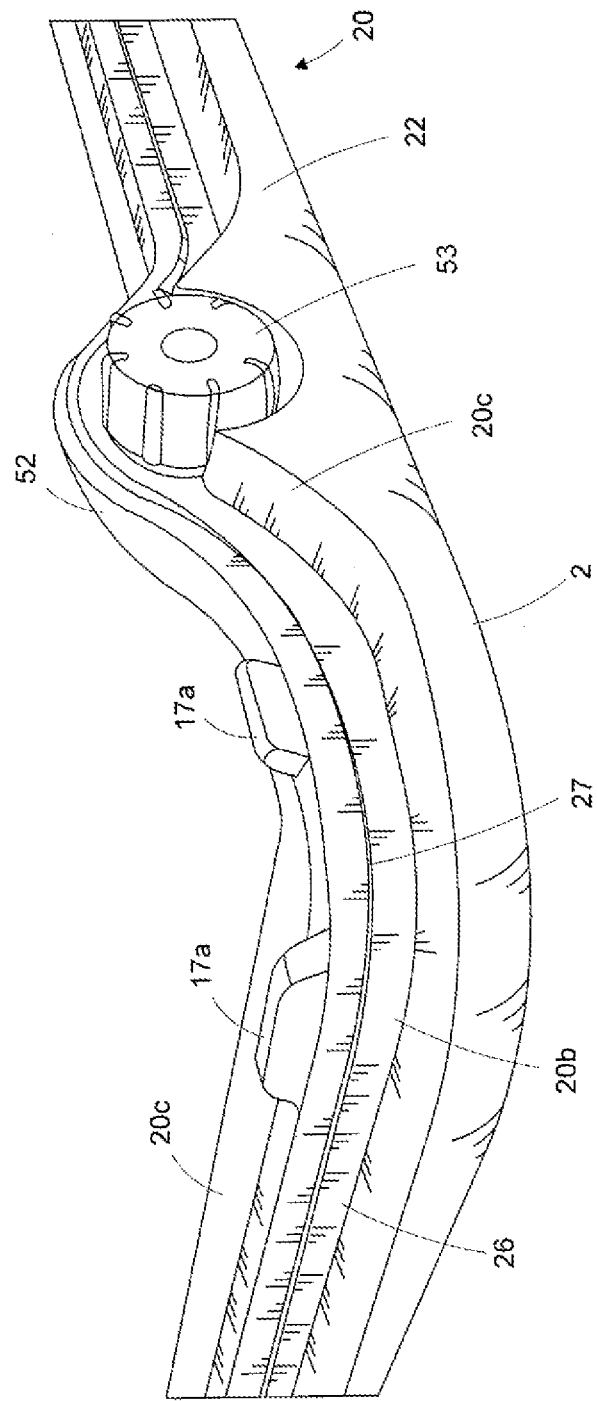

FIG. 7B is a close up front view of the distal end of a top member 2 of a protective housing provided herein. The top member peripheral portion 20 top surface of the top member distal end portion 22 of the top member 2 is depicted. A head phone ceiling port 53 is shown on the top member 2. The top member 2 includes an external peripheral portion 20c that includes an extended ledge region which is composed of a flexible material such as TPE so as to form a shock-protective layer circumscribing the exterior bounds of the top member 2. The top member 2 further includes a middle perimeter portion 20b that includes a raised ridge member 26 that includes a first clasping mechanism 27 that is configured as a protruding lip, e.g., overhang, or catch member. The raised ridge 26 additionally includes a planar top surface, which surface includes raised teeth 17a are shown protruding upward from the curved raised ridge member 26 and are spaced a distance apart from one another so as to receive a corresponding raised tooth 17b (not shown) or teeth members of a corresponding bottom member 3. Further, as can be seen with respect to FIG. 7B the peripheral portion 20 includes a raised section 52 that bounds and accommodates an electrical transmission port 50, such as a headphone jack port, which port is sealed by the placement of a headphone port bung 53 within the aperture of the port 50.

Figure 7C:
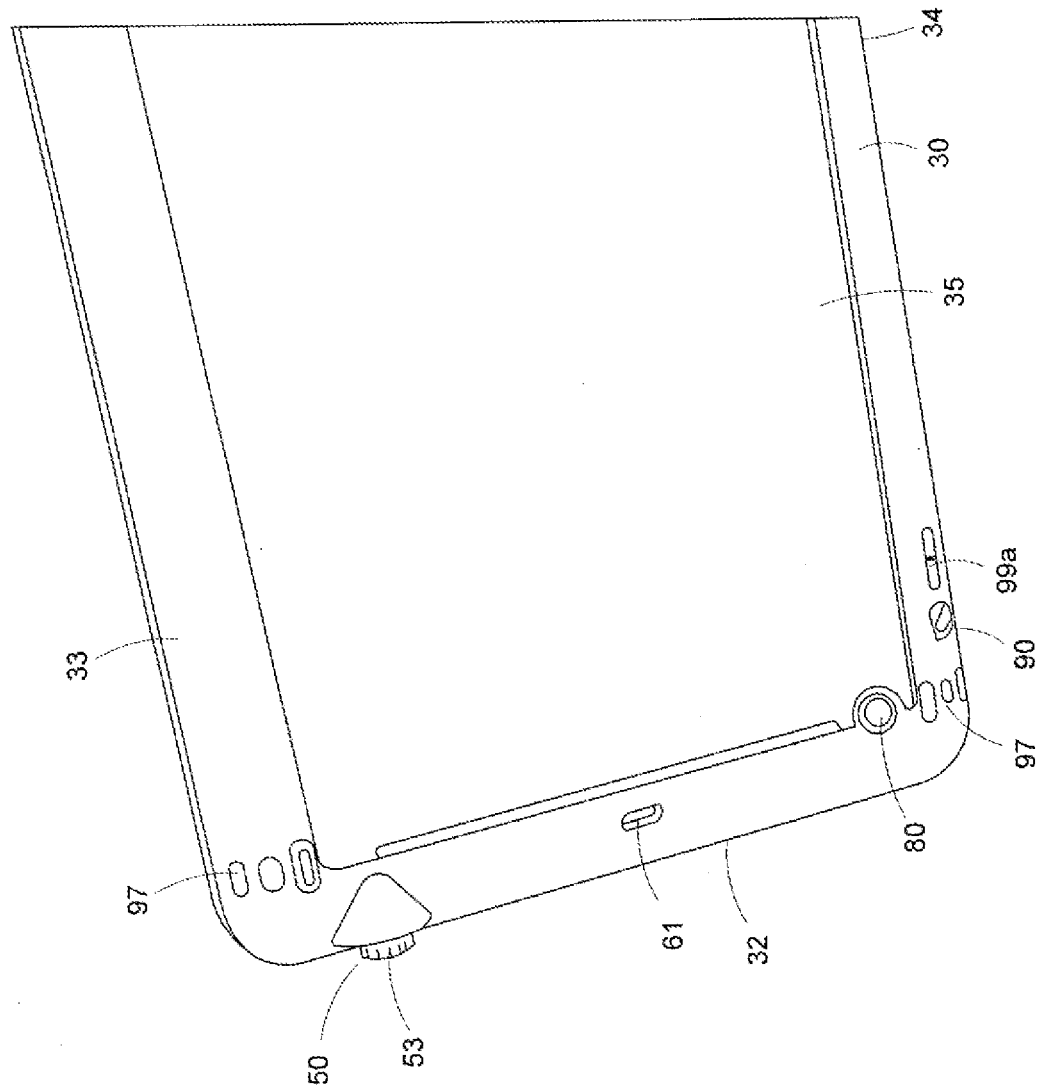

FIG. 7C is a perspective view of the distal 32 bottom member back surface 35. The bottom member peripheral portion 30 is depicted with opposing bottom member left hand side member 33 and bottom member right hand members 34 shown respectively at the top and bottom of this view. The bottom member distal end portion 32, depicted on the left side of this view, incorporates various additional features, including an electrical transmission port configured as a headphone sealing port 50 having a port sealing member 53 retained therein. As can be seen in this embodiment, the bottom member peripheral portion has a raised, reinforced area 52 bounding the transmission port 50 so as to provide extra shock protection to this feature. Also depicted are microphone transmission port 61 and lens feature 80. Additional features, including volume buttons 99a and orientation switch 90 are depicted on the bottom member peripheral portion 30 of the bottom member right hand side member 34. Accessory ports 97 are also depicted.

FIG. 7D is a close up perspective view of a corner of the top 2 and bottom 3 member of a protective housing 1 showing the headphone sealing port member 53 as well as a bottom member accessory port member 97. A headphone sealing port member 53 is retained within the headphone port 50 and this portion is surrounded by a protruding rim 52 along the bottom member peripheral portion 30 that accommodates the opening for the headphone sealing port 50 on the bottom member 3 thereby adding additional support to this portion of the housing. The top member 2 of the protective housing is depicted in this view aligned and coupled to the bottom member 3 and facing away from the front view. A bottom member accessory port 97 having two openings is depicted in this particular embodiment.

FIG. 7E provides a cutaway view of a distal portion of the housing providing a view of the electrical transmission port of FIG. 7D as configured as a headphone port 50. As can be seen with respect to FIG. 7E the bottom member 3 includes an exterior perimeter portion 30c, configured as a flexible shock absorbing member. The bottom member 3 also includes a middle 30b and interior 30a perimeter portion that are spaced apart from one another so as to form a bottom member channel 15b, which channel has a bottom member gasket positioned therein. The bottom member middle perimeter portion includes a clasping member 37 that is configured as a catch, which catch is adapted for engaging a corresponding clasping mechanism 27, e.g., a corresponding catch, of the top member 2 so as to secure the top 2 and bottom 3 members together when they are coupled with one another. The bottom member 3 also includes a bottom surface 35 configured to receive therein and cradle an electronic device 100, such as a tablet computing device, such as a tablet PC.

The top member 2 includes a peripheral portion 20, but does not include a top surface member. Instead, the peripheral portion 20 includes a middle perimeter portion 20b that forms a rigid, skeletal perimeter member that frames the top surface of the electronic device and is configured for being coupled to the bottom member 3 so as to form a liquidproof seal both with the bottom member 3 and the device 100. For instance, the top member middle perimeter portion 20b includes an extended ridge member 26 that impinges into the bottom member channel 10b and therein performs two related functions. First, the extended ridge member 26 includes a clasping mechanism 27 that is configured as a catch, which catch is configured to engage a corresponding clasping mechanism 37, e.g., a corresponding catch, of a bottom member 3 so as to secure the top 2 and bottom 3 members together when they are joined. Secondly, the extended ridge member 26 includes a top surface that is configured for engaging and compressing a bottom member gasket 15b within the bottom member channel 10b thereby compressing it. Collectively these elements function cooperatively to generate a liquid proof seal between the top 2 and bottom 3 members along the peripheral members 20a and 30b where they come together and interface.

Additionally, the top member 2 includes an interior perimeter portion 20a that is also configured to generate a waterproof seal when coupled to a front, top surface of a housed device 100 as shown. The interior perimeter portion 20a of the top member 2 includes two distinct portions that both function to facilitate a waterproof sealing with a housed device. First, the interior perimeter portion 20a is configured to include a top member channel 10a, which top member channel is bounded by interior and exterior top member channel walls 11a and 11b, respectively. The top member channel 10a is configured for retaining a top member gasket 15a, which gasket is configured for engaging a portion of a housed device and specially designed so as to be capable of being compressed by such engagement and thereby producing a watertight sealing with the housed device. For instance, in certain embodiments, the top member gasket 15a is hollow. Secondly, the interior perimeter portion 20c includes an edge portion that is configured to function much like the wiper of an automobile. It has an inclined edge that interface with a top or edge portion of a housed device so as to produce a substantially seamless interface between the device 100 and the housing 1, which interface acts to prevent the impingement of liquid through the housing 1. In a manner such as this a housing 1 of the disclosure is capable of generating a waterproof and shockproof sealing around a housed device.

The top member 2 also includes an exterior perimeter portion 20c that is also configured as a flexible shock absorbing member. The exterior perimeter portion 20c may be configured as an external, flexible bumper portion that is configured to align with a corresponding external bumper member 30c of a bottom member, which performs the same function.

Also depicted is a sound transmission port 50 of the housing 1, wherein the sound transmission port 50 is configured in this embodiment as a headphone transmission port. Accordingly, the top member 2 includes a port aperture 51 into which a headphone interface, or in this instance, a headphone adapter interface 58b may be inserted, so as to allow a headphone or speaker device to be electronically connected to headphone portion of a housed device 100. The headphone port aperture 51 includes a connection element, such as threading 54a, that bound the aperture and are configured for interfacing with a corresponding connection element 54b, e.g., corresponding threading) of a headphone jack and/or a headphone jack adapter 57 (as depicted in this embodiment). The headphone port 50 may include a gasket, however, in this embodiment the headphone jack adapter 57 includes a gasket and so an additional gasket in the headphone port 50 is not needed, although it may be included.

Further depicted in FIG. 7E is an accessory jack adapter 57, e.g., a headphone jack adapter, as it would be when inserted both into the housing 1 and within a housed device 100. The accessory jack adapter 57 includes two transmission interfaces 58. One transmission interface 58*a* is configured for receiving a jack portion of an accessory, such as a headphone, speaker device, or the like. The other transmission interface 58*b* is configured as an accessory, e.g., headphone or speaker, jack portion and is adapted for being inserted within a jack receiving portion of an electronic device so as to generate an electronic interface between the accessory and the electronic device. A unique feature of the accessory jack adapter as herein provided is that it is capable of producing a waterproof seal between the jack portion 58*b* and the jack receiving portion of a housed device. To perform this function the jack adapter 57 includes both a connection interface 54*b*, which in this instance is configured as screw threads, but can be any kind of connection element, such as a cam portion; and further includes a gasket seat having a gasket 55, e.g., an O-ring positioned thereon, such that as the jack adapter 57 is coupled to the housing 1 through the jack port aperture 51, and the corresponding connection elements 54*a* and 54*b* are engaged, a waterproof seal between the housing 1 and the jack adapter is produced. It is noted that a jack adapter 57 need not be provided wherein any accessory to be so engaged with the housing includes a jack configured in a similar manner as that described herein with regard to the jack adapter 57.

FIG. 8A is a close up view of the corner of portion of the front surface of a bottom member 3. The bottom member includes a peripheral portion 30 surrounding a front and back surface member 35. The peripheral portion 30 includes an exterior perimeter portion 30*c*, comprised as a flexible material adhered to or otherwise overmoulded with a bottom member middle perimeter portion 30*b*, which is comprised of a rigid, stiff material that is formed in conjunction with a bottom member interior perimeter portion 30*a*, both of which are fabricated from the same material and at the same time as that of the back surface member 35. It is to this skeletal frame material that the flexible exterior material 30*c* is added. The middle perimeter 30*b* and interior perimeter 30*a* portions are configured to form a bottom member channel 10*b*. As depicted, a bottom member gasket 15*b* is not shown.

Also depicted is a single bottom member raised ridge tooth 17*b* that is shown in this view protruding upward from a top surface of the bottom member middle perimeter portion 30*b*. The bottom member middle perimeter portion 30*b* forms a bounding wall for the bottom member channel 10*b*, which is shown to the immediate right and interior of the bottom member exterior perimeter portion 30*c*. The channel 10*b* is further bounded by the bottom member interior perimeter portion 30*b*. Vertically aligned bottom member teeth receptacles 13*b* are shown as part of the interior bottom channel bounding wall 30*a* and are depicted in this view to the right and interior of the bottom member channel 10*b*, such teeth receptacles 13*b* comprising part of a second clasping mechanism upon reversible engagement with corresponding teeth 13*a* of a top member (not shown).

A bottom member bumper 36 is depicted vertically to the interior of the vertically aligned bottom member teeth receptacles 13*b*. The bottom member interior perimeter portion 30*a* is depicted internal and to the right such that it forms a cohesive seal with bottom member front surface 35*a*. A protruding rim 52 that functions to protect the head phone ceiling port 53 (not shown) is depicted as a curved indenture in the bottom member exterior perimeter portion 30*a* at the top of this view, which bottom member exterior perimeter portion 30*a* is integral with bottom member middle perimeter portion 30*b* that defines the boundary of bottom member channel 10*b* depicted immediately below the bottom member middle perimeter portion 30*b*. A microphone transmission port 61 is visible below the bottom member interior perimeter portion 30*a* to the interior of bottom member channel 10*b*. The microphone transmission port 61 has an aperture extending from the inside of the housing member to the outside, which aperture is covered by a waterproof speaker gasket 61*a*.

Figure 8B:
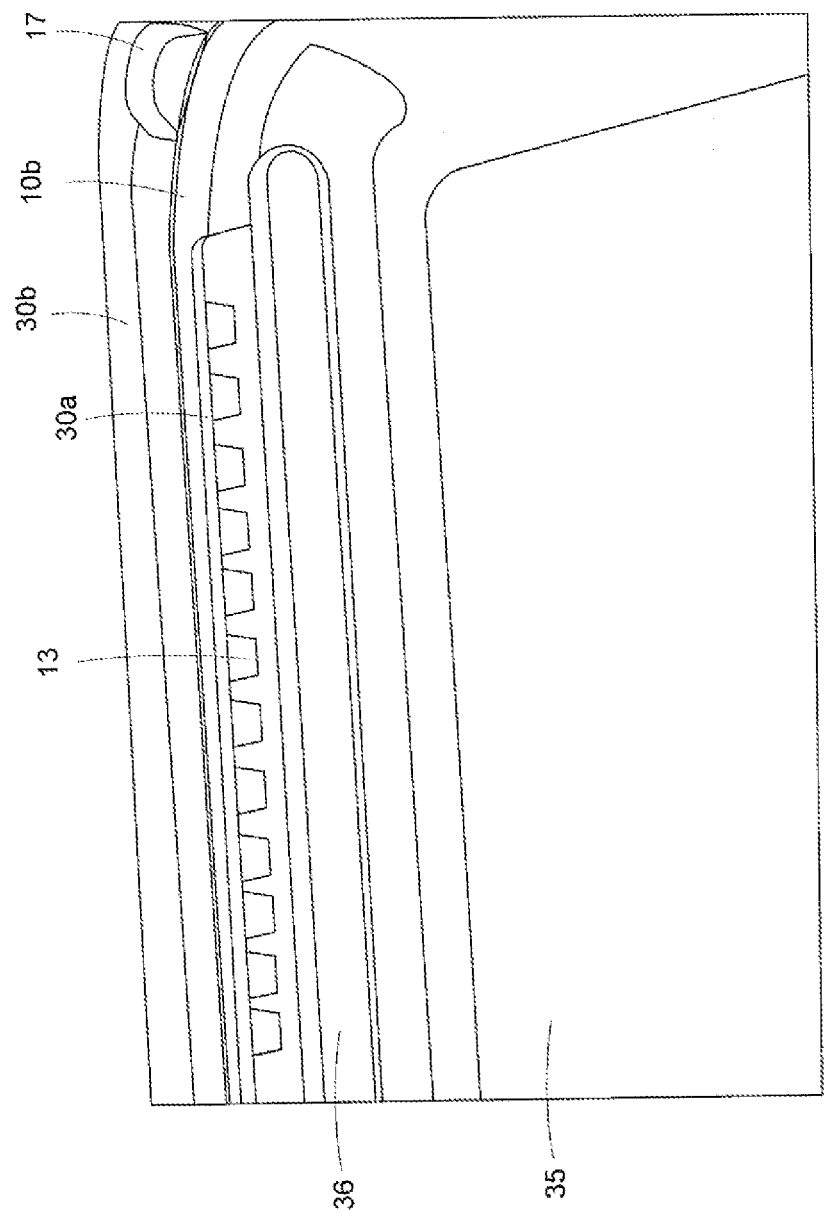

FIG. 8B is a close up view of the corner of portion of the front surface bottom member 3 of FIG. 8A. Bottom member exterior perimeter portion 30*c* is not shown. Bottom member middle perimeter portion 30*b* defines the upper portion of bottom member 3, which is positioned distal to but is integral with bottom member interior perimeter portion 30*a*. One bottom member raised ridge tooth 17*b* is shown protruding upward from the bottom member middle perimeter portion 30*b*. Middle perimeter portion 30*b* forms an exterior bounding wall for bottom member channel 10*b* that is disposed immediately interior to and below bottom member interior perimeter portion 30*a* in this view. Bottom member teeth receptacles 13*b* are depicted as being aligned horizontally and immediately above the bottom member channel 10*b* on the bottom channel interior bounding member 30*a*, such teeth receptacles 13*b* comprising part of a second clasping mechanism upon reversible engagement with corresponding teeth 13*a* of a top member (not shown). Bottom member bumper 36 is illustrated below the bottom member teeth receptacles 13*b*, which has been moulded with the bottom member interior perimeter portion 30*a*.

Figure 9A:
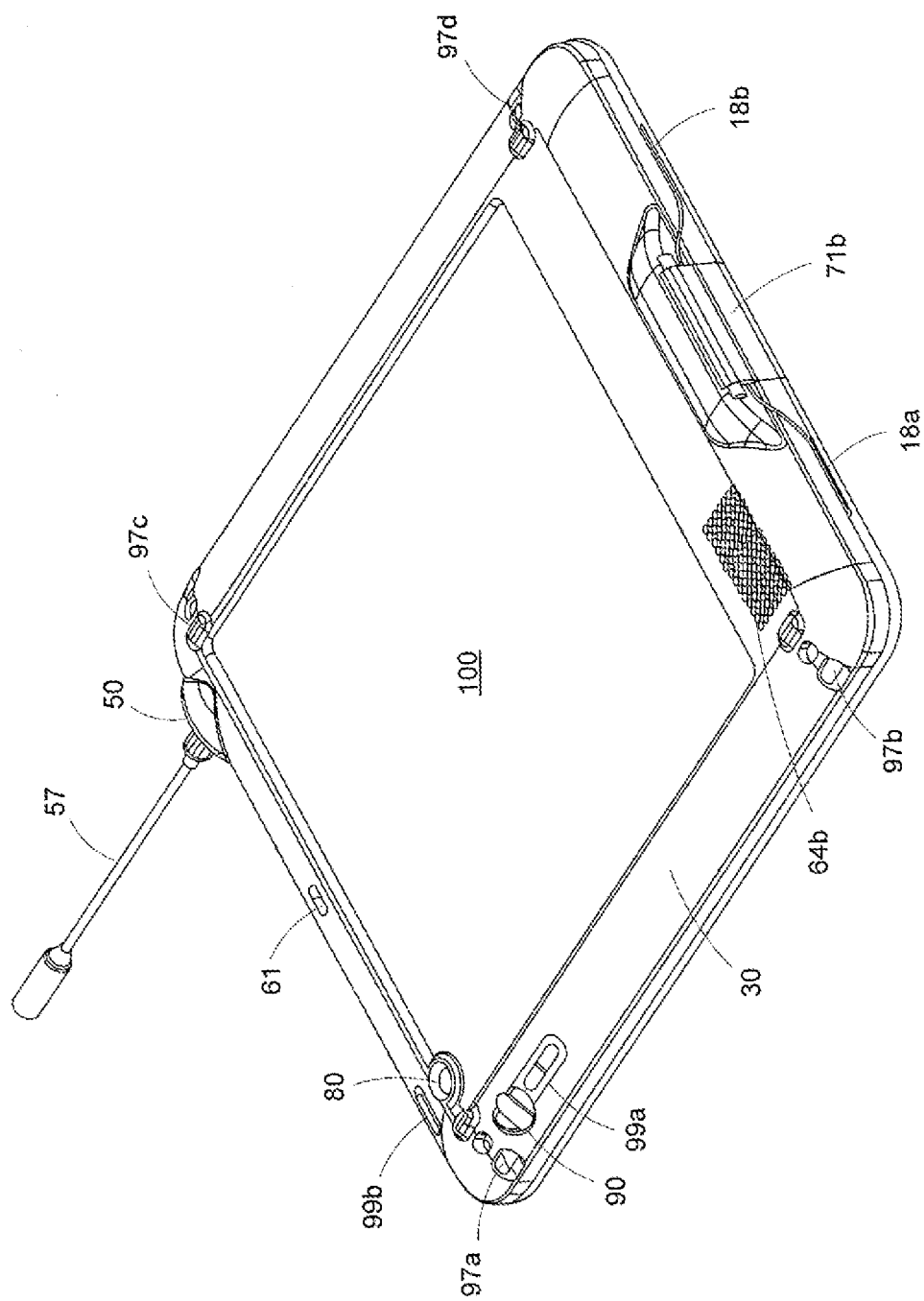
FIGS. 9A-C provide perspective views of the protective housing showing various accessory and control features.

FIG. 9A is a perspective view looking down at the housing 1, when the housing is in a face down orientation and the bottom member 3 is viewed from above. The bottom member peripheral portion 30 is shown with volume buttons 99*a*, an on/off button 99*b*, an silence/orientation switch 90, microphone transmission port 61, speaker grille 60*b*, lens feature 80, and headphone port opening 50 with electronic transmission port adapter 57 shown in operable attachment, where the electronic transmission port adapter 57 can be used to provide a waterproof interface for various types of accessories, such as headphones, speakers, or other members in need of electronic communication with a housed electronic device 100. Latch feature 70 is covered by a latch door 71*b* that may be positioned so as to cover and enclose a charge port opening 11*a* (not shown). Tool slot features 18*a* and 18*b*, which may be used to separate top member 2 from bottom member 3 by a tool, coin, or the like, are also visible in this view.

Figure 9B:
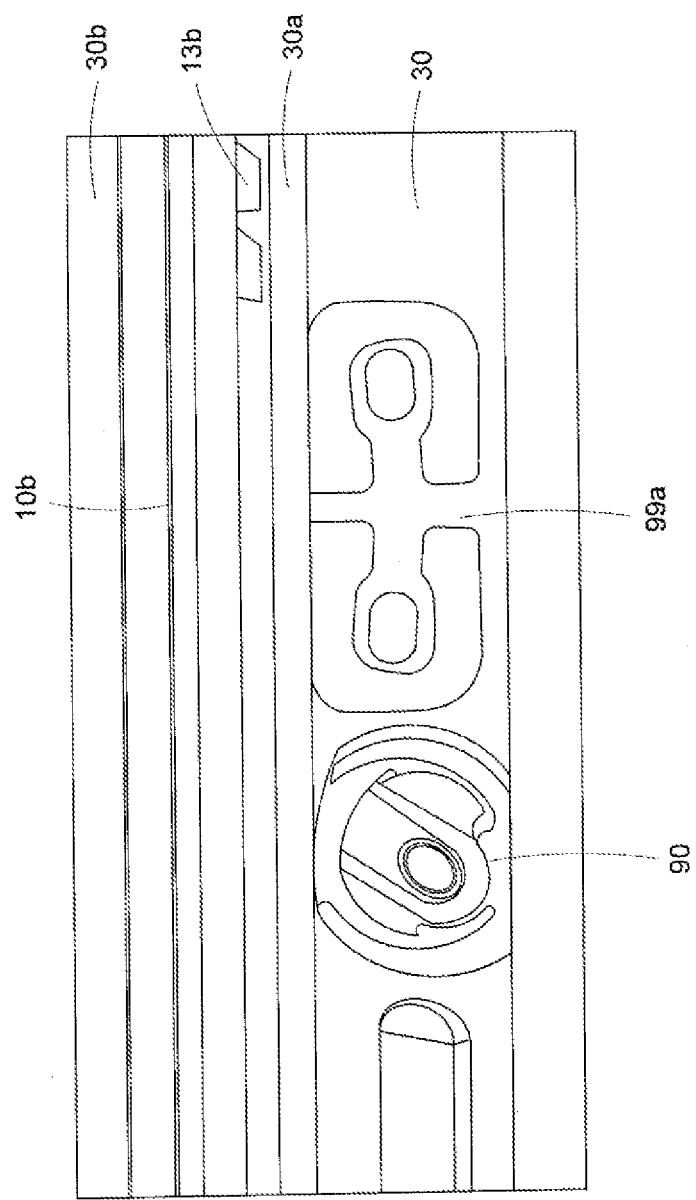

FIG. 9B is a close up side view of the inside of bottom member 3 of a protective housing 1 showing the silence/orientation control switch 90 adjacent to the volume control button 99*a*. The silence/orientation control switch 90 and volume control button 99*a* features are typically fabricated in two parts. First, the bottom member front and back surface 35 is extruded and moulded to form the bottom surface and interior and middle perimeter portions, wherein portions of the peripheral member 30 are fabricated in such a way that apertures therethrough are provided, which apertures can further be formed into the various button features of the housing 1.

These button features may include specific functional elements that are crafted separately but added to the housing after the bottom member 3 has been molded. Waterproof seals and/or seats for these features may then be fabricated and added to the bottom member 35 skeletal frame, such as during an overmoulding process. Accordingly, a suitable orientation/silence switch feature 90*a* and/or volume control see-saw button are engineered and assembled with the case in a manner such as this. Hence, the orientation 90 and volume control 99 buttons are coupled to the housing 1 in such a manner that they are adaptable for engaging the corresponding switches and buttons of a housed device.

The silence/orientation control switch 90 depicted on the interior of a bottom member 3 of the housing 1 in this view engages with a rotating user interface switch member 90*a* (not shown) disposed in operable connection on the exterior of the protective housing 1. The rotating switch member 90*a* of the orientation control switch 90 comprises a handle member 90*b* (not shown) configured for a user to rotate about a partially circular indentation 90*c* (not shown) disposed in the external portion of the protective housing.

The handle member 90*b* is integral with a post member 90*d* that passes from the exterior of the protective housing 1 into the interior thereof. A post member gasket 90*e* circumscribes the post member 90*d* to form a waterproof and dust proof seal therewith so as to prevent the ingress through this feature. The post member engages with orientation control switch 90, which may be configured as a cam-like feature 90*f* having a U-shaped opening that functions to translate the rotational motion of the handle member 90*b* and post member 90*d* into a vertical or horizontal movement of a linearly moveable slider type switch on a housed electronic device. In operation, rotating the handle member 90*d* slides a linearly translating switch on the electronic device from a first position to a second position, for example, to silence the device or as an orientation control switch.

The volume control portion 99*a* shown in this embodiment is configured as a hammerhead sea-saw member and operates as an oscillating toggle that interfaces respectively with the volume control button of a housed electronic device. For example, as illustrated this internal toggle may be actuated on the exterior of the protective housing by depressing either an up volume or a down volume portion of the button to rock back and forth the interior toggle from one side or the other side such that it operably engages the volume control of a housed electronic device. Also depicted in this view is the exterior bottom channel bounding wall 30*b* and interior channel bounding wall 30*a* comprising teeth receptacles 13*b*. Immediately distal to the interior bottom channel bounding wall 30*a* is bottom member channel 10*b*, which has an exterior channel bounding wall 30*b* immediately distal this member, and integral with bottom member interior bounding wall 30*a*.

Figure 9C:
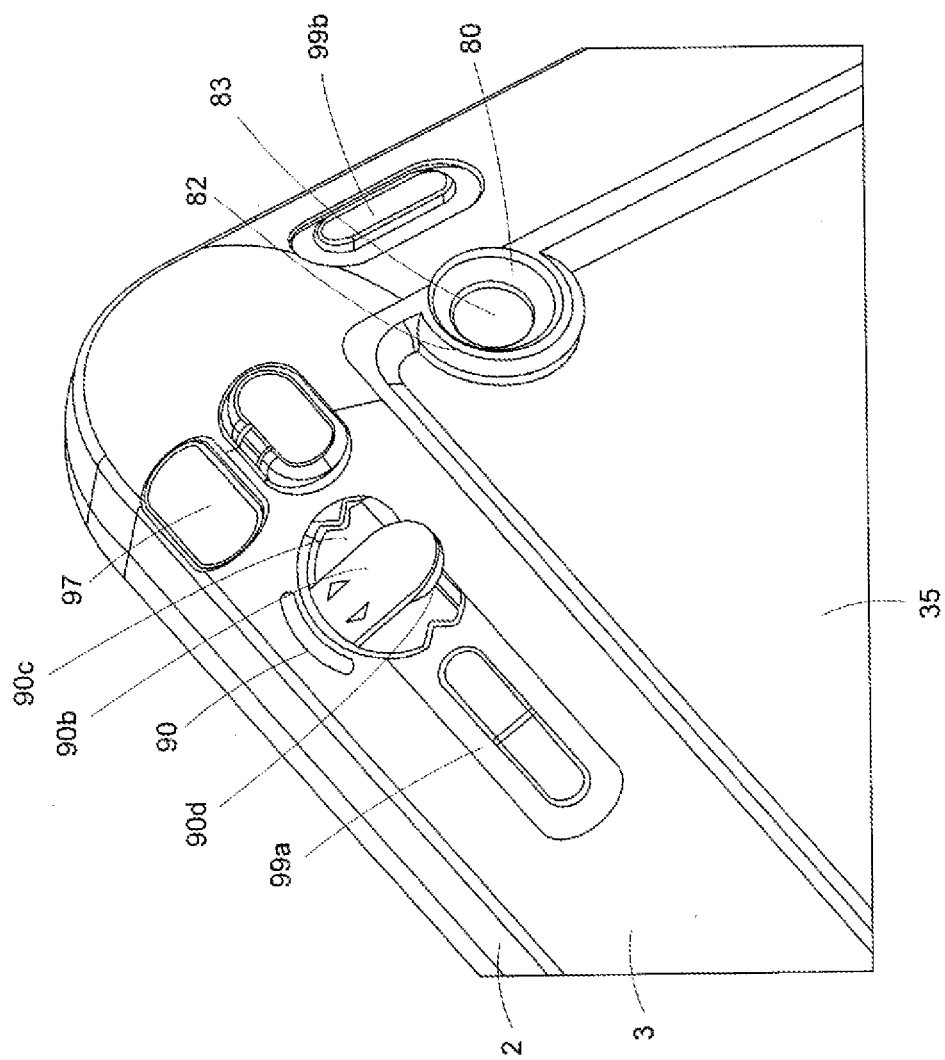

FIG. 9C is a perspective view of a bottom member 3 corner of the protective housing of FIG. 9B. A volume control portion 99*a* is shown, which in this embodiment comprises a hammer head toggle switch, proximal to the silence/orientation control switch 90 disposed within the bottom member peripheral portion 30 adjacent the bottom member back surface 35. Operation of the orientation control switch is described above in the description of FIG. 9*b*. In this view, the orientation control switch handle 90*b* is illustrated as it is situated inside the partially circular indentation 90*c* integral with the bottom member peripheral portion 30. The volume control switch 99*a* shown in this embodiment operates as an oscillating toggle that interfaces with the volume control switch of an electronic device such that an internal toggle (not shown) may be actuated by the volume control switch 99*a* as described above. An on/of switch 99*b* is also provided in like fashion, wherein an extended post feature extends from an exterior of the housing to the interior, which post member is covered by a waterproof sealing envelop. The post member has a user interface portion positioned on the external portion of the housing that may be depressed by a user, which downward force moves the post element proximally downwards thereby engaging the on/off switch of a housed electronic device turning it from the on to the off position and vice versa. A lens feature 80 is also shown on the bottom member interior perimeter portion 30*a* abutting against the on the bottom member back surface 35*b*. The lens feature includes an optical grade lens 83 that has been inserted into the bottom member 3, e.g., via a mandrol or other suitable means, and an optical skirt 82 as been fabricated to surround the lens so as to substantially prevent light, e.g., from a flash member (not shown), from impinging into the camera lens 83 portion. Although a flash feature 85 is not depicted, it may be included in various embodiments.

FIG. 9D is a top view of the back surface 35 of the distal end portion 32 of a bottom member 3. Numerous features can be seen along the bottom member exterior peripheral portion 30 in this Figure, including the volume control portion 99*a* depicted in this embodiment as a slider switch, orientation control switch 90, on/off button 99*b*, and a lens feature 80 having a lens 83 partially surrounded by a lens skirt 82 shown on the bottom member interior peripheral portion 30 abutting against the bottom member back surface 35. Also shown are a microphone transmission port feature 61 and the head phone sealing port 53, which is protected by a reinforced raised member. The orientation control switch handle 90*b* is illustrated as it is situated inside the partially circular indentation 90*c* integral with the bottom member peripheral portion 30, the operation of which is described in greater detail in FIGS. 9B and 9C. The user interface handle 90*b* has movement indicators displayed thereon. The on/off switch 99*b* shown in this view operates a translatable toggle that interfaces with an on/off switch of an electronic device such that an internal depressible toggle or button (not shown) may be actuated by the on/off switch 99*b* depicted in this embodiment.

Figure 10A:
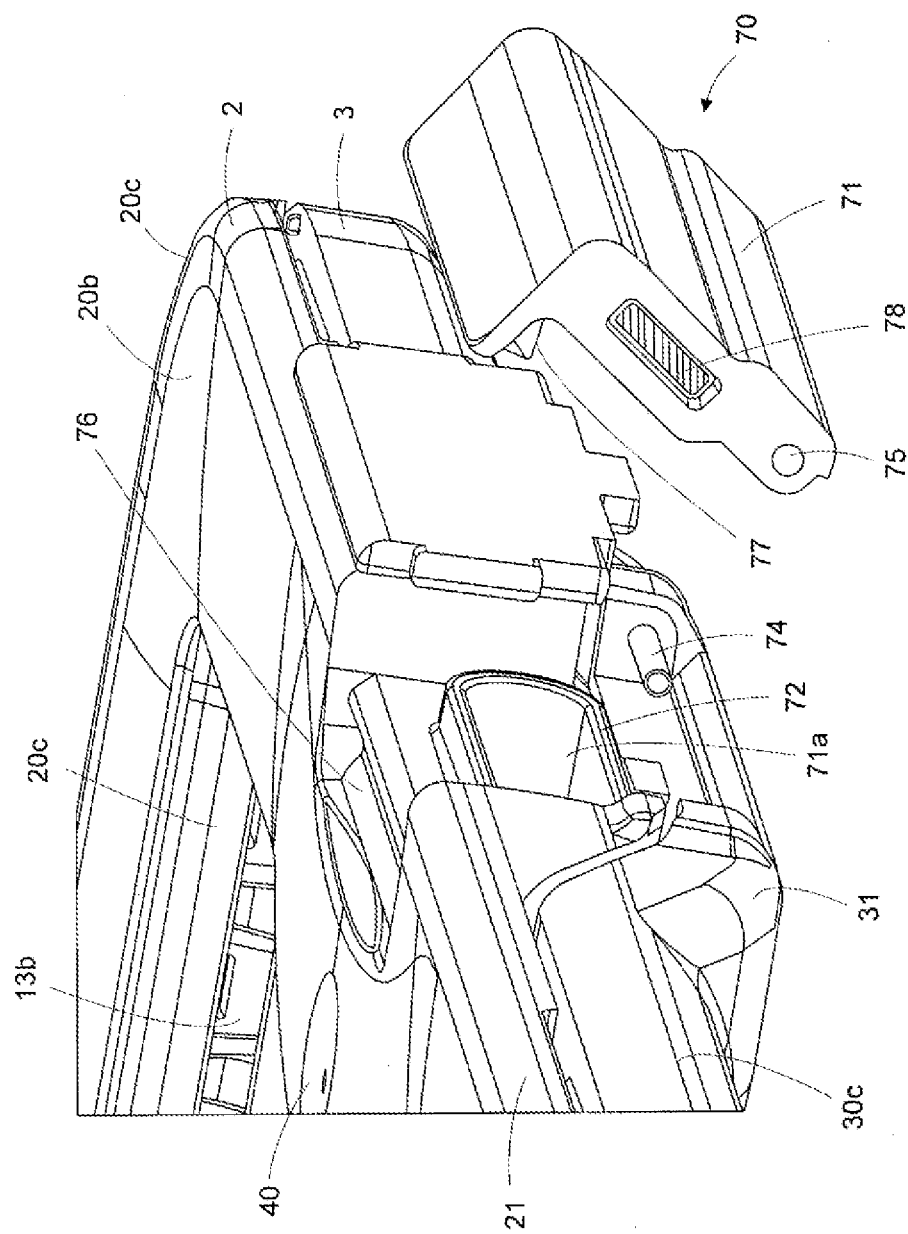

FIG. 10A is a close up perspective view of the proximal portion of the housing 1 showing an electronic transmission port configured as a charge port feature 70 of the housing of FIG. 1A. Both a top member 2 and a bottom member 3 are depicted as they would be coupled together to the form the housing 1. The charge port feature 70 is depicted having a charge port latch door 71*b* that is removed from the housing to show detail.

The bottom 3 and top 2 members are shown coupled together in the bottom of this view such that the top member and bottom member proximal end portions 21 and 31 of their respective peripheral portions 20 and 30 are facing forward and bordering each side of a latch feature opening 71*a*. The bottom member exterior perimeter portion 30*c* forms a downwardly curving ridge configured to accommodate the latch feature opening 71*a* and provide protection from banging, bumping and the like by having a somewhat more substantial bottom member proximal end portion 31.

The bottom member proximal end portion 31 may incorporate various types of latch connecting members, such as an axle receiving orifice, an axle, aperture, hole, hinge, flap, or the like to accommodate a connection member and/or door members. As can be seen in this embodiment, latch door axle 74 is depicted protruding partially from the bottom member middle perimeter portion 30*b* to connect latch door 71*b* at a latch door axle receiving orifice 75 such that it can pivot or swing from an open position to a closed position that provides a liquidproof and dust proof seal for an electrical transmission port, e.g., a charge port.

The top member exterior perimeter portion 20*c* can also be seen in this view such that the top member proximal end portion 21 is situated on top of the bottom member perimeter portion 31, and in conjunction the two surround and form a shock and bump resistant portion at the front of the protective housing 1 where a charge port feature 70 is located. Depicted on the top of this view is the top member peripheral portion front surface illustrating the top member middle perimeter portion 20b and top member interior perimeter portion 20c at the upper corner as well as home button 40 present in the middle left portion of this view. Bottom member clasping mechanism 13b is also shown as seen through the membraneless bounds of the top peripheral portion 20.

As depicted, the latch port feature 70 includes a latch port opening 71a, which opening is bounded by a stiffened bounding member 72 that is sized to receive a connection interface of a device accessory, such as a 30 pin data transfer and charger of an electronic device. The latch port opening 71a is positioned entirely in and through the middle perimeter portion 20b of the top member 2. The bounding member 72 is further configured to include a latch ramp receiving portion 76, which is adapted to receive a latch ramp closure element 77 of the latch door 71b. The top member middle perimeter portion 20b additionally includes a latch door axle 74 for connecting to the latch door 71b.

Accordingly, the latch door 71b includes an axle receiving orifice 75 that is configured to receive at least a portion of a latch ramp axle 74 therethrough, whereby through this interaction the latch door 71b may rotate about the axle 74 from an open to a closed position so as to cover the port opening in a waterproof and shockproof sealing. To better ensure said sealing the latch door 71b may include a sealing mechanism 77, configured here as an extended latch ramp member, that is adapted for engaging a corresponding sealing mechanism on the top member 2. The latch door 71b further includes a gasket 78 that is configured for sealing against the latch port opening 72 thereby protecting the opening from the ingress of liquid when the latch door 71b is closed and engaged with the top member 2.

Figure 10B:
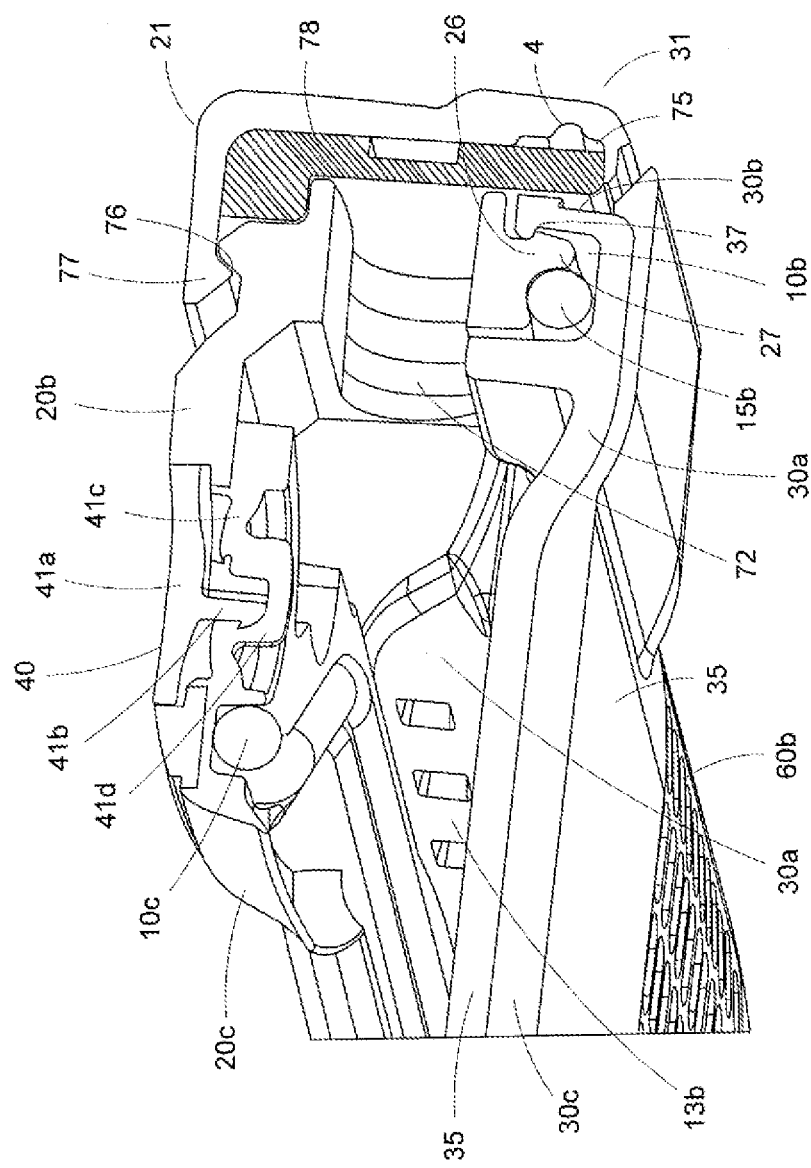

FIG. 10B is cross-sectional view of a latch door feature of FIG. 10A with the latch door feature positioned in the corner of the protective housing 1. The latch door 71b is in the closed position. As indicated above, the latch door feature 70 includes an axle receiving orifice 75 having a latch door axel received therethrough. Also included is a sealing mechanism 77, e.g., latch ramp member, that is engaged with its corresponding sealing mechanism 76, e.g., latch ramp receiving member, on the top member 2. The latch door 71b further includes a gasket 78 that is sealed against the latch port opening 71a and bounding member 72 thereby protecting the opening from the ingress of liquid. The latch door locking ramp 77 is received within the latch ramp receiving member 76, thereby securing the closure and the sealing of the latch ramp door 71b.

As depicted, home button 40 is disposed on the top member peripheral portion 20 top surface, which is in operable connection with the various associated features including the home button user interface 41a, home button device interface 41b, home button sealing member 41c, depicted below the home button 40 and providing a liquidproof sealing therefore, and home button device engagement portion 41d.

To the adjacent right along the top member peripheral portion 20, the top member proximal end portion 21 is depicted as it forms a waterproof seal with the latch cover 71b depicted at the right hand side of this view. The charge port latch or cover 71b, in conjunction with the latch port door 71b and gasket 78 function to provide a waterproof sealing of the charge port orifice 71a. A ramp latch 77 can be seen in this view abutting against a latch ramp receiving member 76 to form a seal at the top member front surface, and where gasket 78 further facilitates a waterproof seal between the exterior of the protective housing and the latch feature opening 71a. In this view, the latch feature opening 71a is depicted with the curved surface of the opening in cross-section is facing forward.

As depicted here, the top member middle perimeter portion 20b of the top member 2 is aligned with the bottom member middle perimeter portion 30b of the bottom member 3, and the corresponding clasping mechanisms 27 and 37 are coupled together. The bottom channel 10b includes a gasket 15b positioned therein, such that an extended ridge member 26 of the top member middle perimeter portion 20b impinges within the channel 10b engages and compresses the gasket 15b within the channel 10b of the bottom member 3 to create a waterproof seal in this portion of the protective housing 1. The bottom member proximal end portion 31 is depicted at the bottom front of this view, with the bottom member back surface 35 including a speaker grille 60b. Teeth receptacles 13b positioned on an interior perimeter portion 30a of bottom member 3 are also visible in this view, and above these can be seen the top member interior perimeter portion 20a as this surface slopes at an angle on the peripheral member 20 front surface.

Figure 10C:
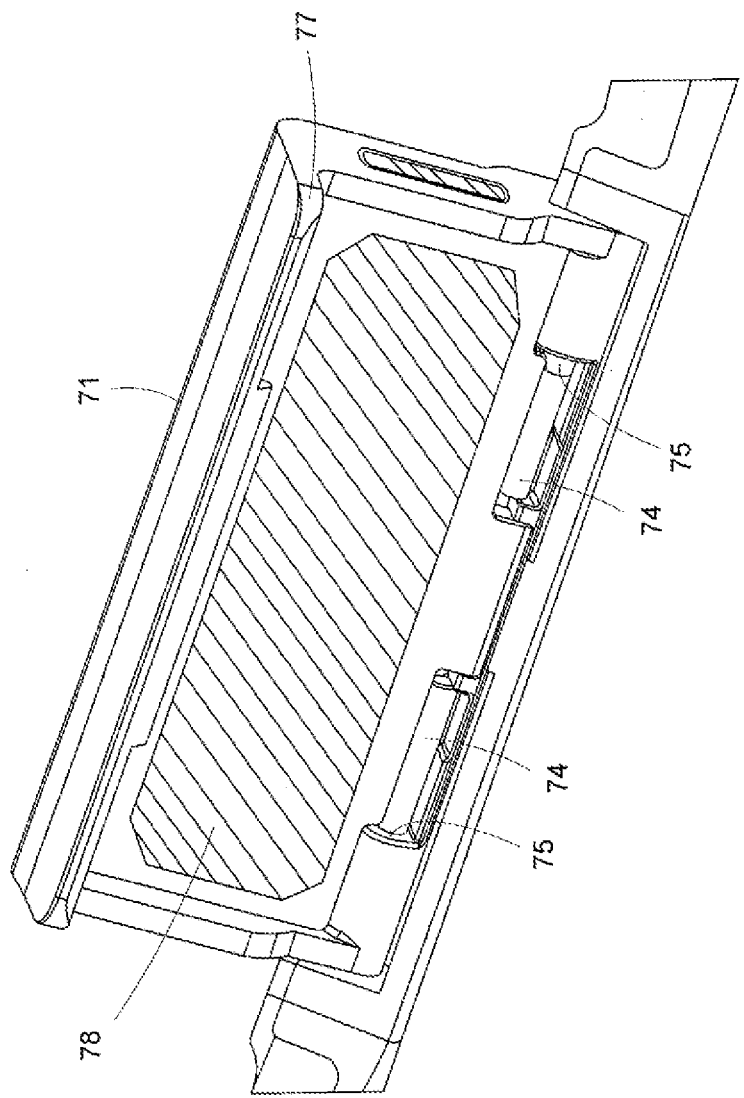

FIG. 10C is a close up perspective view of a portion of latch feature door 71b in pivotal attachment with the bottom member proximal end portion 31 of a bottom member 3 of the protective housing. Latch door 71b is seen with a raised, compressible gasket 78 disposed on interior the surface of the latch door 71b, which is attached to the bottom member proximal end portion 31 of a bottom member 3 of the protective housing via latch door axle 74 having been received within latch door axle orifice 75. The latch door 71b further includes a latch ramp 77 for assisting in securing the latch door 71b in a closed position.

Figure 10D:
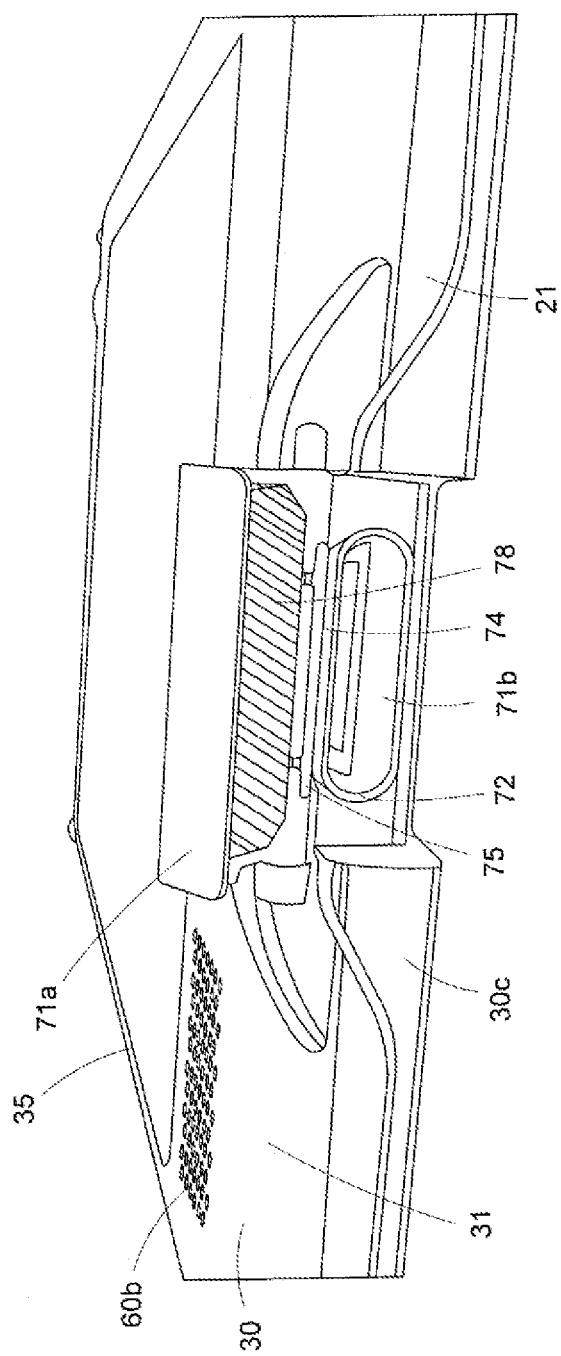

FIG. 10D is a close up perspective view of the proximal portion of a protective housing 1 showing the latch feature 70 in an open position, wherein the latch door 71b is in the open position and the latch opening 71a is clearly seen bounded by stiffened bounding member 72. The bottom member back surface 35 is facing upward in this view, with the speaker grille 60b illustrated in the front upper left portion of the bottom member 3. Latch cover door 71b is depicted opened and as it would close downward from the bottom member 3 in this view. As can be seen, the bottom member proximal end portion 31 is has a curved opening that extends upward and outward in this view to which two axle receiving orifices 75 are located, which function to receive a latch door axle 74 to connect latch door 71b that pivots or swings from an open position to a closed position about the axle 74 where a liquid-proof and dust proof seal for a charge port is formed. The top member exterior perimeter portion 20c also assist in forming a shock and bump resistant portion at the top member proximal end portion 21 surrounding the latch feature opening 70 that is apparent in this view. The latch door 71b further includes a gasket 78 for ensuring a watertight sealing when in the closed position.

FIG. 10E is a perspective view of the top member peripheral portion 20 top surface looking down at a protective housing 1 containing an electronic device 100. A latch feature 70 is provided wherein the latch door 71b is in the closed and engaged position, wherein the latch door 71b has been rotated from the bottom member 3 to engage the top member 2 so as to close and seal the port opening of the latch feature 70.

The top member 2 has a top member peripheral portion 20 that defines an opening for the placement of a touch-sensitive display of an electronic device 100 by circumscribing the outer perimeter of the electronic device 100. The top member peripheral portion 20 has a top member middle perimeter portion 20b, that is configured as a substantially rigid frame circumscribing the bounds of the device 100 and forming the top member 2 of the housing 1. The top member middle perimeter portion 20b is comprised of a substantially rigid material. The top member interior perimeter portion 20a is coupled to the top member middle perimeter portion, such as by overmoulding, is more typically comprised of materials that are more flexible or pliable so as to allow the top member interior perimeter portion 20a to form a soft inner edge suitable for forming a seal with the front surface of the housed electronic device 1 when positioned in the protective housing 1.

The top member peripheral portion 20 can be seen to have opposing top member left hand side portion and top member right hand side portions, 23 and 34 respectively, as well as opposing top member proximal end portion (at front) and top member distal end portions, 21 and 22 respectively. The home bottom 40 is depicted in the middle portion of the surface of the top member proximal end portion 21, with latch door 71b shown extending upward from the bottom member 3 and traversing the bottom member 3 and the top member 2 to form a waterproof seal for the latch feature opening 71a (not shown).

Figure 10F:
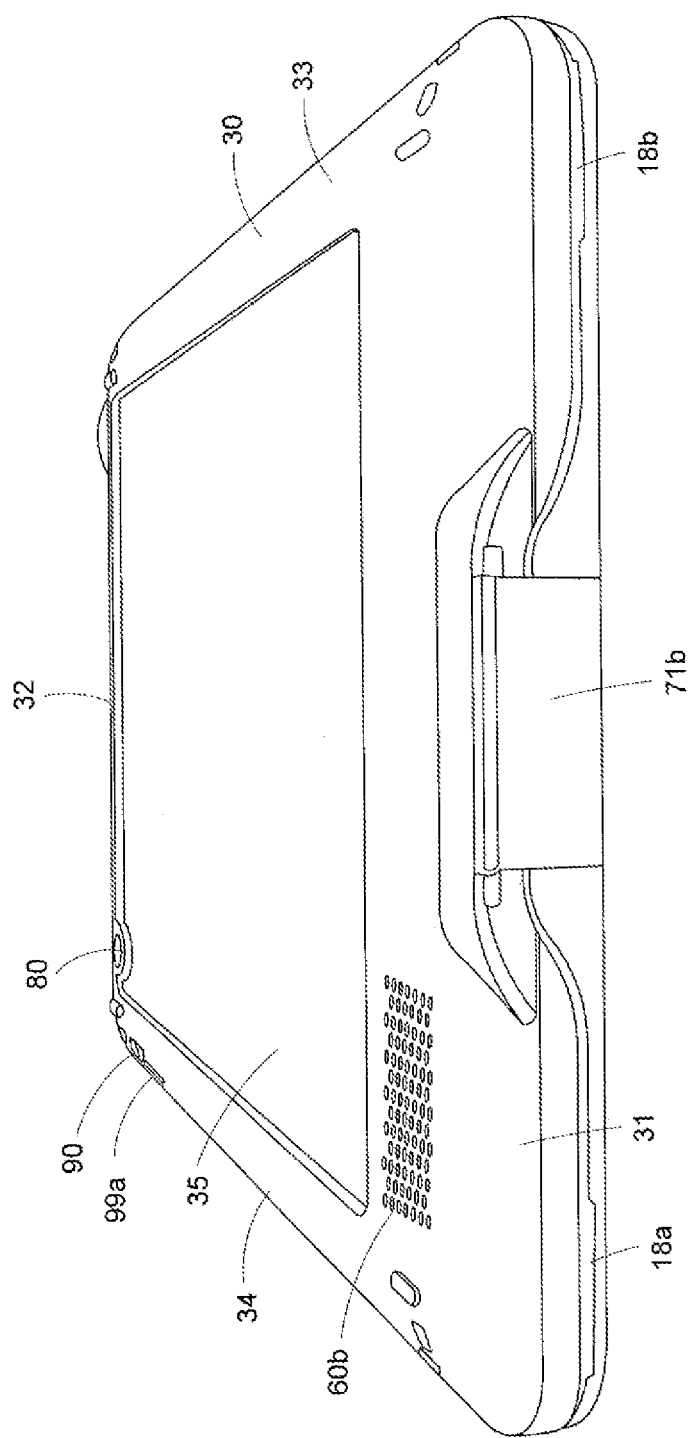

FIG. 10F is a perspective view of a proximal portion of the housing 1 when the housing is face down revealing the bottom member back surface 35 looking down at a protective housing. The bottom member peripheral portion 30 is depicted on the top of this view defining the perimeter of the bottom member surface 35, where opposing bottom member right hand side member and bottom member left hand members, 34 and 33 respectively, are illustrated on the left and right sides. The bottom member proximal end portion 31 appears at the front of this view, with speaker grille 60b shown of the left hand portion. A latch port feature 70 is also depicted having a latch door 71b in the closed and engaged position.

Additional features are depicted on the bottom member perimeter portion 30 shown in the upper left portion of this view, including sound control button 99a, silence/orientation switch 90, and lens feature 80. Latch door 71b is depicted here traversing between the bottom member 3 and the top member 2, which may function to cover and enclose a charge port opening (not shown). Also shown at the front of this view between the bottom member 3 and the top member 2 are two tool slot features 18a and 18b, which may be used to disengage the top member 2 and bottom member 3 upon insertion of a screw driver, coin, or other member that can be used to apply a force to disengage the bottom member 3 and the top member 2.

Figure 11A:
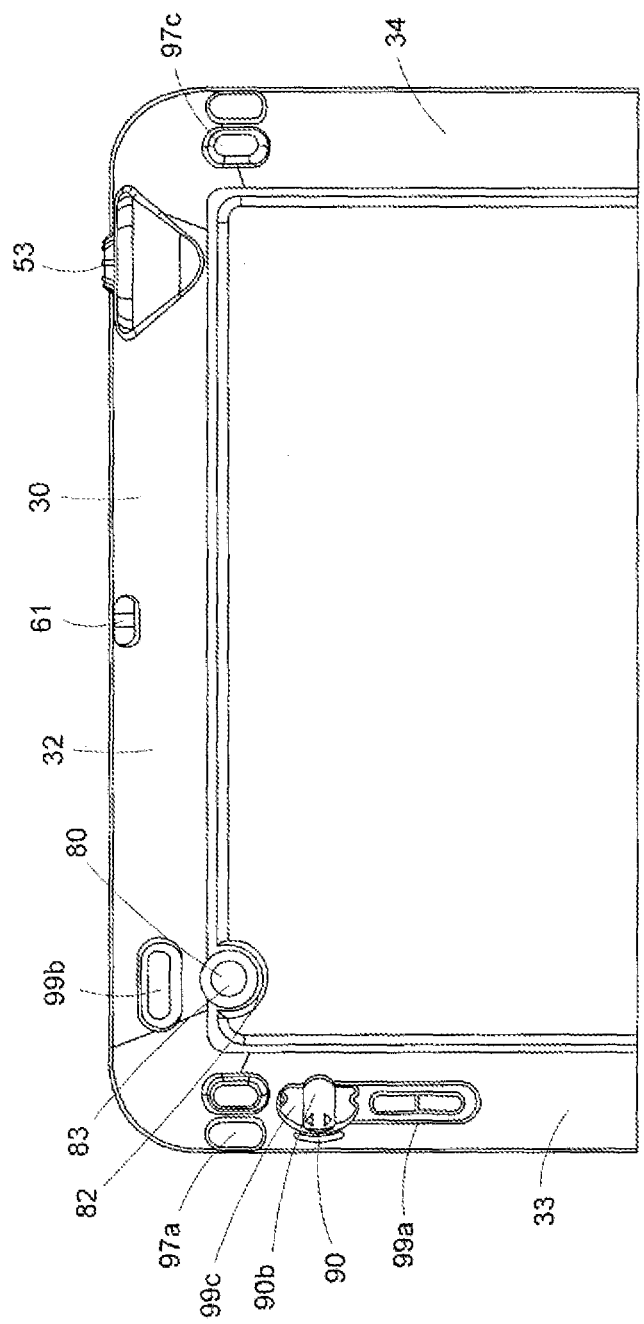
FIGS. 11A-C provide perspective views of the protective housing, including control features, accessory features, and a clasping mechanism.

FIG. 11A is a perspective view of the bottom member back surface 35. The bottom member perimeter portion 30 is shown at the top and sides of this view, with opposing bottom member right hand side member 33 and bottom member left hand members 34 shown left and right side respectively in this particular view. The bottom member distal end portion 32, depicted on the top of this view, incorporates headphone sealing port member 53, which is protected by a reinforced raised rib portion, microphone transmission port 61, and lens feature 80, partially circumscribed by lens skirt 82 and having an optical grade lens 83 positioned therein, and additional features, including volume buttons 99a and orientation switch 90 are depicted on the bottom member right hand side member 33 on the back surface 35b of the bottom member 3. The orientation control switch 90 includes orientation control switch handle 90b depicted within a partially circular indentation 90c integral with the bottom member perimeter 30. The on/off switch 99b shown on bottom member distal end portion 32 in this embodiment operates as an oscillating toggle that interfaces with the on/off switch of an electronic device. Bottom member accessory ports 97a and 97b are depicted on the upper portion of opposing bottom member right hand side member 33 and bottom member left hand member 34.

Figure 11B:
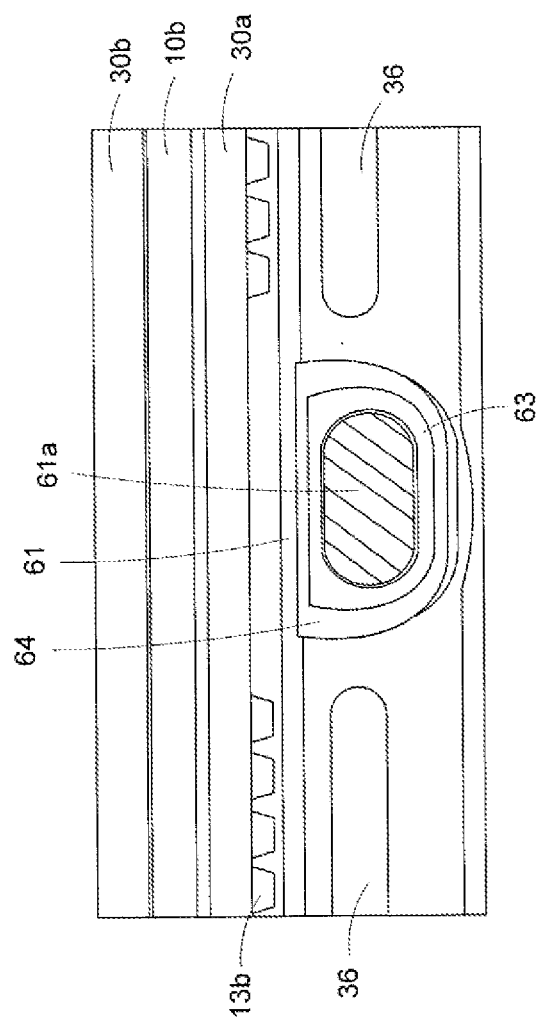

FIG. 11B is a close up view of a bottom member 3 of a protective housing illustrating the microphone transmission port 61 as viewed from the interior of the bottom member 3 of the protective housing 1. The bottom member interior peripheral portion 30 is shown with the microphone transmission port 61 centered and bordered by right and left hand bumpers 36. The microphone transmission port 61 incorporates several features that facilitate the transmission of sound from an electronic device outward from the protective housing and to provide a waterproof seal so that water does not enter the protective housing. Accordingly, the microphone transmission port 61 includes an inlet aperture 62 (not shown) and therefore incorporates an acoustic membrane and/or gasket 61a that is transmissive for sound but are non-transmissive for liquid and which covers the aperture of the microphone port on the inside. The acoustic membrane 61a is further adhered to the housing and coupled therewith by a microphone gasket overmoulding 63 section. It is also useful to direct, channel, or block the transmission of sound by incorporating a microphone port echo canceling feature 64, which is depicted in this embodiment as a raised circumscribing ridge that minimizes the transmission of unwanted sound capable of creating interference into the microphone port 61, such as through the internal transmission from the housed speaker portion. Bottom member teeth receptacles 13b disposed on an interior bottom member bounding wall 30a as well as channel 10b are depicted interiorly to the inner surface of the bottom channel exterior bounding wall 30b, with bottom member channel 10b situated immediately above in this view such that the bottom member channel 10b is bordered on top by the bottom member interior perimeter portion 30b that is contiguous with the bottom member middle perimeter portion 30b depicted at the top of this view.

Figure 11C:
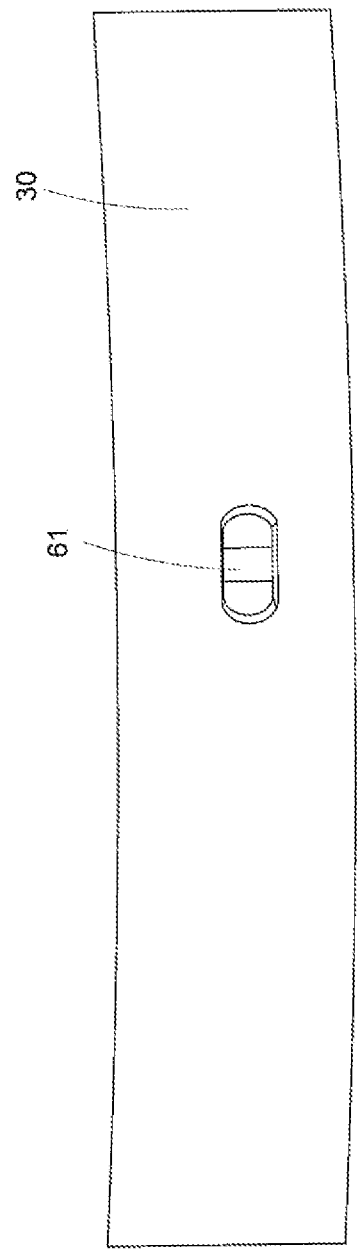

FIG. 11C is a close up front view of a bottom member 3 of a protective housing 1 directed to the microphone transmission port 61. Looking at the exterior of a protective housing, the bottom member exterior perimeter portion 30c is shown here with the microphone transmission port 61 depicted in approximately the center portion of the bottom member distal end portion 32 relative to its longitudinal axis, with microphone grille 61b providing protection against the entry of an unwanted object into the microphone transmission port 61 while allowing for the transmission of sound.

The microphone transmission port 61 may be disposed in a different portion of the protective housing in alternative embodiments (not shown). The microphone transmission port 61 incorporates several features that are not shown in this view that facilitate the transmission of sound from an electronic device outward from the protective housing and to provide a waterproof seal so that liquid does not enter the protective housing though the microphone port, these features may include, for example, an acoustic membrane 61a (not shown) that is transmissive for sound but is non-transmissive for liquid, which membrane covers the aperture of the microphone port on the inside and which may be sealed to the housing by a microphone gasket overmoulding 63 (not shown).

Figure 12A:
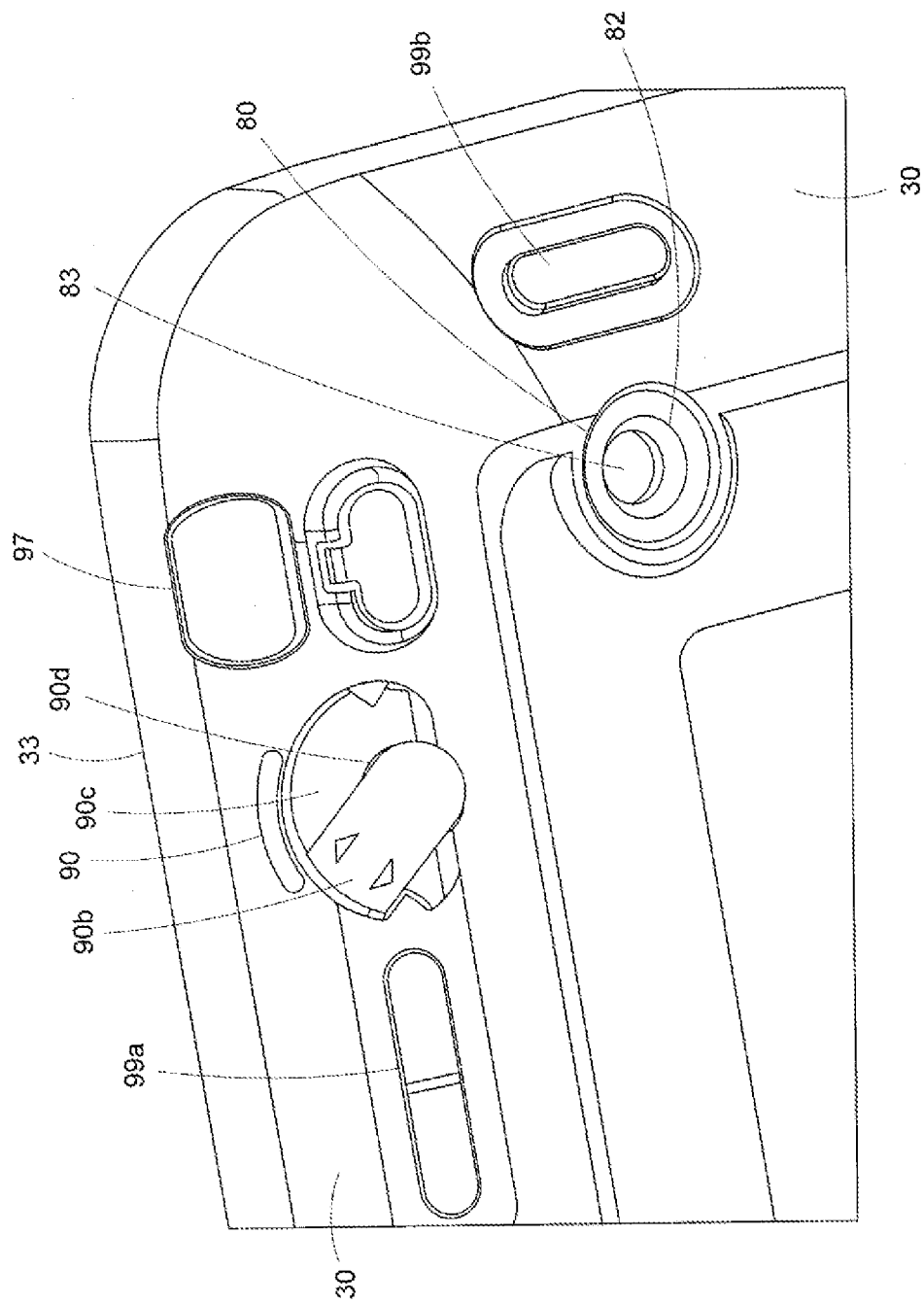

FIG. 12A is a close up view of a corner of the bottom member 3 of the protective housing where the bottom member right hand side member 33 abuts against the bottom member distal end portion 32 along the bottom member perimeter 30. A volume control portion 99a, which is a slider control in this embodiment, and orientation control switch 90 are disposed on the bottom member right hand side member 33 adjacent to bottom member external accessory port 97. The orientation control switch handle 90*b* is illustrated as it is situated inside the partially circular indentation 90*c* integral with the bottom member peripheral portion 30. The on/off switch 99*b* shown in this embodiment operates as an oscillating toggle that interfaces with the on/off switch of an electronic device such that an internal toggle (not shown) may be actuated by the on/off switch 99*b* depicted in this embodiment. A lens feature 80 is also shown on the bottom member interior perimeter portion 30*a* abutting against the on the bottom member back surface 35. The lens feature includes an optical grade camera lens 83 that is surrounded and protected by an overmoulded lens skirt adapted for blocking the errant transmission of light into the lens 83.

In the embodiment shown here, the external accessory port 97 includes a first opening and a second opening adjacent thereto in order facilitate the coupling of a variety of accessory members to the housing, for example for using, carrying, and/or mounting the protective housing, including for example a belt clip, leg mount, hand mount, hand strap, arm strap, bike mount, car mount, or the like. The lens feature 80 is coextensive with the bottom member perimeter 30 at the bottom member distal end portion 32.

Figure 12B:
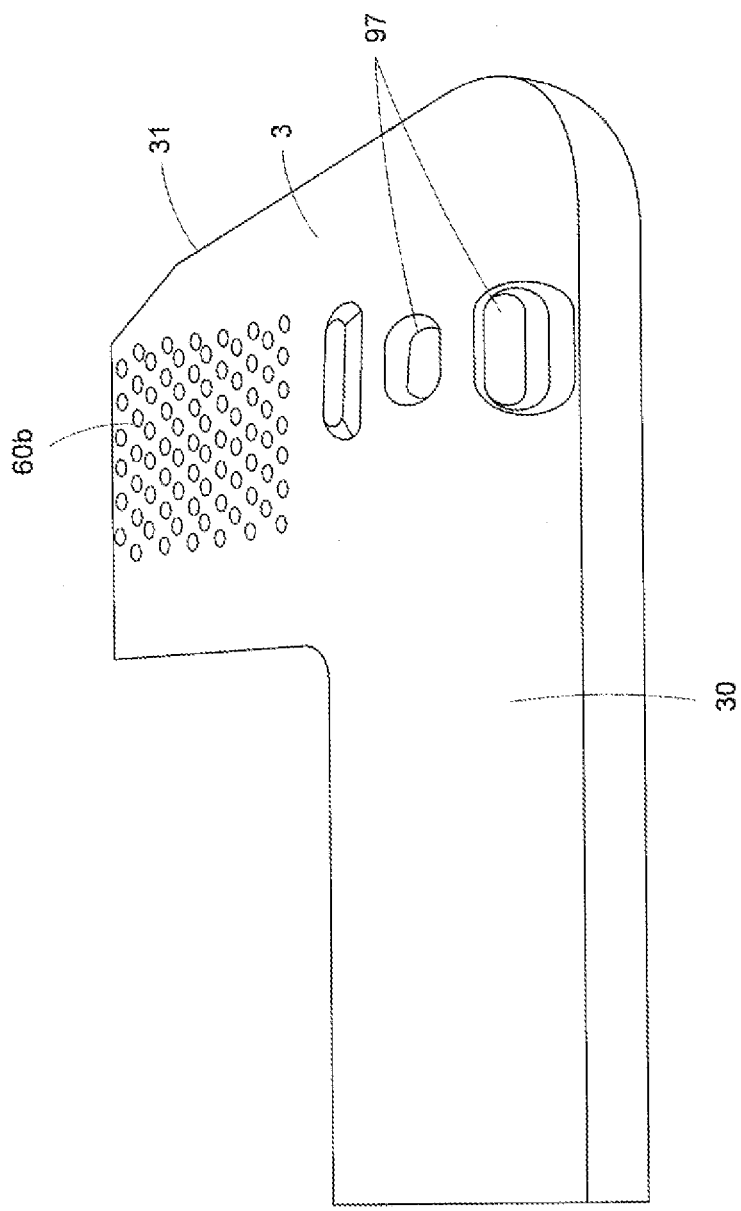

FIG. 12B is a close up perspective view of a corner portion of the bottom member proximal end portion 31 of a bottom member 3 of a protective housing. Speaker grille 60*b* is shown on the upper right portion of the bottom member peripheral portion 30 in this view, with an offset or riser on the bottom member 3 back surface 35 depicted immediately below the speaker grille 60*b*, such offset or riser functioning to lift the bottom surface from a surface on which it is set. Although only one riser is depicted, there may be two, three, four, or more positioned about the housing such as in each of the corners of the top and/or bottom member. One external accessory port 97 having two openings for the attachment of an accessory for the protective housing is also depicted.

FIG. 12C is a close up perspective view of a corner portion of the bottom member proximal end portion 31 of a bottom member 3 of a protective housing showing an external accessory port 97 having two openings that are in connection in the bottom member of the housing. The two openings are positioned such that their lumens intersect to form a relatively "L" shape. In this manner an elongated accessory attachment member having an accessory interface on an external edge thereof and an accessory locking pin receiving portion on an internal edge thereof may be inserted into one of the openings; and likewise an extended locking pin having a user interface on an external portion thereof and a locking interface at an internal edge thereof may be inserted into the other opening so as to engage the lock receiving portion of the accessory attachment thereby locking it in place, together both of which function to allow various accessories, such as handles and mounts, to be removably attached to the housing. The various connection interfaces may be any suitable interface capable of allowing an accessory to be coupled to the accessory attachment member, and any suitable locking interface may be employed. In one embodiment, the lock receiving portion of the accessory pin is a grille portion and the lock portion of the locking element is a flexible fork member having tines that interlock with the grille element to couple therewith and thereby lock the accessory pin element in place. Speaker grille 60*b* is also depicted immediately below the external accessory port 97 in this view.

FIG. 13A-E are perspective views of a protective housing test seal member. In another aspect, a protective housing testing system is provided. In certain embodiments, a protective housing testing system comprises a seal test member 500 that provides a visual indication of a proper seal of a protective housing provided herein, for example to indicate a proper seal of a top member 2 and bottom member 3 of a protective housing. A test seal member of the protective housing testing system may serve as a reproduction, facsimile, replica, or proxy for an electronic device. Accordingly, a test seal member 500 need not be a true duplicate of an electronic device. In fact, it is desirable in certain embodiments it is desirable to provide a simplified and cost effective substitute for an electronic device which retains all the desirable characteristics for the intended purpose of using a test seal member 500 for the purpose of determining if a particular protective housing has a waterproof seal.

As such, the test seal member may have certain features of an electronic device. In particular, in certain embodiments it is important that the test seal member have at least some members which have size and dimensions that are very similar to, or even nearly identical with, those of an electronic device in which the protective housing is intended to be utilized. In particular, it is desirable for those members of a seal test member to have dimensions, sizing, and configuration to simulate those portions of an electronic device that interact with a protective housing provided herein.

In the embodiments of the test seal member 500 depicted in FIG. 13, a test seal member comprises a front surface 501 and a back surface 502. In certain embodiments, the front surface 501 of the test seal member 500 faces the back surface 35*b* of the top member of a protective housing upon being placed in a protective housing, and where the back surface of the test seal member 502 faces the front surface of the bottom member of a protective housing upon being placed in a protective housing.

The back surface 502 of the test seal member comprises a outer perimeter member 503 that is disposed at the outer edge of the bottom surface of the test seal member 500 and it typically surrounds the entire edge of this surface in order to closely approximate the members on an electronic device that would alternatively reside in an enclosed protective housing when it is not tested by the protective housing system.

In addition to the outer perimeter member of the back surface 502 of the test seal member, the test seal member may comprise additional ridge members. Accordingly, certain embodiments provided herein comprise a plurality of ridge members 504, including an outer edge member 504*a* disposed on the outmost portion of the outer perimeter member 503, such as about an outer perimeter member 503 that defines the edge of the test seal member. These embodiments may further include a middle ridge member 504*b* to the interior of the outer ridge member 504*a*, and an inner ridge member 504*c* disposed interior of both the middle ridge member 504*b* and the outer ridge member 504*a* on the back surface 502 of the test seal member 500. In certain embodiments the ridge members comprises a continuous ridge that extends, and in other embodiments the inner ridge member is not necessarily a continuous ridge. In certain embodiments, a channel 510 is defined by the middle ridge member 504*b* and the inner ridge member 504*c*. Inside this test seal member 500, channel ridge members 504*d* may be additionally included, for example on at least a part of the surface of the inner ridge member 504*c* that defines a surface of the inner ridge member.

In certain embodiments, the front surface of a test seal member 500 is substantially planar and smooth about its front surface. In other embodiments (not shown), the front surface of test seal members are provided which have alternative configurations that are adapted to mimic an electronic device as it is situated in a protective housing provided herein.

Figure 13A:
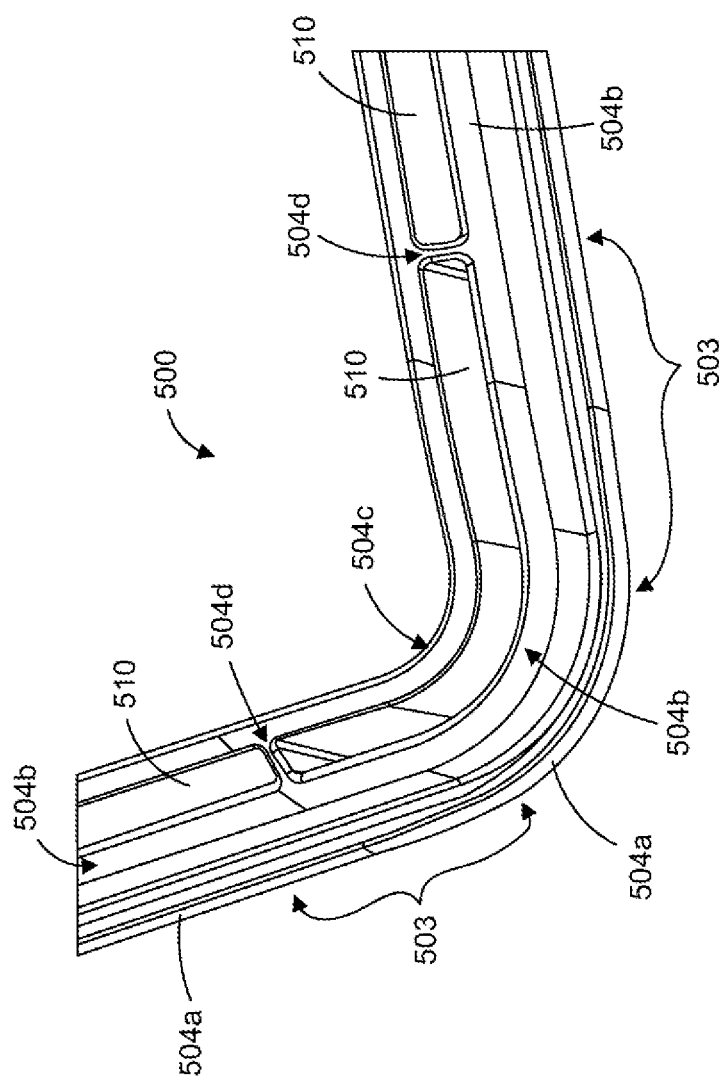
Figure 13B:
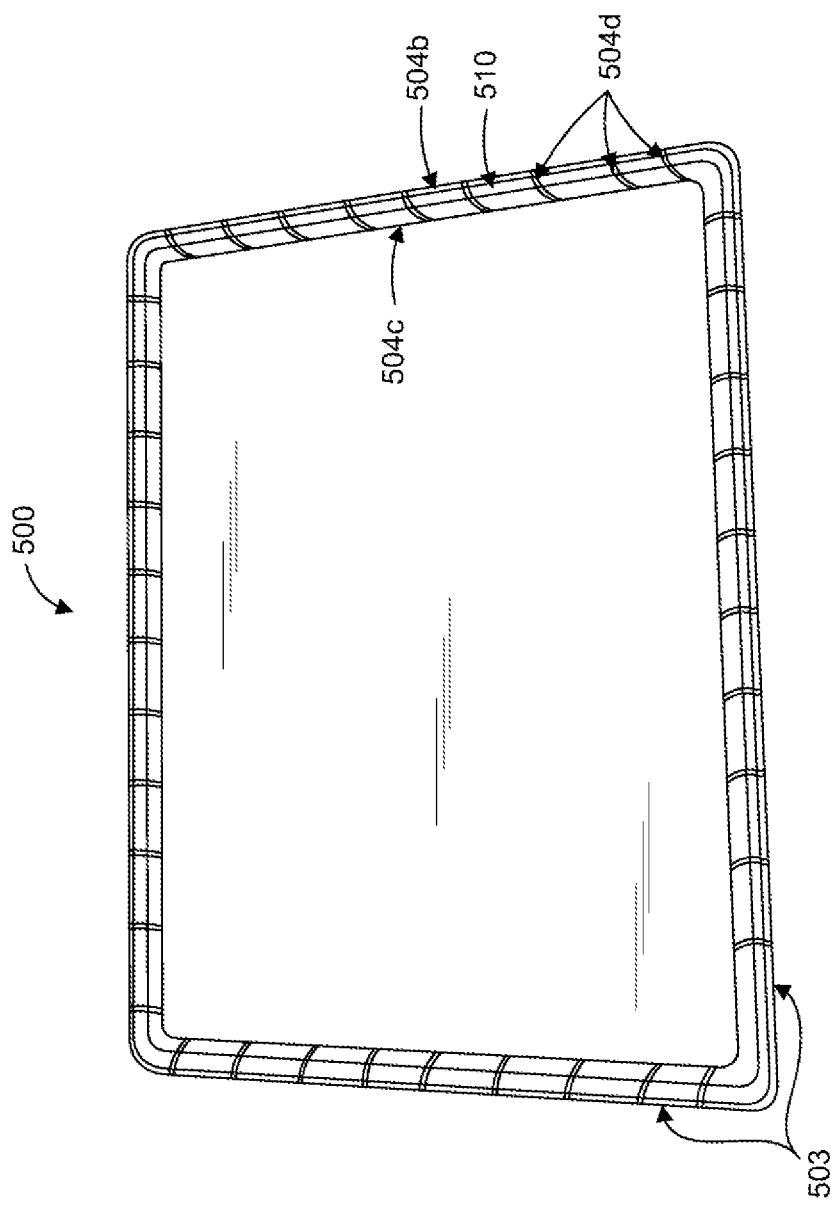
Figure 13C:
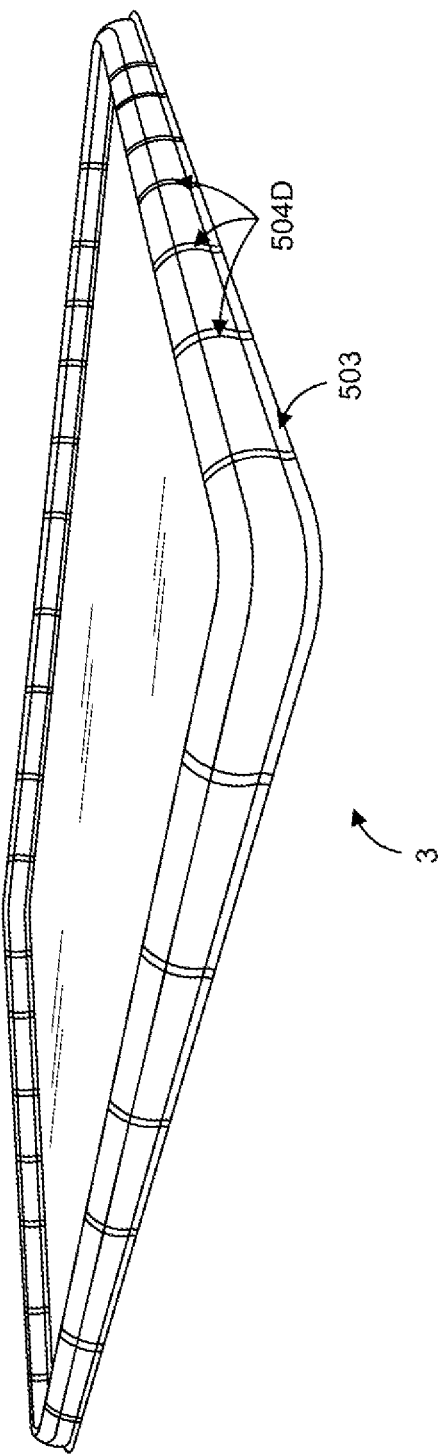
Figure 13E:
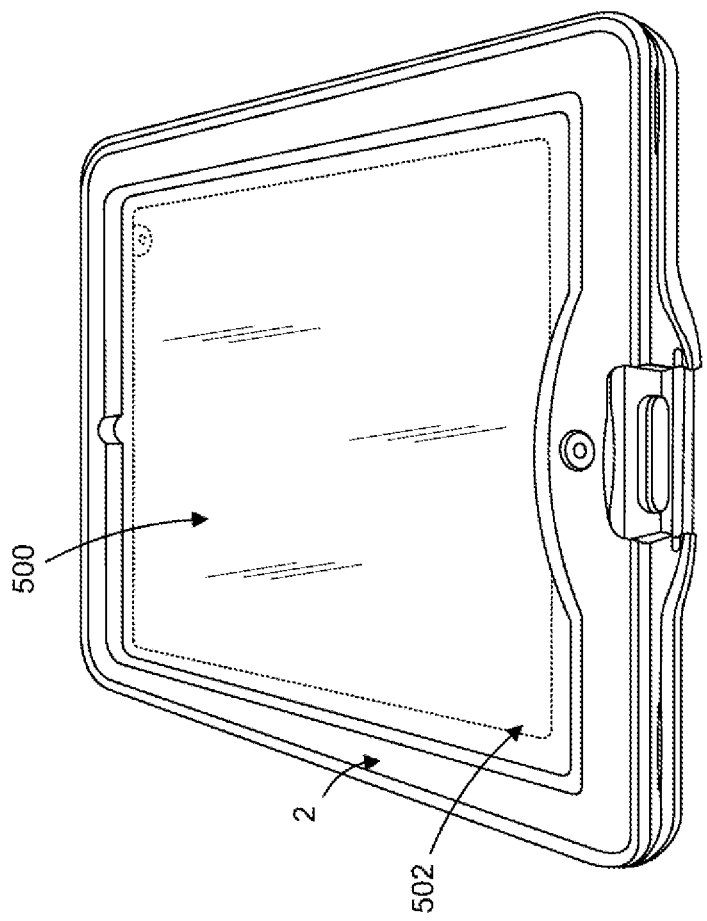

In operation, the seal test member provides a visual indication of a proper seal of the top housing member with the bottom housing member 3 and of the inner edge of the top housing member with a region proximate at least the portion of the top surface. FIG. 13c depicts a test seal member 500 situated in the top member 2 of a protective housing. In this view, the front surface 501 of the test seal member 500 is facing upward and the back surface 502 of the test seal member 502 is engaged with a top member 2 back surface 25b. Device retention teeth 96a and 96b of the top member 2 of a protective housing 2 are depicted retaining a test seal member 500 as it engages with the top member 2, such that device retention teeth 96a and 96b assist in retaining the test seal member 10. The outer perimeter member 503 of the test seal member 500 contacts at least portions of the top member interior perimeter portion 20a as well raised ridge teeth 17 that comprise part of a first clasping mechanism. The outer perimeter of the test seal member 503 may further engage with teeth 13a of the top member that comprise part of the second clasping mechanism.

Additionally, when the test seal member 500 engages with a bottom member 3 of a protective housing, the outer perimeter 503 of the test seal fits closely against the bottom member 3 bottom channel interior bounding member 30a such that teeth receptacles 13b of the bottom member engage with ridge channel members 504d as the middle ridge member 504b and inner ridge member 504c of the test seal member 500 abut against the different portions of the bumper 36 of the bottom member 3 of a protective housing such that the middle ridge member 504b and inner ridge member 504c of the test seal member 500 straddle opposing side of the bumper 36 along its longitudinal axis.

More particularly, in another aspect, a protective housing testing system is provided. In certain embodiments, a protective housing testing system comprises a seal test member, a bottom housing member, a top housing member, and a coupling mechanism. The function of the seal test member provided in these embodiments is to provide a visual indication of a proper seal of the top housing member with the bottom housing member of the protective housing.

In certain embodiments, a test seal member of the protective housing testing system may serve as a replica or proxy for an electronic device. As such, the test seal member may have certain features of an electronic device. In particular, in certain embodiments it is important that the test seal member have at least some members which have size and dimensions that are very similar to, or even nearly identical with, those of an electronic device in which the protective housing is intended to be utilized. In particular, it is desirable for those members of a seal test member to have dimensions, sizing, and configuration to simulate those portions of an electronic device that interact with a protective housing provided herein.

A protective housing that is tested by a protective housing testing system provided herein may comprise a bottom housing member. A bottom housing member may house at least a portion of the seal test member. A top housing member of the protective housing may function to house at least a second portion of the seal test member. The top housing member of the protective housing may comprise an inner edge to frame at least a portion of the top surface to allow touch access to the portion of the top surface.

Accordingly, a test seal member comprises a front surface and a back surface. In certain embodiments, the front surface of the test seal member faces the back surface of the top member of a protective housing upon being placed in a protective housing, and where the back surface of the test seal member faces the front surface of the bottom member of a protective housing upon being placed in a protective housing.

The back surface of the test seal member comprises a outer perimeter member that is disposed at the outer edge of the bottom surface of the test seal member and it typically surrounds the entire edge of this surface in order to closely approximate the members on an electronic device that would alternatively reside in an enclosed protective housing when it is not tested by the protective housing system.

In addition to the outer perimeter member of the back surface of the test seal member, the test seal member may comprise additional ridge members. Accordingly, certain embodiments provided herein comprise a plurality of ridge members, including an outer edge member disposed on the outmost portion of the outer perimeter member, such as about an outer perimeter member that defines the edge of the test seal member. These embodiments may further include a middle ridge member to the interior of the outer ridge member, and an inner ridge member disposed interior of both the middle ridge member and the outer ridge member on the back surface of the test seal member. In certain embodiments the ridge members comprises a continuous ridge that extends, and in other embodiments the inner ridge member is not necessarily a continuous ridge. In certain embodiments, a channel is defined by the middle ridge member and the inner ridge member. Inside this test seal member, channel ridge members may be additionally included, for example on at least a part of the surface of the inner ridge member that defines a surface of the inner ridge member.

In certain embodiments, the front surface of a test seal member is substantially planar and smooth about its front surface. In other embodiments (not shown), the front surface of test seal members are provided which have alternative configurations that are adapted to mimic an electronic device as it is situated in a protective housing provided herein.

The coupling mechanism may comprise various clasping mechanisms described herein such that the interaction of the test seal member replicates some features and dimensions of an electronic device that are important for engagement with elements of the protective housing, including various clasping mechanisms.

In operation, the seal test member provides a visual indication of a proper seal of the top housing member with the bottom housing member and of the inner edge of the top housing member with a region proximate at least the portion of the top surface.

It is to be understood that although the various embodiments depicted herein have been described with reference to a housing 1 wherein the housing includes a top or a bottom member does not include or incorporate a top or bottom surface member, such as a front screen membrane, in various instances, such a top or bottom surface member may be added to a corresponding peripheral portion of the housing, so as to fully enclose the housed device. For instance, in various embodiments, a top or bottom display membrane may be included spanning from one perimeter portion to the other perimeter portion. The top or bottom surface membrane may be fabricated along with the other housing components so as to be integrally affixed thereto, such as via overmoulding, or it may be a separate element meant not to be attached to the housing components themselves, but rather to the device itself, which device is then coupled to the housing. In other embodiments, a front screen membrane is included to interface between the housing and a housed device, wherein the front screen membrane is an independent surface element that may removably attach to one or both of the housing and the device, such as via an adhesive, cohesion, or other attachment means.

The membrane may be fabricated from any suitable material. The membrane may typically be transparent, but may contain one or more optically opaque regions. An opaque region may be entirely opaque or may include one or more optically transmissive regions. The membrane may be configured to include an optically transmissive region and an opaque region, such as an opaque region that may further be configured to includes optically clear regions, e.g., for a proximity or ambient light sensor feature. The membrane may additionally be configured to include a button feature. The membrane may additionally be configured to include an acoustic aperture feature, a camera lens feature, a flash feature, and the like.

The button feature may include a plurality of sub-features. For example, the button feature may include a button feature membrane with a button feature first transition that interacts with a button feature pivot such that as the button is depressed, the button feature pivot deforms. The button feature may also include a standoff or actuator that is coupled to the button feature membrane, such as to the underside of the button feature membrane via a suitable adhesive. The button feature standoff may be configured such that as the button feature is depressed the standoff interfaces with a button of an underlying device so as to effectively manipulate said button. Such a button feature may be fabricated in any suitable manner such as being fabricated from component parts and assembled together or it may be formed, such as thermal formed, in conjunction with the membrane. In various other embodiments the button feature may simply be an indented portion, e.g., a thermally formed indented portion, of the front membrane circumscribed by a raised region. Also, an inward facing surface of the button may include a standoff, such as an adhesive spacer element, that may function so as to allow the button to better engage a home button of an underlying device.

In various embodiments, the acoustic aperture feature may be comprised of an acoustic exit aperture that is overlaid with a water-impermeable gasket, e.g., an acoustic membrane or vent material, which membrane material covers the acoustic aperture thereby preventing the ingress of water there through while at the same time allowing the transmission of sound. The acoustic aperture feature may include an acoustic membrane material which may include an acoustic exit aperture. The acoustic membrane material may be offset from the membrane and attached therewith by an adhesive ring and may further be associated with an acoustic vent material, which acoustic vent material is sound permeable but liquid impermeable. The acoustic vent material may be associated with the acoustic membrane material such that it covers the acoustic exit aperture so as to prevent the ingress of water there through while at the same time allowing the transmission of sound.

The membrane may also include video camera and/or proximity sensor and/or ambient light sensor regions, which regions may be configured for interacting with a video camera and proximity sensor and ambient light sensor of an underlying device. These video camera and proximity sensor and ambient light sensor regions may simply be optically clear regions. In various other embodiments, the camera region may include a lens configured to be aligned with the camera lens of a housed device. A flash feature may also be included.

In another aspect, a protective housing for a tablet computer is provided. Accordingly, certain primary embodiments of the protective housing for a tablet computer have the elements described herein in this paragraph. A protective housing according to these primary embodiments provided herein includes a back side, a perimeter, and a front side that includes a multi-touch display. The protective housing has a bottom member that typically include a frame that defines an outer perimeter of the bottom member. The frame of such a bottom member may have an outer wall, where the outer wall of the frame has a first latching mechanism. The bottom member may include an inner surface that is configured for receiving at least part of the perimeter or back side of a tablet computer. The inner surface of the bottom member may additionally form an inner wall as well as an outer wall, such that the two are spaced apart from each other. The inner wall of the inner surface of the bottom member may further include a second latching mechanism. In another aspect, the bottom member has a first channel that is formed between the outer wall and the inner wall. This first channel, defines by the outer wall and the inner wall, can include a first seal that is placed within the first channel.

The embodiment of the protective housing described above has a top member that mates or otherwise engages with the bottom member in order to at least partially cover a tablet computer. Accordingly, this top member is designed to engage with the bottom member as the two mate together to form a protective housing for a tablet computer. The top member is configured to include a frame having an inside edge to frame a multi-touch display. This frame of the top member also defines an outer perimeter or the top member. The top member may include a protrusion that extends down from an inner surface of the frame near the outer perimeter. This protrusion inserts into the first channel and mates against the first gasket. The protrusion has a third latching mechanism for latching with the first latching mechanism of the outer wall of the bottom member. The protrusion in the top member may further include a fourth latching mechanism that latches together with the second latching mechanism of the inner wall of the bottom member.

Additional embodiments of a protective housing for a tablet computer may be derived from the primary ones described above, some of which may include variations and/or additional features. Accordingly, another embodiment has a top member that further includes a shoulder to mate against a top of the outer wall of the bottom member.

In another embodiment of the protective housing, the inner surface of the top member further includes a second channel that is defined by an inner side wall and an outer side wall that is proximate the inside edge. This embodiment may further include a second gasket that is placed within the second channel. This second gasket extends out from the inner side wall and the outer side wall of the second channel to seal the front side of a tablet computer at the multi-touch display when the top member is coupled with the bottom member. In some embodiments, the top member further includes a flexible ridge at the inside edge. The flexible ridge is configured to abut against the front side of the tablet computer near the periphery of a multi-touch display located inside of the second gasket.

In certain other embodiments, a protective housing for a tablet computer may further comprise one or more pads that are raised or protrude from the inner surface proximate the inner wall of the inner surface of the top member. These pads, whether only one or more than one are included, form a seat for the back side of the tablet computer to offset the back side of the tablet computer a predetermined distance from the inner surface of the top member. One or more of these pads may be interchangeable.

In other embodiments of the protective housing, the bottom member further includes a window that is formed between the outer surface and the inner surface of the bottom member. This window may be a translucent membrane.

In other embodiments of the protective housing for a tablet computer, the bottom member further includes a charge port that passes through a bottom edge of the top member. These variations typically have a door coupled by a hinge with the bottom member to close the charge port. The door for closing a charge port may further include a latch for securing the door in a closed position. This door may further include a flexible pad to seal the charge port when the door is in the closed position. In certain embodiments, the flexible pad is configured to amplify sound emanating from the tablet computer when the door is in an opened position.

In certain other embodiments, the top member has one or more teeth that upward from an inside surface of a bottom edge of the top member. These one or more teeth function to receive a bottom edge of the tablet computer and to position the tablet computer relative to the top member.

In other embodiments of the protective housing for a tablet computer, the bottom member also includes a camera lens, for example a camera lens that is formed in a top edge near the inner surface of the bottom member. In such embodiments, the bottom member of the protective housing may further include a light a light sensor aperture that is near the camera lens but also optically separated from the camera lens.

In other embodiments of the protective housing for a tablet computer, the top member further incorporates a flexible sealed button region that functions to operate a button connected to the inner surface of the top member.

In other embodiments of the protective housing for a tablet computer, the top member further incorporates a headphone jack aperture. In these embodiments, the protective housing typically further includes a bung to occupy and seal the headphone jack aperture.

In other embodiments of the protective housing for a tablet computer, the bottom member further includes a sealed toggle switch in the rigid frame for operating a corresponding toggle switch of the tablet computer.

In other embodiments of the protective housing for a tablet computer, the bottom member further includes one or more sealed button regions. These seal button regions extend from an outer surface of the bottom member, and they function to operate each of one or more corresponding buttons of the tablet computer.

In certain embodiments, the first latching mechanism of the bottom member further includes a first ridge that protrudes along an inner face of the outer wall of the rigid frame of the bottom member. In these embodiments, the third latching mechanism may include a second ridge that protrudes along an outward face of the protrusion of the top member. This second ridge functions to interlock with the first ridge when the bottom member is mated with the top member.

In certain other derivatives of the primary embodiment, the second latching mechanism further includes a plurality of holes that are typically spaced apart along the inner wall of the bottom member. In these embodiments, it may be further desirable for the fourth latching mechanism to have a plurality of tabs that protrude from an inward face of the protrusion of the top member. Each one of the plurality of tabs is designed to interlock with a corresponding one of the plurality of holes present in the second latching mechanism when the bottom member is mated with the top member.

In some embodiments, the bottom member of a protective housing for a tablet computer has a speaker or part thereof, such as a speaker grill, provided as part of an inner surface of the bottom member. An exemplary speaker grill includes a pattern of apertures or openings in a speaker region in the rigid frame and a water-impermeable fabric attached to the inner surface of the bottom member over the speaker region.

Like the first primary embodiment of a protective housing for a tablet computer, an alternative primary embodiment of a protective housing for a tablet computer also includes a bottom member having a rigid frame that defines an outer perimeter that has an outer wall. The outer wall of the bottom member in this embodiment has a first latching mechanism. The bottom member also has an inner surface for receiving at least part of the perimeter or back side of the tablet computer. This inner surface forms an inner wall that is spaced apart from the outer wall. The inner wall of the bottom member incorporates a second latching mechanism. The bottom member of the protective housing also has a first channel that is formed between the outer wall and the inner wall. This first channel includes a first gasket that is situated within the first channel. The protective housing also has a top member that mates with the top member described above in order to at least partially cover a tablet computer that is housed within the protective housing. The top member has a ridged frame that has an inside edge that frames a multi-touch display of a tablet computer, and which also defines an outer perimeter for the top member. The bottom member further includes a protrusion that extends down from an inner surface of the rigid frame near the outer perimeter. This protrusion in the bottom member is capable of inserting into the first channel of the bottom member in order to facilitate the mating against the first gasket. This protrusion of the top member includes a third latching mechanism for latching with the first latching mechanism of the outer wall of the bottom member. Upon latching the protrusion of the top member additionally includes a fourth latching mechanism for latching with the second latching mechanism of the inner wall of the bottom member. The top member of the protective housing also has a second channel that is defined by an inner side wall and an outer side wall proximate an the inside edge. The top member additionally includes a second gasket that is situated within the second channel and which extends out from the inner side wall and the outer side wall of the top member. This second gasket functions to seal the front side of the tablet computer at the multi-touch display when the top member of the protective housing is mated with the bottom member.

Another alternative primary embodiment of a protective housing for a tablet computer also includes a bottom member having a frame that defines an outer perimeter that has an outer wall, where this outer wall includes a first latching mechanism. The bottom member in this embodiment has an inner surface for receiving at least part of the perimeter or back side of the tablet computer. A protective housing according to this embodiment has a top member that is capable of engaging/mating with the bottom member to at least partially cover the tablet computer. The top member has a frame with an inside edge that frames the multi-touch display. This frame is has ridged portions that defines an outer perimeter that correspond with the outer perimeter of the bottom member. The top member of this embodiment also includes a second latching mechanism for latching with the first latching mechanism. The top member also includes a gasket situated near the inside edge of the rigid frame. This gasket functions to seal the front side of the tablet computer at the multi-touch display when the top member is mated with the bottom member.

With respect to FIG. 14A, in particular embodiments, the housing 201 may include a top member 202 and a bottom member 3 that when removably coupled together form the housing 201. Also included is a locking member 204, which locking member is configured for interacting with both the top 202 and bottom 203 members so as to lock the two members in place with respect to one another. Accordingly, in various embodiments, in addition to a top and/or a bottom member, the housing may also include a locking member. In various instances a locking element is not included. However, where a locking element is included the locking element may be any suitable element that is capable of interacting with a top or bottom member or a component thereof to lock the top and bottom member together. It may be a fastener, a clasp, a latch, a band, a belt, a buckle, a wire, a bolt and nut, a screw, a lock, and the like.

It is to be understood that although as herein depicted a locking member 204 is included, in various embodiments, a locking member need not be included or may be included in a different configuration, albeit with corresponding changes being made to the top and bottom members to account for the absence or change in configuration of the locking member. For instance, the top member 202 may be configured for coupling to the bottom member 203 and thereby forming a waterproof seal without the addition of a locking member 204. Such an instance may be useful where the two members are designed to be coupled together and once coupled are not to be easily uncoupled. Or the locking element may be configured differently, such as a locking wedge element, wherein the top and bottom member suitably configured so as to have corresponding wedge receiving members that are adapted to receive the locking wedge in a manner that accomplishes the coupling of the top and bottom members together in a waterproof sealing.

In various instances, where a locking element is included, as herein described, the locking member may be one or more elements meant to be associated with respective top and bottom members and further meant to be coupled together so as to lock the top and bottom members together. In one instance, the thickness of a locking member may be more or less than about 10 mm or about 8 mm, such as less than about 7 mm or about 6 mm, for instance, less than about 5 mm or about 4 mm, such as less than about 3.5 mm or about 2.5 mm including less than about 2 mm or about 1 mm dependent upon how the locking member is configured and where along the locking member the measurement is taken.

The width of a suitable locking element will also vary and may be more or less than about 15 mm or about 13 mm, such as less than about 12 mm or about 10 mm, for instance, less than about 9 mm or about 8 mm, such as less than about 6 mm or about 5.5 mm, for example, less than about 5 mm or about 4.5 mm, including less than about 3 mm or about 2.5 mm, even less than about 2 mm or about 1 mm dependent upon how the locking member is configured and where along the locking member the measurement is taken.

The height of a suitable locking element will also vary and may be more or less than about 16 mm or about 15 mm or about 13 mm or less, such as less than about 12 mm or about 10 mm, for instance, less than about 9 mm or about 8 mm, such as less than about 7 mm or about 6 mm, for example, less than about 5 mm or about 4.5 mm, including less than about 3 mm or about 2.5 mm, even less than about 2 mm or about 1 mm dependent upon how the locking member is configured and where along the locking member the measurement is taken.

The length of the locking member will vary dependent on the configuration of the underlying device to be housed. Such devices are typically in the shape of a square or rectangle, and thus, the length of an individual locking member will vary dependent on what side of the housing the locking member is to be positioned. It is to be noted that the device to be encased may have any suitable shape, e.g., round, circular, elyptical, triangular, square, rectangular, and the like, and consequently the housing may additionally have any suitable corresponding shape. However, in various instances, the shape of the housing is either square or rectangular and the length of the locking members may therefore be more or less than about 800 mm or about 750 mm or less, such as about 700 mm or 650 mm or less, such as about 500 mm or about 450 mm or about 400 mm or less, for instance, about 350 mm or about 300 mm or less, such as 250 mm or less, such as about 230 mm or about 200 mm or less, for instance, about 150 mm or less, including about 100 mm or about 85 mm or less, for example, about 80 mm or about 75 mm or less, such as about 70 mm or about 65 mm or about 60 mm or less, or even be about 50 mm or about 25 mm or less.

The top and bottom members may be fabricated from any suitable material but typically are fabricated from materials that are capable of providing one or more of stability, shock and liquid resistance to a housed device when the top and bottom members are properly coupled together. In certain embodiments, the top and bottom members may be composed of various different components and therefore may be fabricated from a plurality of different materials. Suitable materials from which the top and bottom member and/or their component parts may be fabricated include rigid, semi-rigid, and flexible materials that may be fabricated together so as to provide shock and/or liquid resistance to the housing. Such materials may include but are not hereby limited to thermoplastic materials such as polycarbonates, and/or glass fibre filled polycarbonates and/or acrylonitrile butadiene styrenes, and/or polyethylenes, and/or polypropylenes, and/or polyurethanes, and/or polyethylene terephthalate, and/or polyamides, and/or thermoplastic elastomers, and/or thermoplastic vulcanates, and/or thermoset epoxies, and/or silicons, and/or metals such as aluminium, and/or steel, and/or stainless steel, and/or titanium, and the like.

In this embodiment, the top member 202 of the housing 201 does not include a front and a back surface member. Although not included in this embodiment in other embodiments, as described above, a top member front and back surface member may be included. If a top member front and back surface member were to be included, it could be fabricated from any suitable material, such as polycarbonates, and/or polyethylenes, and/or polypropylenes, and/or polyurethanes, and/or polyethylene terephthalate, and/or silicons, and the like, be configured as a membrane that spans from one side of the perimeter to the other, and may be attached therewith by a moulding process, such as by being overmoulded with one or more of the perimeter portions.

With respect to FIG. 14A, the top member 200 is primarily defined by the perimeter portion 220. The perimeter portion 220 is defined by a proximal end portion 221 and a distal end portion 222 as well as opposing side portions 223 and 224. The perimeter portion 220 may further include additional perimeter portions such as an exterior perimeter portion 220a, a middle perimeter portion 220b, and an interior perimeter portion 220c. The exterior 220a and interior 220c perimeter portions may be composed of the same material or different materials from the perimeter portion, e.g., middle perimeter portion 220b, which materials may be the same or different from each other. In certain embodiments, the perimeter portion surface may include additional materials such as those materials used in fabricating one or more port 246, 285, 291 and/or switch features 271, 272, 273, described herein below.

In this embodiment, the bottom member 203 is defined both by the perimeter portion 230 and the bottom member front 235 and back surface 236 member. The perimeter portion 230 is further defined by a proximal end portion 231 and a distal end portion 232 as well as opposing side portions 233 and 234. The perimeter portion 230 may further include additional perimeter portions such as an interior perimeter portion 230a, a middle perimeter portion 230b, and an exterior perimeter portion 230c. The interior 230a and exterior 230c perimeter portions may be composed of the same material or different materials from the perimeter portion, e.g., middle perimeter portion 230b, which materials may be the same or different from each other. In certain embodiments, the perimeter portion surface may include additional materials, such as those materials used in fabricating one or more switch features, described herein below.

Additionally, the bottom member 203 of the housing 201 includes a bottom member front 235 and a back 236 surface member, which surface member is surrounded by the perimeter portion 230. It is to be noted that although the bottom member 3 is depicted as having a bottom member front 235 and back 236 surface member, in other embodiments, the surface member need not be included. Rather, the bottom member 203 may be configured in a similar manner as the top member 200, wherein the bottom member 203 may be primarily defined by a perimeter portion 230 without having a bottom surface member associated therewith. Alternatively, the top member 200 may be configured as the bottom member 300 by having a top member front and back surface member associated with the perimeter portion 200. In this embodiment, the bottom member front 235 and back 236 surface member includes a lens feature 280.

The front 235 and back 236 surfaces of the bottom surface member 203 may be composed of the same material or different materials, which materials may be the same or different from the material or materials of one or more of the perimeter portion(s) 230. In certain embodiments, the front 235 and back 236 surface member of the housing 201 are comprised of at least one membrane. In other instances, the front 235 and back 236 surface member of the housing 201 is comprised of the same material of at least part of the perimeter portion 230, such as being composed of the same material as the rigid or semi-rigid middle perimeter portion 220b. In certain embodiments, the bottom member surface member is comprised of a semi-rigid material that is capable of vibrating in such a manner that it amplifies the sound characteristics emitted from an encased device, in other embodiments, the bottom surface member is comprised of a material that dampens the sound characteristics of an encased device. In this embodiment, the bottom surface member 35,36 includes a sound transmission portion 260 that is configured for allowing sound to traverse through the bottom of the housing.

As depicted, the housing 201 is further configured such that the top 202 and bottom 3 members may be coupled together in such a manner as to provide a waterproof seal there between. The components of the housing 201, therefore, may be configured so as to include a clasping mechanism. Any suitable clasping mechanism may be used, so long as it is capable of providing for the coupling of the top 202 and bottom 3 members together around a device to be encased, such as an electronic device, in a waterproof seal, while maintaining the design features of the encased device. In this instance, the clasping mechanisms, e.g., locking elements, of the housing are configured as corresponding snap-tooth elements. In other embodiments, such as those set forth below, e.g., with respect to FIG. 14E, the clasping mechanisms of the housing are configured as corresponding hook and wedge elements.

Figure 14B:
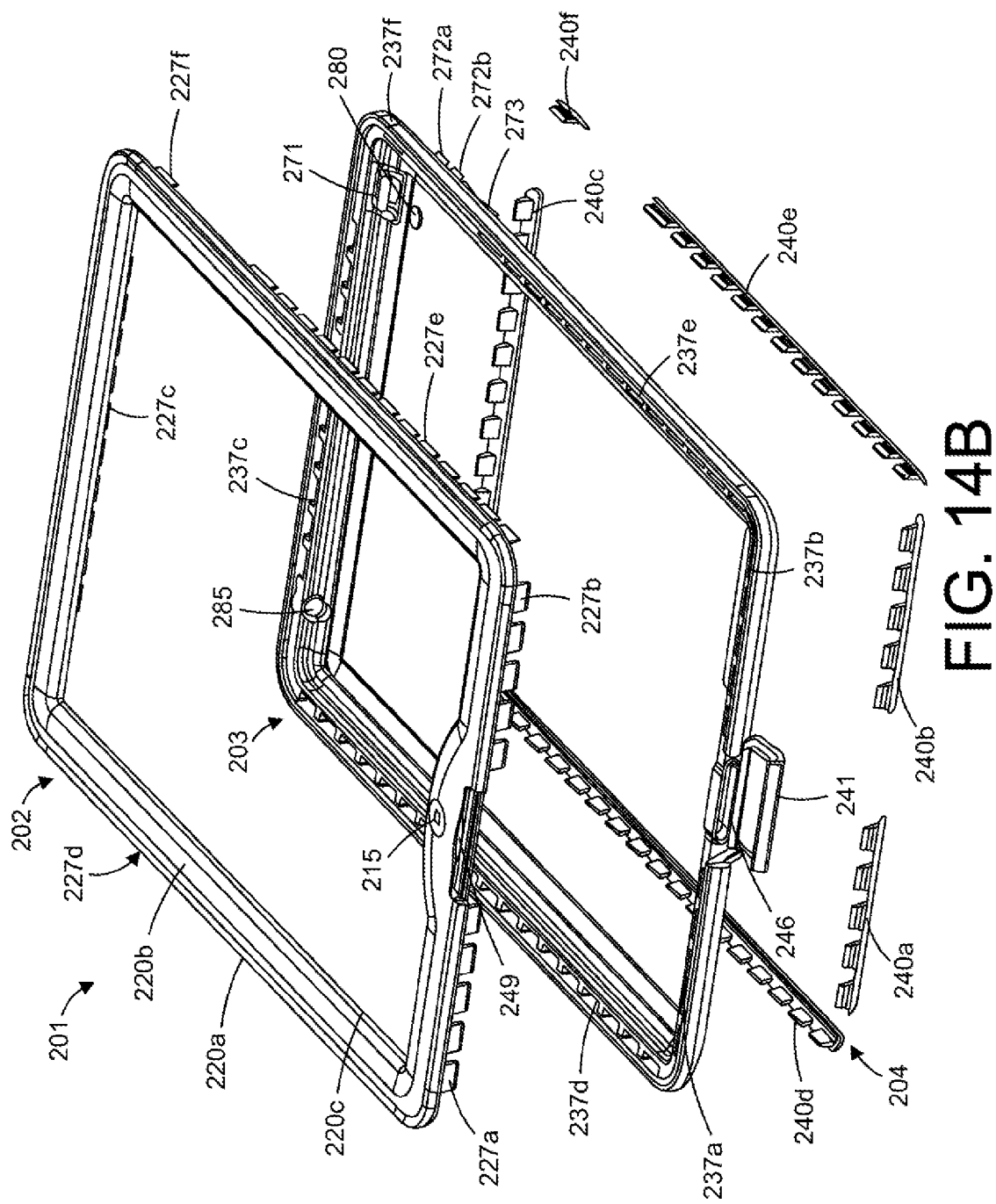

Accordingly, as can be seen with respect to FIG. 14B, the top member 200 of the housing 201 includes a clasping mechanism that is configured as snap-tooth members 207, which snap-tooth members 227 are configured for interfacing with a corresponding clasping mechanism on the bottom member 203. The top member clasping mechanism 227 includes six separate snap-tooth locking members: left proximal snap-tooth members 227a, right proximal snap-tooth members 227b, distal snap-tooth members 227c, left snap-tooth members 227d, and right snap-tooth members 240e and member 240f.

In this instance, therefore, the clasping mechanism 237 of the bottom member 3 includes snap-tooth receptacles 237, which receptacles are configured for receiving the snap-tooth members 227. The clasping mechanism 237 includes six separate snap-tooth receptacles: left proximal snap-tooth receptacles 237a, right proximal snap-tooth receptacles 237b, distal snap-tooth receptacles 237c, left snap-tooth receptacles 237d, and right snap-tooth receptacles 240e and receptacle 240f.

Further, in the embodiment depicted in FIG. 14B, the housing 201 additionally includes a clasping mechanism 204, configured as a snap-tooth comb locking member. The locking element 204 includes six separate snap-tooth locking combs: left proximal snap-tooth comb 240a, right proximal snap-tooth comb 240b, distal snap-tooth comb 240c, left snap-tooth comb 240d, and right snap-tooth combs 240e and 240f. The top 202 and bottom 203 members are consequently configured for interfacing with the snap-tooth locking element 204 in such a manner that a waterproof seal is provided thereby. Hence, the snap-tooth members 227 of the top member 202 are configured for interfacing with the snap-tooth comb locking member 204, and the snap-tooth receptacles 237 of the bottom member 203 are further configured for receiving both the snap-tooth members 227 of top member 202 as well as the snap-tooth combs 240.

As depicted, the top member 202 includes six sets of snap-tooth members: 227 a, b, c, d, e, and f. Consequently, the bottom member 203 includes snap-tooth receptacles 237 a, b, c, d, e, and f; and the locking element 204 includes snap-tooth combs 240 a, b, c, d, e, and f. It is to be noted that the number and sets of snap-tooth members, receptacles, and comb elements may vary in corresponding fashion. Hence, in certain embodiments, there may be more or less than six sets of snap-tooth members, receptacles, and combs, such as five, four, three, two or one set.

As indicated, the snap-tooth receptacles 237 are configured for receiving and engaging the snap-tooth members 227 as well as the snap-tooth comb elements 240 so as to provide a firm connection therewith. As can be seen with respect to FIG. 16, each snap-tooth receptacle 237 includes a snap-tooth receptacle space 38 within which portions of the snap-tooth members 227 and the comb elements 240 are received. In this embodiment, the snap-tooth receptacles 237 are further configured for engaging both the snap-tooth member 227 and the comb element 240.

For instance, one or more of the receptacles 237 includes a snap-tooth comb engaging interface, such as detent 239a, which detent engages a corresponding engaging interface, e.g., detent receiving element 244, on the comb element 240. This interaction helps to lock the comb 240 in place and prevents it moving horizontally and disengaging from the snap-tooth receptacle 238 and then being free to move vertically along its vertical axis. Additionally, as depicted, receptacle 237 includes a snap-tooth member engaging interface, e.g., detent 239b, that engages a corresponding engaging interface, e.g., detent receiving element 228b, on the snap-tooth member 227. This interaction helps to lock the snap-tooth member 227 in place and prevents it from moving vertically with respect to its vertical axis.

Figure 14C:
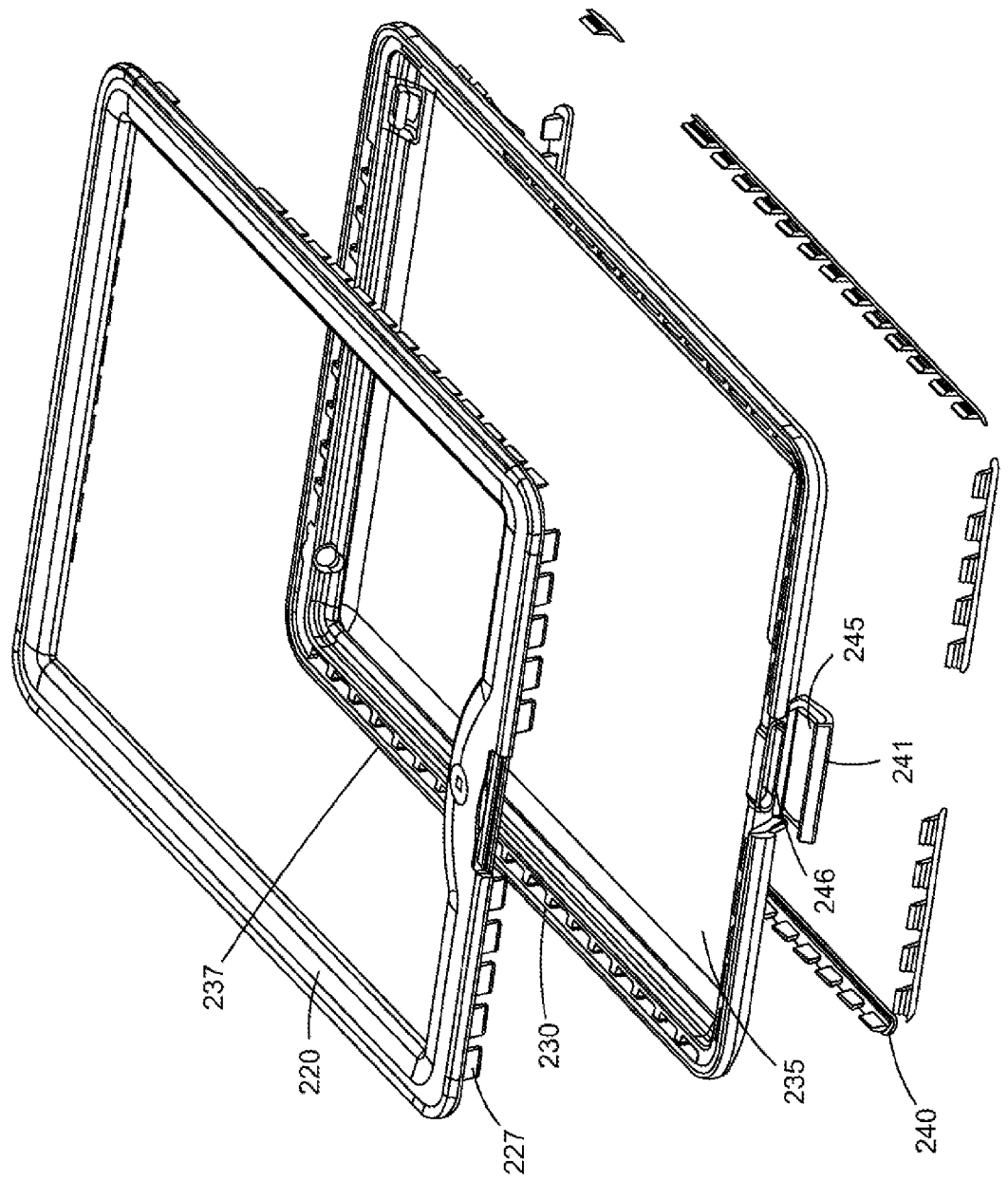

As depicted in FIG. 14C, the snap-tooth member 228 and the snap-tooth comb 240 are configured in such a way that when they are in contact with one another, each prevents the other from moving laterally away from its vertical axis. In a manner such as this the snap-tooth member 228 is held in place against the snap-tooth member engaging detent 239b, and prevented from being disengaged therefrom, either vertically or horizontally; and the snap-tooth comb 240 is held in place against the snap-tooth comb engaging detent 239a, and prevented from being disengaged therefrom, either vertically or horizontally. Consequently, while the comb 240 is in place, both the snap-tooth member 228 and the snap-tooth comb 240 are locked against each other, the top member 202 is coupled with the bottom member 203, and a waterproof seal is provided thereby. This sealing further functions to lock the top member 202 against the bottom member 3 such that the two members cannot be uncoupled until the comb is removed.

It is to be noted that although a specific configuration is herein presented, the interaction of the snap-tooth member 228, with the comb 240, and their interaction with the bottom member 203, e.g., with receptacles 237, can be configured differently without departing from the spirit of the interaction. For instance, the individual engagement elements, e.g., 228, 239, 244, etc. may be configured differently and/or be positioned on different surfaces. For example, the snap-tooth member 228 may include a snap-tooth comb-engaging element, which snap-tooth comb 240 may include a corresponding snap-tooth member engaging element. In such an instance, the snap-tooth member 228 may directly engage and lock with the snap-tooth comb 240, via the corresponding engagement elements, so as to lock the snap-tooth member 228 together with the snap-tooth engagement comb 240, thereby effectuating the coupling of the top member 202 with the bottom member 203. In such an instance receptacle detents 39 may or may not be present. Or, in another embodiment, the referenced detents 239 could have different engagement configurations than those provided with respect to FIG. 18.

Accordingly, FIG. 14B provides a perspective view of the housing 201 in an exploded view. The housing includes top member 202, bottom member 203, and locking element 204, where the locking element is configured as a snap-tooth comb member. The top member 202 may include a plurality of features. For instance, the top member 202 may primarily include a perimeter portion 220. The perimeter portion may include one or more different sub-portions, such as an exterior perimeter portion 220a, a middle perimeter portion 220b, and an interior perimeter portion 220c. One or more of these perimeter portions may be fabricated from the same or different material and/or may perform one or more of the same or different functions.

For example, the top member exterior perimeter portion 220a may be fabricated from a flexible material so as to provide a measure of shock absorbance to the housing 201. The middle perimeter portion 220b may be fabricated from a rigid or a semi-rigid material so as to provide structural integrity to the top member 202. Such materials may include but are not hereby limited to thermoplastic materials such as polycarbonates, and/or fibre filled polycarbonates and/or acrylonitrile butadiene styrenes, and/or polyethylenes, and/or polypropylenes, and/or polyurethanes, and/or polyethylene terephthalate, and/or polyamides, and/or polyvinyl chlorides and/or thermoplastic elastomers, and/or thermoplastic vulcanates, and/or thermoset epoxies, and/or silicons, and/or metals such as aluminium, and/or steel, and/or stainless steel, and/or titanium, and the like. The interior perimeter portion 220c may be fabricated from a flexible or a semi-flexible material. For instance, the flexible exterior and/or interior perimeter portions may be made and associated with the more rigid middle perimeter portion by any suitable process such as overmoulding, vulcanizing, adhesive bonding, thermal bonding, substrate bonding such as an adhesive tape substrate, mechanical bonding such as stretching around, and/or entrapment in a groove, and the like.

With respect to the exterior perimeter portion 220a, in certain instances, it may be fabricated from a flexible or semi-flexible material, such materials may include but are not hereby limited to rubbers such as natural, and/or nitrile, and/or neoprene, and/or silicons, and/or fluorosilicones and/or fluorocarbons, and/or perfluor elastomer and/or polyurethanes, and/or thermoplastic elastomers such as ethylene propylene, and/or thermoplastic vulcanates, and/or thermoplastics such as polypropylene, and/or polyethylene and/or foams such as foamed polyvinyl chloride, and/or foamed nitrile rubber, and/or foamed polyurethane urethane, and the like. Thus, the exterior perimeter portion 220a may be configured in such a way so as to act like a bumper providing the housing with a measure of shockproof protection.

With respect to the interior perimeter portion 220c, it may be fabricated from a flexible or semi-flexible material, such materials may include but are not hereby limited to rubbers such as natural, and/or nitrile, and/or neoprene, and/or silicons, and/or fluorosilicones and/or fluorocarbons, and/or perfluor elastomer and/or polyurethanes, and/or thermoplastic elastomers such as ethylene propylene, and/or thermoplastic vulcanates, and/or thermoplastics such as polypropylene, and/or polyethylene and/or foams such as foamed polyvinyl chloride, and/or foamed nitrile rubber, and/or foamed polyurethane urethane, and the like, and may be configured so as to facilitate the generation of a watertight seal with a surface, e.g., screen, of an encased device.

In certain embodiments, the interior perimeter portion may be adapted for facilitating the cleaning of said screen. For instance, the interior perimeter portion 220c may be configured as a wiper and may be adapted for bridging the surface of the screen of an underlying device with the middle perimeter portion 220b, such that as one wipes the screen toward the wiper, any particulate or fluid matter is pushed up and over the perimeter 220, rather than into the top member/device screen interface. It is to be noted that although three perimeter portions 220 a, b, c are demarcated more or less perimeter portions may be included. For example, in certain embodiments, an exterior 20a and/or interior 20c perimeter portion need not be associated with the middle perimeter portion 220b.

The top member 202 may also include a home button 215. For instance, the middle perimeter portion 20b may have an extended portion that is configured for interfacing with a button present on a top surface screen of an underlying device. Additionally, the top member 202 may have an interface 249 for engaging a portion of a charge port latch 241. As indicated above, the top member 202 further includes one or more clasping mechanisms, which in this instance are configured as a plurality of snap-tooth members 227 a, b, c, d, e, and f. However, in other embodiments, such as provided with respect to FIGS. 14E-14I, and as described in detail herein, the clasping mechanisms may be configured as wedge receiving duck hook elements. Further, in this embodiment the top member 202 does not include a top member front and back surface that stretches from one side of the perimeter to the other; however, in various other embodiments, a front and back surface, such as a pliable membrane, may be provided.

The bottom member 203 may also be defined by a perimeter portion 230. The perimeter portion may include one or more different sub-portions, such as an exterior perimeter portion 230a, a middle perimeter portion 230b, and an interior perimeter portion 230c. The bottom member 203 perimeter portions may be fabricated from the same or different materials, such materials may include but are not hereby limited to thermoplastic materials such as polycarbonates, and/or fibre filled polycarbonates and/or acrylonitrile butadiene styrenes, and/or polyethylenes, and/or polypropylenes, and/or polyurethanes, and/or polyethylene terephthalate, and/or polyamides, and/or polyvinyl chlorides and/or thermoplastic elastomers, and/or thermoplastic vulcanates, and/or thermoset epoxies, and/or silicons, and/or metals such as aluminium, and/or steel, and/or stainless steel, and/or titanium, and the like, and may perform the same or different functions. The exterior perimeter portion 230a may be fabricated from a flexible or a semi-flexible material. For instance, the flexible exterior perimeter portion may be made and associated with the more rigid middle perimeter portion by any suitable process such as overmoulding, vulcanizing, adhesive bonding, thermal bonding, substrate bonding such as an adhesive tape substrate, mechanical bonding such as stretching around, and/or entrapment in a groove and the like. In various embodiments, more or less perimeter portions may be included.

Additionally, the perimeter portion 230 may include one or more other features. For instance, the perimeter portion 230 may include one or more port features, such as a charge port receptacle 246. The charge port receptacle 246 may be configured for receiving a charger of a device to be encased, and may include a receptacle cover 241, such as a charge port door. The charge port door 241 may further be configured for opening and closing and thereby sealing the charge port receptacle 246 in a waterproof seal. Consequently, the top member 202 may be configured for interacting with the charger port door 241 so as to provide waterproof seal therewith.

For example, as indicated above, the top member 202 may include a latching feature 249, e.g., a latch ramp receiver, that is configured for engaging a corresponding latching feature, e.g., a latch ramp, on the charge port door 241, so as to seal the charge port receptacle 246 in a waterproof seal. It is to be noted that although the latch feature has been described with respect to various of its elements being positioned on the top 202 and/or bottom 203 member, it is understood that this order may be reversed and/or all of the latch feature may be positioned entirely on one of the top or bottom members.

The bottom member 203 may additionally include one or more button interfaces, such as one or more orientation toggle interfaces 72 a and b, a volume button interface 73, and/or an on/off button interface 71, which interfaces may be positioned along the perimeter 230 or on a back surface member 235, 236 of the bottom member 203. Further, the bottom member 203 may include a port, such as an earphone port 285, which port may be adapted to receive an earphone, speaker, or other jack feature; and/or a noise reduction port feature 291. A front and back surface 235, 236 of the bottom member may also include a lens feature 280.

It is to be noted, as can be seen with respect to the front and back surface member 235,236 of FIG. 14B, the surface may be fabricated from any suitable material, such as polycarbonates, and/or polyethylenes, and/or polypropylenes, and/or polyurethanes, and/or polyethylene terephthalate, and/or silicons, and/or glass such as toughened or impact modified grades and/or painted, and/or powder coated and/or vacuum metalized, and the like, and be of any suitable color. In this instance, the front and back surface 235,236 is fabricated from a transparent material, such as a clear plastic. Having a transparent bottom member surface may be useful because it allows a user to readily see the condition of the underlying electronic device, facilitates the transfer of radiant energy from the device, and helps maintain the aesthetic features of the underlying device. Nevertheless, in other instances, the bottom member front and back surface 235,236 is fabricated from an opaque material. Further, as described above, a perimeter portion 230 of the bottom member may include a clasping mechanism 237, such as one or more sets of snap-latch receptacles, such as receptacles 237 a, b, c, d, e, and f, which receptacles are adapted for receiving one or both of the snap-tooth members 228 and/or the snap-tooth combs 240. It is to be noted, however, that in certain instances, as described herein with respect to FIGS. 14E-14I, the clasping mechanism 237 of the bottom member 203 may have a different configuration, such as a locking wedge receiving hook configuration.

As can be seen with respect to FIG. 14B, the housing 1 may also be configured for receiving one or more locking elements 240, such as snap-tooth combs 240 a, b, c, d, e, and f, which locking elements may engage one or both of the clasping mechanisms of top 202 and bottom members 203 so as to couple the top and bottom members together and to provide a waterproof seal therewith. It is also to be noted that although the locking element 204 is depicted as being a snap-tooth comb locking element, in various embodiments it may be configured as a locking wedge, which locking wedge is adapted for engaging corresponding hook elements of the top and bottom member clasping mechanisms.

FIG. 14C provides a front perspective view of the housing of FIG. 14B, however, in this embodiment, the bottom member front and back surface 235, 236 of the bottom member 203 is opaque and not transparent. As depicted the top member 202 includes a perimeter portion 220, which perimeter portion 220 includes a series of snap-tooth members 227. The bottom member additionally includes a perimeter portion 230; however, unlike the top member 202, the bottom member 203 includes a front and back surface member 235, 236. Albeit, in certain instances it is the top member 202 that includes a front and back surface member, while the bottom member 203 does not. In other embodiments, neither the top 202 nor the bottom member 203 include a front and back surface member; rather each is defined solely by perimeter portions 220 and 230 respectively. In this instance, the bottom member 203 includes a charge port receptacle 246 and a charge port door 241, having a charge port gasket 245; while the top member includes a charger port door engaging member, e.g., latch ramp receiver 249. However, it is understood that this order may be reversed or configured differently, as described above. Also depicted are locking elements 240, which in this instance are configured as snap-tooth combs.

Figure 14D:
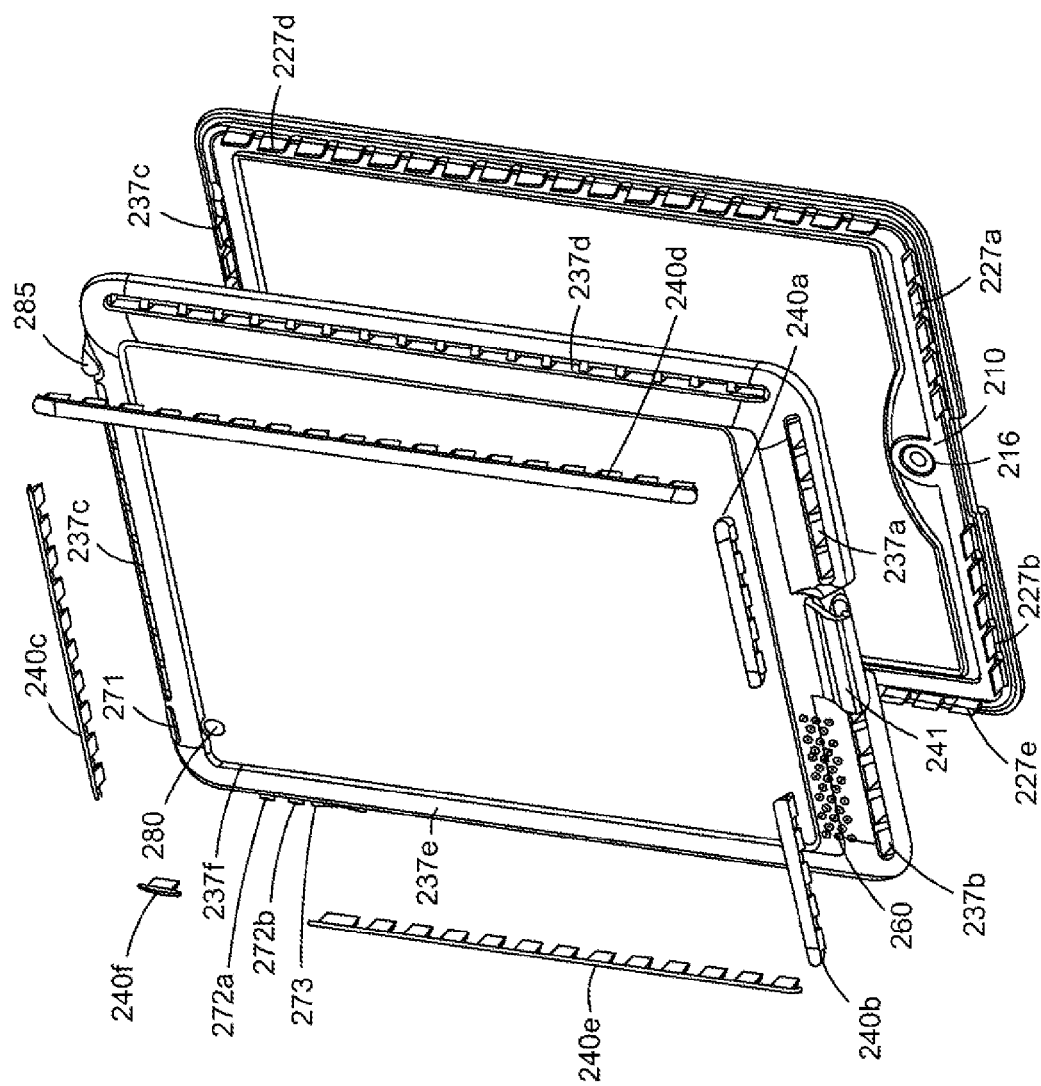

FIG. 14D provides a back perspective view of the housing of FIG. 14C. As can be seen from this view, top member 202 additionally includes a button feature 215, which button feature traverses from one side of the perimeter portion 220 to the other. The button feature 215 is configured for interacting and thereby manipulating a button of an underlying device. As shown, the button feature 215 is overlaid with a home button gasket 216, which gasket provides a waterproof sealing for the home button 215. Also depicted is a perimeter gasket 210 positioned on an underside of the perimeter portion 220, such as under middle perimeter portion 220b. In this instance, the gasket 210 circumscribes the entire perimeter portion 220, and further circumscribes the bounds of the button feature 215. In this manner, a watertight seal is produced when the top member 202 is coupled together with the bottom member 23 and/or locked therewith, for instance, via locking element 204.

Figure 14E:
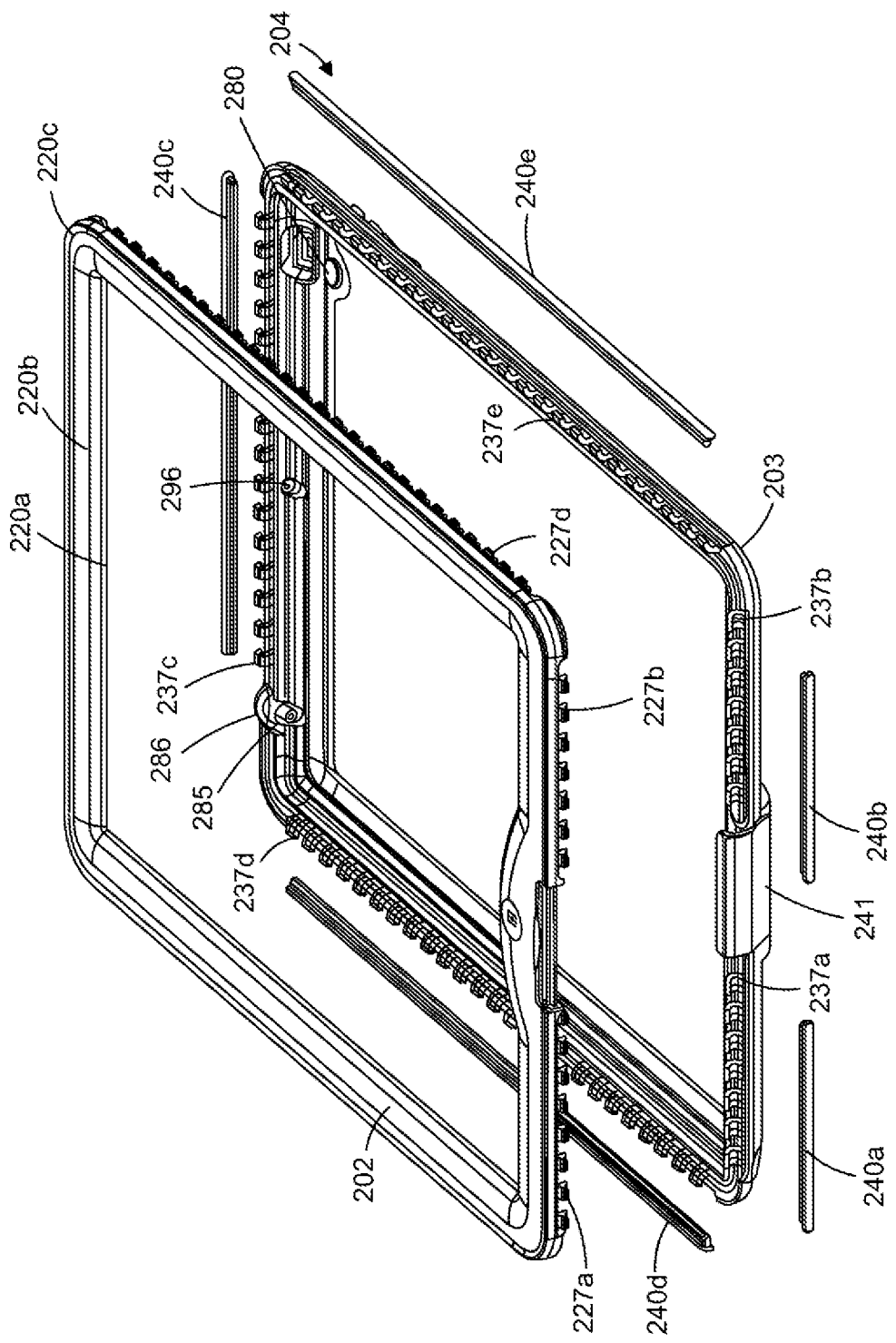

As indicated above, FIG. 14E provides a top down perspective view of an alternative embodiment of the housing 201 described herein. This embodiment of the housing 201 includes a top member 202 and a bottom member 203 which are configured for encasing an electronic device, such as a tablet computer or reader. When the top 202 and bottom 203 members are coupled together, e.g., positioned against each other, they provide a continuous inside surface and a continuous outside surface. This embodiment of the housing 201 also includes clasping mechanisms that are configured for providing a waterproof sealing when the top 202 and bottom members 203 are coupled together. In this embodiment, an additional clasping mechanism, e.g., locking elements 204, is also provided so as to fixedly attach the top member 202 and bottom member 203, such as when they are encasing an electronic device. The locking elements 204 include a left proximal locking wedge 240a, a right proximal locking wedge 240b, a distal locking wedge 240c, a left locking wedge 240d and a right locking wedge 240e.

The top member 202 includes a top member exterior perimeter portion 20a, a top member middle perimeter portion 220b, and a top member interior perimeter portion 220c. The top member interior perimeter portion 220c defines a rectangular space in the middle of the top member 202. The top member middle perimeter portion 20b surrounds the outer edge of the top member interior perimeter portion 220c. The top member exterior perimeter portion 220a surrounds the outer edge of the top member middle perimeter portion 220b.

The top member exterior perimeter portion 220a can be configured as a bumper. A bumper, as used herein, is a flexible or semi-flexible material that cushions the outer edge of the top member 202. The top member interior perimeter portion 20c can be configured as a wiper. A wiper, as used herein, is a flexible or semi-flexible material that can be configured to contact the surface of the electronic device when in contact with the top member. The flexible or semi-flexible material may be but are not hereby limited to rubbers such as natural, and/or nitrile, and/or neoprene, and/or silicons, and/or fluorosilicones and/or fluorocarbons, and/or perfluor elastomer and/or polyurethanes, and/or thermoplastic elastomers such as ethylene propylene, and/or thermoplastic vulcanates, and/or thermoplastics such as polypropylene, and/or polyethylene and/or foams such as foamed polyvinyl chloride, and/or foamed nitrile rubber, and/or foamed polyurethane urethane, and the like.

On the under side of the outside edge of the top member middle perimeter portion 220b are provided top member wedge receiving duck hooks 227. The left proximal side of the top member middle perimeter portion 220b has top member left proximal wedge receiving duck hooks 227a positioned on the under side of the outside edge of middle perimeter portion 220b. The right proximal side of the top member middle perimeter portion 220b has top member right proximal wedge receiving duck hooks 227b positioned on the under side of the middle perimeter portion edge 220b. The right side of the top member middle perimeter portion 220b has top member right wedge receiving duck hooks 227d positioned on the under side of the outside edge of the middle perimeter portion 220b.

The bottom member 203 includes an earphone jack port 285 in its distal left side. The earphone jack port 285 includes an earphone port cover 286 that may be removably inserted into the earphone jack port 285 in such a manner as to provide a waterproof seal therewith. When the earphone port cover 286 is inserted into the earphone jack port 285 the earphone port cover 286 prevents the passage of fluids, especially liquids, into and through the earphone jack port 285. In certain embodiments, these fluids include air and water.

The bottom member 203 also includes a lens feature 280. The lens feature 280 may simply be a clear surface that is transparent to light. In this embodiment, the lens feature 280 includes a lens that provides magnification and/or filtering to a camera lens, such as camera lens present on an encased device, which is placed against the inside surface of the lens feature 280. The lens feature 280 may also contain a lens that provides a wide angle effect to a camera lens that is placed against the inside surface of the lens feature 280. The lens feature 280 may also contain a transparent material that does not substantially bend light passing through the material that makes up the lens feature 280. Thus, a camera placed against the inside surface of the lens feature would not have its performance affected by the presence of the lens feature 280. The transparent material that makes up the lens feature can be glass, plastic or the like.

The bottom member 203 also includes a noise reduction port 296 in the approximate center of its distal side 232.

Like the top member 202, the bottom member 203 also has wedge receiving elements, in this instance, they are configured as bottom member wedge receiving hooks and are positioned along the outermost edge of middle perimeter portion 230b. The left proximal outer edge of the bottom member 203 has bottom member left proximal wedge receiving hooks 237a positioned on its upper edge. The right proximal outer edge of the bottom member 203 has bottom member right proximal wedge receiving hooks 237b positioned on its upper edge. The distal outer edge of the bottom member 203 has bottom member distal wedge receiving hooks 237c positioned on its upper edge. The left outer edge of the bottom member 203 has bottom member left wedge receiving hooks 237d positioned on its upper edge. The right outer edge of the bottom member 203 has bottom member right wedge receiving hooks 237e positioned on its upper edge.

The top member 202 and bottom member 203 can be fitted together. When the top member 202 and bottom member 203 are aligned and coupled together, the top member wedge receiving duck hooks 227 and bottom member wedge receiving hooks 237 can interdigitate and thereby interlock. This interdigitation creates a groove along the perimeter 220 where the top member 202 and bottom member 203 join. The locking wedge elements 204 can then be inserted into these grooves to lock the top member 202 and bottom member 203 together. In certain embodiments, this is configured to create a fluid tight seal between the top member 202 and bottom member 203. In certain instances, the fluid can be air, water or the like.

Figure 14F:
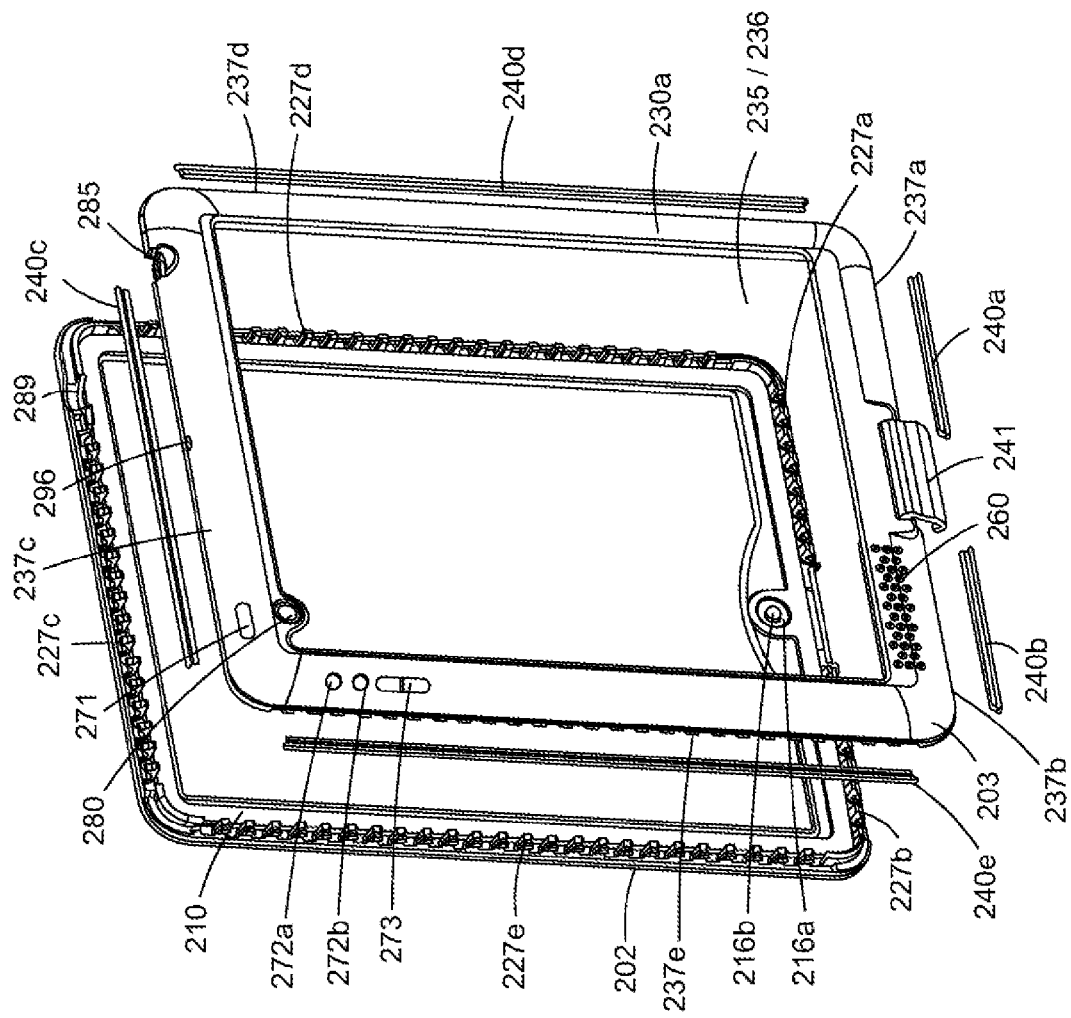

FIG. 14F shows a bottom up perspective view of embodiment of the housing described herein at FIG. 14E. The bottom member 203 is shown proximal to the top member 202 in this perspective. In this embodiment, the front/back surface 235/236 of the bottom member 203 is made of a transparent material, such as polycarbonates, and/or polyethylenes, and/or polypropylenes, and/or polyurethanes, and/or polyethylene terephthalate, and/or silicons, and/or glass such as toughened or impact modified grades and the like. The front/back surface may be fabricated along with at least a portion of the perimeter portion 220 or it may be adjoined thereto. The front and back surface member 235,236 of FIG. 14F may be fabricated from a rigid, flexible or a semi-flexible material and may be made and associated with the middle perimeter portion by any suitable process such as overmoulding, in-mould decorating, vulcanizing, adhesive bonding, thermal bonding, substrate bonding such as an adhesive tape substrate, mechanical bonding such as stretching around, and/or entrapment in a groove and the like.

In this embodiment, the front/back surface 235/236 is moulded along with the middle perimeter portion 220b as a contiguous member. Overlaid on the exterior edge of the back surface 236 and middle perimeter portion 220b of the bottom member 203 is an exterior perimeter portion 230a. The exterior perimeter portion 230a can be made of any suitable material, and may be a flexible or semi-flexible material that cushions the outer edge of the bottom member 223, such materials may include but are not hereby limited to rubbers such as natural, and/or nitrile, and/or neoprene, and/or silicons, and/or fluorosilicones and/or fluorocarbons, and/or perfluor elastomer and/or polyurethanes, and/or thermoplastic elastomers such as ethylene propylene, and/or thermoplastic vulcanates, and/or thermoplastics such as polypropylene, and/or polyethylene and/or foams such as foamed polyvinyl chloride, and/or foamed nitrile rubber, and/or foamed polyurethane urethane, and the like, thereby acting as a bumper portion. The flexible or semi-flexible material can be rubber, neoprene, polypropylene or the like.

The exterior view of the bottom member 203 shows the passage of the earphone jack port 285 through the left distal side 232 of the bottom member 203. (It is the right distal side of the bottom member 203 when viewed from the top side of the housing.) The exterior view of the bottom member 203 also shows the passage of the lens feature 280 through the right distal side of the bottom member 203. (It is the right distal side of the bottom member 203 when viewed from the top side of the housing.) The exterior view of the bottom member 203 further shows the passage of the noise canceling feature 296 through the distal side of the bottom member 203. It is the right side of the bottom member 203 when viewed from the perspective shown in FIG. 14E.

The bottom member 203 includes a bottom member on/off switch 71 on the right distal side of the bottom member 203. (It is the right distal side of the bottom member 203 when viewed from the perspective shown in FIG. 14E.) The bottom member 203 further includes orientation toggles 272a and b on the right side of the bottom member 203. (It is the right side of the bottom member 203 when viewed from the perspective shown in FIG. 14E.) The bottom member additionally includes a volume button 273 just below the orientation toggles 272a and b. The bottom member 203 also includes a sound transmission portion 260 just above its right proximal end 231. (It is the right proximal end of the bottom member 203 when viewed from the perspective shown in FIG. 14E.) Also on the proximal end 231 of the bottom member 203 is a charge port door 241. (It is the proximal end of the bottom member 203 when viewed from the perspective shown in FIG. 14E.) The charge port door provides access to a charge port located on the distal end of an encased electronic device. In certain embodiments, when the charge port door 241 is closed it prevents fluids from passing through the charge port door 241 to the inside of the housing. In certain embodiments, the fluid is air, water or the like.

The top member 202 also includes a gasket 210 along the inside edge of the top member middle perimeter portion (20b from FIG. 14E). The gasket 210 can create a fluid tight seal between the top member 202 and the bottom member 203 and/or electronic device when the electronic device is encased and in contact with the top member 202. The gasket 210 can be made of a flexible or semi-flexible material that cushions where the top member 202 and the electronic device meet and also can create a seal between them. The flexible or semi-flexible material may include but are not hereby limited to rubbers such as natural, and/or nitrile, and/or neoprene, and/or silicons, and/or fluorosilicones and/or fluorocarbons, and/or perfluor elastomer and/or polyurethanes, and/or thermoplastic elastomers such as ethylene propylene, and/or thermoplastic vulcanates, and/or thermoplastics such as polypropylene, and/or polyethylene and/or foams such as foamed polyvinyl chloride, and/or foamed nitrile rubber, and/or foamed polyurethane urethane, and the like.

Visible in this interior view of the top member 202 are the distal wedge receiving duck hooks 227c positioned along the distal side 222 of the top member 202. (It is the distal side of the top member 202 when viewed from the perspective shown in FIG. 14E.) Also visible in this interior view of the top member 202 are the left wedge receiving duck hooks 227d positioned along the left side of the top member 202. (It is the left side of the top member 202 when viewed from the perspective shown in FIG. 14E.)

The top member 202 includes a button gasket 216a located at the distal end of the top member 202. (It is the distal side of the top member 202 when viewed from the perspective shown in FIG. 14E.) The button gasket 216a underlays a home button feature 215 of the top member 202 and provides a waterproof sealing therewith, thereby preventing the leakage of liquid through the home button 215. As the home button 215 includes a home button nob 215b for manipulating the home button of an encased device, the button gasket also allows for the manipulation of a control surface on the electronic device through the housing through the button gasket button interface 16b located on the inside surface of the button gasket 216a, which interface underlays that home button nob 215b. Accordingly, in certain embodiments, the button gasket 16a and button gasket button interface 216b allows for manipulation of a control surface on the electronic device while preventing the passage of fluid through the top member 202. In certain instances, this fluid can be air, water or the like.

The top member 202 also includes an earphone jack cutout 289 located at the left distal end. (It is the left distal side of the top member 202 when viewed from the perspective shown in FIG. 14E.) The cutout allows for the tight junction of the top member 2 and bottom member at the earphone jack port 285.

Figure 14G:
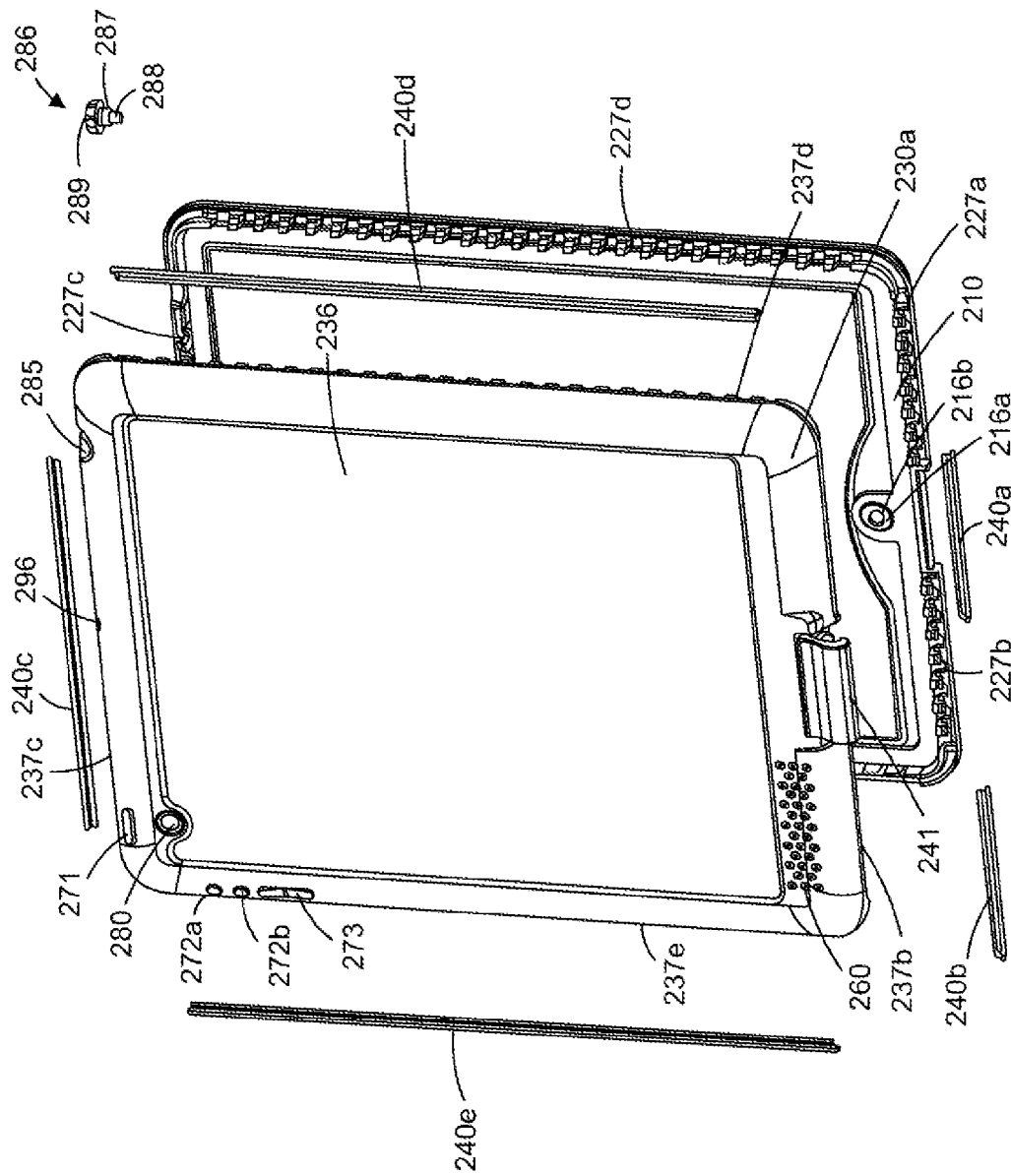

FIG. 14G shows a related embodiment of the housing described at FIG. 14E. In this embodiment, the bottom member front/back surface 235,236 is opaque. FIG. 14G shows a detailed view of the earphone port cover 286. The earphone port cover 286 includes a bung head 289, bung threads 288, and a bung gasket 287. The bung gasket 287 and threads 288 fit into the earphone jack port 285. When the bung gasket 287 is positioned inside the earphone jack port 285 and the threads 288 tightened against the corresponding threads present in the port 285, the bung head 289 covers the external opening of the ear phone jack port 285 and a waterproof seal is provided thereby. Accordingly, in certain embodiments, the bung gasket 287 prevents the passage of fluid into the interior of the housing. In certain instances, this fluid can be air, water or the like.

Specifically, in certain embodiments, the earphone jack port 285 is grooved, so that the ear phone port cover 286 may be screwed into position closing the earphone jack port 285. In these embodiments, the ear phone port cover 286 includes bung threads that allow the ear phone port cover to be screwed into the ear phone jack port 85. These threads can be typical screw-like threads, be configured as a cam feature, or other closure mechanism, such as a depressible seal mechanism that depresses as the port cover 286 is inserted into the port jack 285 and then expands once therein thereby sealing the port in a waterproof seal.

Figure 14H:
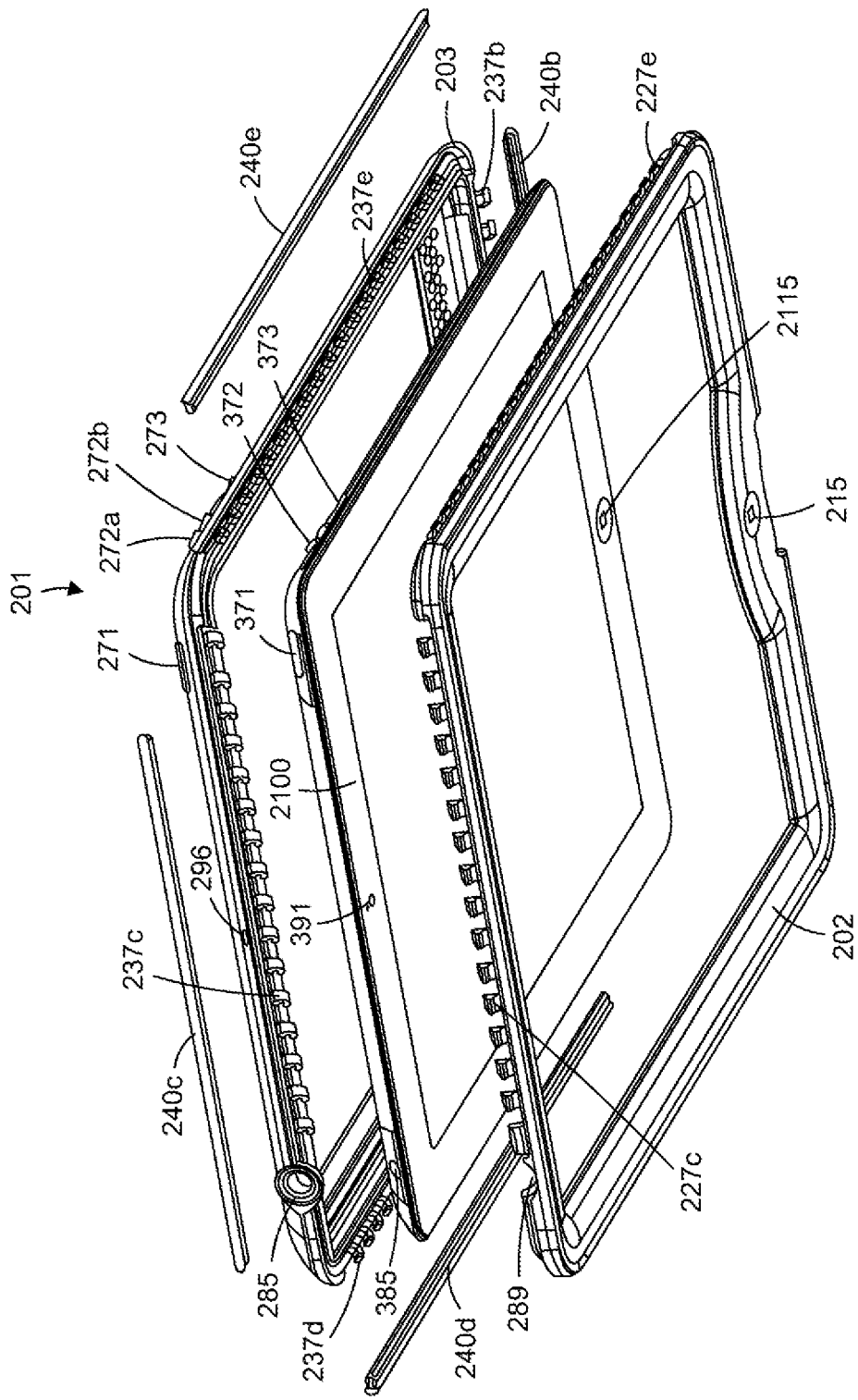

FIG. 14H shows an embodiment of the housing described herein with the electronic device 100 it houses. The electronic device 100 includes a device earphone jack port 185 on its left distal end. (It is the left distal end of the electronic device 100 when viewed from the perspective shown in FIG. 14E.) The electronic device 100 also includes a device noise canceling feature 196 on the proximal end of its top face. (It is the proximal end of the top face of the electronic device 100 when viewed from the perspective shown in FIG. 14E.) The electronic device 100 further includes a device on/off switch 171 on its right distal end. (It is the right distal end of the electronic device 100 when viewed from the perspective shown in FIG. 14E.) The electronic device 100 additionally includes a device orientation toggle 172 on its right side near its distal end. (It is the right side near the distal end of the electronic device 100 when viewed from the perspective shown in FIG. 14E.) The electronic device 100 also includes a device home button 115 on the distal end of its top face. (It is the distal end of the top face of the electronic device 100 when viewed from the perspective shown in FIG. 14E.)

As shown in FIG. 14H, the earphone jack port 285 is positioned to allow access to the device jack port 185. Also as shown in FIG. 14H, the noise reduction port 96 is positioned to allow the device noise canceling feature 196 to have access to the outside of the housing. Also as shown in FIG. 14H, the bottom member on/off switch interface 271, the orientation toggles 272a and b, volume button 273, and home button 15 allow for manipulation of the device on/off switch 171, the device orientation toggle 172, the device volume switch 173 and the device home button 115 of the encased electronic device (100) while the electronic device (100) is encased in the housing.

Figure 14I:
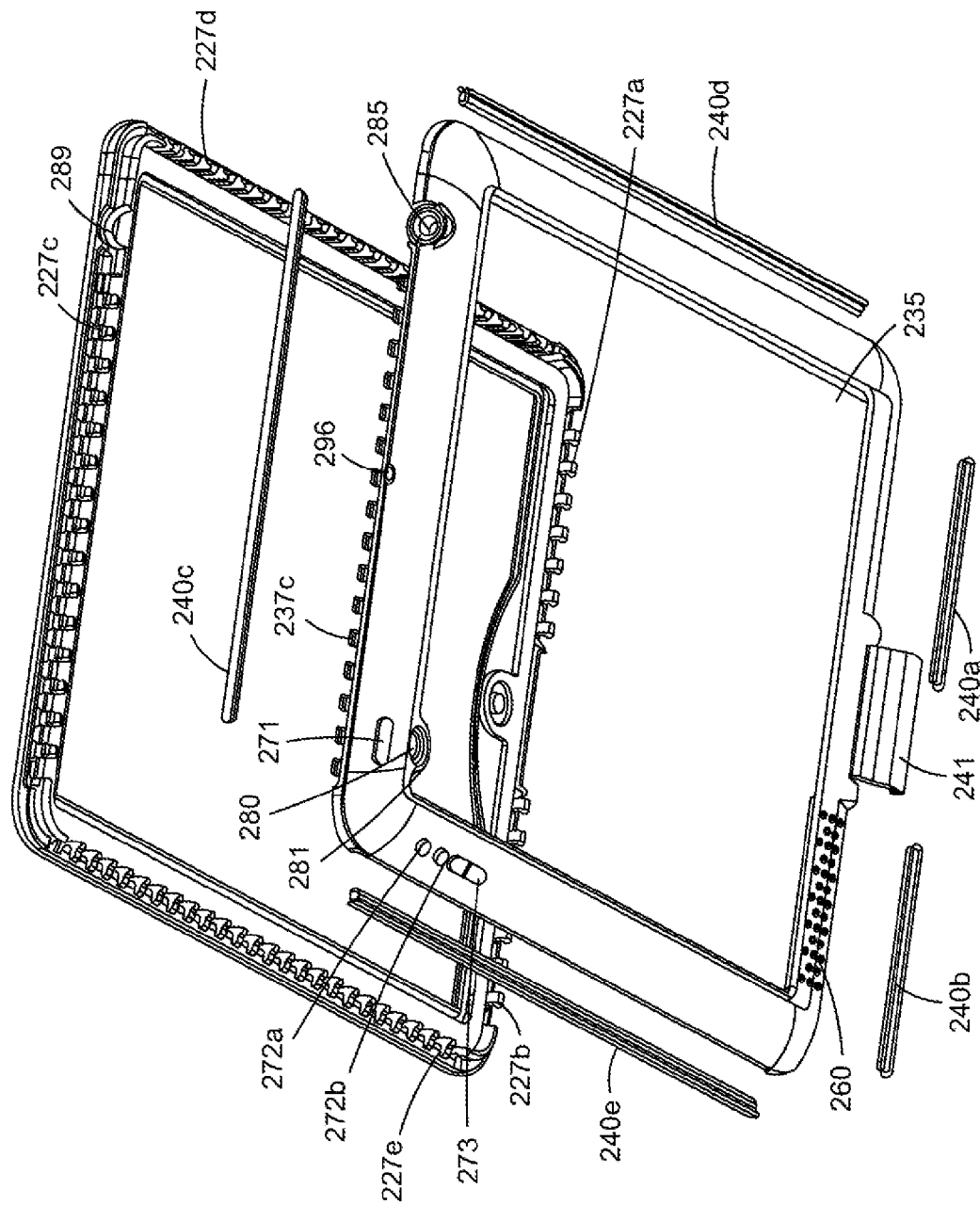

FIG. 14I shows a different perspective of the embodiment shown in FIG. 1F.

Figure 15A:
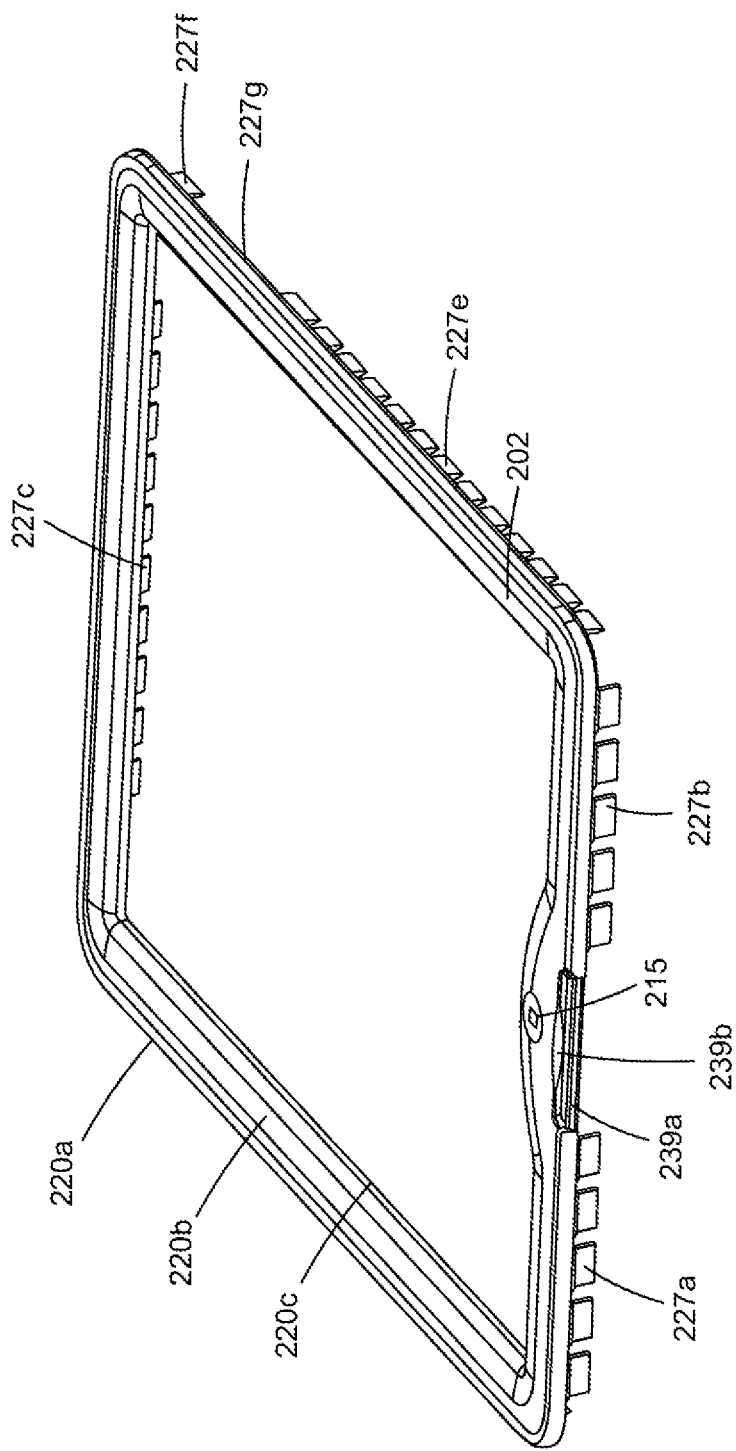

FIG. 15A provides a top-down perspective view of the top member 202 of FIG. 15A. As depicted the top member 202 is primarily defined by a perimeter portion 220. The perimeter portion includes an exterior perimeter portion 220a, a middle perimeter portion 220b, and an interior perimeter portion 220c. In this instance, all three perimeter portions are fabricated from different materials and moulded together. The outer perimeter portion 220a is fabricated from a flexible or semi-rigid material and is adapted to give the outer rim of the case a measure of shock absorbance. The flexible or semi rigid material may include but are not hereby limited to rubbers such as natural, and/or nitrile, and/or neoprene, and/or silicons, and/or fluorosilicones and/or fluorocarbons, and/or perfluor elastomer and/or polyurethanes, and/or thermoplastic elastomers such as ethylene propylene, and/or thermoplastic vulcanates, and/or thermoplastics such as polypropylene, and/or polyethylene and/or foams such as foamed polyvinyl chloride, and/or foamed nitrile rubber, and/or foamed polyurethane urethane, and the like. Thus, the outer perimeter portion 220a is referenced herein as a bumper portion. The flexible or semi rigid material may include but are not hereby limited to rubbers such as natural, and/or nitrile, and/or neoprene, and/or silicons, and/or fluorosilicones and/or fluorocarbons, and/or perfluor elastomer and/or polyurethanes, and/or thermoplastic elastomers such as ethylene propylene, and/or thermoplastic vulcanates, and/or thermoplastics such as polypropylene, and/or polyethylene and/or foams such as foamed polyvinyl chloride, and/or foamed nitrile rubber, and/or foamed polyurethane urethane, and the like.

The interior perimeter portion 220c is also fabricated from a flexible or semi-rigid material and is adapted to provide a measure of sealing for the interior of the housing 201. For instance, the interior perimeter portion 220c is adapted so as to interact with a screen portion of an encased device in such a manner that a close interface is generated. This close interface will help prevent water from seeping in under the interior perimeter portion 220c. Additionally, the interior perimeter portion is adapted such that fluids and/or particulate matter will slide or otherwise flow over the perimeter 220 of the top member 202, rather than under the perimeter 220. For this reason, the interior perimeter portion may be referenced herein as a wiper portion. The flexible or semi rigid material may include but is not hereby limited to rubbers such as natural, and/or nitrile, and/or neoprene, and/or silicons, and/or fluorosilicones and/or fluorocarbons, and/or perfluor elastomer and/or polyurethanes, and/or thermoplastic elastomers such as ethylene propylene, and/or thermoplastic vulcanates, and/or thermoplastics such as polypropylene, and/or polyethylene and/or foams such as foamed polyvinyl chloride, and/or foamed nitrile rubber, and/or foamed polyurethane urethane, and the like. The inner perimeter portion 220c may be made and associated with the middle perimeter portion by any suitable process such as overmoulding, in-mould decorating, vulcanizing, adhesive bonding, thermal bonding, substrate bonding such as an adhesive tape substrate, mechanical bonding such as stretching around, and/or entrapment in a groove and/or other mechanical bonding method and the like.

The middle perimeter portion 220b is made from a semi-rigid to rigid material and it separates the exterior bumper 220a portion from the interior wiper 220c portion. The middle perimeter portion functions in part to give structural integrity and stability to the housing 201. The rigid to semi-rigid material may include but is not hereby limited to thermoplastic materials such as polycarbonates, and/or fibre filled polycarbonates and/or acrylonitrile butadiene styrenes, and/or polyethylenes, and/or polypropylenes, and/or polyurethanes, and/or polyethylene terephthalate, and/or polyamides, and/or polyvinyl chlorides and/or thermoplastic elastomers, and/or thermoplastic vulcanates, and/or thermoset epoxies, and/or silicons, and/or metals such as aluminium, and/or steel, and/or stainless steel, and/or titanium, and the like.

Although the perimeter portion 220 has been exemplified here in as being composed of three different parts 220 a, b, c, which parts are fabricated from three different materials, the perimeter portion 220 may, in various instances, be composed of more or less component parts, which in turn may be fabricated from the same or different materials.

The top member 202 further includes a clasping mechanism 227 that is configured as a plurality of engaging members, which members are configured for engaging one or more of the bottom member 203, e.g., the bottom member clasping mechanism 237, and/or the locking element 204. The engaging members 227 may have any suitable configuration so long as they are capable of interacting with one or both of the bottom 203 or locking 204 members so as to couple the top 202 and bottom 203 members together and thereby generate a waterproof sealing therewith. One or a plurality of engaging members 227 may be provided and in this instance, a plurality of sets of engaging members: 227 a, b, c, d, e, and f, have been provided.

It is to be noted that the number of individual engaging members, e.g., snap-teeth, provided in each set may vary, as well as the number of sets may vary. It is useful, however, to have the engaging members circumscribe the entire perimeter or a substantial portion thereof, as this will provide a more secure coupling of the top 202 and bottom 203 members with one another. As depicted, there is a gap between snap-teeth 227e and snap-tooth 227f, which gap is adapted to accommodate various features of the underlying device, such as volume control and/or orientation features. It is noted that where such features of an underlying device differ, so too will the configuration of the clasping mechanism, e.g., the configuration of snap-teeth engaging members 227 will differ. In any event, enough snap-teeth members 227 should be included so as to create a firm, waterproof sealing around the perimeter of the housing 201.

Also included in the top member are a button feature 215, a charge port latching ramp engaging element 239a, and a thumb-nail cutout portion 239b. As described above, the configuration of each of these features could be interposed or otherwise different, for instance, all of these elements may be positioned entirely on the top or bottom member, if desired.

Figure 15B:
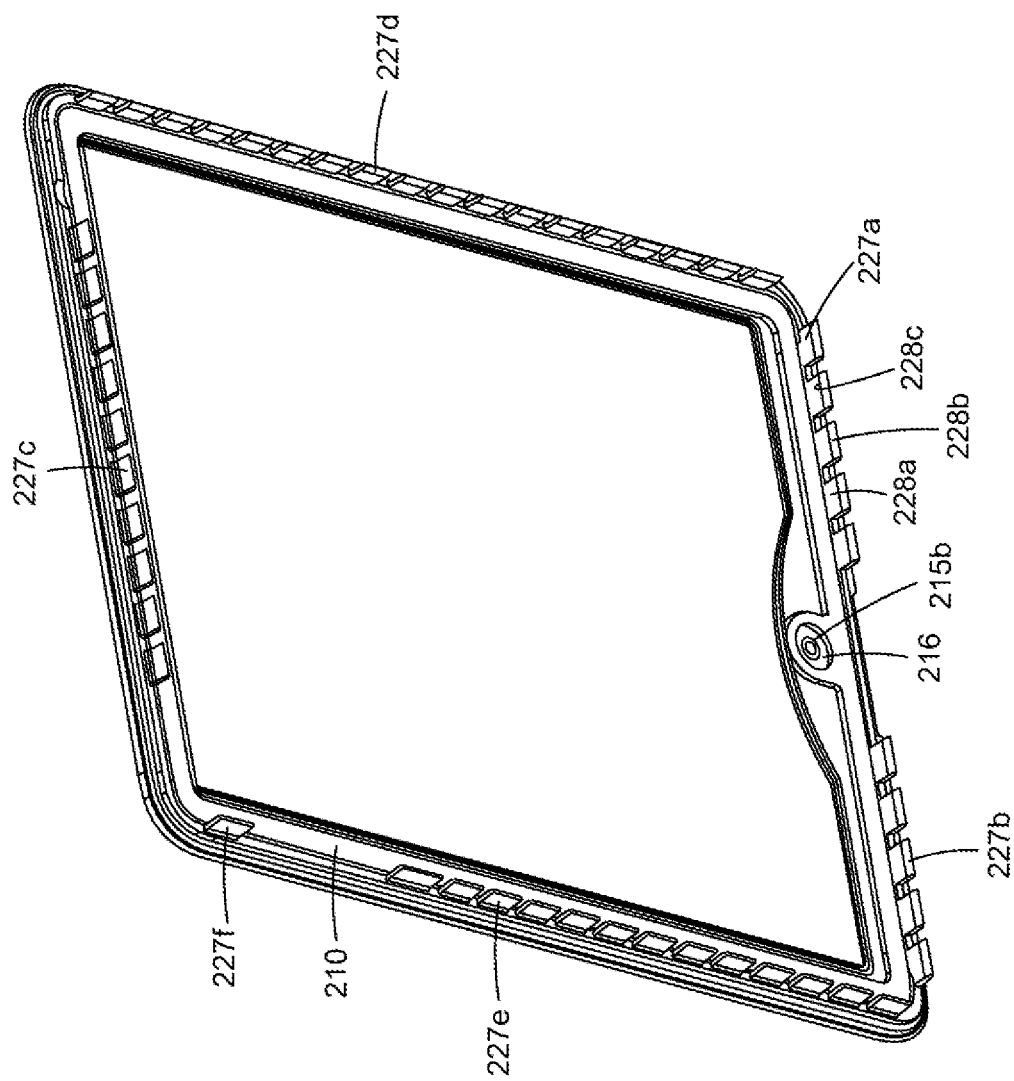

FIG. 15B provides a bottom-up perspective view of the top member 202 of FIG. 15A. As can be seen with respect to FIG. 15B, the bottom surface of the perimeter portion 220 of the top member 202 includes a gasket 210. The gasket circumscribes the entire perimeter 220. Although the gasket 210 need not circumscribe the entire perimeter 220, in many instances it is beneficial that it do so as to secure a waterproof sealing when the top 202 and bottom 203 members are securely fitted around an encased device and coupled and/or locked together.

Also depicted is the under side of the home button 215, which home button 215 is covered with a home button sealing gasket 216. As can be seen with respect to FIG. 15A, the perimeter portion 220b forms an extended region wherein the home button feature 215 is positioned. Although this feature may be part of the perimeter portion, e.g., integral therewith, it may in various embodiments be distinct therefrom. For instance, in this embodiment, the extended perimeter portion includes a cutout portion 215c wherein the home button feature is positioned. A semi-rigid home button 215a is positioned therein and overlaid with a flexible home button gasket 216. The home button 215a includes a nob portion 215b, which is configured as button interface portion, which interface portion interfaces with the home button of an encased device so as to manipulate the functioning of said device. The flexible home button gasket 216 additionally includes a home button interface portion 16a, which interface portion overlays the home button interface portion 215b.

The top member 202 snap-tooth members 227 a, b, c, d, and e are also clearly depicted. Each snap-tooth member 227 includes a plurality of sub portions. For instance, each snap-tooth member 227 includes a snap-tooth base 228a, a slanted surface face 228b, and an intersecting surface face 228c. Together the slanted face 228b and intersecting face 228c form a catch or ledge that is capable of engaging a corresponding engagement element provided on a bottom 203 or locking 204 member. In a manner such as this a top 202 and bottom 203 member may be coupled and/or locked together, for instance, by the top-member clasping mechanism, depicted herein as 228 engaging a corresponding clasping mechanism on a bottom 203 and/or locking 204 member.

FIG. 15C provides a top-down perspective view of the bottom member 203. As can be seen with respect to FIG. 15C, the bottom member 203 is also at least partially defined by the perimeter portion 230. The perimeter portion includes an exterior perimeter portion 230a, a middle perimeter portion 230b, and an interior perimeter portion 230c.

The exterior perimeter portion 230a includes several features such as a charge port receptacle cutout, which at least partially surrounds the charge port receptacle of the middle perimeter portion 246, and a plurality of button and/or switch interfaces, such as orientation toggle interfaces 272 a and b, volume switch interface 273, and on/off switch interface 271. It is to be noted that these features include an interface element that translates action from an exterior perimeter portion 220a of the bottom member 203 through to the middle perimeter portion 220b. The middle perimeter portion 220b, therefore, has a corresponding button and/or switch interface element that translates this action to an encased device thereby allowing a user to manipulate the functioning of the encased device by manipulating the exterior button and/or switch features. In this instance, the interior perimeter portion 220c is simply cut away from the button features, but in certain instances could overlay one or more of them. Additionally, the interior perimeter portion 220c forms an interior perimeter bumper portion as well as a device seat, which is adapted for cushioning the device from the interior of the housing and providing a measure of shock absorbance therefore.

Further, the bottom member 203 may includes an earphone port 285 that is adapted to receive an earphone, speaker, or other jack feature. The earphone port 285 traverses form the exterior to the interior of the housing 201. Not shown, but which may be included, either on a top or a bottom member is a noise reduction port feature. Also, in this embodiment the front and back surface 235,236 of the bottom member 203 is opaque and does not include a lens feature.

The bottom member 203 additionally includes a speaker transmission portion 60 that is adapted for transmitting sound from an interior of the housing 201 to an exterior of the housing. The speaker sound transmission portion 260 includes sound inlet apertures 261, which apertures translate from the interior of the housing to the exterior of the housing thereby letting sound flow therethrough. The apertures 261 overlaid with a membrane, e.g., an acoustic vent membrane, 263, which membrane allows sound to pass there through bot not liquid, such as water. In a manner such as this sound may be permitted to pass through the bounds of the housing 201, but water is not. The transmission portion may also include a sound barrier 263 that is adapted to contain sound within the bounds of the transmission portion, and to prevent sound from being translated to other regions of the interior back surface of the housing 201. This barrier 263 may or may not be included, but where included it may function to dampen the bass characteristics of sound generated by an encased device.

The perimeter portion 230 of the bottom member 203 includes clasping mechanism 37 that is configured as a set of snap-latch receptacles. The bottom member, therefore includes a left proximal snap-tooth receptacle 237a, a right proximal snap-tooth receptacle 237b, a distal snap-tooth receptacle 237c, a left snap-tooth receptacle 237d, a right snap-tooth receptacle 237e, and a right snap tooth receptacle 237f. These receptacles are adapted for receiving both the snap-tooth members 228 of the top member 202 and the snap-tooth combs 240.

FIG. 15D provides a bottom-up perspective view of the bottom member 203 of FIG. 15C. As can be seen with respect to FIG. 15D, the bottom member includes a perimeter portion 220 that includes an exterior perimeter portion 230a and a middle perimeter portion 230b. The exterior perimeter portion 230a includes a charge port cutout which cutout allows access to the charge port receptacle 246 of the middle perimeter portion. The exterior perimeter portion 220a additionally includes orientation toggle interfaces 272 a and b, volume switch interface 273, and on/off switch interface 271. The bottom member 203 also includes an earphone port 285 and the front and back surface 235,236 includes a lens feature 280 as well as a speaker transmission portion 260 that includes sound inlet apertures 261. The bottom member additionally includes snap-tooth receptacles 237a, b, c, d, e, and f.

Figure 15E:
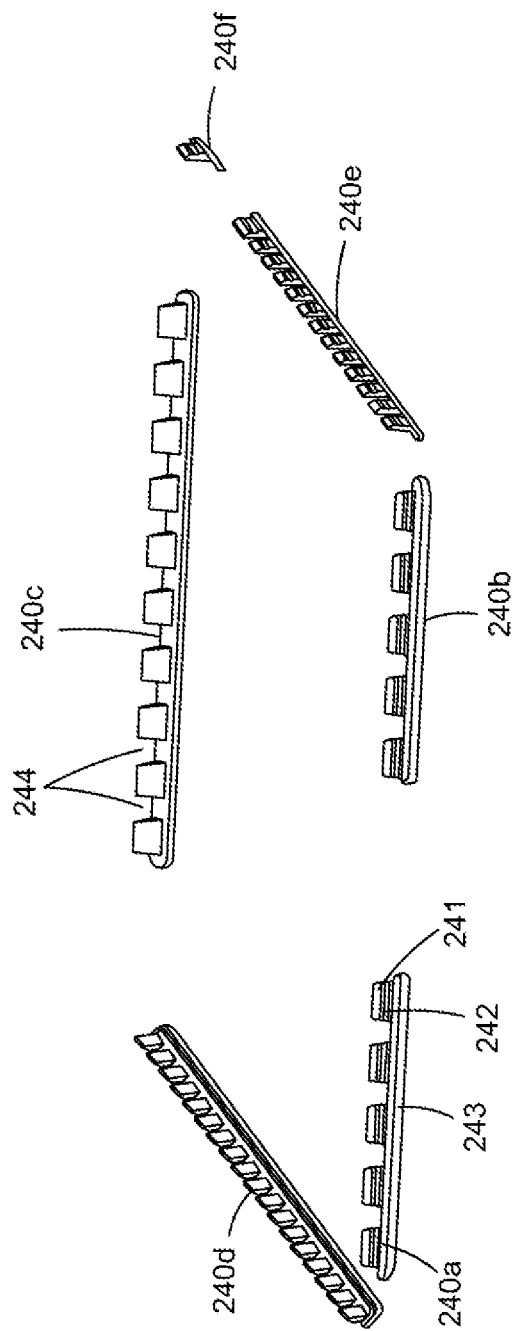
FIG. 15E provides a perspective view of a locking member.

FIG. 15E provides a perspective view of the locking member 204. In this embodiment the locking member is configured as a plurality of snap-tooth combs: left proximal snap-tooth comb 240a, right proximal snap-tooth comb 240b, distal snap-tooth comb 240c, right snap-tooth comb d, and right snap tooth e. Each snap-tooth comb includes one or a plurality of snap-tooth elements. Each snap tooth element includes a plurality of portions, such as a slanted snap-tooth clasping surface 242 and an intersecting snap-tooth clasping surface, both of which are joined by a snap-tooth comb backbone 243. Each snap-tooth is additionally separated from one another by a snap-tooth space 244. It is noted that right snap-tooth 240f comprises a solitary snap-tooth element and is separated from snap-tooth comb 240e by a space. This space is configured for accommodating one or more button features, such as button features 272 and 273 of the bottom member. This space may be longer or shorter and the snap-tooth element 240f may have a plurality of snap-tooth elements, or may not be present at all. However, it is useful to have snap-tooth 240f present so as to provide structural integrity to the seal formed by coupling the top member 202 with the bottom member 203.

Figure 15F:
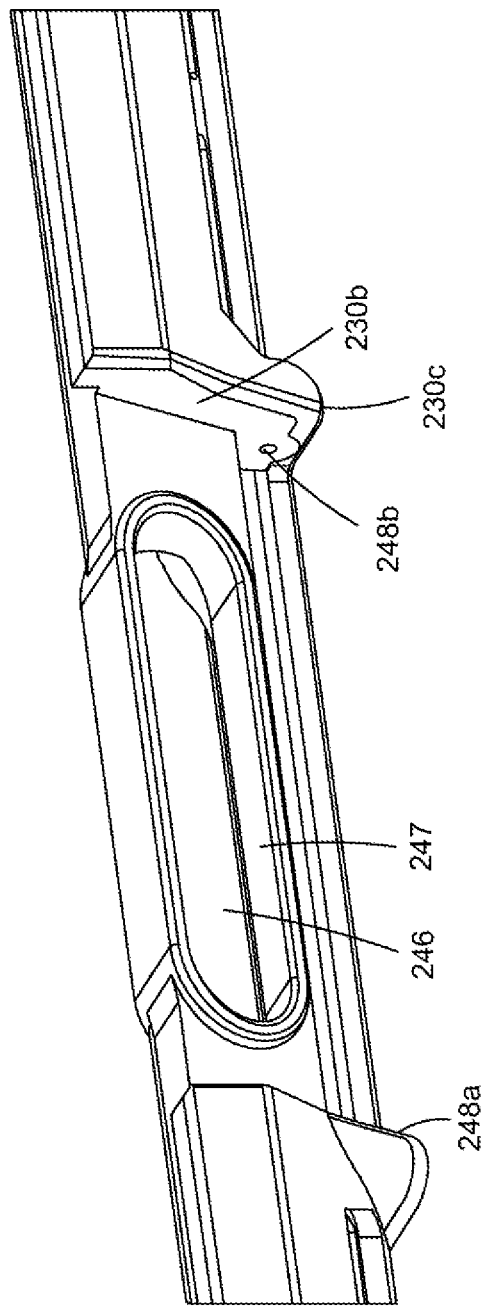
FIG. 15F provides a perspective view of the proximal side of the protective housing.

FIG. 15F provides a perspective view of the proximal end 231 of the bottom member 203. Specifically, the bottom member charge port receptacle 246 is provided. The charge port receptacle 246 is bounded by bounding member 247, which bottom member further includes one or more charge port axle receiving orifices 248 a, b. As can be seen with respect to FIG. 15F, the charge port bounding member 247 is formed as part of the middle perimeter portion 220b, and is further at least partially surrounded by a cutout portion of the exterior perimeter portion 220a.

Figure 15G:
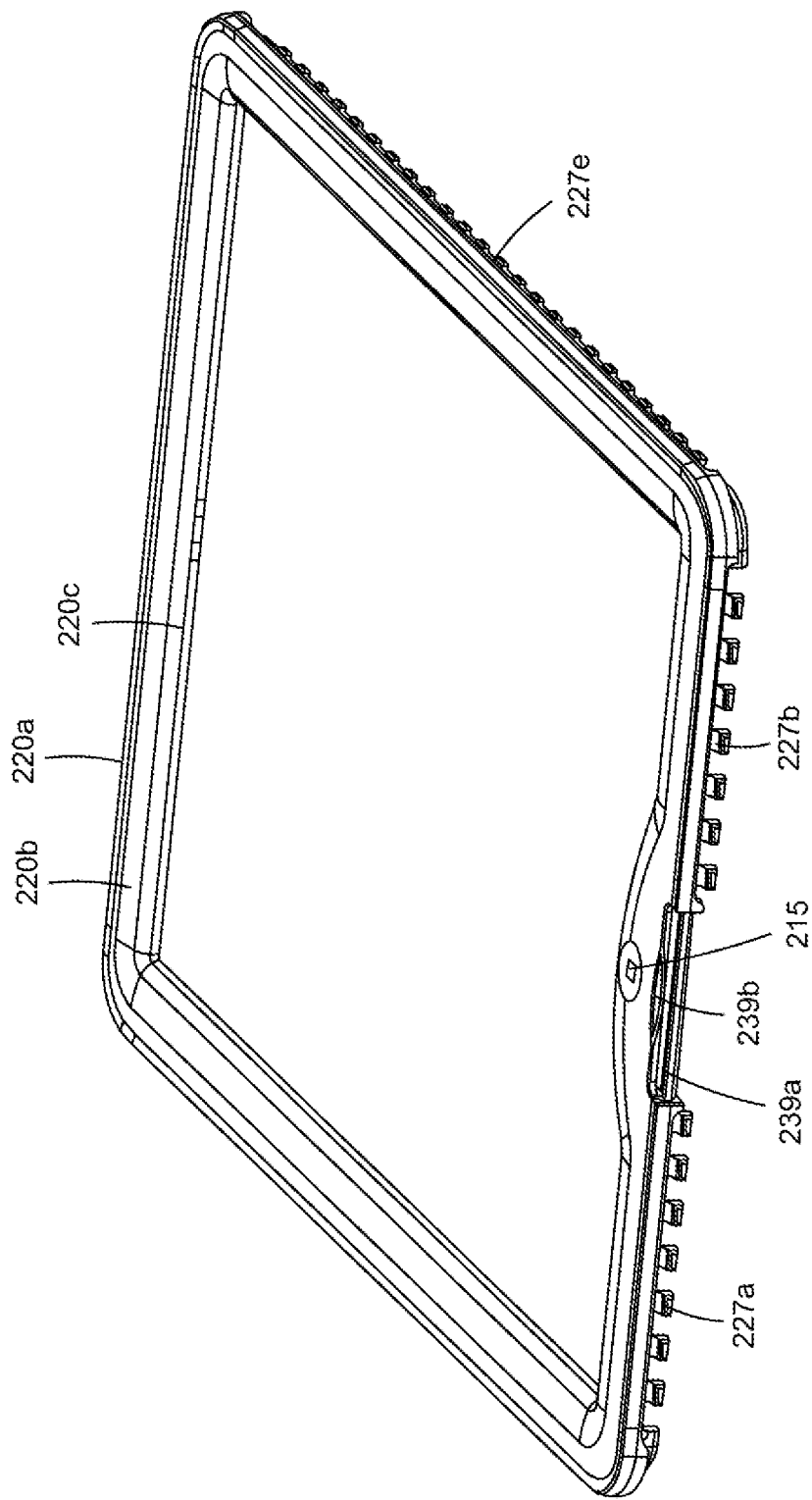

FIG. 15G provides a top-down perspective view of the alternative wedge-locking version of the top member 202 of FIG. 14E. As depicted the top member 202 is primarily defined by a perimeter portion 220. The perimeter portion includes an exterior perimeter portion 220a, a middle perimeter portion 220b, and an interior perimeter portion 220c. In this embodiment, and as can be seen with respect to FIG. 15H, the top member 202 includes a clasping mechanism 227 that is configured as a plurality of sets of wedge receiving, e.g., duck hook engaging, members, such as: a left proximal duck hook portion 227a, a right proximal duck hook portion 227b, a distal duck hook portion 227c, a left side duck hook portion 220d, and a right side duck hook portion 227e.

The duck-hook engaging members 227 of the top member are configured for interfacing with one or more clasping mechanism 237 of the bottom member 203, which in this embodiment are configured as wedge receiving, e.g. hooks, as well as being configured for receiving at least a portion of the locking element 204 therein. In this embodiment the locking element 204 is configured as a wedge member 240. See FIG. 15K.

It is to be noted that with respect to this embodiment, the number of individual duck hook members provided in each set may vary, as well as the number of sets may vary. The top member duck hook and corresponding bottom member hook engaging members may circumscribe the entire perimeter or a portion thereof, and in this embodiment circumscribe a substantial portion thereof thereby providing a more secure coupling of the top 202 and bottom 203 members with one another. The top member also includes a button feature 215, a charge port latching ramp engaging element 239a, and a thumb-nail cutout portion 239b. As can be seen with respect to FIG. 15H, the top member 202 further includes a button feature 215 having a button feature sealing gasket 216 and an earphone port cutout 289.

Figure 15H:
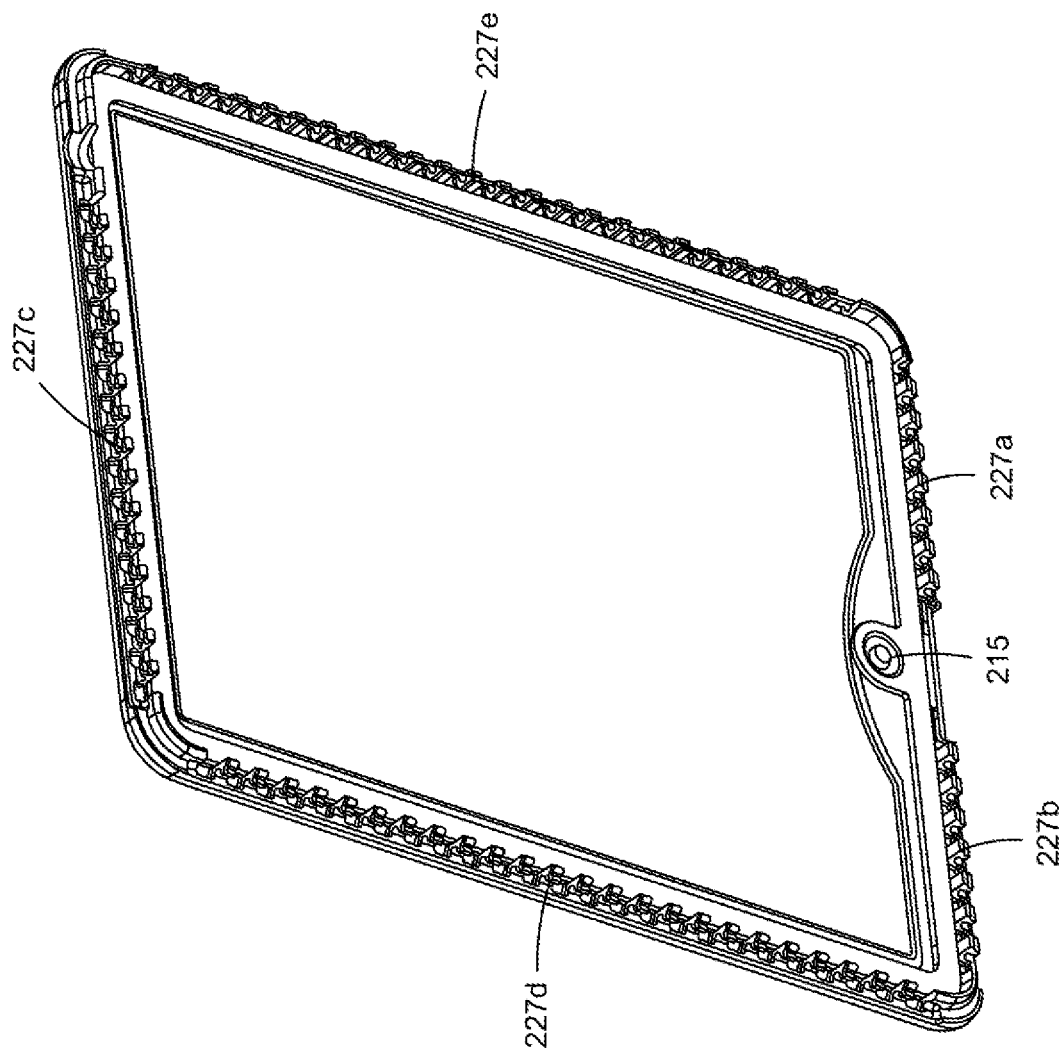
Figure 15I:
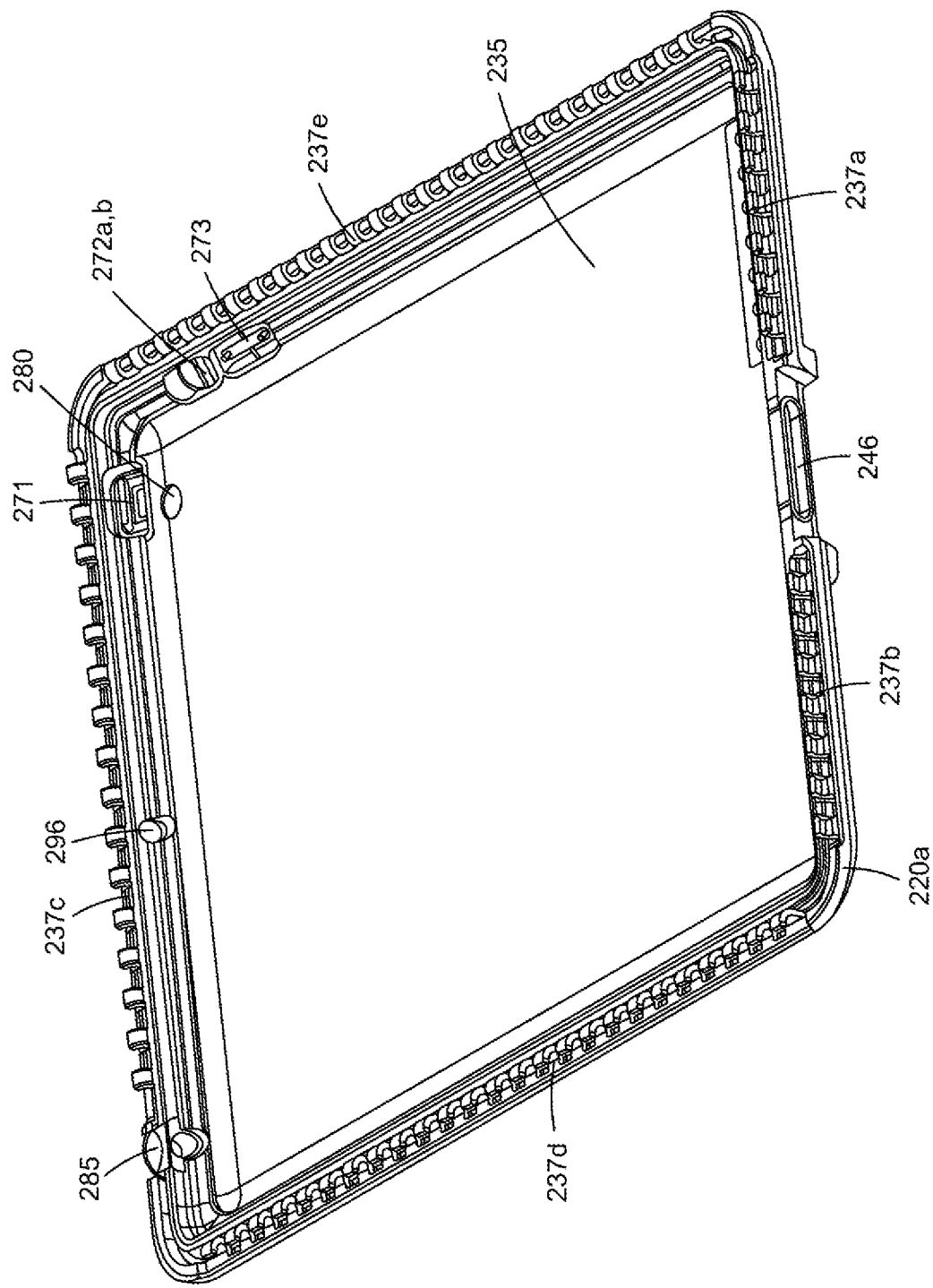

FIG. 15I provides a top-down perspective view of the bottom member 203 of the locking wedge embodiment provided in FIG. 15H. As can be seen with respect to FIG. 15I, the bottom member 203 is at least partially defined by the perimeter portion 230. The perimeter portion includes an exterior perimeter portion 230a, a middle perimeter portion 230b, and an interior perimeter portion 230c. The exterior perimeter portion 230a includes a charge port receptacle 246 and a plurality of switch interfaces, such as orientation toggle interfaces 272 a and b, volume switch interface 273, an on/off switch interface 271, as well as a noise cancelling feature 291. The bottom member 203 also includes an earphone port 285 that is adapted to receive an earphone, speaker, or other jack feature.

The perimeter portion 230 of the bottom member 203 includes clasping mechanisms 237a, b, c, d, and e, which clasping mechanisms are configured as sets of wedge receiving hooks. The bottom member 203, therefore, includes a set of left proximal wedge receiving hooks 237a, a set of right proximal wedge receiving hooks 237b, a set of distal wedge receiving hooks 237c, a set of left wedge receiving hooks 237d, and a set of right wedge receiving hooks 237e. These wedge receiving hook elements are spaced apart from one another in such a manner that the gaps between each hook element are adapted for receiving corresponding duck hook elements of the top member 202. And together, when the top member 202 is coupled to the bottom member 203, and the top member 202 wedge receiving duck hook elements 227 are aligned with the bottom member 203 wedge receiving hooks 237, a cavity is formed via the complimentary shape of the hook features such that a locking wedge element 240 may be inserted there into and thus function to lock the hooks in place thereby sealing the top 202 and bottom 203 members together in a waterproof sealing.

Figure 15J:
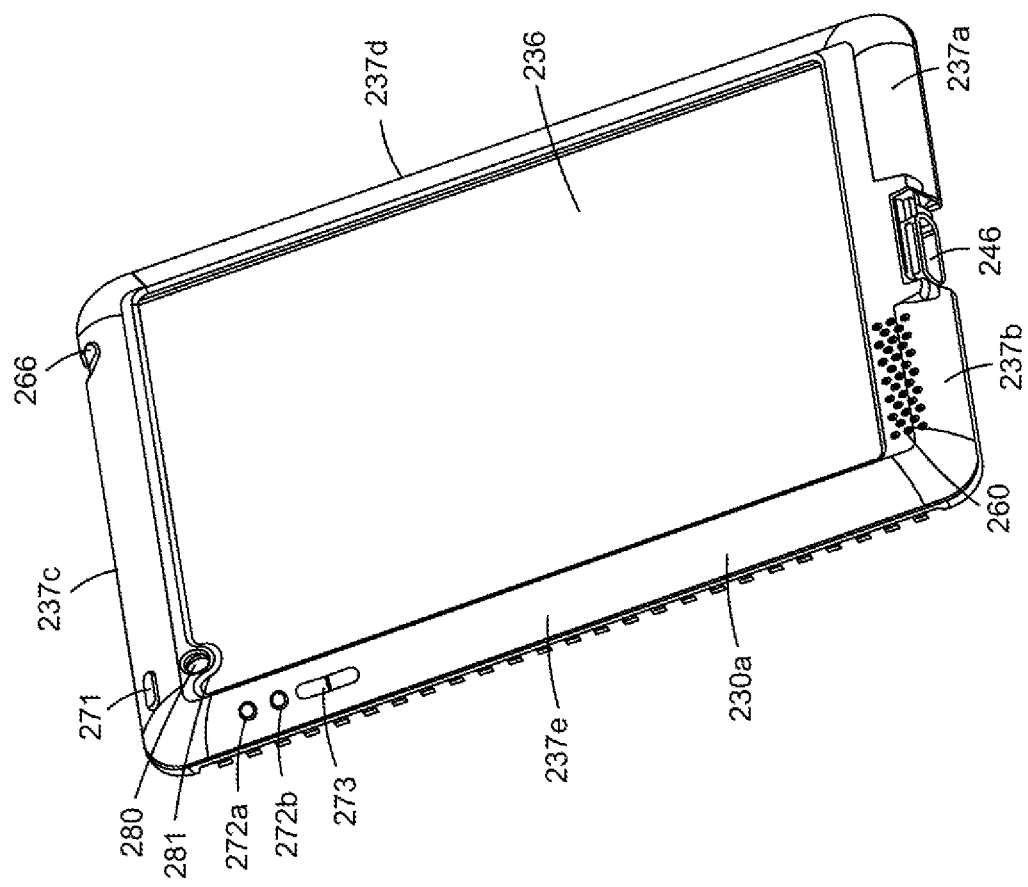

FIG. 15J provides a bottom-up perspective view of the bottom member 203 of FIG. 21. As can be seen with respect to FIG. 15J, the bottom member includes a perimeter portion 220 that includes an exterior perimeter portion 230a and a middle perimeter portion 230b. The exterior perimeter portion 230a includes a charge port cutout which cutout allows access to the charge port receptacle 246 of the middle perimeter portion. The exterior perimeter portion 220a additionally includes orientation toggle interfaces 272 a and b, volume switch interface 273, and on/off switch interface 271. The bottom member 203 also includes an earphone port 285 and the front and back surface 235,236 includes a lens feature 280, having a raised lens skirt 281 as well as a speaker transmission portion 260 that includes sound inlet apertures 261. The bottom member additionally includes wedge receiving duck hook members 237a, b, c, d, e, and f.

FIG. 15K provides a perspective view of the locking member 204. In this embodiment the locking member is configured as a plurality of locking wedges: left proximal locking wedge 240a, right proximal locking wedge 240b, distal locking wedge 240c, left locking wedge 240d, and right locking wedge 240e. Each locking wedge 240 includes a plurality of sub-portions, such as a wedge base element 246, hook interface member 247, which in this instance is shaped as an arrow point, and a wedge intersecting surface 248, which in this instance is formed as a groove thereby giving the locking wedge a distinct arrow shape. It is noted that a suitable locking wedge 240 may have any configuration so long as it is able to be fitted within the groove created by the interdigitated hook members of the top 202 and bottom 203 members, and thereby capable of locking the top 202 and bottom 203 members together in a waterproof seal. Thus, although in this embodiment the locking wedge 240 is configured as an arrowhead, it may have other suitable configurations as well, although the arrowhead configuration may have particular usefulness.

In certain embodiments, the housing may include a port opening, such as an electrical interface port, for instance, a charge port receptacle. To ensure increased protection of the underlying device, such as to protect the underlying device from dirt, liquid, shock, etc., the housing may additionally include a port door and latch that is capable of opening and closing so as to cover and seal the charge port receptacle. The port and/or door may be positioned, for instance, along a perimeter of the housing, such as at a proximal or distal end or a side thereof. In certain instances, the port receptacle and door provide a shock and water resistant latch port. The port door may be positioned on a top or a bottom perimeter member of the housing and may be configured for spanning across from one side of the opening to another.

Figure 15L:
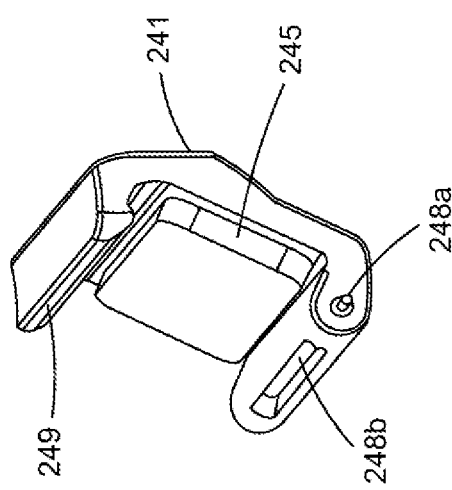

For example, FIG. 15L provides a perspective view of a charge port door 241 and latch 249 of a latch feature of the housing 201. The charge port door 241 includes a charge port gasket 245. The charge port gasket 245 is configured for engaging and sealing around a charge port receptacle 246 and thereby creating a waterproof seal therewith. The charge port door 241 additionally includes a charge port axle 248*b*, which in this embodiment is configured as a charge port "pin" member. The charge port pin member 248*b* fits through a charge port axle orifice 248*a* of the charge port door 241 and interfaces with corresponding orifices 248 *c, d*, on the bottom member 203 so as to connect the charge port door 241 with the bottom member 203 and allow the charge port door 241 to open and close by rotating about the axle 248*b*.

Figure 15M:
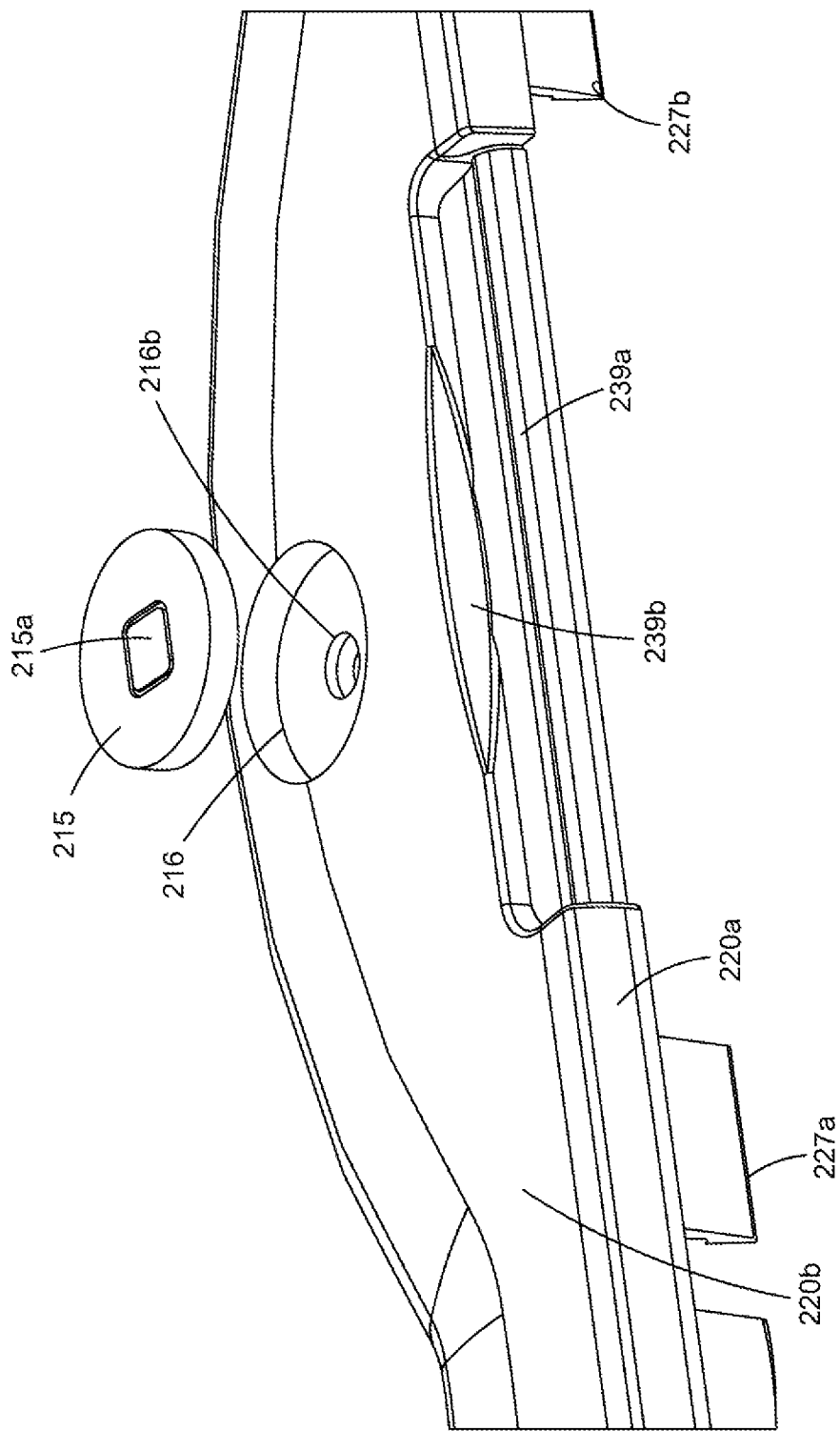

FIG. 15M provides a perspective view of a button feature 215 positioned on a middle perimeter portion 220*b* at a proximal end 221 of the top member 202. The button feature 215 includes a button 215*a* and a button interface portion or nob 215*b* positioned on the underside of the button 215*a*. Also shown is a button feature sealing gasket 16 and corresponding button interface portion receiving element 216*b*.

Additionally depicted is a top member 202 latch port interface 239. The top member 202 latch port interface includes a latch receiving ramp 239*a* and a thumbnail cutout 239*b*. Specifically, where a charge port receptacle 246 and charge port door 241 are provided, for instance, on a bottom member 203 of housing 201, a further latch port interface 239 may be provided, for instance, on a top member 202. The latch port interface 239 is configured for engaging the charge port door 241 so as to lock the latch door 241 in a closed position. In this instance, the latch port door interface 239 is positioned above the charge port receptacle 246 and receptacle bounding member 247. The latch port door interface 239 is configured as a latch ramp, which latch ramp 239*a* is adapted for engaging a corresponding latch ramp interface portion 249 of the latch door 241 when the latch door is in the closed position thereby securing the latch door in the closed position.

Figure 15N:
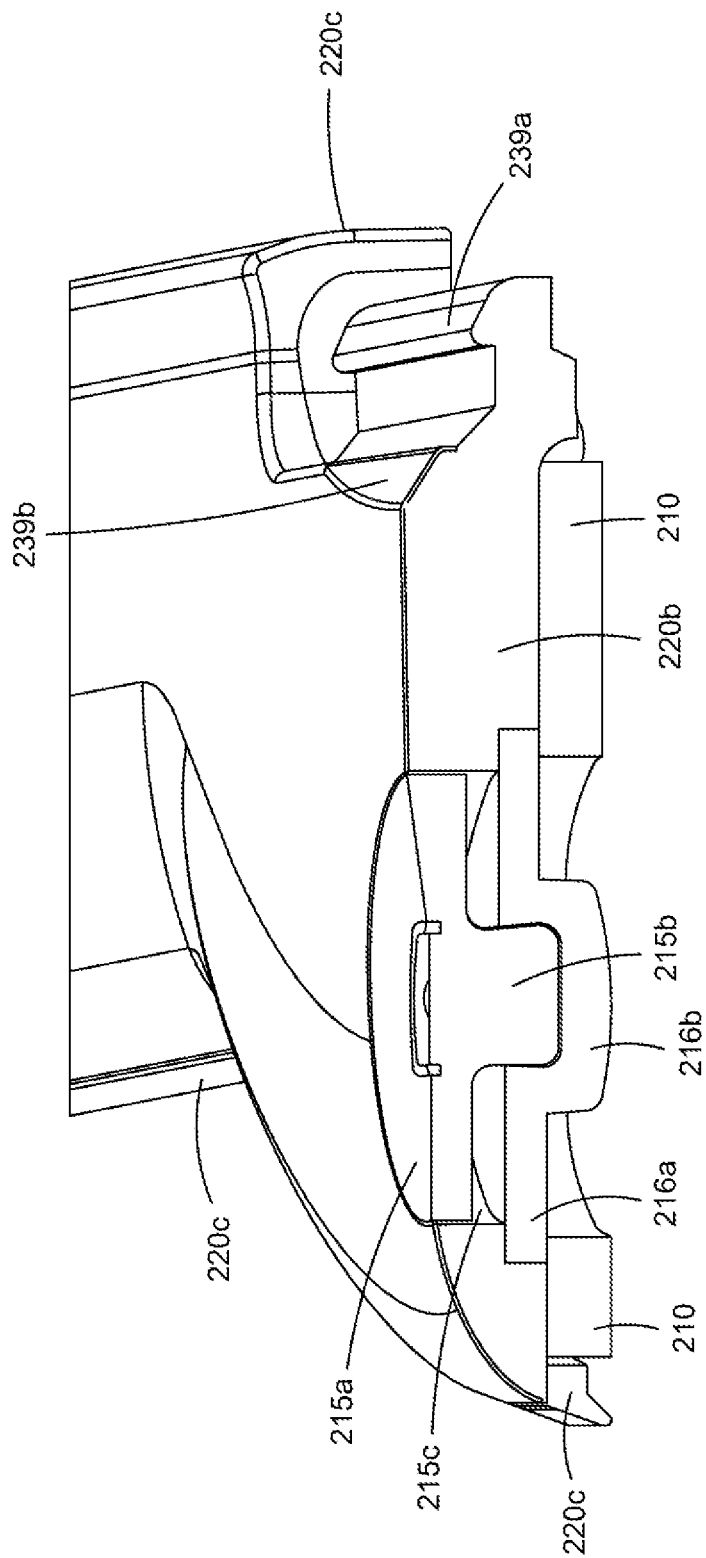
Figure 150:
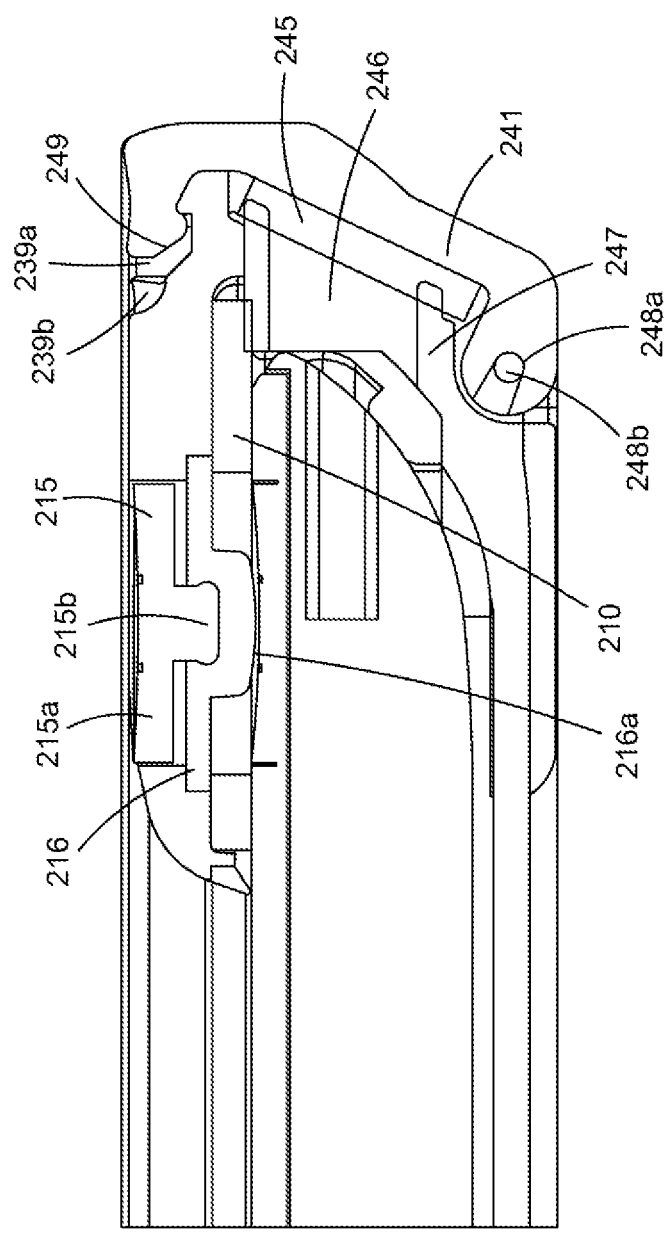

FIG. 15N provides a cutaway view of the button feature 15 of FIG. 15M. The button feature 215 includes a button 215*a* and a button interface portion or nob 15*b* positioned on the underside of the button 215*a*. Also shown is a button feature sealing gasket 216 and corresponding button interface portion receiving element 216*b*. As can be seen, there may be a small space 215*c* between the button 215 and the button sealing gasket 216. The top member gasket 210 further surrounds the underside of the button feature 215 to further provide waterproof protection therefore.

FIG. 15O provides a cutaway view of a button feature 215 and a latch port feature. The latch port feature includes a charger port receptacle 246 that is bounded by a charger port bounding member 247 and covered by the charge port door 241 of FIGS. 15L and M. The button feature 215 includes a button 215*a* and a button interface portion or nob 215*b* positioned on the underside of the button 215*a*. Also shown is a button feature sealing gasket 216 and corresponding button interface portion receiving element 216*a*.

In this instance, the latch feature is positioned on a proximal end 231 of the housing 201. The latch feature includes a port or latch receptacle bounding member 247, having a port opening 246 therein, and further includes a latch door 241. The port receptacle bounding member 247 circumscribes the opening 246, wherein the opening may be configured to receive a charge member for charging an underlying electronic device. The latch feature also includes a latch cover 241 that is configured for covering the latch receptacle bounding member 247 so as to form a waterproof seal therewith.

The latch feature and port opening bounding member 247 may have any suitable configuration. In one embodiment, the latch feature is positioned entirely in one of the upper or lower housing members. Consequently, all of the latch feature components will be positioned entirely on that housing member. In an alternative embodiment, the latch feature is configured for spanning from one housing member, e.g., 202, to the other housing member, e.g., 203. Thus, the opposing housing members 2 and 203 will have corresponding latch interfaces that are configured for engaging the latch door 241 so as to seal the port receptacle 247. In either instance, the port receptacle bounding member 247 includes an opening 246, and the port covering 241, e.g., a latch door, which latch door 41 is configured for moving from an open to a closed position so as to cover the port receptacle 246.

As depicted, the latch feature is configured for spanning from one housing member 202 to the other housing member 203. Accordingly, each of the housings 202,203 will include corresponding latch interfaces. For instance, the charge port receptacle bounding member 247 is positioned within the proximal end portion 221 of top member 202. The latch feature includes a cover door and a plurality of latch door interfaces.

For instance, the first latch feature interface is a latch door connector 48*b*. The latch door connector 248*b* may have any suitable configuration so long as it is capable of interfacing with a latch door 241 and facilitating the movement of the latch door 241, e.g., from an opened to a closed position or vice versa. In this instance the latch door connector is configured as a latch door axle 248*b* that is positioned on the proximal end portion 231 of the bottom member 203. The latch door axle 248*b* is positioned below the port receptacle bounding member 247, which is contained in top member 202. The latch door axle 248*b* is configured for engaging the latch door 241 via an axle orifice 248*a* so as to assist the latch door in moving from an opened to a closed position, wherein the closed position the latch door 241 spans the opening 246 bounded by the charge port receptacle 246. Thus, the moving of the latch door 241 from an opened to a closed position results in the covering and/or sealing of the opening 246 bounded by the charge port receptacle bounding member 247. In this instance, the latch door 241 is configured for rotating about the latch door connector 248*b*.

As depicted, the latch port door 241 is in a substantially closed position whereby the charge port door latch ramp 249 is engaged with the latch ramp receiving element 39*a*. The charge port door 241 includes a charge port gasket 245 that seals around the charge port receptacle 246 thereby creating a waterproof seal therewith. Also depicted are the charge port connector, e.g., an axle pin, 248*b* which is fitted through the charge port axle orifice 248*a* of the charger port door 241.

In certain embodiments, the closing of the latch door 241 closes the port opening 246 in a liquid-tight seal. To ensure a liquid-tight seal, the latch feature may have one or more additional features. For instance, the latch feature may include a gasket 245, such as an O-ring or other depressible gasket. The gasket 245 may be positioned on or around a charge port receptacle bounding member 247 or may be positioned on a latch door 241 or both.

For instance, as depicted in FIG. 15O, the latch door 241 includes a gasket 245, which gasket is of a dimension so as to be at least partially fitted within the opening 246 of the bounding member 247 such that as the latch door is moved from an opened to a closed position, a portion of the gasket 245 covers the opening 246 and, in certain instances, may at least be partially fitted within the port opening 246, in either instance thereby sealing the port. Accordingly, the charge port receptacle bounding member 247 includes a gasket interface surface that is positioned in such a manner so as to interact with the gasket 245 and thereby provide a watertight seal when the latch door 241 is in the closed configuration, e.g., when the latch ramp interface 239 is coupled to the latch ramp 249.

To facilitate this interaction, in certain embodiments, it may be beneficial for the housing member, e.g., 202, having the charge port opening bounding member 247 therein to include an additional rigid structural feature that is adapted to provide increased structural integrity to the charge port receptacle bounding member 247 so as to provide additional support for the port opening. For example, in certain instances, when there is a charge port receptacle bounding member 247 in a top member 202 of the housing 201, the port opening may have a tendency to make the immediate surrounding material weaker. Therefore, a rigid support material may be associated with the bounding member 247 so as to support the region surrounding the port opening.

Without the inclusion of the rigid support material the top and bottom portions surrounding the opening may be forced away from one another thereby compromising the ability of the opening to be sealed in a watertight manner. In such an instance, the rigid stiffening material may be added so as to insure the integrity of the port opening. In certain instances, this reinforcing is accomplished without thickening the material of the housing member because this might result in making the overall housing thicker, wider, and/or longer, although it can be done in this manner. In an alternative embodiment, therefore, a rigid element is added to the top member 202 having the port opening 271a therein. For instance, an injection molded stiffener, such as a stainless steel, magnesium, rigid plastic component, or the like may be included in the top member 202 and associated with the material surrounding the port opening 246 so as to provide increased rigidity thereto, thereby maintaining the physical integrity of the port opening and preventing flexing. It is to be understood that although the above has been described with respect to the port opening being positioned in the top member 202, the port opening can be positioned in the bottom member 3 as well with consequent changes to the other latch features.

Figure 15P:
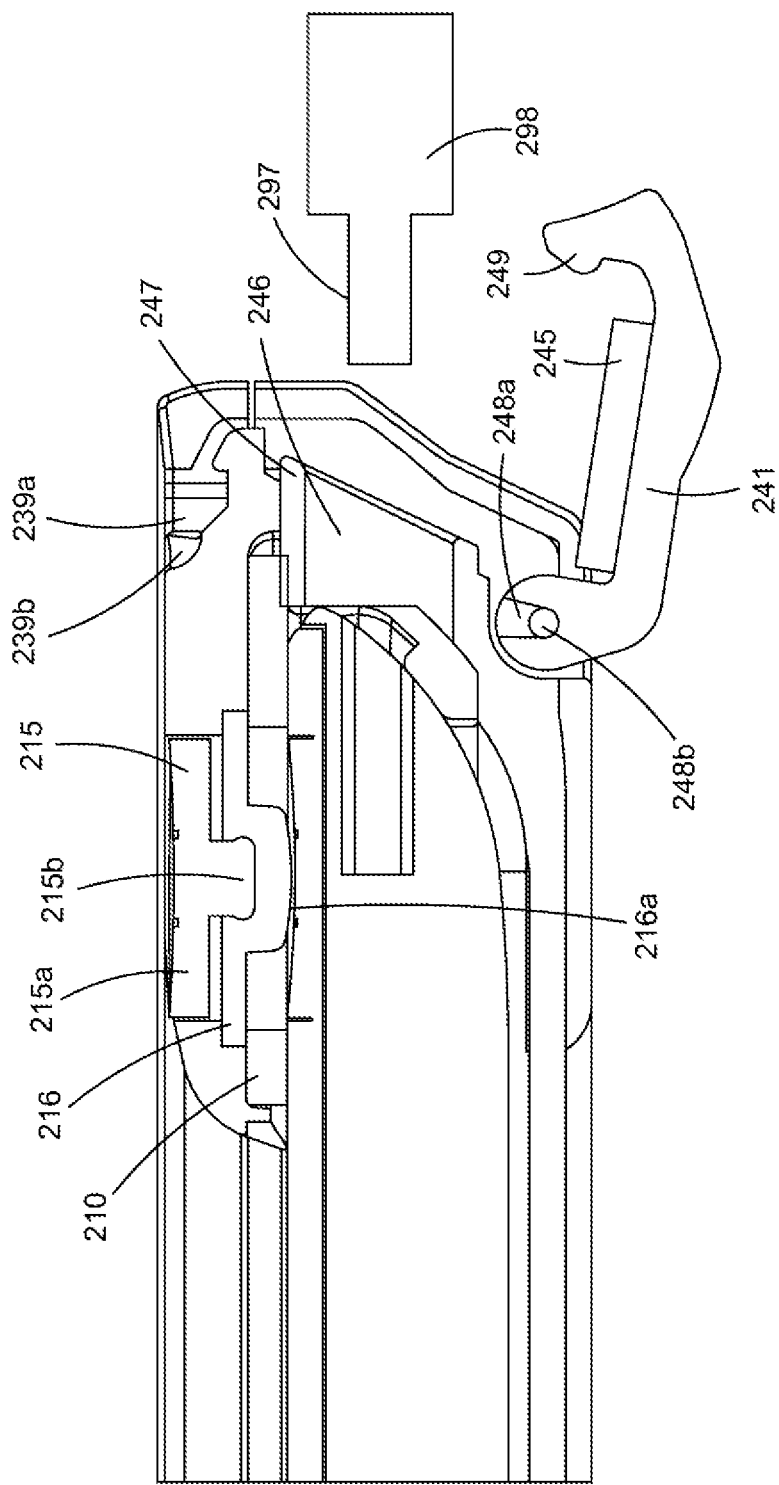

As can be seen with respect to FIG. 15P, the latch feature includes a charge port receptacle bounding member 247 having a latch door 241, which latch door is in the open position. As depicted, the top member 202 includes the charge port receptacle bounding member 247 and further includes a latch ramp receiving member 239 associated therewith. The port opening bounding member 247 bounds an opening 246, e.g., a port opening, in the top member 202. The bottom member 203 includes a latch door axle, e.g., a hinge axle, 248b. The latch door 241 interfaces with the hinge axle 248b on the bottom member 203. For instance, the latch door 241 includes an axle orifice 248a through which the hinge axle 248b is fitted. The latch door 241, therefore, rotates around the hinge axle 48b, e.g., back and forth from a closed to an opened position. The latch door 241 additionally includes a latch ramp or interface portion 49 that interfaces with the latch ramp receiving member 39a positioned above the port opening bounding member 247 of the top member 202. Accordingly, when the latch door 241 is in the closed position the latch ramp interface portion 249 couples with the latch ramp receiving member 39a to close and/or seal the port opening 246.

FIG. 15P provides the same view as in FIG. 15O this time with the latch ramp 249 disengaged from the latch ramp receiving member 239a and the charge port door 241 in the open position. Depicted is a bottom member 203, having a back surface 236 and a proximal end 231 perimeter portion 230. The bottom member 203 also includes a hinge axle 248b, which axle resides in a hinge orifice 248a. A latch door 241 is also provided. The latch door 241 interfaces with the hinge axle 248b on the bottom member 203. The latch door 241 includes a hinge axle interface, e.g., configured as a hinge orifice 248a. The hinge orifice 248a is configured for receiving the hinge axle 248b therein. The interaction between the hinge axle 48b and the hinge orifice 248a allows the door 241 to rotate about the axle 248b so as to move from an open to a closed position. Additionally, the latch door 241 includes a latch ramp 249 that interfaces with the latch ramp receiving portion 239a of the top member 202 so as to secure the latch cover 271b in the closed position. As depicted, the latch ramp 249 is disengaged from the latch ramp receiver 239a and the latch door is opened.

Also depicted is top member 202. The top member 202 includes a proximal end portion 221. The proximal end portion 221 includes an outer perimeter portion 220a, which outer perimeter portion is comprised of a semi-flexible material, and middle perimeter portion 220b, which middle perimeter portion is comprised of a rigid material. The proximal end portion 221 of the top member 202 also includes a port opening 246. The port opening 246 is bounded by a port receptacle bounding member 247. In this instance, the outer perimeter portion 220a includes a cutout portion, which cutout portion accommodates the charge port receptacle bounding member 247 and charge port door 241. The charge port receptacle bounding member 247 may therefore be contiguous with, e.g., formed by, the rigid material comprising the middle perimeter portion 220b, or may be added thereto.

The port receptacle bounding member 247 may also include a gasket interface that is configured for interfacing with a gasket, such as a gasket 245 associated with a latch door 241, e.g., a gasket that is dimensioned for fitting around and/or within and sealing the port opening 246 when the latch door 241 is in a closed position.

Figure 15Q:
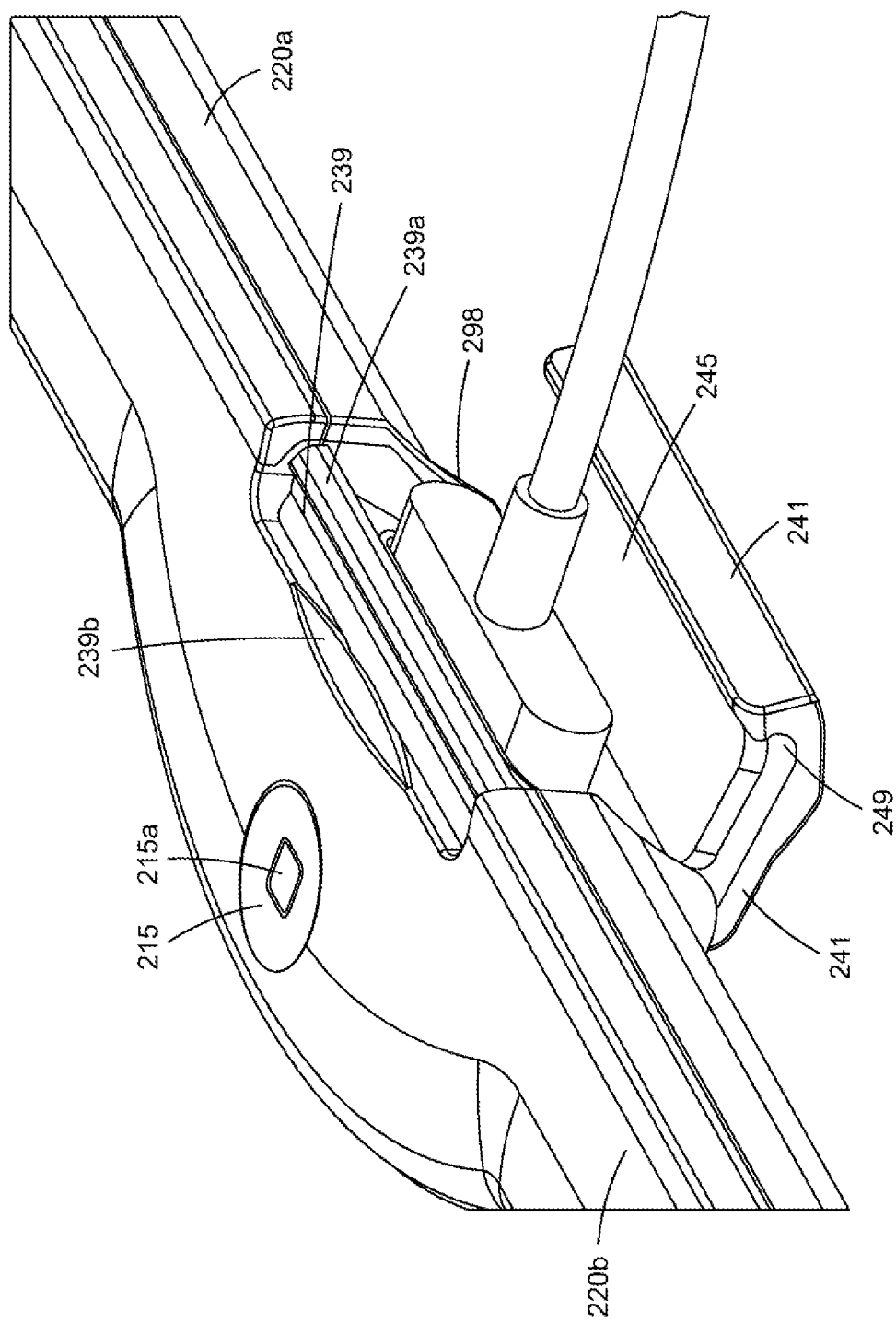

FIG. 15Q provides a perspective view of FIG. 15P this time with the charger 298 fully installed.

Figure 16A:
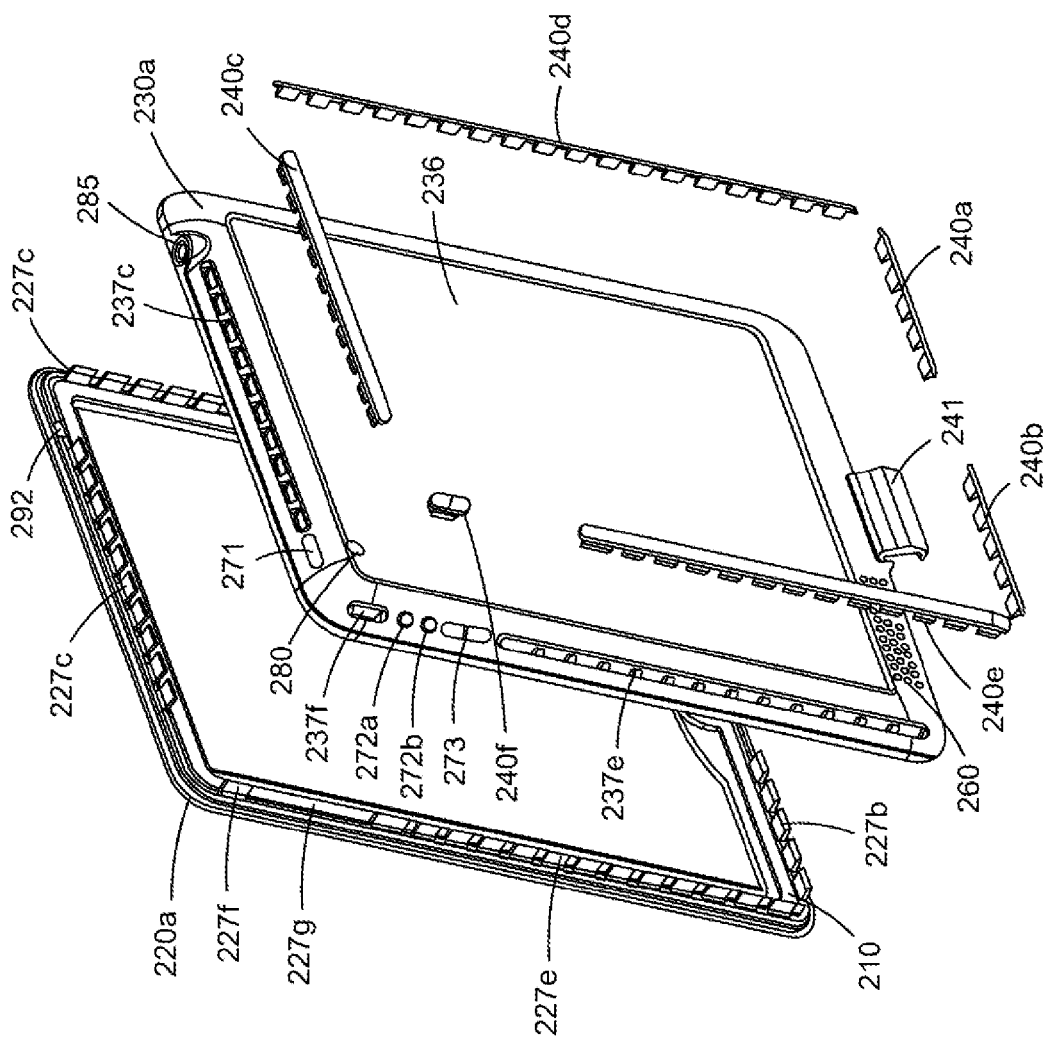

FIG. 16A provides a side-vertical perspective of the housing 201 in an exploded, disassembled view. The housing 201 includes a top member 202, a bottom member 203, and a locking element 204, wherein the locking element is configured as a series of snap-tooth comb elements 240 a left-proximal snap-tooth comb, 240b right proximal snap-tooth comb, 240c distal snap-tooth comb, 240d left hand side snap-tooth comb, 240e right hand side snap-tooth comb, and 240f right hand snap-tooth. The top member 202 includes corresponding sets of snap tooth members 227 a, b, c, d, e, and f. And the bottom member 203 includes corresponding snap-tooth receptacles 237 a, b, c, d, e, and f that are positioned around its perimeter portion, e.g., middle perimeter portion 230*b*, and configured for receiving and engaging both the snap-tooth members 227 of the top member 202 as well as the snap-tooth combs 240.

Accordingly, distal extended portions of the snap tooth members 227 of the top member 202, and distal extended portions of the snap-tooth combs 240 are configured for being inserted into the snap-tooth receptacles 237 of the bottom member 203 and for engaging therewith so as to not only couple the top 202 and bottom 203 member together but to lock them into place in a waterproof manner. Specifically, as the top member 202 is coupled with the bottom member 203 and locked into place by the locking combs 240 being inserted into the receptacles 237 and engaging therewith. The gasket 210 is thereby compressed against an encased device and/or the bottom member and thereby seals the housing 201 against infiltration by liquids and particulate matter such as dust, dirt, mud, snow, and the like. Also depicted are charge port door 241, on/off switch 271, orientation toggles 272 *a* and *b*, volume control switch 273, lens feature 280 positioned on back surface 235, earphone port 285, and earphone port cutout 292.

Figure 16B:
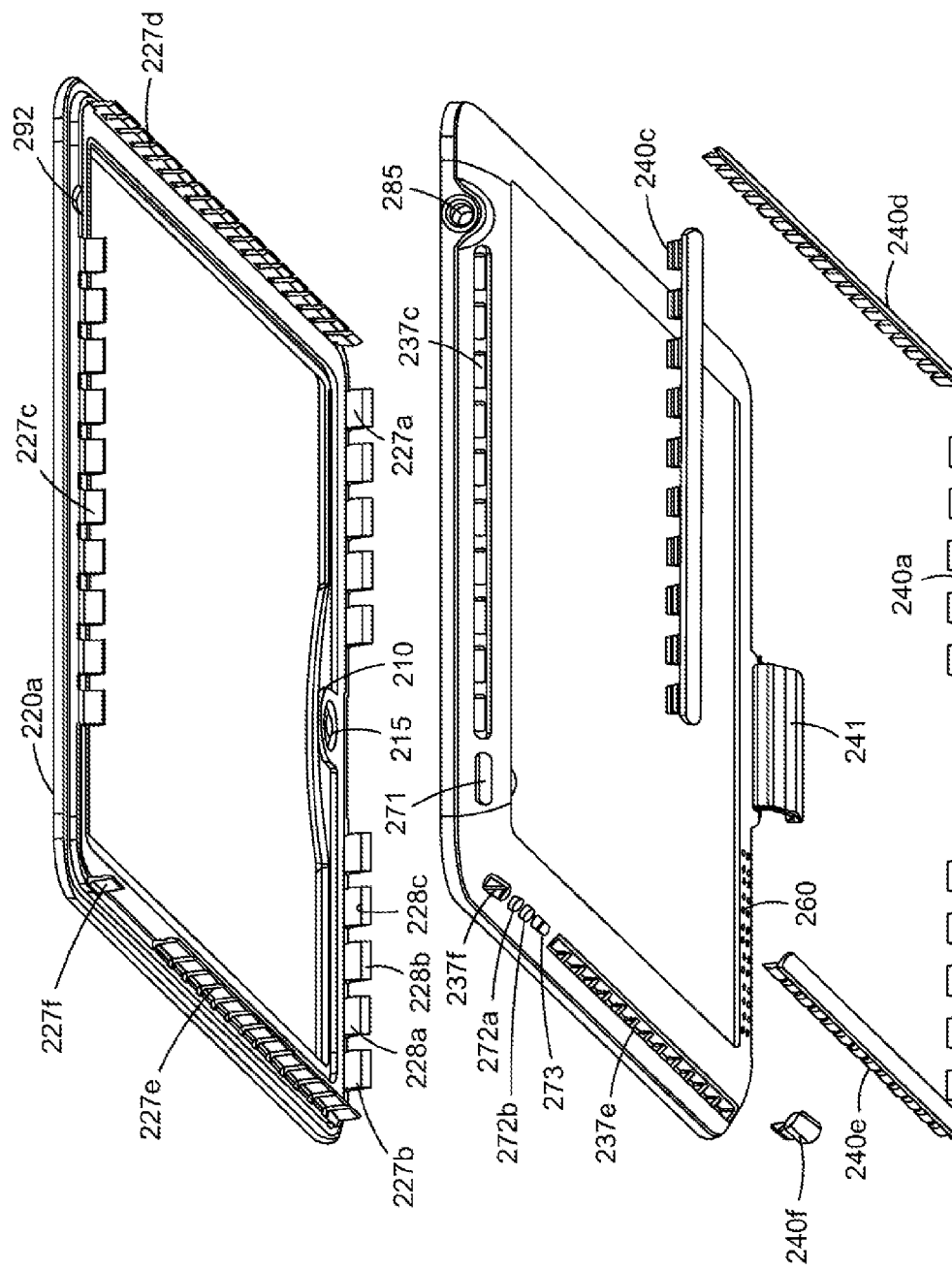

FIG. 16B provides another view of the housing 201 of FIG. 16A this time from a horizontal distal head on view.

Figure 16C:
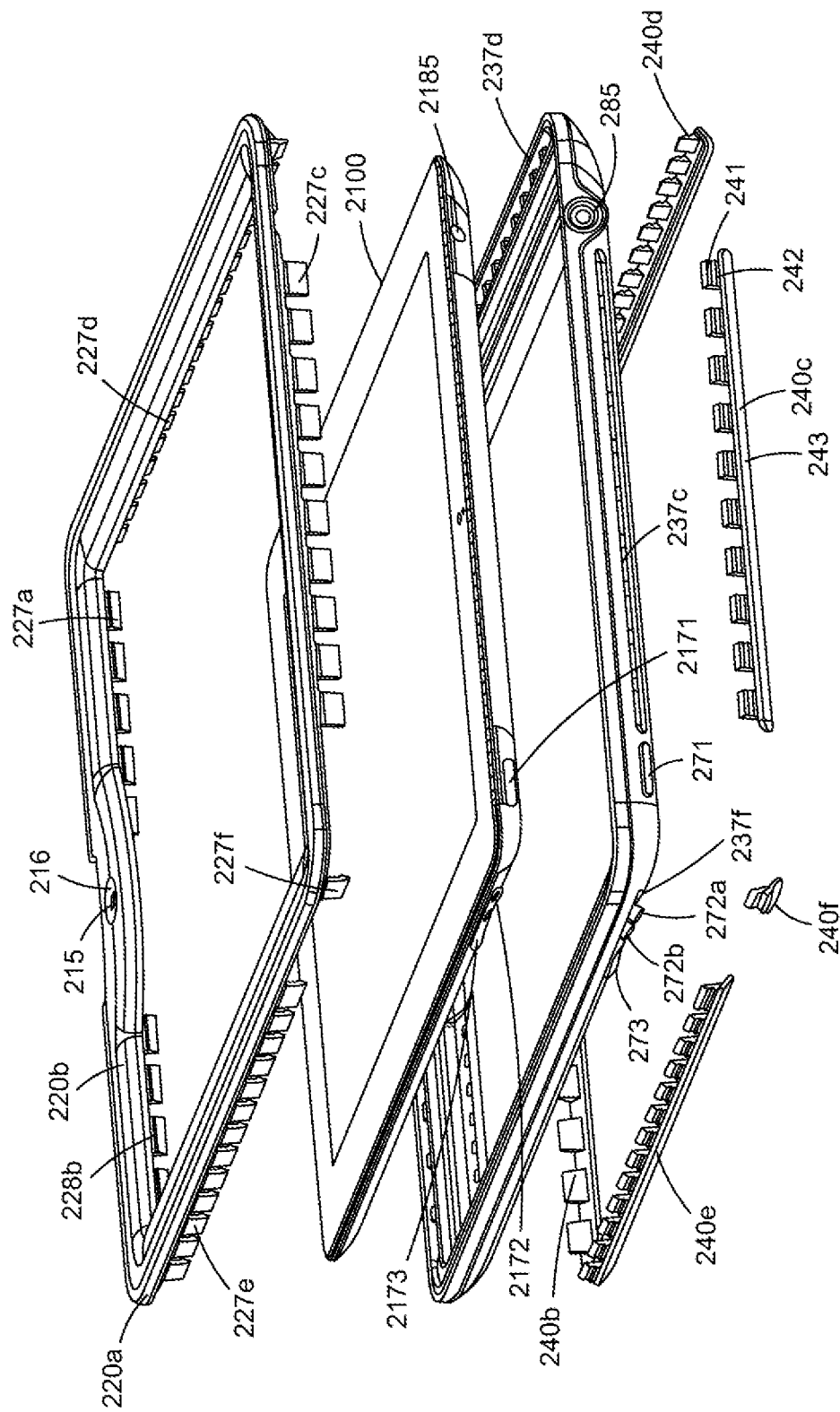

FIG. 16C provides the same housing as set forth in FIG. 16B however this time with an electronic device 100 to be encased provided. The housing 1 includes a top member 202 and a bottom member 203, which fit over and surround the device 100 to be encased. The top member 202 includes a plurality of sets of snap tooth members 227 *a, b, c, d, e*, and *f*. And the bottom member 203 includes corresponding snap-tooth receptacles 237 *a, b, c, d, e*, and *f* that are positioned around its perimeter portion, e.g., middle perimeter portion 230*b*, and configured for receiving and engaging both the snap-tooth members 227 of the top member 202 as well as the snap-tooth combs 240.

Once positioned around the device 100, the top 202 and bottom member 203 are coupled together, e.g., by snapping the snap-tooth members 227 together with the snap-tooth catches configured on the interior walls of the snap-tooth receptacles of the bottom member. The locking element 204 includes corresponding sets of snap-tooth combs 240 *a, b, c, d, e*, and *f* that are configured for being inserted into the receptacles 237 *a, b, c, d, e*, and *f* and thereby engaging corresponding engagement portions therein, thereby being locked into place and consequently locking the snap tooth members 227 of the top member 202 in place as well.

Accordingly, once the top member 202 and bottom member 203 are positioned around the electronic device 100 and coupled together by being snapped into place around the perimeter edge, the left-proximal snap-tooth comb 240*a* may be inserted and snapped into place, followed by the right proximal snap-tooth comb 240*b*, the distal snap-tooth comb 240*c*, the left hand side snap-tooth comb 240*d*, the right hand side snap-tooth comb 240*e*, and finally the 240*f* right hand snap-tooth may be inserted and snapped into place, thereby locking the housing together. It is to be understood that the order of assembly provided herein is for exemplary purposes only as the order may change as desired.

FIG. 16D provides a rear view of the housing of FIG. 16C this time with the device 100 encased, the top 202 and bottom 203 members coupled, and the locking elements 240 inserted therein and the housing 201 fully assembled and locked into place.

Figure 17A:
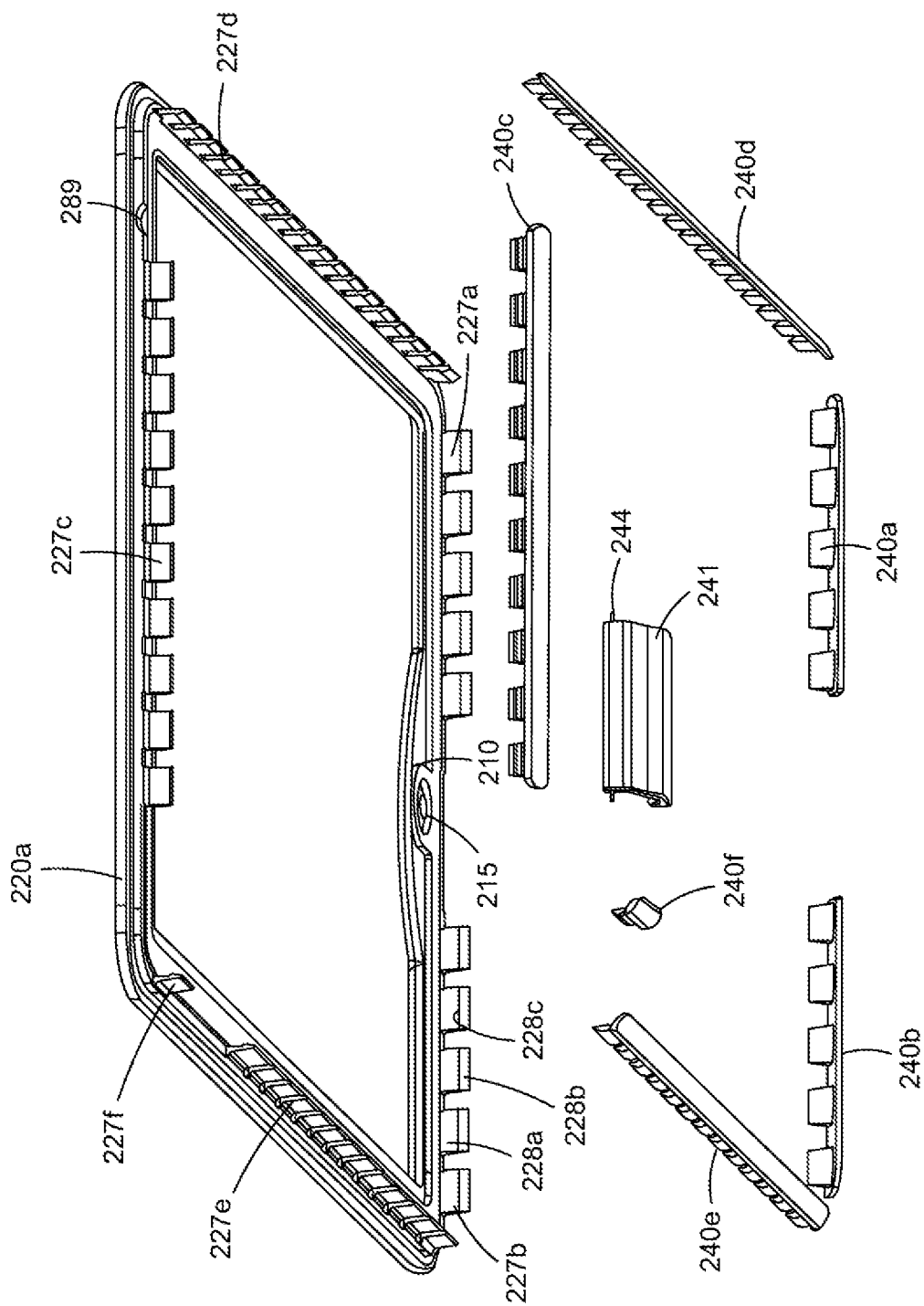
FIGS. 17 A-I provide perspective and side views of the protective housing and its snap-tooth members.

FIG. 17A provides a distal forward perspective view of the top member 202 and locking element 240 as they would be positioned and aligned prior to insertion within the bottom member 203. The top member 202 includes a middle perimeter portion 220*b* having sets of snap-tooth members 227 positioned thereon, e.g., fabricated as an integral member thereof and extending downward away from the perimeter portion.

In this embodiment, there are six sets of snap-tooth members that are configured for being inserted within and engaging the receptacles 237 of the bottom member as well as for interfacing with six corresponding locking elements: left proximal snap-tooth members 227*a* are configured for interfacing with left proximal snap-tooth comb 240*a*, right proximal snap-tooth members 227*b* are configured for interfacing with right proximal snap-tooth comb 240*b*, distal snap-tooth members 227*c* are configured for interfacing with distal snap-tooth comb 240*c*, left side snap-tooth members 227*d* are configured for interfacing with left side snap-tooth comb 240*d*, right side snap-tooth members 227*e* are configured for interfacing with right side snap-tooth comb 240*e*, and snap-tooth member 227*f* is configured for interfacing with snap-tooth element 240*f*. Also depicted are gasket 210, which gasket surrounds the underside perimeter portion 220*b* and home button feature 215, as well as latch door 241.

Figure 17B:
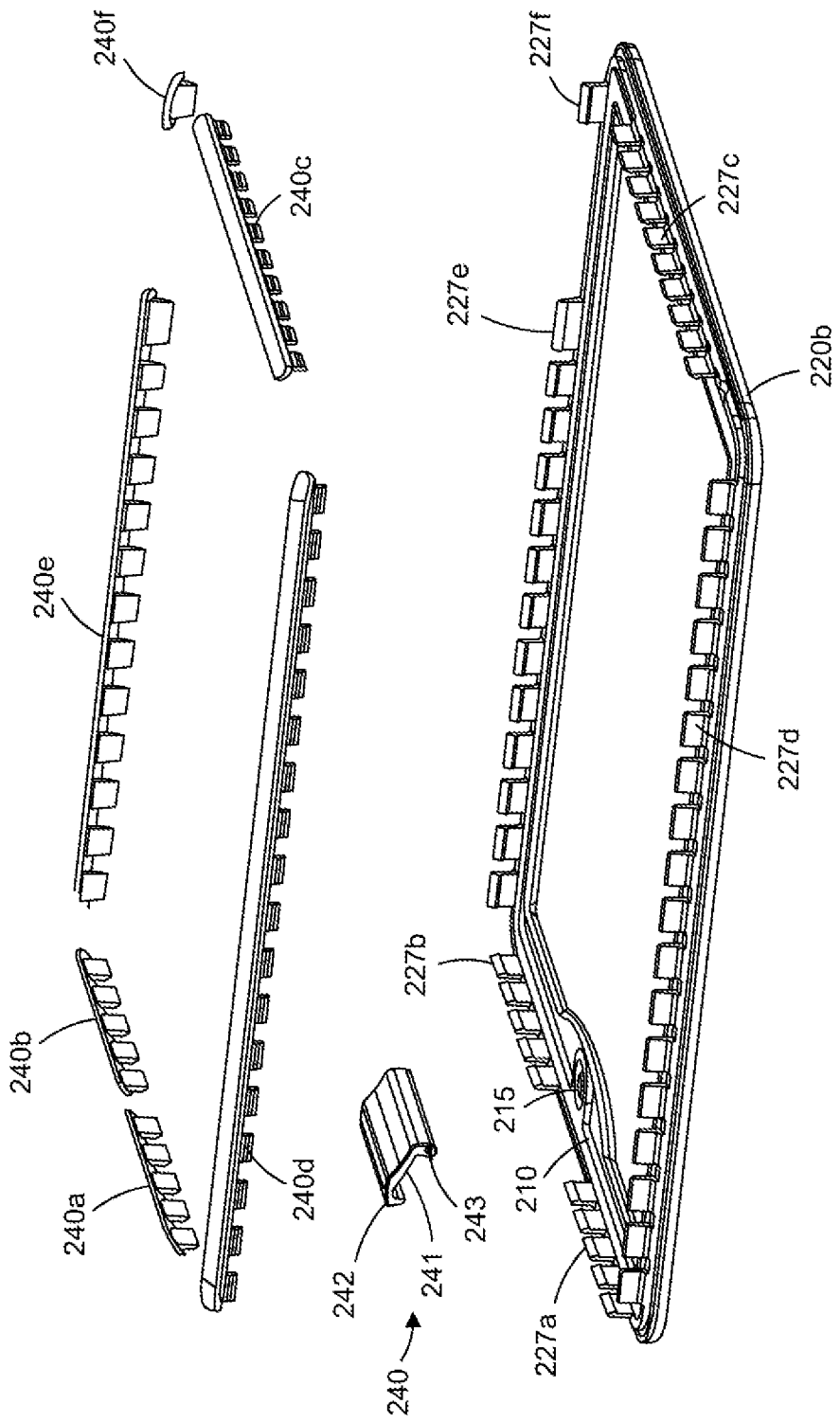

FIG. 17B provides a reverse orientation view of FIG. 17A.

FIG. 17C provides a perspective view of the proximal end 21 of top member 202. As can be seen with respect to FIG. 17C the proximal end 221 includes an exterior perimeter portion 220*a* forming a bumper member around a middle perimeter portion 220*b*, and an interior perimeter portion 220*c*, formed as an interior wiper portion. The middle perimeter portion forms a home button feature 215 as well as a charge port receptacle 246 and latch receiving ramp 239*a* and cut out 239*b*. For instance, the middle perimeter portion 220*b* includes a latch port ramp receiving member 239*a* and a cutout 239*b*. Also depicted are left and right snap-tooth members 220*d* and *e*.

Figure 17D:
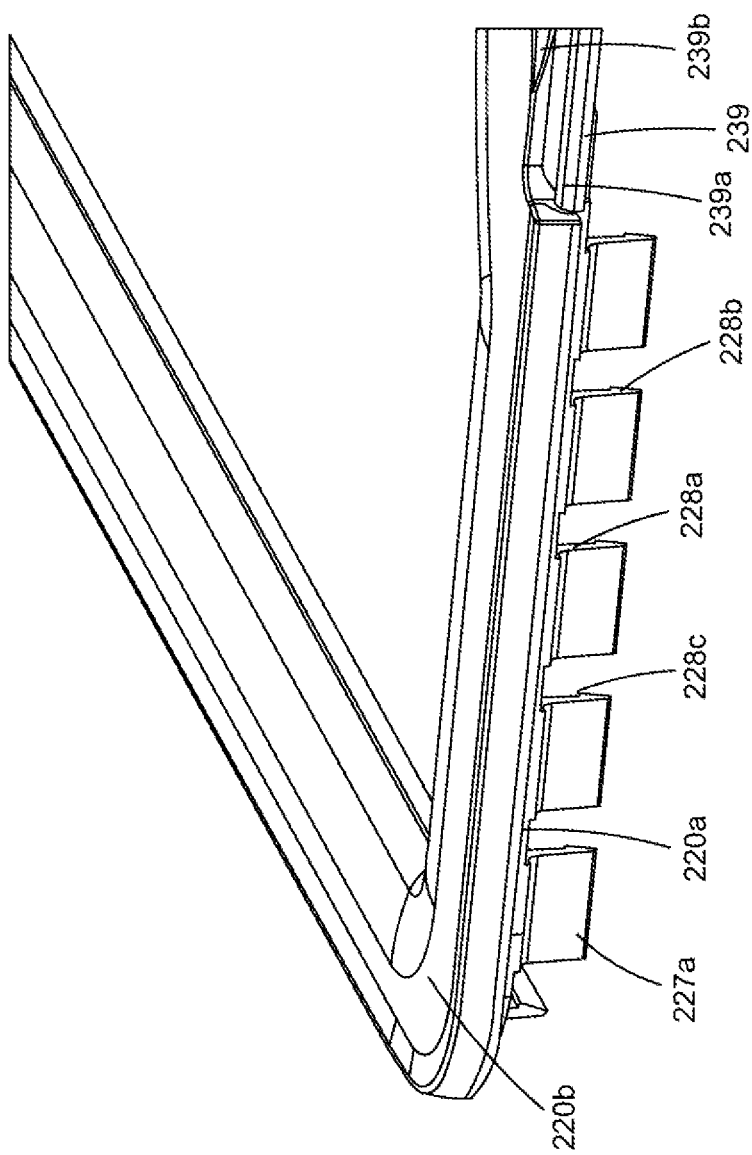

FIG. 17D provides a close up view of the left proximal snap-tooth members 227 of the top member 202. As can be seen, each snap-tooth member 227 includes a plurality portions, such as snap-tooth base member 228*a*, a snap-tooth slanted surface 228*b*, and a snap-tooth intersecting surface 228*c*. Together these features allow the snap-tooth members to engage and be engaged with corresponding features either on a bottom member 203 and/or a locking element 240.

Figure 17E:
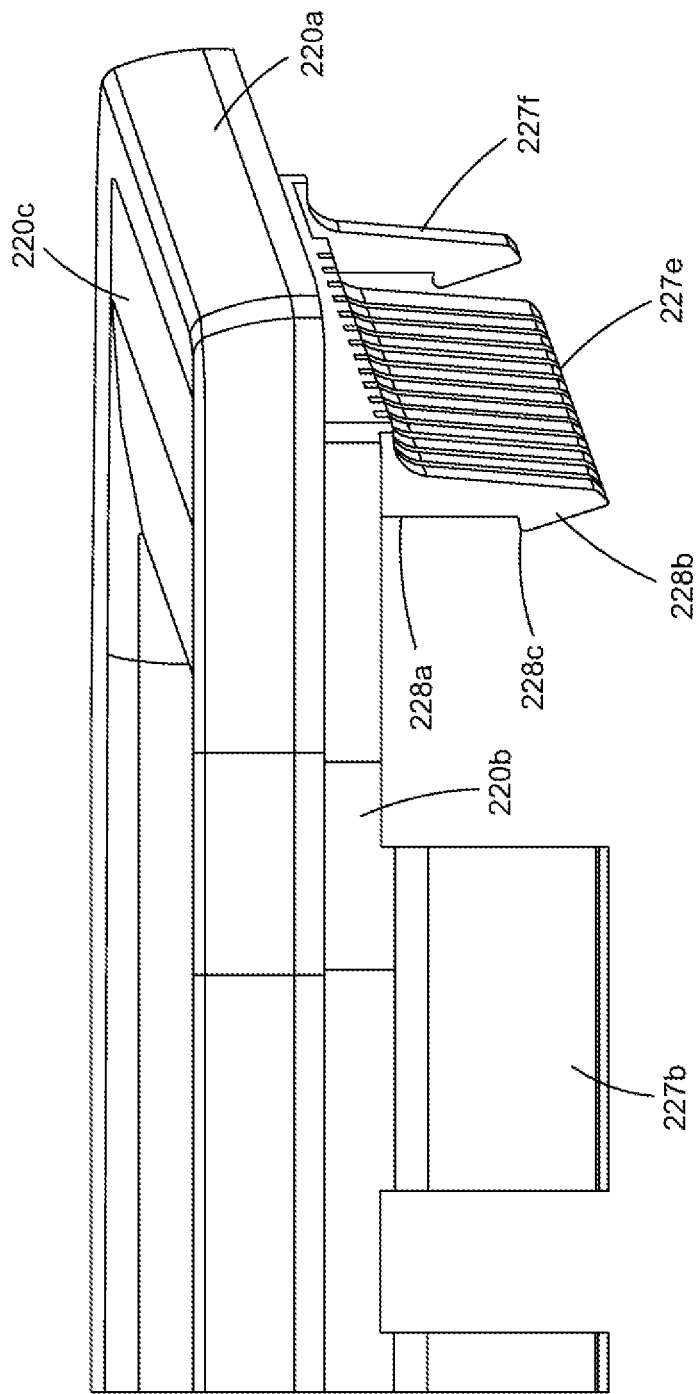

FIG. 17E provides a side perspective view of the right-hand side snap-tooth members. As can be seen, there is a gap between the snap-tooth members 228*e* and 228*f*, which gap is configured to accommodate various button features positioned on the right hand side of the bottom member 203. Such a gap can be positioned anywhere necessary to accommodate various features of the underlying device. Hence, one or more gaps may be present, e.g., along a perimeter portion of the housing.

Figure 17F:
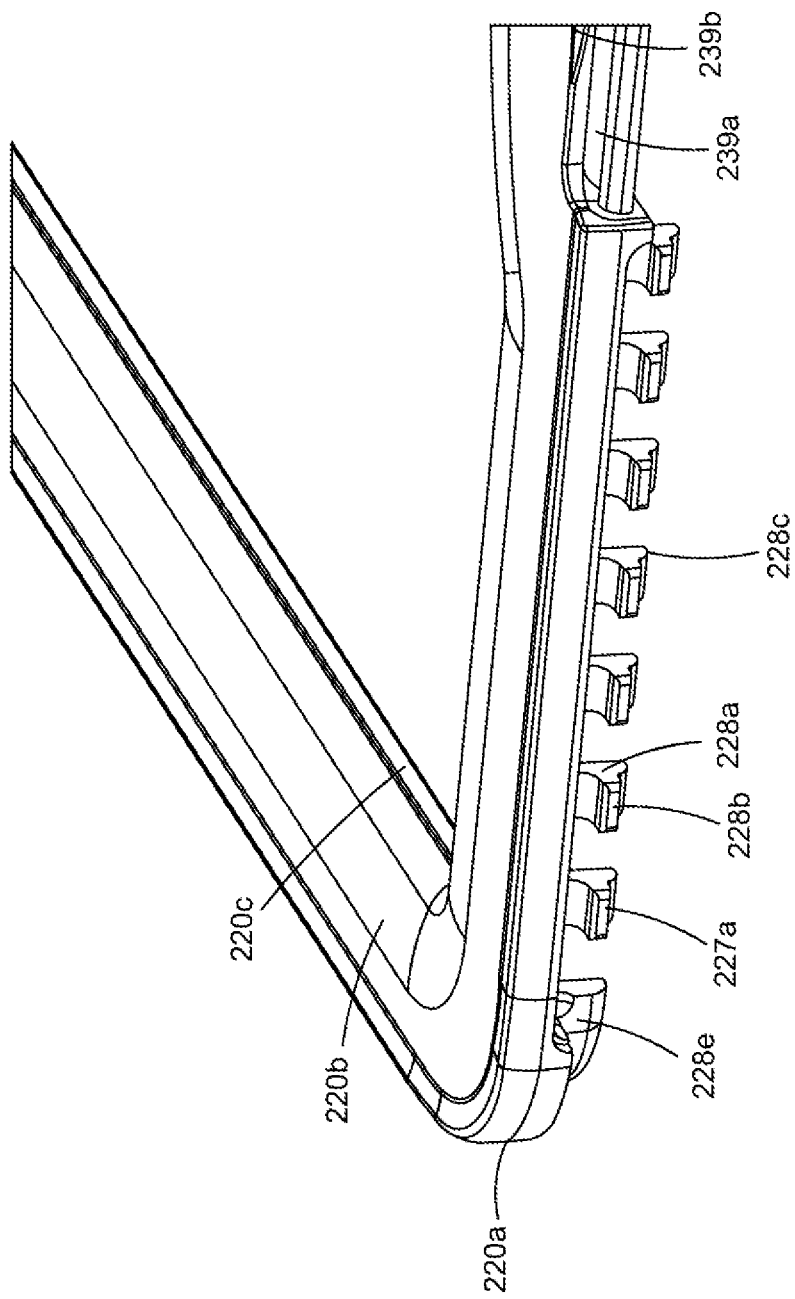

FIG. 17F shows a detailed view of a wedge locking embodiment of the top member 202 of the housing 201 described herein. Specifically, FIG. 17F shows the top member wedge receiving duck hooks. Each of the duck hooks includes a locking hook base member (228*a*), a wedge seat member (228*b*) and a duck head portion (228*c*). The locking hook base member attaches the duck hook to the top member (202). The wedge seat member creates a groove for the introduction of the locking element (204), here, the left proximal locking wedge (240*a*). The duck head portion (228*c*) fits into a groove in the bottom member (203), increasing the stability of the housing when the top member (22) and bottom member (203) are joined. The top member has a similar groove between each of the duck hooks for receiving the corresponding hook from the bottom member (203). In some embodiments the wedge receiving hooks in the top member and/or the bottom member have duck head portions. In certain embodiments, only the top member wedge receiving hooks have duck heads. In other embodiments, only the top member wedge receiving hooks have duck heads. In the embodiments shown in the figures, the wedge receiving duck hooks work similarly across the edges of the top member (202).

FIG. 17F also shows a latch ramp receiving element (239*a*) and a thumb nail cut out portion (239*b*). The latch ramp receiving element is for receiving the charge port door (241) and securely fastening the door. In certain embodiments, the charge port door (241) is fastened so as to create a seal that prevents leakage of fluids into the interior of the housing. In certain embodiments, the fluids are air, water or the like. The thumb nail cut out portion (239*b*) is for opening the charge port door (241) without the use of tools. The charge port door (241) can be opened manually using the thumb nail cut out portion (239*b*).

FIG. 17F also shows a corner member (228*e*) in the top member (202). The corner member (228*e*) fits into a corresponding groove on the bottom member (203) when the top member (202) and bottom member (203) are joined. In certain embodiments, the corner member (228*a*) prevents leakage of fluids into the interior of the housing. In certain embodiments, the fluids are air, water or the like.

Figure 17G:
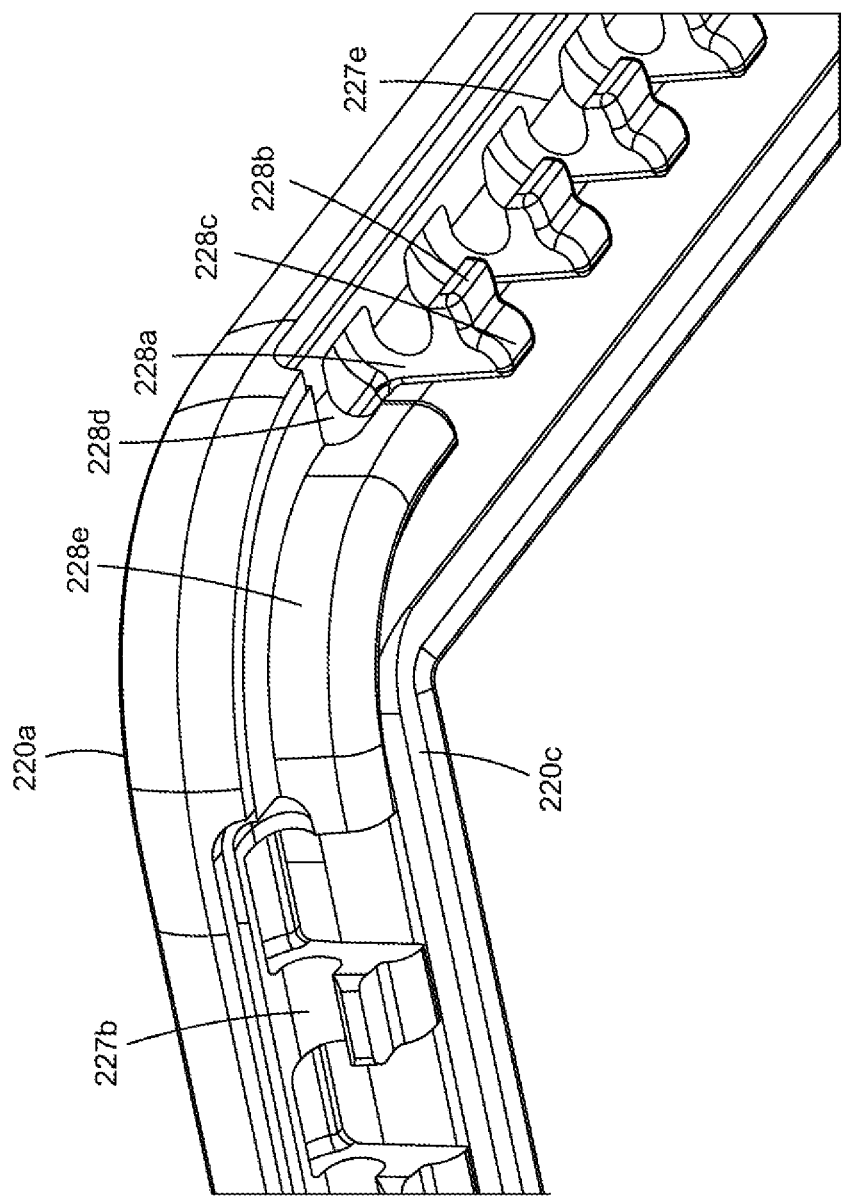

FIG. 17G shows detail of an embodiment of the top member (202) of the housing described herein. Specifically, FIG. 17G shows the corner where the right proximal and right sides of the top member (202) join. FIG. 17G also shows the locking hook duck head groove (228*d*) found between each hook on the bottom member (203). In this embodiment, both the top member (202) and the bottom member (203) have duck head hooks. The locking hook duck head groove allows for the locking hook duck heads found on the bottom member right wedge receiving hooks (237*e*) and bottom member right proximal wedge receiving hooks (237*b*) to be inserted providing for increased stability when the top member (202) and bottom member (203) are joined. These locking hook duck head grooves (28*d*) are found between each of the duck hooks along the bottom edge of the top member (202).

Figure 17H:
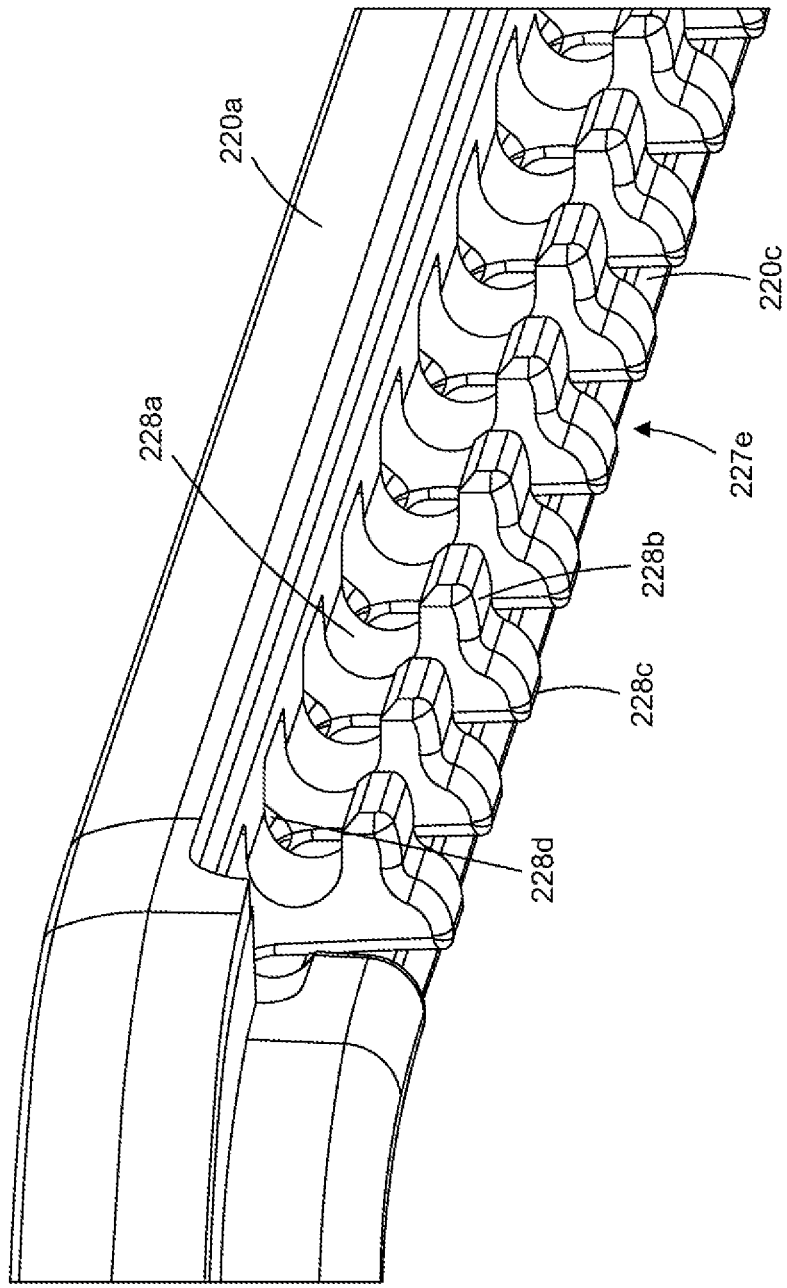

FIG. 17H shows a different perspective of the embodiment shown in FIG. 17G.

Figure 17I:
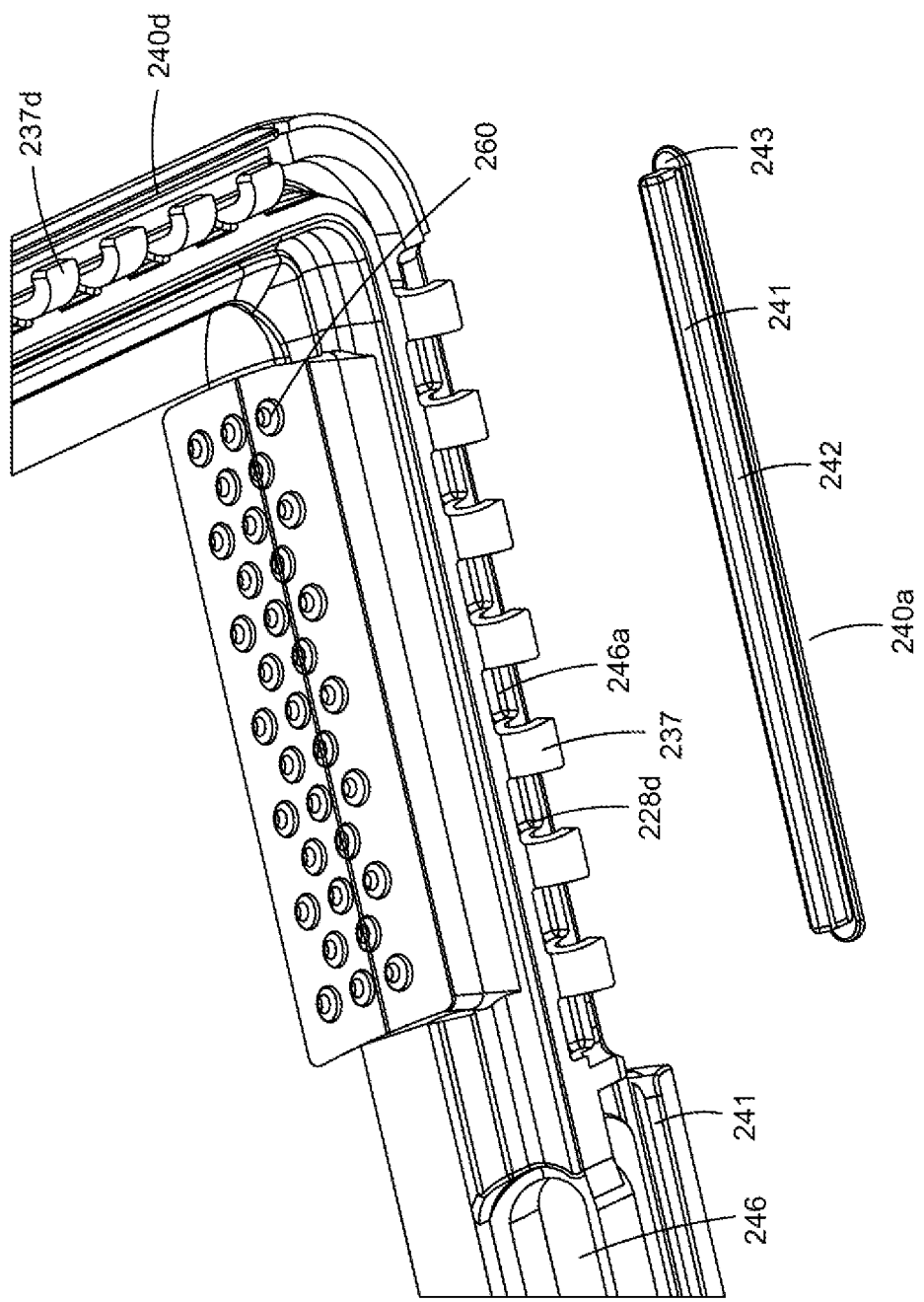

FIG. 17I shows an embodiment of the housing described herein. This is a magnified view of the right proximal end of the bottom member (203) as shown from the top of the housing.

FIG. 17I also shows the top member locking element receiving space (246*a*). This space allows the top member right proximal wedge receiving duck hooks (227*b*) to interface with the bottom member right proximal bottom member wedge receiving hooks (237*b*). Each top member locking element receiving space (246*a*) receives a duck hook from the top member (202). The interface of the duck hooks from the top member (202) and the bottom member (203) create a groove for the locking elements (204) to be inserted into.

Further, each top member locking element receiving space (246*a*) contains a locking hook duck head groove (228*d*) for insertion of the duck heads from the duck hooks on the top member (202). These are shown in greater detail in FIGS. 17G and 17H.

FIG. 17I shows additional detail for the left proximal locking element (240*a*). The left proximal locking element includes a hook interface member (241), a wedge intersecting surface (242) and a wedge base element (243). The hook interface member (241) is the portion of the wedge that in inserted most deeply inside of the groove created by the hooks. The wedge intersecting surface (242) make up the sides of the wedge. The wedge intersecting surface (242) interacts with the walls of the groove created by the hooks. The wedge intersecting surface (242) is oval shaped in cross-section. That is, the wedge intersecting surface (242) in narrow where it meets with the hook interface member (241) widens to its widest point approximately half way between the hook interface member (241) and the wedge base element (243) and then narrows again. This holds the left proximal locking element (240*a*) and the other locking members on the housing in place when the locking elements are inserted into the groove made up of the hooks. The wedge base element (243) covers the groove made by the hooks when the locking element is inserted into the groove.

Figure 18A:
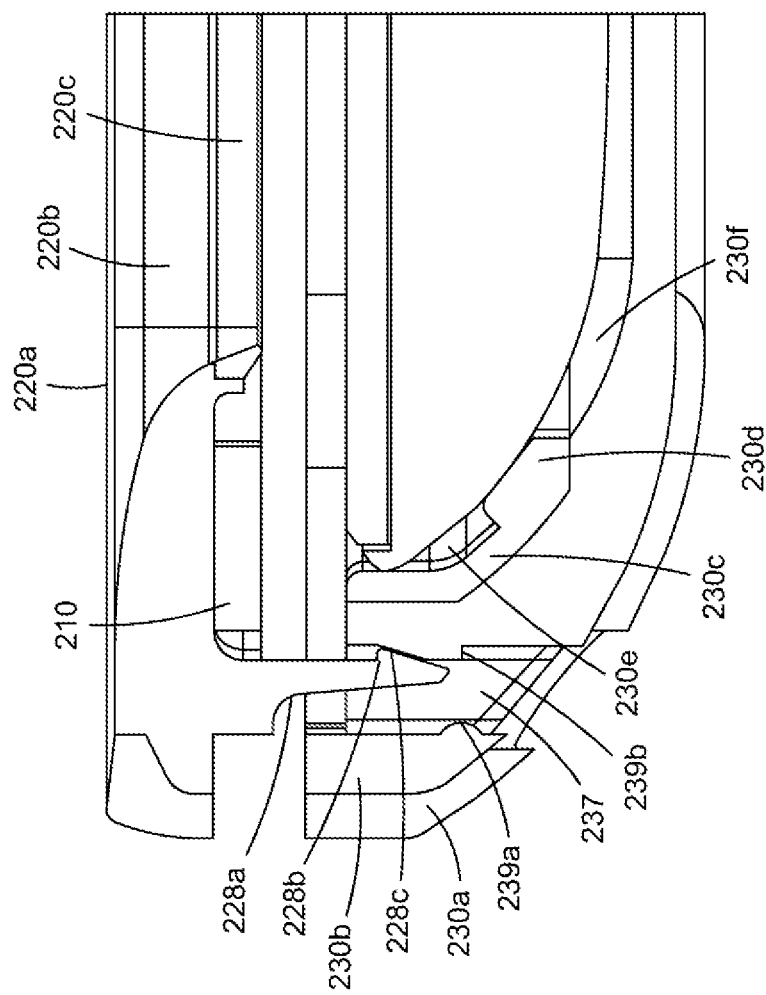
FIGS. 18A-K provide side cutaway views of snap-tooth members of the protective housing.

FIG. 18A provides a cutaway view of the top 202 and bottom 203 members prior to being coupled and locked together. As can be seen, the top member 202 includes a snap-tooth member 227 that is configured for being received within a corresponding snap-tooth receiving receptacle 237 on bottom member 203. The top member 202 snap-tooth member 227 is configured for engaging and being coupled to the receptacle 237 of the bottom member 203. For instance, the bottom member 203 receptacle 237 includes an engagement element 239 that is configured for engaging a corresponding engagement element of the top member 202 snap-tooth member 227. Specifically, the snap-tooth member 228 includes a snap-tooth intersecting surface 228*c* that is configured for engaging a corresponding bottom member snap-tooth interface 239*b*, such that when engaged, the top member 202 cannot be uncoupled from the bottom member 203. Additionally, the receptacle 237 also includes a locking member snap-tooth catch 239*a* that is configured for engaging a corresponding engagement element on a snap-tooth comb portion that is configured for being inserted into the receptacle 237.

Accordingly, the snap-tooth member 228 and the snap-tooth comb 240 are configured in such a way that when they are inserted into the snap-tooth receptacle 237 of the bottom member 203 and in contact with one another, each prevents the other from moving laterally away from its vertical axis. See, for instance, FIG. 18C.

Figure 18B:
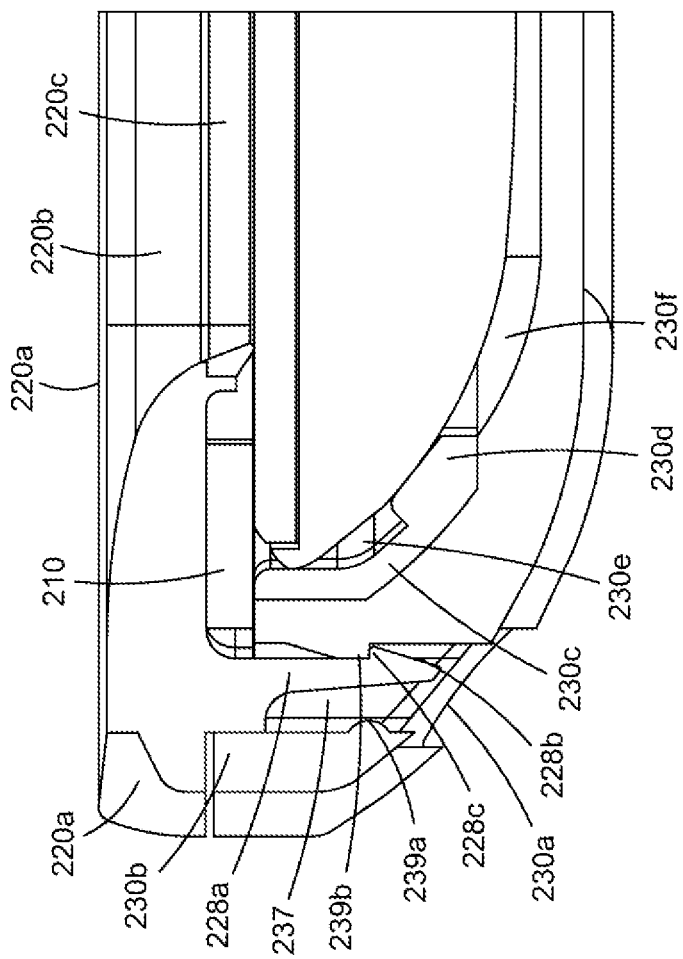
Figure 18C:
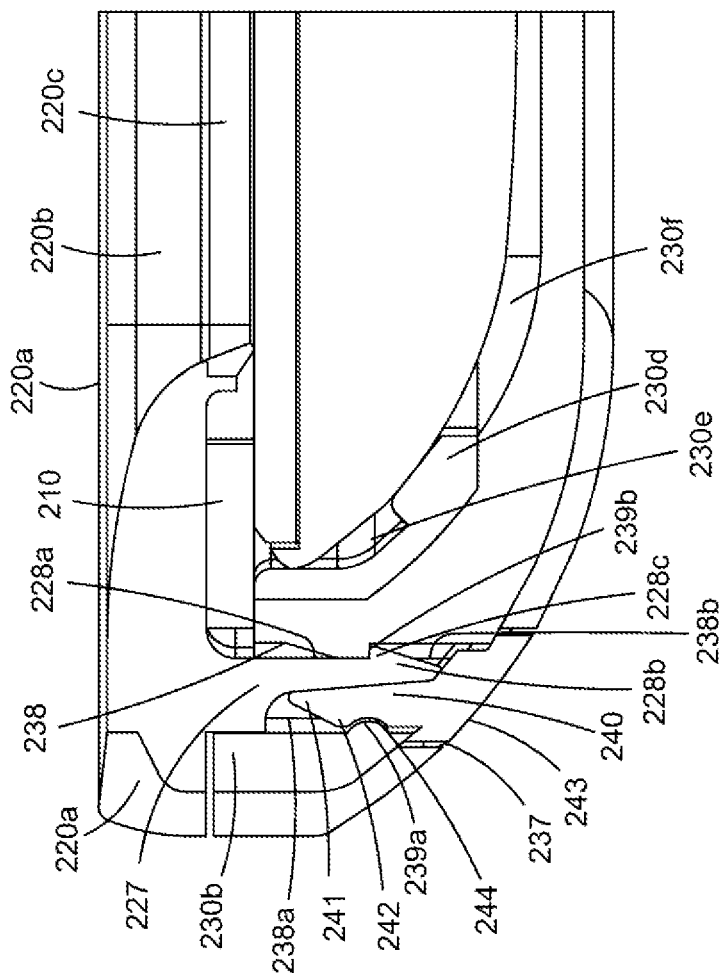

As can be seen with respect to FIG. 18C, the snap-tooth member 228 is configured for being engaged with the bottom member snap-tooth member engaging detent or catch 239*b* (see FIG. 18B) and may be held in place therewith and prevented from being disengaged therefrom, either vertically or horizontally, by the insertion of the snap-tooth comb 240. And once the snap-tooth comb 240 is inserted within the snap-tooth receiving receptacle 237 of the bottom member 203, the snap-tooth comb 240 is held in place against the snap-tooth comb engaging detent 239*a*, and prevented from being disengaged therefrom, either vertically or horizontally by its interaction with the top member 202 snap-tooth member 227. Consequently, while the comb 240 is in place, both the snap-tooth member 228 and the snap-tooth comb 240 are locked against each other, the top member 202 is coupled with the bottom member 203, and a waterproof seal is provided thereby. This sealing further functions to lock the top member 202 against the bottom member 203 such that the two members cannot be uncoupled until the comb 240 is removed.

It is to be noted that although a specific configuration is herein presented, the interaction of the snap-tooth member 228, with the comb 240, and their interaction with the bottom member 203, e.g., with receptacles 237, can be configured differently without departing from the spirit of the interaction. For instance, the individual engagement elements, e.g., 228, 239, 244, etc. may be configured differently and/or be positioned on different surfaces. For example, the snap-tooth member 228 may include a snap-tooth comb-engaging element, which snap-tooth comb 240 may include a corresponding snap-tooth member engaging element.

In such an instance, the snap-tooth member 228 may directly engage and lock with the snap-tooth comb 240, via the corresponding engagement elements, so as to lock the snap-tooth member 228 together with the snap-tooth engagement comb 240, thereby effectuating the coupling of the top member 202 with the bottom member 203. In such an instance receptacle detents 239 may or may not be present. Or, in another embodiment, the referenced detents 239 could have different engagement configurations than those provided with respect to FIG. 18.

FIG. 18B provides the same view of the top 202 and bottom 3 members of FIG. 18A this time with the snap-tooth member 227 of the top member 202 completely inserted into the bottom member 203 receptacle 237 and fully engaged with the bottom member snap-tooth interface 239b. This engagement will prevent the snap-tooth member from moving vertically away from the bottom member 203. However, until the snap-tooth comb 240 is inserted, the snap-tooth member engagement portion 228 may be moved laterally so as to be disengaged from the bottom member snap tooth interface 239b thereby being released therefrom and allowing the top member 202 to be uncoupled from the bottom member 23.

For instance, the very snap-tooth comb 240 that is used to lock the snap-tooth member 227 together with the snap-tooth receptacle 237 of the bottom member when inserted one way, e.g., into the snap-tooth receptacle space 238a so as to allow the snap-tooth engaging detent 239a of the bottom member 203 to engage the snap-tooth comb detent interface 244 positioned on the comb 240, when inserted in the reverse orientation, e.g., into the snap-tooth receptacle space 238b, the tines 241 of the snap-tooth comb 240 may be positioned within the snap-tooth receptacle space 238b and the slanted surface 241 of the comb 240 may engage the slanted surface 28b of the snap-tooth member 227. In such a position, the snap-tooth comb 240 may be employed to disengage the snap-tooth member 228 from the bottom member 203, e.g., by a simple flick of the wrist of the hand holding the snap-tooth comb 240 that has been inserted into the snap-tooth receptacle in the reverse orientation.

FIG. 18C provides the same view as in FIG. 18B this time with the corresponding snap-tooth comb 240 inserted into the bottom member receptacle and fully engaged with the receptacle engaging detent 239a via corresponding snap-tooth comb detent interface 244. As can be seen with respect to FIG. 18C, although both the top member 202 snap-tooth member 227 and snap-tooth comb 240 are received within the bottom member 203 receptacle 237, neither element is locked to one another. Although, if desired, they could each be configured to lockingly engage the other. However, it is useful to configure the snap-tooth member 228 and snap-tooth comb 240 to not lockingly engage one another so that the comb 240 may be more easily disengaged from the bottom member 203 and disassociated from its interface with the top-member 202 snap-tooth member and employed in uncoupling the top member 202 from the bottom member 203 as described above and thereby facilitating with the disassembly of the housing 201 into its component parts. Having the locking member 240 actually firmly engage the snap-tooth member 228 would make this process more difficult, although in some instances, that may be useful, such as where the housing 201 is to be applied around a device and not to be removed therefrom.

It is also noted with respect to FIG. 18C, that the interior perimeter portion 230c of the bottom member 203 is formed as both an interior bumper portion, providing shock absorbance to an encased device, but also as a device seat. The interior perimeter portion 230c therefore includes a device seat portion 230d that is configured for positioning the device within the housing with a specific orientation. For instance, the device seat 230d contacts the device and raises it above the bottom member 203 front/back surface 235, 236 creating an interior portion space 239f therebetween. This space 239f further functions to provide shock absorbance to the housing, facilitates the transmission of heat away from the device, and creates a sound channel for the amplification of sound away from the back cover. The interior perimeter portion 230c includes an additional interface 230g that engages an edge of the encased device and thereby creates another interior space 230e, which additionally functions to provide a measure of shock absorbance for an encased device.

Figure 18D:
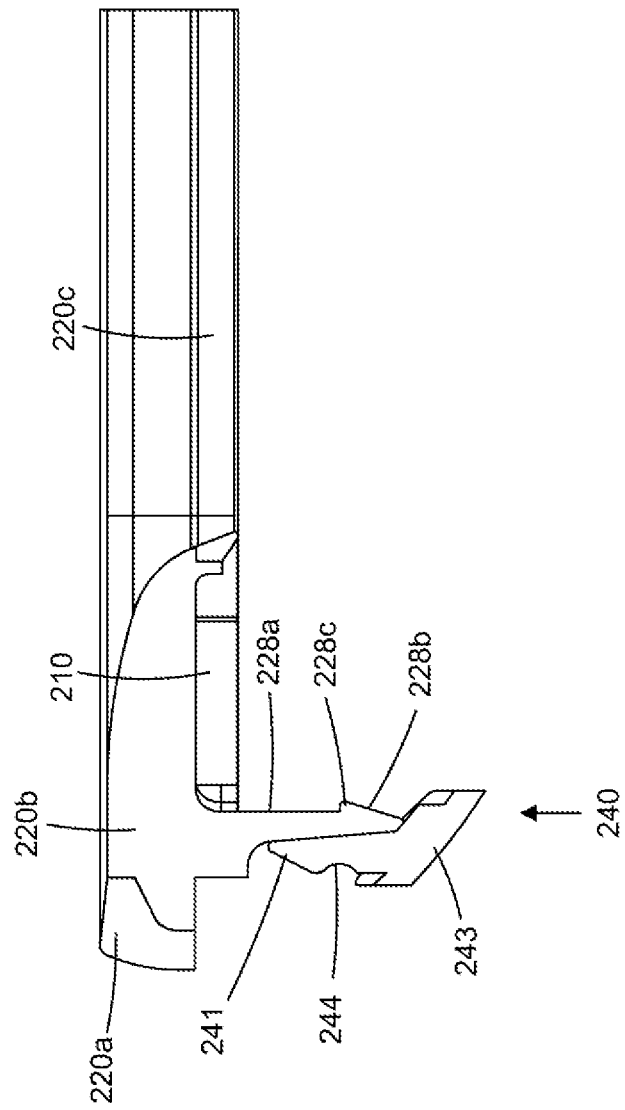

FIG. 18D provides a close up view of the interaction between the snap-tooth member 228 and snap-tooth comb 240 illustrated in FIG. 18C. The lack of engagement between the top member snap-tooth member 228 and the snap-tooth comb 240 allows the comb 240 to be easily removed with respect to the snap-tooth member 28 and thus facilitates the disassembly of the case. Specifically, as described above, once removed the comb may be inverted and the tines of the comb (snap-tooth elements 241) inserted into the receptacles 237, e.g., into snap-tooth disengagement space 238b and used to disengage the snap-tooth member engaging surface 228c from the receptacle snap-tooth engaging detent 239b. Once disengaged the top member 202 may be easily uncoupled and removed from the bottom member 203, and any encased device may be removed therefrom.

Figure 18E:
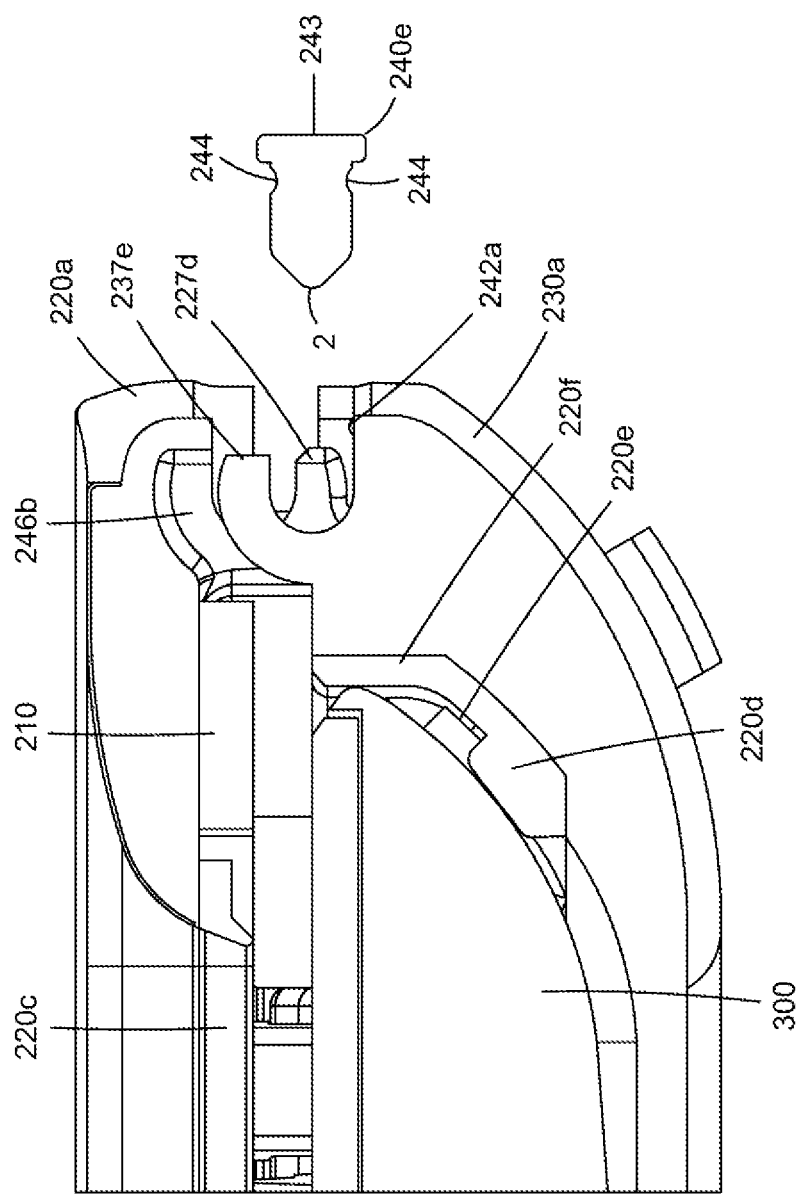

FIG. 18E shows a cross section of an embodiment of the housing described herein. The top member (202) is shown in close proximity to the bottom member (203) at the right proximal corner. The bottom member right wedge receiving hooks (237e) are shown just below insertion into the space beside the top member right wedge receiving duck hook (227d). The right locking wedge (240e) is also shown prior insertion into the groove formed by the hooks. The hook interface member (241) is shown pointing at the groove to be formed by the hooks. The wedge intersecting surface (242) shows indents that correspond with the bottom member wedge interfacing detent (242a). In certain embodiments, an interfacing detent can be formed in the top member (202) to interface with the wedge intersecting surface (242).

FIG. 18E also shows the interior perimeter portion device seat (220d) and interior perimeter portion device interface (220f) on the interior of the bottom member (203) in the interior perimeter portion device space (20e). In certain embodiments, the interior perimeter portion device seat (220d) and interior perimeter portion device interface (220f) can be a flexible or semi-flexible material that cushions the electronic device (300) when in contact with the bottom member (203). The flexible or semi-flexible material can be rubber, neoprene, polypropylene or the like.

Figure 18F:
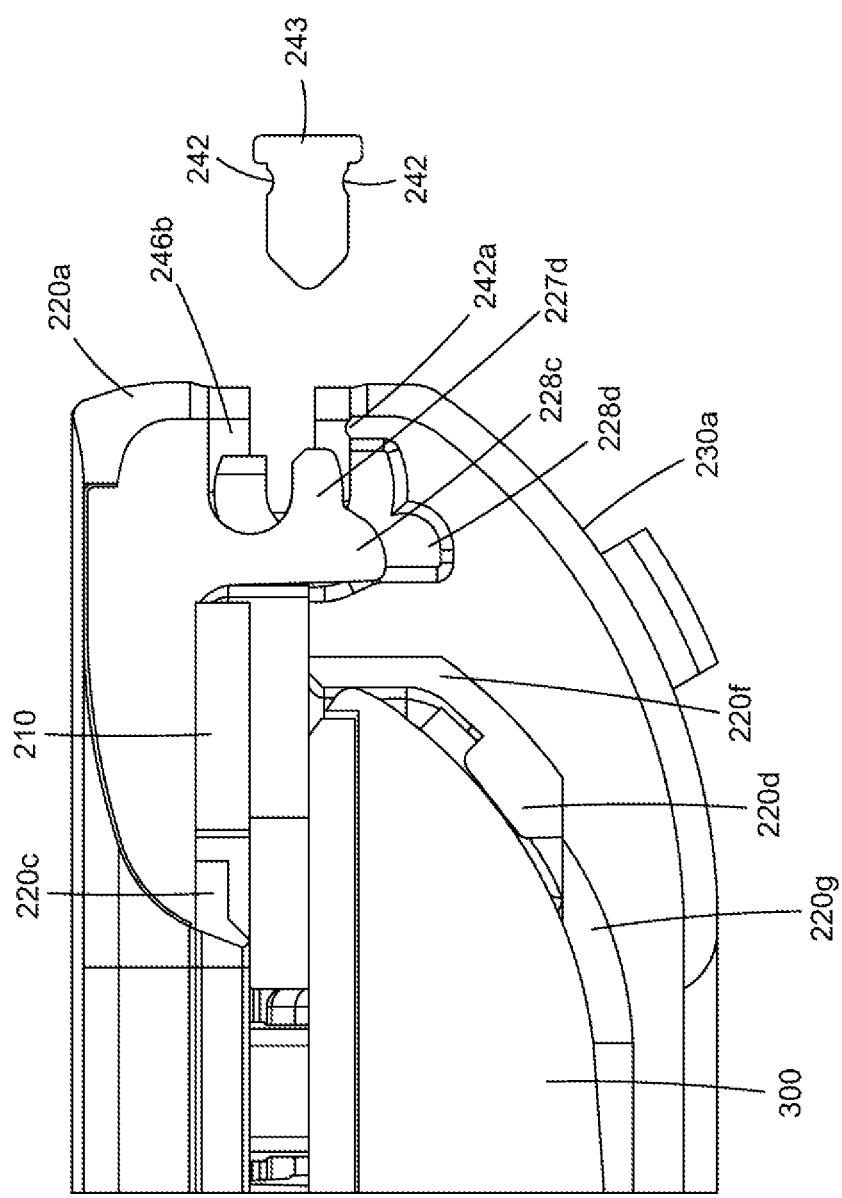

FIG. 18F is another cross section of the right proximal corner of the housing containing the electronic device (300). In this cross section, the right top member wedge receiving duck hook (227d) is shown, as well as the locking hook duck head (228c). The duck hooks on the top member (202) have duck heads that when inserted into the locking hook duck head groove (228d) improve the stability of the upper member (202) and lower member (203) when they are joined together.

FIG. 18F also shows the interior space (220g) between the electronic device and the bottom member (203).

Figure 18G:
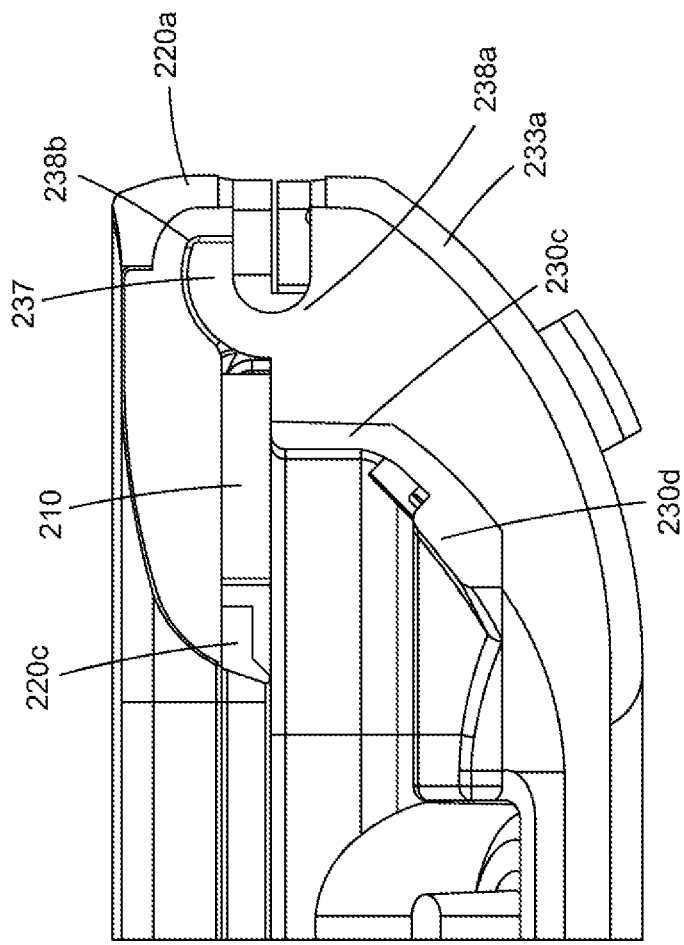

FIG. 18G is a cross section of the right proximal corner of the housing wherein the top member (202) and the bottom member (203) are joined. The wedge receiving hook edge (238b) is inserted into bottom member locking element receiving space (246b).

The electronic device (100) is absent from FIG. 18G. However, the gasket (10) would be pressed against the electronic device (300) if it were present.

Figure 18H:
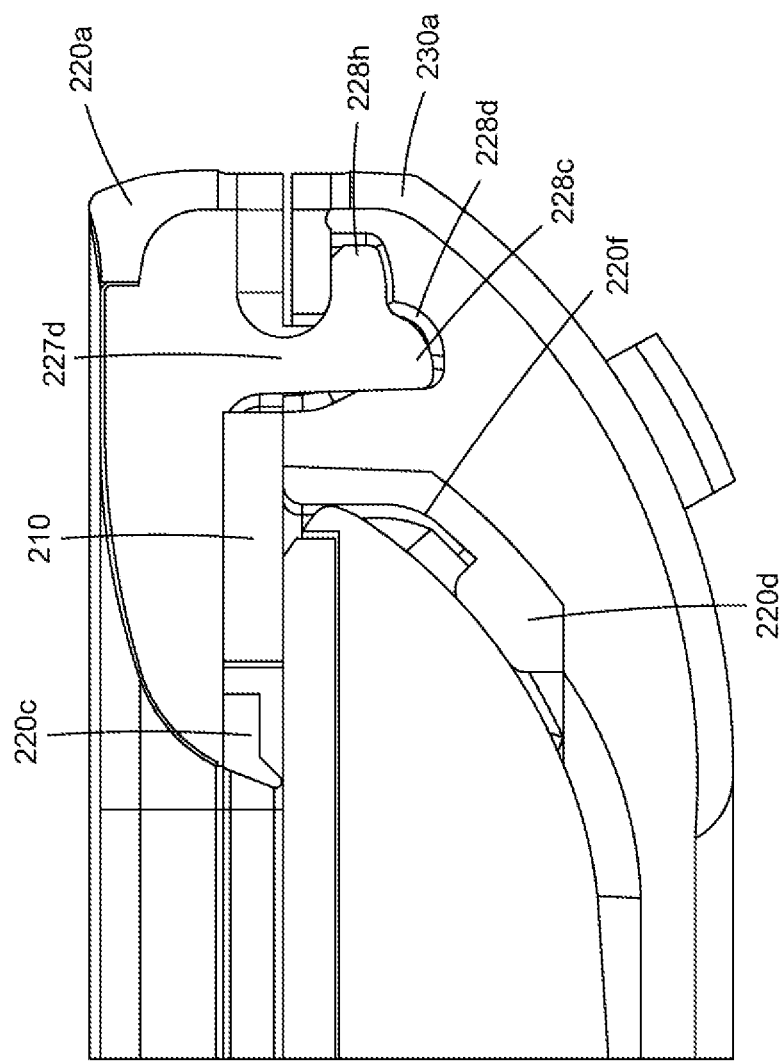

FIG. 18H is a cross section of the right proximal corner of the housing wherein the top member (202) and the bottom member (203) are joined. FIG. 18H shows the locking hook duck (228c) inserted into the locking hook duck head groove (228d). Further, FIG. 18H also shows the locking hook wedge seat member inserted into the top member locking element receiving space (246a).

Figure 18I:
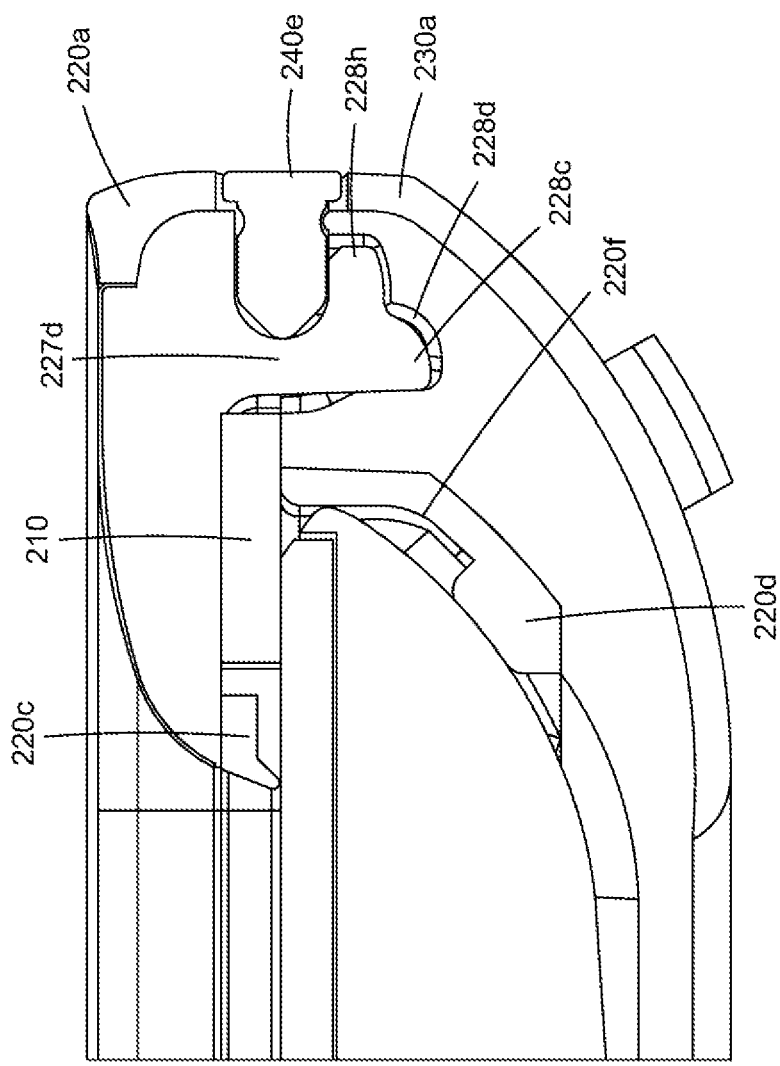

FIG. 18I is a cross section of the right proximal corner of the housing containing the electronic device (300). The right locking wedge (240e) is inserted into the groove made by the hooks from the top member (202) and bottom member (203). FIG. 18I also shows how the gasket (210) and the top exterior perimeter portion are adjacent to the electronic device (300) when the top member (202) and the bottom member (203) are joined. The position of the position of the top member right wedge receiving dock hook (227d) is shown.

Figure 18J:
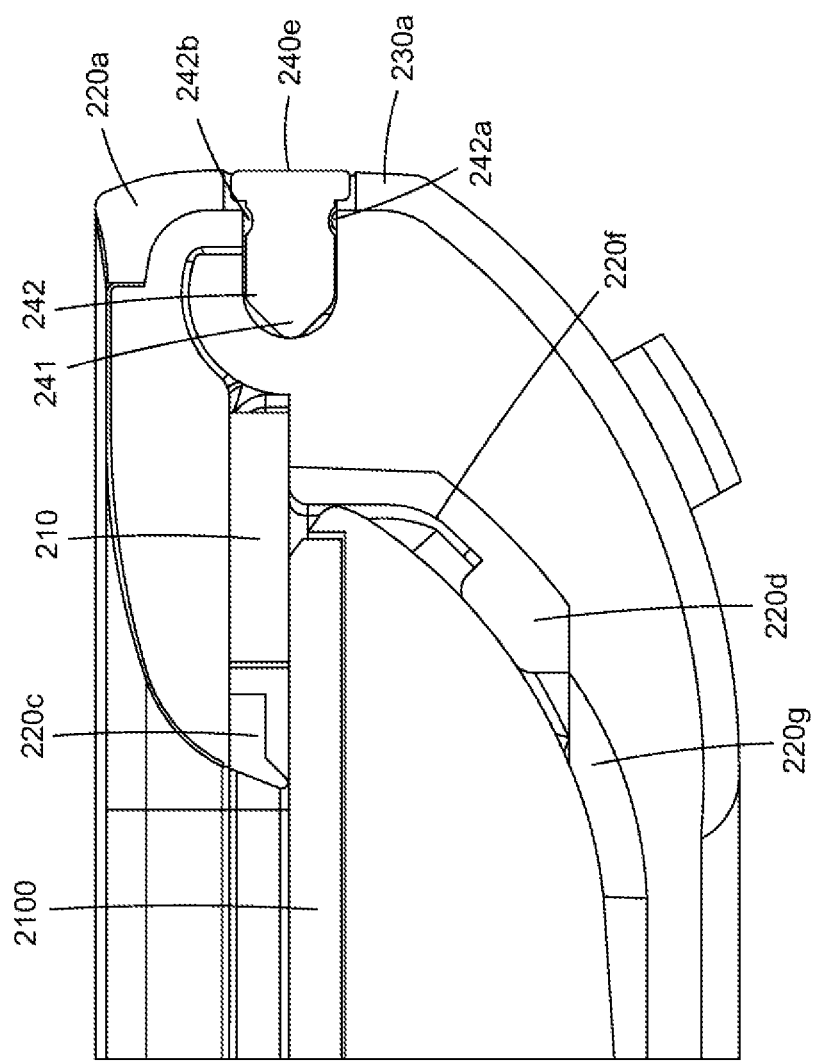

FIG. 18J is a similar cross section to the one shown in FIG. 18I. FIG. 18J shows the position of a bottom member right wedge receiving hook (237e). FIG. 18J also shows a top member wedge interfacing space (242b). In some embodiments, this space is occupied by a detent similar to the bottom member wedge interfacing detent (242a).

Figure 18K:
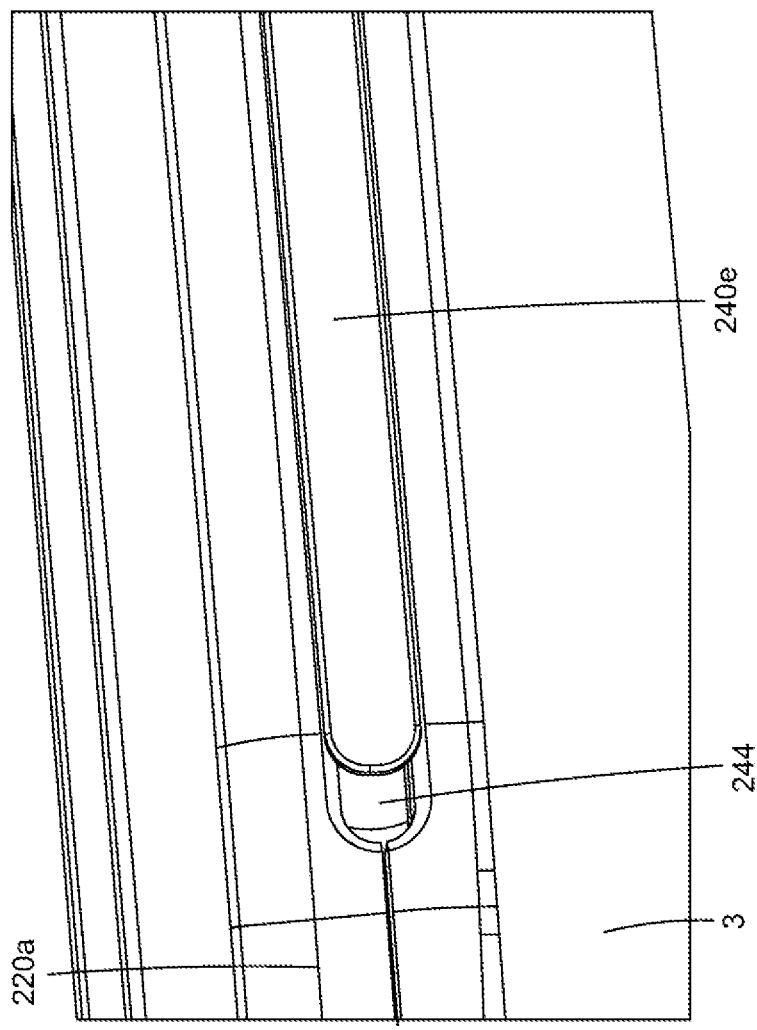

FIG. 18K shows a side view of the right locking wedge (240e) fitting into the groove made by the hooks from the top member (202) and the bottom member (203). When the right locking wedge is inserted into the groove, a finger nail slot (244) remains, allowing the wedge to be removed without tools.

Figure 19:
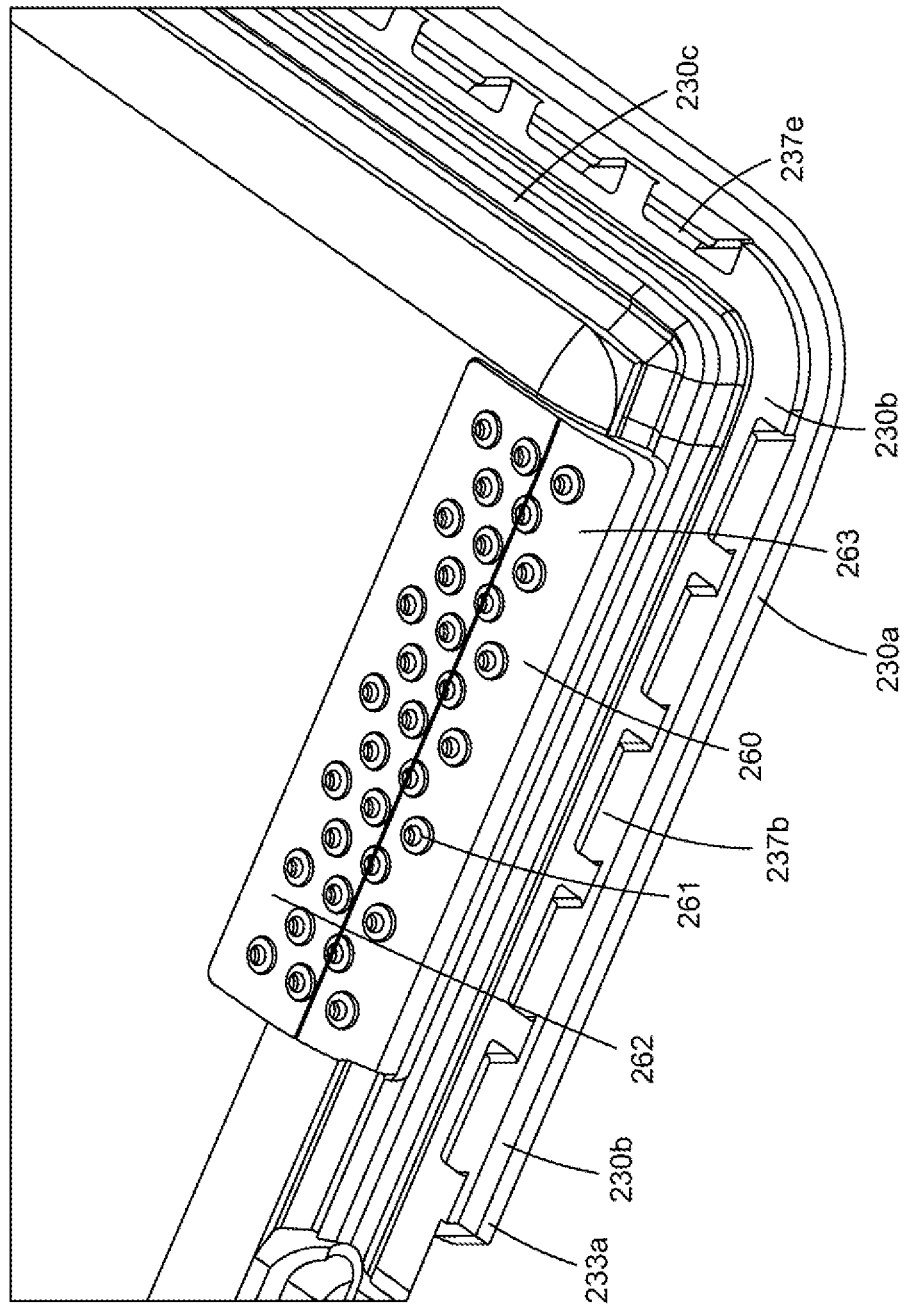
FIG. 19 provides a close up perspective view of a sound transmission portion of the protective housing.

FIG. 19 provides a close up view of the sound transmission portion 260 as described herein. The sound transmission portion may be positioned any suitable place along the housing such as along a perimeter portion 220 or along a front and back surface portion 235/236. Further, the sound transmission portion may have any suitable configuration so long as it is capable of transmitting sound through the bounds of the housing while at the same time as preventing the ingress of liquid, such as water, therethrough.

For instance, in certain embodiments, a perimeter or front and back surface portion of the housing may include sound transmission portion that is configured as a sound port, which port is adapted for enhancing the transmission of sound through the housing. In one instance, such sound port may be configured as an acoustic vent portion. A suitable acoustic vent will be adapted for transmitting and/or directing sound through the bounds of the housing such as toward a microphone portion, or away from a speaker portion, of an underlying electronic device housed within the housing.

For instance, a perimeter or front/back surface portion, such as on a distal or proximal end portion, may include a sound transmission portion that is configured as an acoustic vent feature for transmitting sound. The acoustic vent feature may include one or a plurality of sound channel(s) having an acoustic vent material positioned therein. The acoustic vent material may span the sound channel at an angle from 0 to 180 degrees in a forward or reverse direction. The sound channel may extend from an exterior portion of the perimeter or back surface to an interior portion of the perimeter or front surface and the acoustic vent material may transect the sound channel, e.g., at an angle with respect to a centerline there through.

A proximal end portion of the housing 201 may include one or more, such as a plurality of sound transmission portions 260 configured as acoustic vents. For instance, in certain embodiments a microphone acoustic vent and/or a speaker acoustic vent portion may be provides. In one embodiment, the proximal end portion may include a plurality of acoustic vents which acoustic vents include a first sound channel for directing sound to a microphone acoustic vent, and a second sound channel for directing sound away from a speaker acoustic vent. The acoustic vents may be positioned within a top 202 or a bottom 203 member and traverse from the outside of the housing, through the exterior, middle, and interior perimeter portions and into the interior of the housing. The vents may include acoustic channels which acoustic channels include respective acoustic membranes that transect the acoustic channels. The housing surrounding the acoustic membranes may be configured so as to be overmoulded therewith. Hence, the sound channels may further include overmould portions that are configured to interface with a perimeter portion of the membranes so as to be overmoulded therewith and thereby secure a liquid-tight seal between the housing and the acoustic membranes. The acoustic membranes are transmissive for sound but are non-transmissive for liquid. Thus, sound can travel through the sound channel in the housing but liquid, such as water, cannot because it cannot pass through the acoustic membrane.

In certain embodiments, the proximal end portion includes a plurality of sound transmission portions, e.g., acoustic vents 260. In certain instances, the plurality of sound transmission portions include a sound channel leading to a microphone acoustic vent, and a sound channel leading to a speaker acoustic vent. The acoustic vents may be positioned within a top member 202 or bottom member 203 and traverse from the outside of the housing 201 into the interior of the housing.

Where such acoustic channels are provided, the acoustic channels may include respective acoustic membranes and grille portions, which grille portions are configured for providing additional support for the acoustic membranes. Specifically, the sound channel may be configured to tapper toward the acoustic vent material, e.g., membrane, which sound channel is configured for directing sound toward a microphone portion or away from a speaker portion of an underlying electronic device housed within the housing 201. An acoustic vent bounding member, e.g., an overmoulded skirt seal, may also be included and circumscribes the acoustic vent membrane. For instance, a portion of the acoustic vent material may be overmoulded with a rigid material so as to facilitate the isolation and reduction of transmission of sound, such as from the speaker vent portion, so as to prevent interference therewith, and may further strengthen the seal between the housing and the acoustic membrane thereby ensuring the liquid-proof nature of the acoustic vent. The acoustic vent material 267a may be a membrane, which membrane may be cantered at an angle from 0 to 180 degrees, such as from 90 to 180 degrees. It is to be noted that although the sound transmission portions 60 are described as being positioned on a proximal end of the housing 201, they could be positioned anywhere along the perimeter or top or bottom front and back surface of the housing without departing from the nature of the disclosure. The acoustic vent material may be positioned within the assembly 260 at an angle so as to increase the cross sectional area of the vent material for improved sound transmission.

Figure 20:
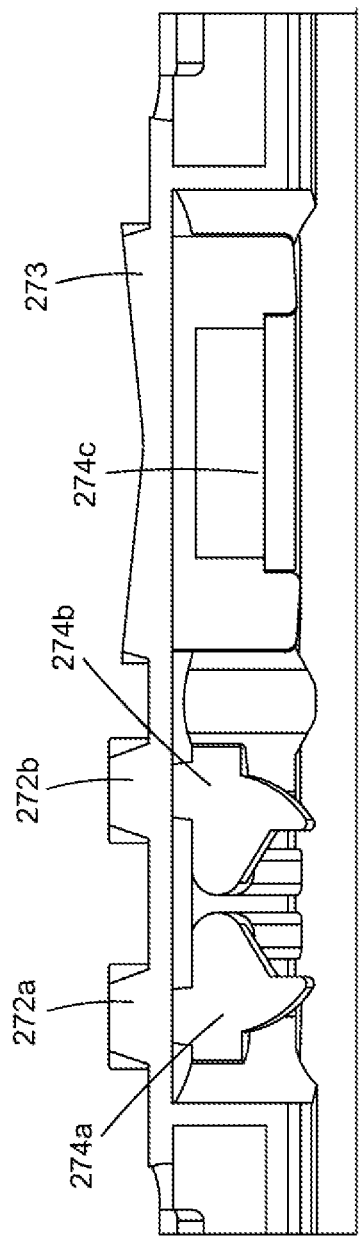
FIG. 20 provides a close up perspective view of a switch feature of the protective housing.

FIG. 20 provides a close up view of the interior perimeter portion 220b with the orientation and sound switch interfaces blown up in detail. Accordingly, in certain embodiments, a perimeter portion of a housing of the disclosure may include one or more fabricated switch or button features. For instance, a switch or button feature for engaging a switch or button mechanism of an encased device, such as an on/off, orientation, or silence switch or volume button, may be provided. As can be seen with respect to FIG. 20, a switch feature such as orientation toggles 272a, 272b may be included on a portion of the housing 201, such as on one of the opposing side portions. The perimeter of the housing 201 may further include other features such as one or more of an on/off switch 271, a volume control button 273; a coin slot feature; one or more acoustic vents, a latch feature, and the like. The switch, toggles, and button features may be fabricated into the housing 201 and are specifically configured for engaging the respective switches, toggles and buttons of a housed device. Hence, the switches, toggles and buttons are designed to model and ensure both the functionality and aesthetics of the underlying switches and buttons of the underlying device.

As depicted, the perimeter portion of the housing 201 may contain a toggle feature 272 and volume buttons 273. The housing 201 includes a top housing member 202 having a perimeter portion 220, and a bottom housing member 203, having a perimeter portion 230. As depicted, the toggle feature 272 and volume buttons 273 are positioned along a perimeter portion 230 of the bottom member 203. In this embodiment, the style of the toggle 272 and button 273 features are designed to retain the stylistic features and functionality of the switches and buttons of the underlying device. The orientation toggles 272a, 272b are configured for engaging a respective orientation switch of a housed device so as to manipulate the orientation feature of the housed device. The volume control toggles or buttons 73 are configured for engaging their corresponding buttons on a housed device for the increasing and decreasing of the volume of an underlying device.

The orientation switch feature 272 includes an actuator base, which may be fabricated from a rigid material, and may include one or more axles or rockers that pivot about the base so as to effectively engage a portion or portions of a silence switch of a housed device. Volume control toggles 273 include a flat user engagement surface portion, which may be engaged by a user, and an extended button engagement portion that is configured for engaging a button of a housed device.

For instance, the orientation toggle feature may be configured as a plurality of slider toggles 272a, 272b, which toggles 272 include a housing, an actuator top member, a rigid actuator base, and switch interfaces 274a, 274b, which switch interfaces couples with an orientation switch of an underlying device so as to manipulate the orientation switch, e.g., from one orientation to another. The orientation toggle feature may further include an axle or rocker about which the actuator top member rotates.

Specifically, the toggles may be formed as oblong hook members that are positioned a space away from one another so as to surround a switch, such as an orientation switch of an underlying device. As one or the other toggles is depressed, the toggle rotates around the base via the axle thereby engaging the switch and changing the orientation. If an opposite orientation is desired, the opposing toggle is depressed. In a manner such as this the orientation switch of an encased device may be manipulated so as to slide from a first to a second position and back again thereby manipulating the orientation view of an underlying device.

It is to be noted, that although the toggle feature 272 has been described as having various switch components, various of the switch components may be included or excluded or modified without departing from the nature of the switch feature 290 so long as the switch feature is capable of engaging and manipulating a switch of an underlying device. For instance, in certain instance, a switch feature may include a flexible, semi-rigid switch housing, which housing includes one or more rigid or semi-rigid switch interface portions that are associated with an inside surface of the housing, which switch interface portions are configured for engaging a switch of the underlying device. In such an instance, the switch housing may be a raised member that is configured for being depressed in an up or down direction or switched from a side to side direction, which depression or switching allows one of the switch interface portions to engage and manipulate the underlying switch of a housed device either upwards or downwards or from side to side.

As illustrated in FIG. 20, the orientation toggle feature includes an actuator switch housing that overlays the oblong toggle top members, each toggle axle, and switch interface portions 274a and 274b. As the housing is depressed, the top member is manipulated, e.g., moved upward or downward or side to side in a linear direction, the base member rotates about the axle thereby causing one or the other of the switch interface to translate the switch of an underlying device in an opposing linear direction, e.g., thereby changing the orientation view of the underlying device.

Also depicted is a plurality of button switches, such as volume control buttons, wherein the switch housing include corresponding switch interface portions that are configured for engaging and manipulating a switch of a housed device, when the housing is depressed such as in an upward or downward direction, e.g., thereby increasing or decreasing the volume thereof. It is noted that the on/off switch 271 may be configured to operate in a similar manner.

Figure 21B:
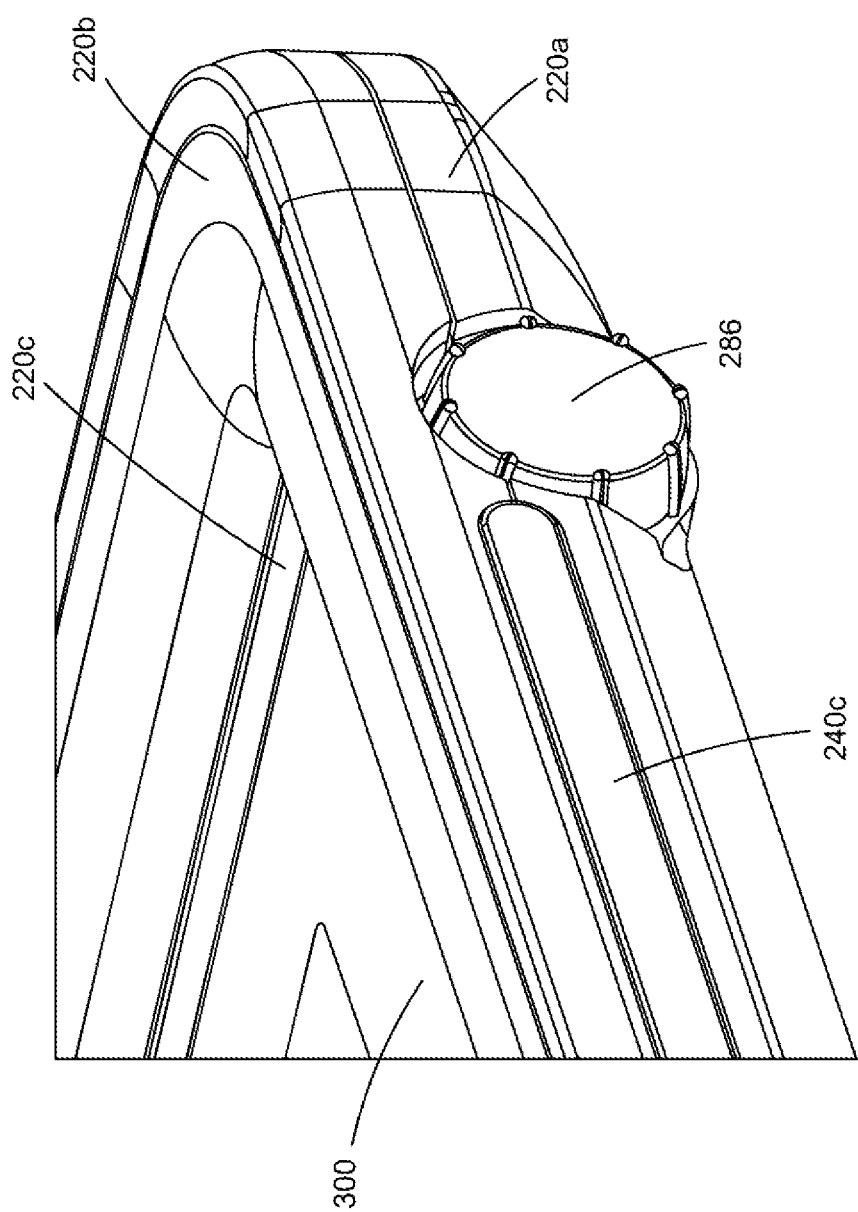
Figure 21C:
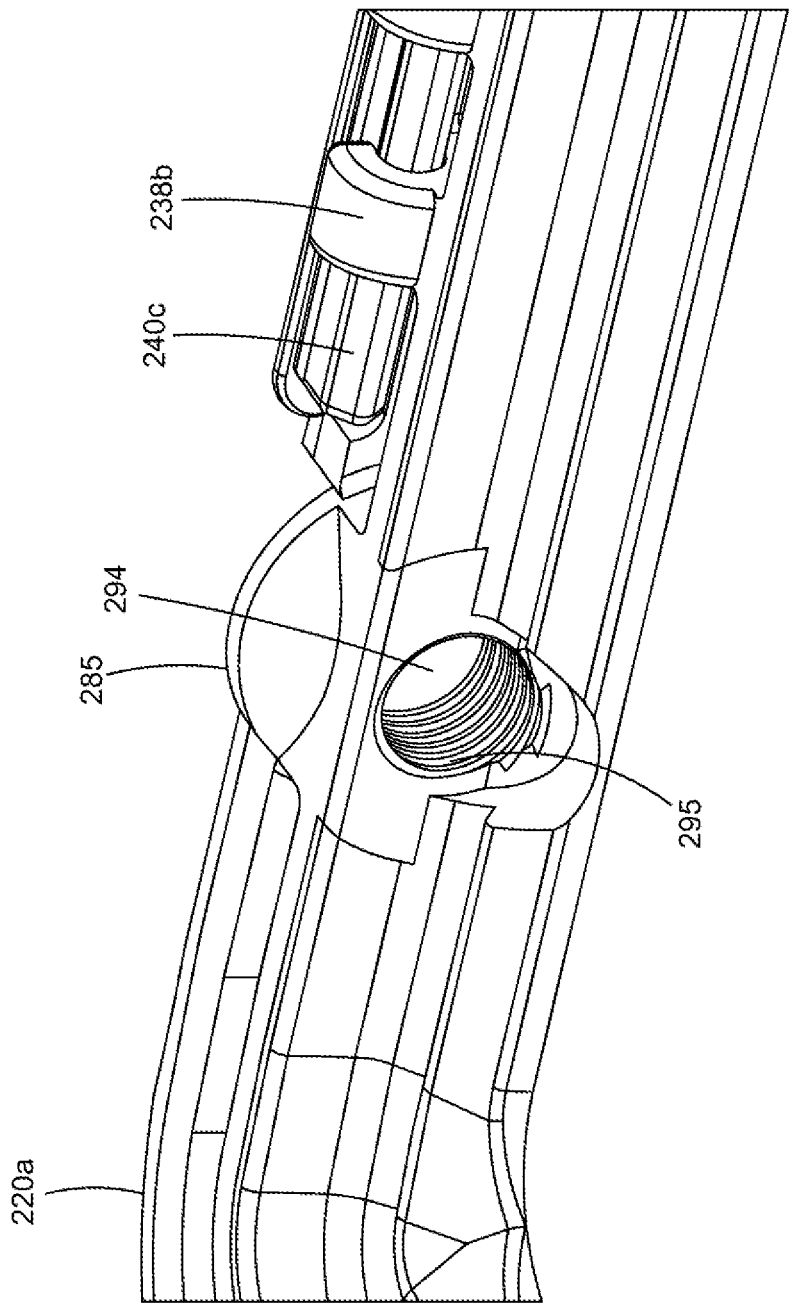
Figure 21D:
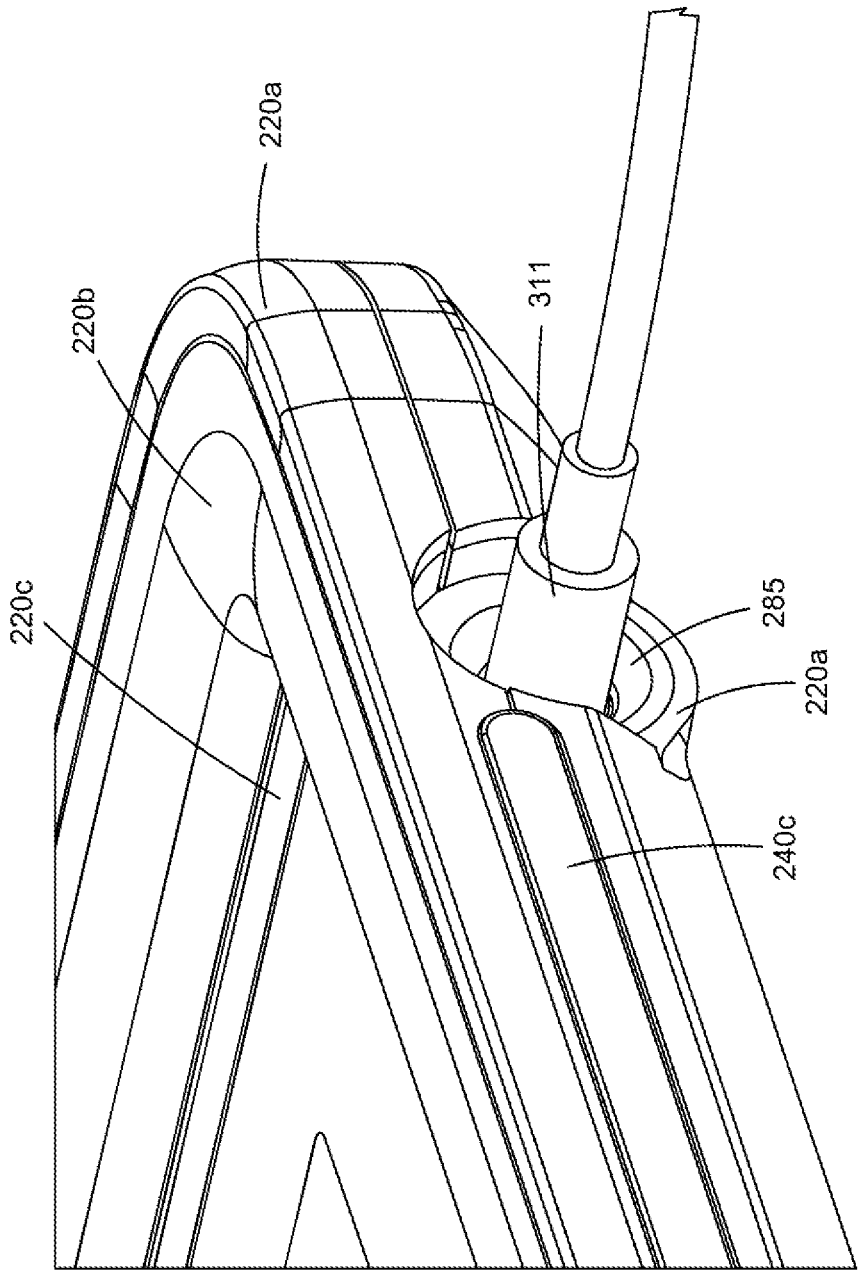
FIGS. 21D-F provide perspective views of a headphone port.

FIGS. 21A-C provide a detailed view of the noise cancelling feature 291 positioned on the distal end 232 of the bottom member 203 as described herein. The noise cancelling feature 291 includes a sound channel 292 that traverses from the exterior 220a of the housing 201, through the perimeter portions 220b, 220c into the interior of the housing 201. The sound channel is transected by a membrane 293, which membrane is configured for letting sound pass therethrough but not liquids, such as water.

Accordingly, in various instances, a perimeter portion or a top and bottom surface of the housing 201 may include a sound transmission portion 260 that is configured as a noise cancelling feature 291. In this configuration, the noise cancelling feature 291 functions for assisting in directing ambient noise toward a noise cancelling microphone present on an encased device thereby facilitating in the cancelling of ambient noise. The noise cancelling feature 291 may be positioned anywhere on the housing 201, on a top member 202 or bottom member 203, such as along the perimeter 220 or 230. As depicted in FIG. 21, the noise cancelling feature 291 is positioned on a bottom member 203.

As can be seen with respect to FIG. 21A, the noise cancelling feature 291 includes an acoustic inlet aperture that communicates with an interior of the housing. As can be seen with respect to FIG. 21B, the inlet aperture communicates through a sound guide channel 292, which channel 292 directs sound toward an acoustic membrane 293 positioned in a transverse manner within the sound guide channel 292. The acoustic inlet aperture may be offset from a noise cancelling microphone of an encased device, but is configured for directing ambient noise thereto. Accordingly, as depicted, the noise cancelling feature 291 includes one or more sound inlet apertures, a sound guide channel 292, and an acoustic vent membrane 293. The sound guide channel 292 is configured for directing sound toward a noise cancelling microphone present on an encased electronic device. The acoustic vent membrane 293 may be positioned so as to intersect the sound guide channel 292. In the same manner described above, the acoustic membrane 263 may be associated with the housing in an overmoulded configuration and an adhesive may be included to secure the membrane to the housing.

FIGS. 21A-21F provide various detailed views of the earphone port 285 positioned on the distal end 232 of the bottom member 203 as described herein. In this instance, the outer and middle perimeter portion 220a, 220b of the housing 201 includes a headphone port feature 285, for instance, for receiving either a jack, such as a headphone jack of a headphone or speaker assembly, or a closure device, e.g., a bung 286, or the like. It is noted that the headphone port feature may be included in a top and/or bottom member 202, 203.

As can be seen with respect to FIG. 21C, the headphone port feature 285 includes an aperture 294 positioned in the bottom members 203. The aperture 294 is bounded by a threaded region 295, which threaded region 295 may be configured for receiving a corresponding threaded region 288 present on either a headphone jack or a closure device, such as an ear phone jack port bung 286. In various instances, a gasket, such as an O-ring, may be included in addition to the threads.

Accordingly, a suitable headphone jack or closure device 286 will include a corresponding thread feature 288 and may additionally include a gasket 289. If the headphone jack and/or closure device 286 includes a gasket 289, then the aperture 294 need not include a gasket, rather it will simply include the threaded feature 288. The threaded region 288 may be configured as a typical thread feature or may be configured as a cam feature. Hence, it is to be noted, that the gasket 289 may be present within the housing of the aperture 294, or may be present on the port bung 286 or headphone jack.

The aperture 294, therefore may be bounded by both of a gasket 289 (e.g., if not included in a corresponding port bung 286 and/or jack 257), and a threaded region 295, which threaded region 295 is configured for receiving the corresponding threaded region 288 on an ear phone jack port bung 286 and/or corresponding region on an ear phone or speaker jack. (See FIGS. 21D-21F). In this configuration, the coupling of the ear phone jack port bung 86 or jack with the headphone port feature 285 results in a liquid and dirt tight seal, which seal prevents a liquid, such as water, and/or dirt from entering the housing 201 through the headphone port 285. (See for instance, FIGS. 21B and 21E).

Figure 21E:
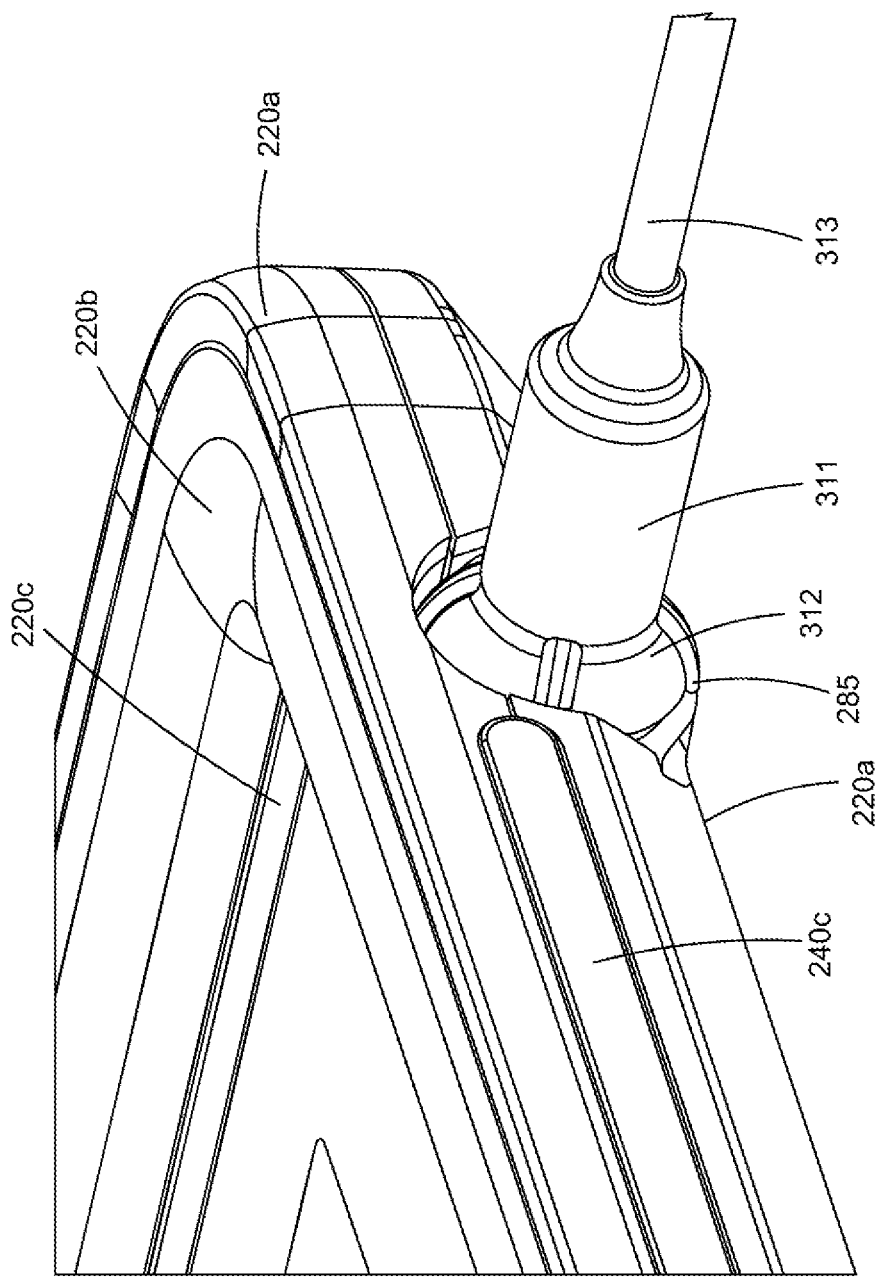
Figure 21F:
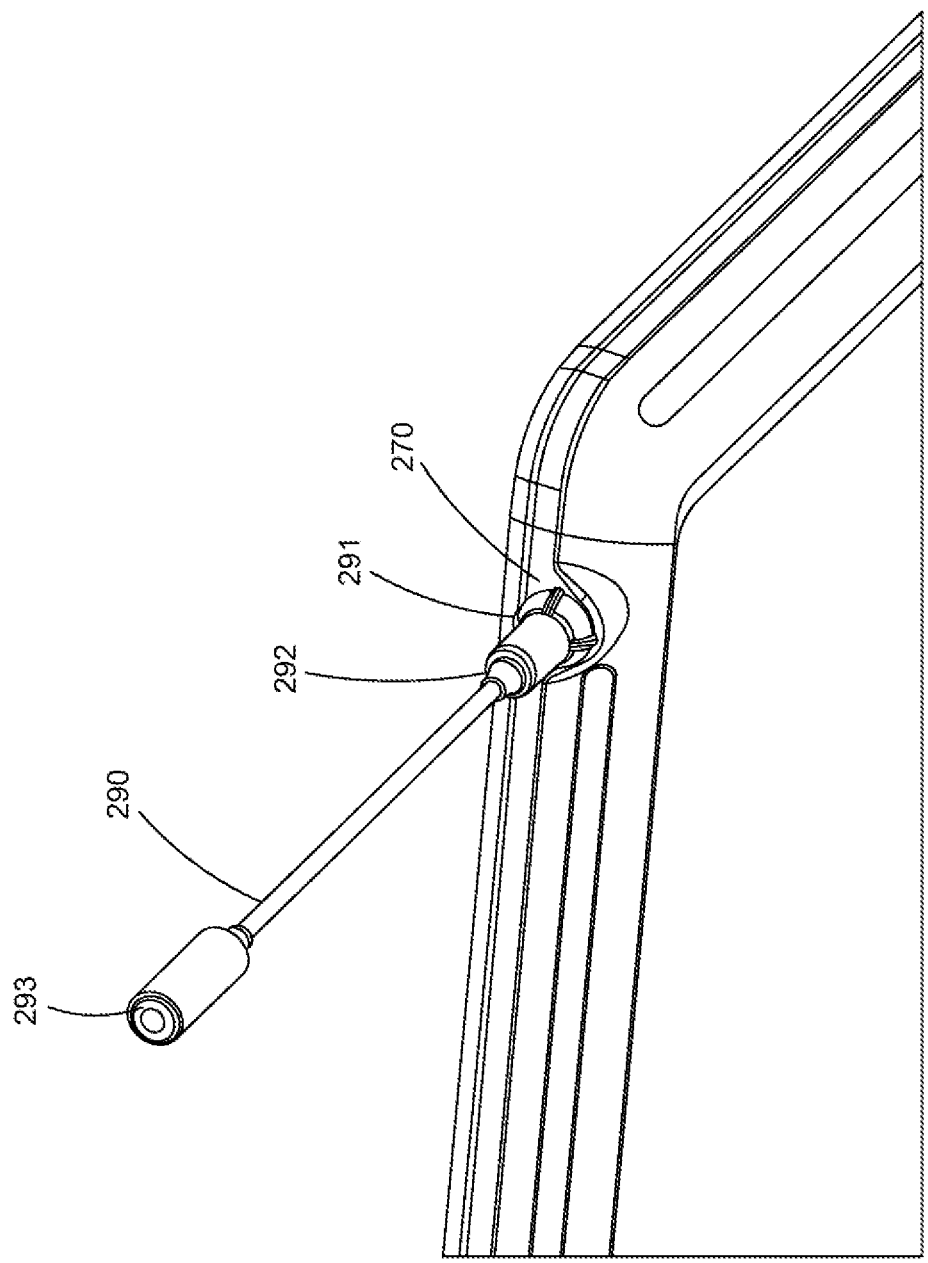

As can be seen with reference to FIG. 21E, an element of the housing may be a port 285, such as a headphone port, that is configured for acting as an interface between a headphone, speaker, or other jack containing device, and a jack port of an underlying electronic device so as to provide a liquid-proof interface between the headphone, speaker jack, etc. and the underlying device. In such an instance, the interface is a liquid and dirt proof seal. In certain instances, however, a headphone, speaker, or other device containing a jack interface may not be included or may not otherwise be associated with the housing or an underlying device associated therewith. In such an instance, a port sealing device 285 may be associated with the port of the housing so as to maintain a liquid and dirt proof seal when a liquid-proof jack, such as the one described herein below, is not associated with the port of the housing.

In certain instances, a port sealing bung 286 is provided for sealing an associated port 285 of a housing 201. The port sealing bung 286 may include a top member 289a, which top-member may further include a grip feature region 289b. The port sealing bung 286 may also include a gasket region containing a gasket 288 and a threaded region containing threads 287, which threads are configured for coupling with corresponding threads 295 of a jack port 285 so as to establish a liquid and dirt tight seal there between.

It is to be noted that the threaded regions may be configured as a thread feature or a cam feature. For instance, instead of the threaded region depicted, a cam feature, such as a bayonet cam feature can be provided. The cam feature may be configured for coupling the jack port sealing bung 286 with the jack port 285 in a liquid-tight seal when the port is not associated with a corresponding liquid-proof jack interface. It is to be noted that when the cam feature is included in the jack port bung 286, a corresponding cam receiving feature is substituted for the threaded region 295 of the port jack 285. For instance, when the cam feature is an expanded cam feature that is included in the jack port bung 286, a corresponding indented cam receiving feature is substituted for the threaded region 295 of the port jack 285. The cammed jack port bung 86 also includes a top member 289a having a grip feature 289b and gasket 288.

Figure 22A:
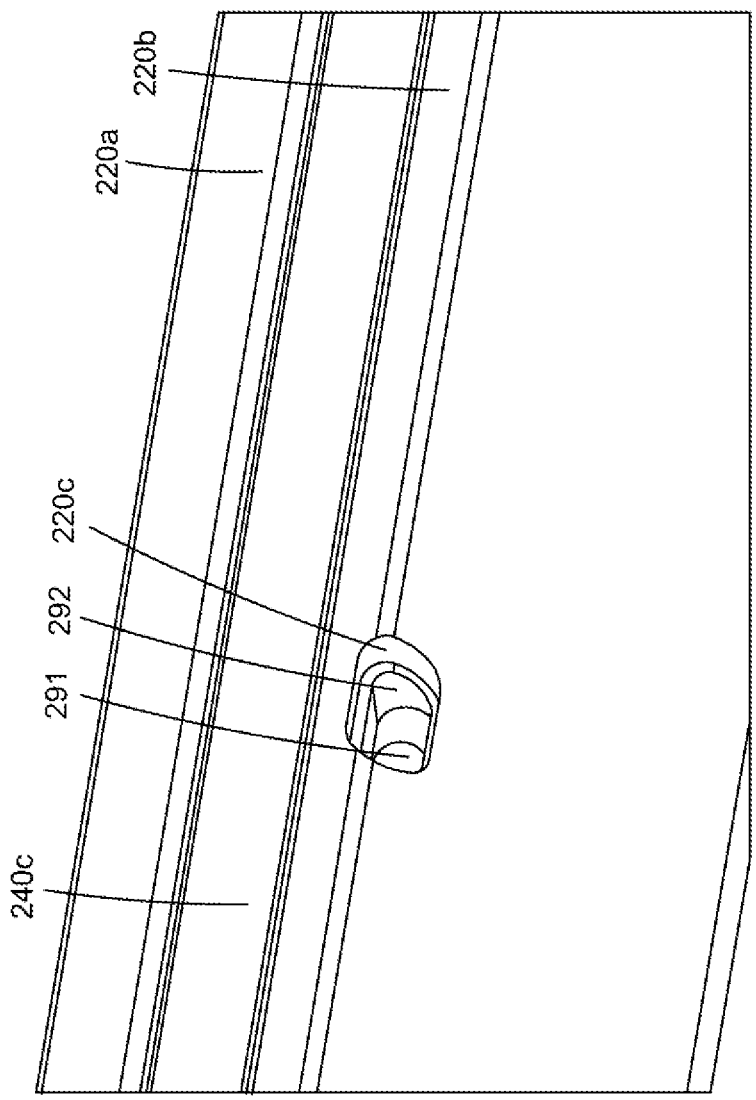
FIGS. 22A-C provide close up perspective and side cutaway views of a noise cancelling feature on the protective housing.
Figure 22B:
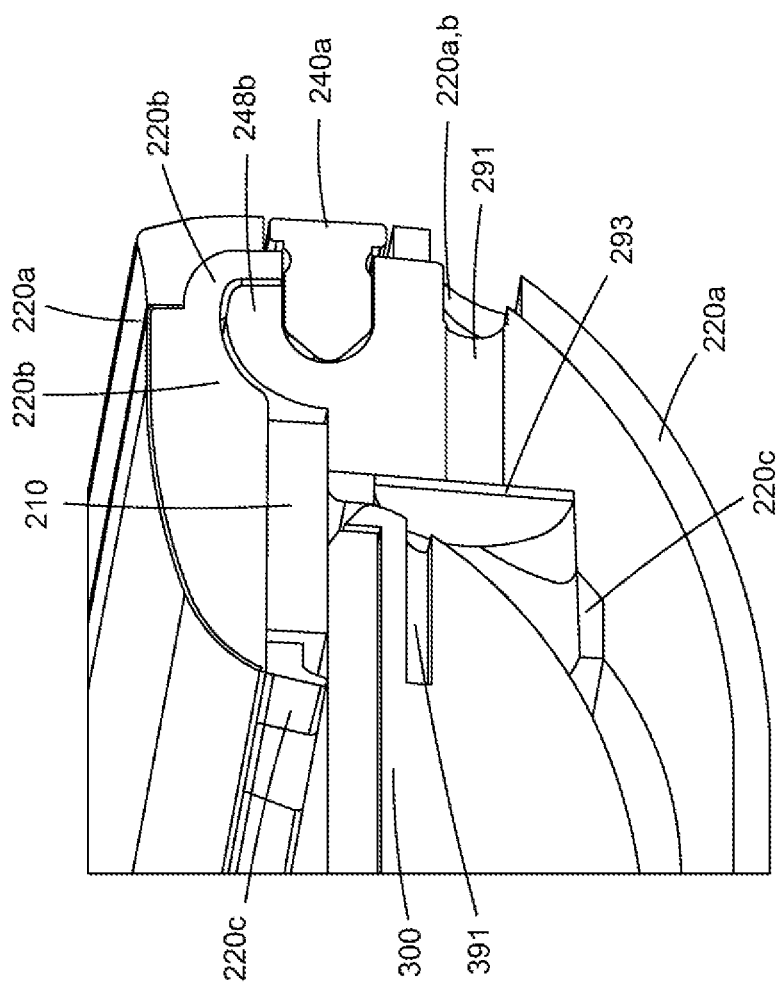
Figure 22C:
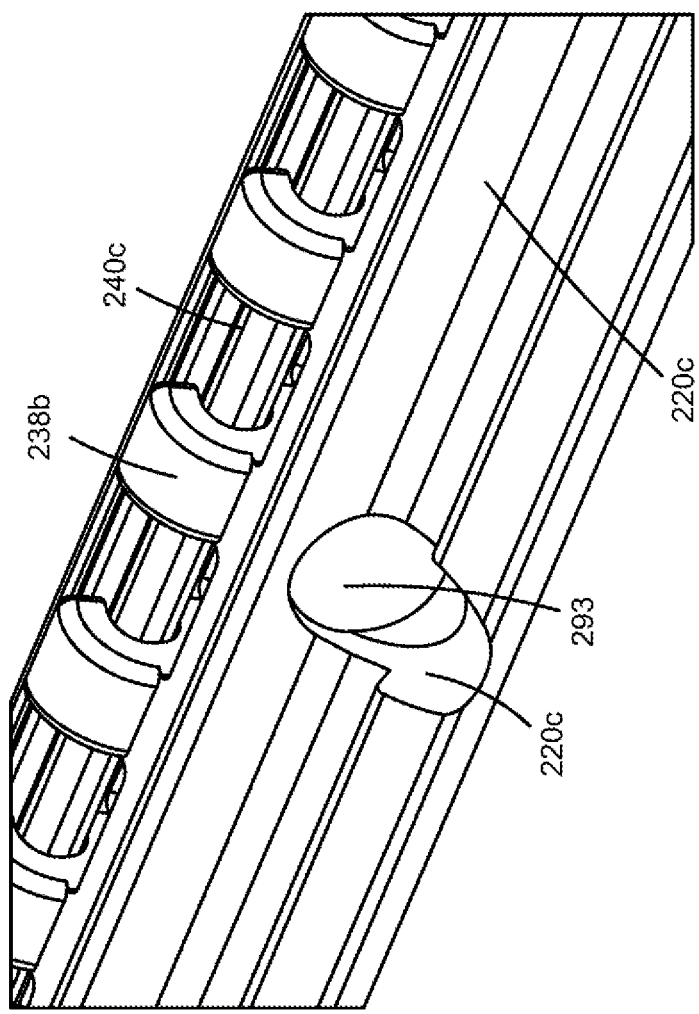
Figure 23B:
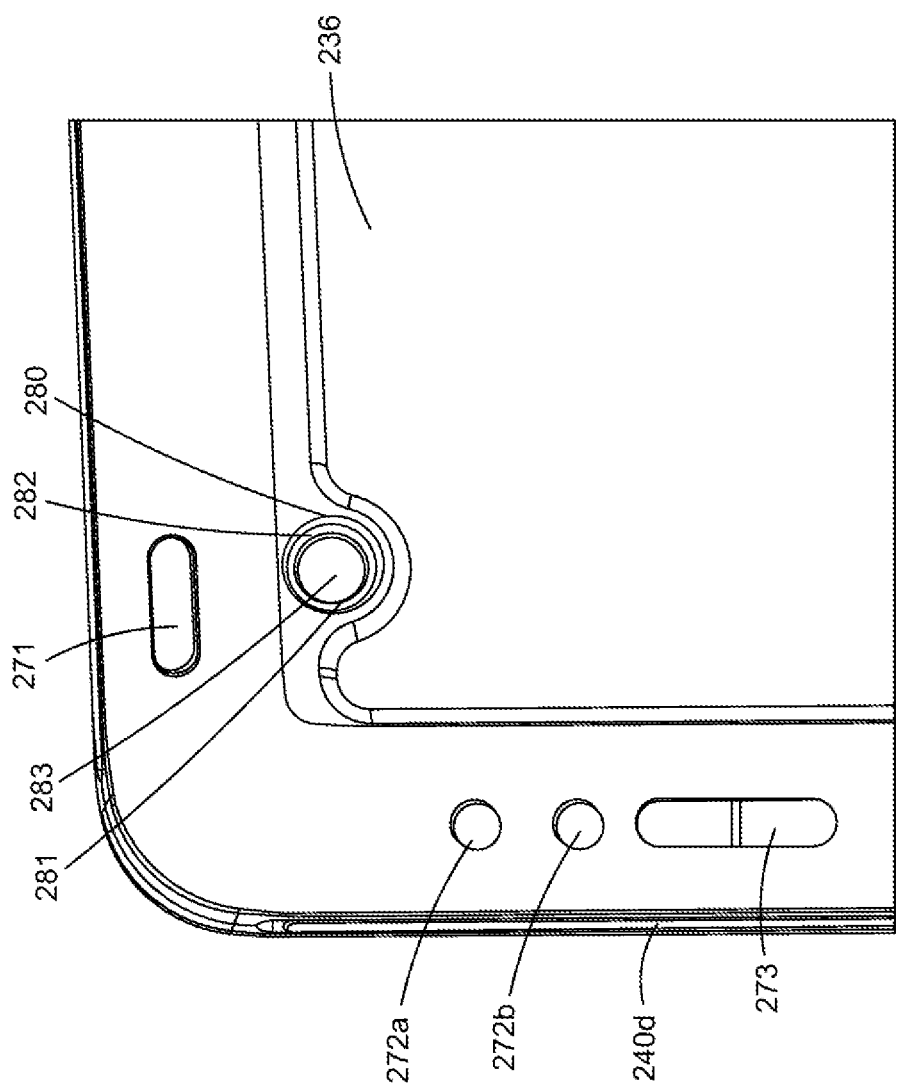

FIGS. 22A and 22B provide a close up of a camera or lens feature 280 as described herein. In this instance, the bottom member 203 includes the lens feature 280, wherein in other embodiments, a lens feature 280 may be included in top member 202, or both. The camera portion 280 may include one or more of a raised lip portion 281 surrounding an optical skirt 282. The optical skirt 282 is configured for housing at least a camera lens region 283a and may additionally include a flash lens region 283b. Either lens can be replaced by an optically transmissive region.

Accordingly, in certain embodiments, a top and/or a bottom member 202, 203 may include a camera portion 280 having a lens feature, such as a camera and/or flash feature. In typical cases, a lens and/or flash feature is not provided. Rather, there is simply an optically transmissive region provided. Such a region may be problematic because it may interfere with the clarity of pictures taken by the camera, and further, where a flash is provided may allow the transmission of light incident to the camera lens of the underlying device thereby causing pictures taken thereby to be washed out. In other instances, a cut-out portion of the casing is provided through which pictures may be taken. However, this is not ideal as it prevents the case from being water resistant. If a camera and/or lens is to be provided in a housing of the disclosure, it may be so provided in such a manner as to be stepped up from the housing. This is not ideal because it is hard to clean, easy to scratch, and hard to protect.

Accordingly, in certain embodiments, a lens feature 280 is provided wherein one or more lenses, such as a camera 283a and/or a flash 283b lens, are positioned within the top 202 or bottom 203 member of the housing 201 so as to be integral therewith and not substantially stepped up there from. The lens feature may include a lens 283a for a camera and/or another lens 283b for a flash, and may further include an optical skirt 282 surrounding the one or more lenses so as to prevent inerrant light transmission, e.g., to reduce internal reflection and thereby reduce flair.

In fabricating a lens feature 280, the one or more lenses may be pressed into the top 202 or bottom member 203, so as to be pressed flush against the housing material. Such a fabrication method may be better than molding because typical molding process using rubber and other such materials are difficult with respect to glass due to the difference in thermal expansions and contraction. Further, it is difficult to make such seals watertight.

Accordingly, in one embodiment, a housing containing a lens element 280 is provided wherein one or more lenses 283 are provided, these may have a diameter that is greater than that of the lenses provided in the underlying device. A housing member 202 or 203 may then be fabricated, e.g., molded, and provided separately, a mandrol, or other such tool, may then be employed to press the lens feature into the housing member. This will give the lens feature a clean, well-fit interface with the surrounding material of the housing member. The lens feature should be configured such that the transition is flush with no cavities between the lens feature and the housing material. As can be seen with respect to FIG. 22A, the camera feature 280 includes a raised lip portion 281 that surrounds an optical skirt 282. The optical skirt 282 includes a camera lens orifice containing a camera lens 283a and a flash lens orifice containing a flash lens 283b.

As can be seen with respect to FIG. 22B, the lens feature 280 includes an optical skirt 282. The optical skirt 282 includes a camera lens orifice containing a camera lens 283a. It is to be noted that in this embodiment a flash lens orifice containing a flash lens 283b is not provided, however, in other embodiments, a flash lens 283b may be present. In other instances, no lenses are provided. Rather a simple optically clear transmissive region may be provided instead.

The optical skirt 282 may be configured so as to prevent the transmission of light from the flash to the camera lens. The optical skirt 282 includes a camera lens orifice containing a camera lens 83a and may include a similar flash lens orifice containing a flash lens. The lens skirt 282 includes a concentric baffle detail which provides an enhanced field of view for the lens 283a.

Figure 24A:
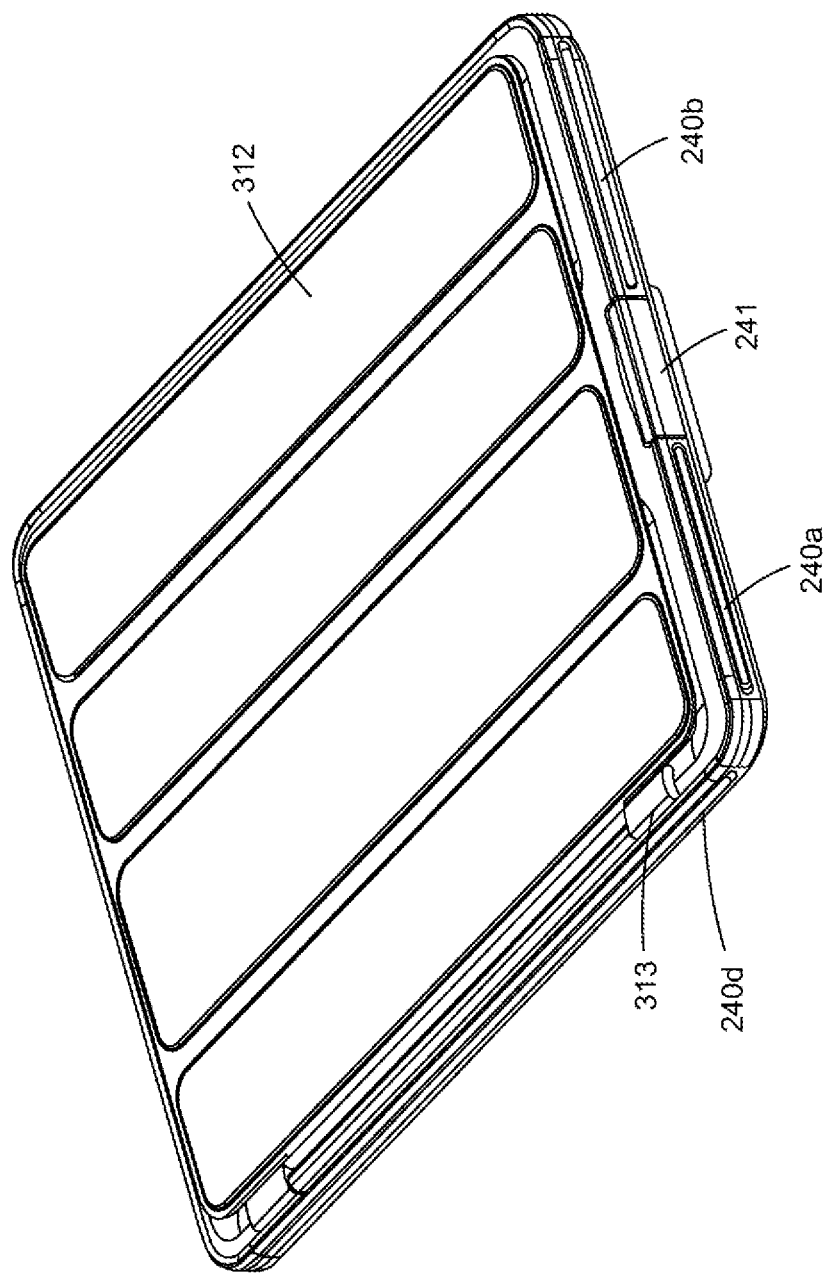
FIGS. 24A-B provide perspective views of a protective housing having a cover.
Figure 24B:
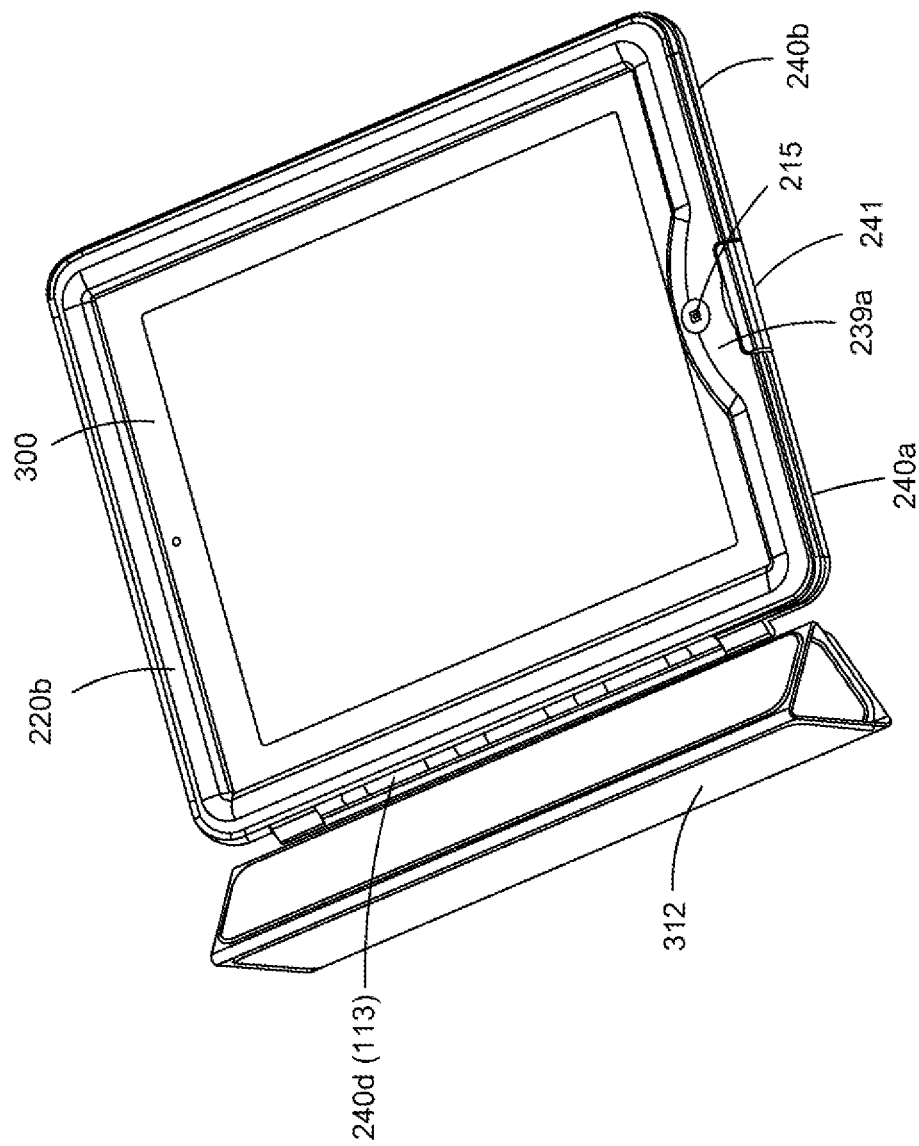

FIGS. 24A and 24B provide embodiments of the housing 201 wherein the housing further includes a cover 206. The cover may be removably attached to a front surface of the perimeter portion 220a of the top member 202, e.g., via moulding and/or via an adhesive or magnets. Alternatively, the cover can be associated with a wedge locking element and attached to the housing by insertion of the wedge element into the associated wedge groove formed by the coupling of the top member with the bottom member. The cover can be configured for interacting with the housing such that when the cover is engaged for the purpose of covering an encased device, the device is turned off and by opening the cover the device is turned on. There perimeter portion therefore may be configured for transmitting an on/off signal based on the relative positioning of the cover.

It is to be noted that one or more of the above described features could be positioned along the perimeter portion 220, 230 of a top 202 or bottom member 203 as well. Additionally a top member 202 front/back surface 225/226 may also be provided, e.g., a membrane. Where provided, the top member 202 front/back surface 225, 226 may include a video camera optically clear region, a proximity sensor, and/or an acoustic vent ear piece aperture for transmitting sound through the top member membrane 225, 226. One or more of the top member 202, the bottom member 203, and/or a locking member may include one or a plurality of stand-offs, such as on a front/back surface thereof.

Additionally, the top and/or bottom member may be configured so as to include a slot region to facilitate in separating the top member from the bottom member of the housing. For instance, a tool may be placed within the slot and twisted thereby causing the two members of the housing to separate, e.g., unzip. In this regard, the flexible material of the housing, e.g., the overmoulded exterior perimeter portion 220a of the top or bottom member 202, 203 may facilitate such an interaction because if the material of the housing were exclusively rigid such an interaction would be hard to achieve in addition to a consistent seal.

Accordingly, in certain embodiments, an outer perimeter portion may include a slot feature, such as a coin slot feature, for assisting in separating the top member 202 of the housing from the bottom member 203 of the housing. The slot feature may include an indented, e.g., cut out portion along the perimeter positioned where the two members meet. The cut out portion may be positioned in top member 202, and further be bounded by a plurality of bounding members, such as overhang portions in top housing 202 and bottom housing 203.

The top member 202 may additionally include a concave configuration while the bottom member 203 includes a convex configuration, such that as the top 202 and bottom 203 members are joined together a coin slot feature is formed so as to assist a user in opening the opposing members of the housing 201, such as by inserting a tool, such as a coin, into the concave region and twisting thereby forcing the top member 202 away from the bottom member 203.

Additionally, a housing of the disclosure may be configured to house virtually anything capable of being housed and transported. For instance, a housing may be provided that is in the form of a case, such as a brief case, suitcase, messenger case, and the like. For example, the housing 1 may be in the form of a storage container, cooler, warmer, or the like. The storage container can be configured to store anything in need of being protected from the environment, such as food, liquids, ice, paper, notebooks, books, household items, work items, office supplies, medical items, sports items, clothing, fragile items, precious items, and the like.

Such a housing would include a top member 202 and bottom member 203, which top and bottom members include respective clasping mechanisms 227 and 237, as described above. A gasket 215 would also be provided and positioned along a perimeter portion of the top or bottom member. A hinge element could be provided or incorporated into the wedge configuration described above and be positioned in a top or bottom member. The top member therefore could be connected to the bottom member 203 via the hinge element. In such an embodiment, the clasping mechanisms and/or gasket, may not need to entirely circumscribe the perimeters of the top and bottom members, however, in various embodiments, one or more of the clasping mechanisms and gasket do circumscribe the entire perimeter portions, e.g., of the respective top and/or bottom members 202, 203. In this instance, the top 202 and bottom 203 members would not be configured from being removed from one another. In other instances, the top member 202 would be configured for being completely removed from the bottom member 203. In this instance, the clasping mechanisms 227 and 237 may circumscribe the entire perimeter portions of the top and bottom members 202, 203, and the gasket 210 may entirely circumscribes the perimeter portion of the bottom member 203.

An additional latching mechanism may be included to either of the top and bottom members 202, 203 for further securing of the sealing of the top and bottom members together. This additional latching mechanism may be in any configuration so long as it is capable of facilitating the coupling and/or securing of the top member 202 with the bottom member 203. For instance, the latching mechanism may be one commonly known in the art. In certain embodiments it may include a locking mechanism known in the art, such as a lock and key mechanism, a combination mechanism, a hoop mechanism through witch an external lock is added, and the like.

EXAMPLES

Two cases as described were manufactured. One case had the snap-tooth configuration such as that depicted and described with reference to FIG. 1A and the other had the locking wedge configuration such as that depicted and described with reference to FIG. 1E. The cases and their components had the following dimensions:

Wedges Embodiment
>Whole Housing
  Width 204 mm (8")
  Length 260 mm (10¼")
  Thickness 17 mm (11/16")
  Mass: 220 g (8 ounces)
Beyond Device
  add to width each side 9 mm (11/32")
  add to Length each end 9 mm (11/32")
  add to thickness Top perimeter 4 mm (5/32")
  add to thickness Top face 0-0.5 mm (0-1/64")
  add to thickness Bottom perimeter 4 mm (5/32")
  add to thickness Bottom face 2 mm (3/32")
Top Member
  Width 204 mm (8")
  Length 260 mm (10¼")
  Thickness at seal 3.5 mm (⅛")
  Thickness at interdigitation 9 mm (⅜")
  Weight 60 g (2 ounces)
Bottom Member
  Width 204 mm (8")
  Length 260 mm (10¼")
  Thickness at seal 12 mm (½")
  Thickness at interdigitation 15 mm (⅝")
  Weight 160 g (5¾ ounces)
Wedges
  Thickness at engagement 2.5 mm (1/10")
  Thickness overall 3.2 mm (⅛")
  Width 4.5 mm (3/16")
  Length—varies
    Sides—230 mm (9")
    Headphone end—150 mm (6")
    Latch end—2 short either side of latch—68 mm (2⅝")
Snaps Embodiment
>Whole Housing
  Width 204 mm (8")
  Length 260 mm (10¼")
  Thickness 17 mm (11/16")
  Mass: 220 g (8 ounces)
Beyond Device
  add to width each side 9 mm (11/32")
  add to Length each end 9 mm (11/32")
  add to thickness Top perimeter 4 mm (5/32")
  add to thickness Top face 0-0.5 mm (0-1/64")
  add to thickness Bottom perimeter 4 mm (5/32")
  add to thickness Bottom face 2 mm (3/32")
Top Member
  Width 204 mm (8")
  Length 260 mm (10¼")
  Thickness at seal 3.5 mm (⅛")
  Thickness at snap fits 12 mm (½")
  Thickness at front face 0 mm (0")
  Weight 60 g (2 ounces)
Bottom Member
  Width 204 mm (8")
  Length 260 mm (10¼")
  Thickness at seal 12 mm (½")
  Thickness at snap receiving pockets 12 mm (⅝")
  Thickness at bottom face 2 mm (3/32")
  Weight 160 g (5¾ ounces)
Locking Combs
  Thickness at engagement 2 mm (3/32")
  Thickness overall 3.5 mm (⅛")
  Height 8 mm (5/16")
  Length—varies
    Volume control sides—175 mm (7")
    Single corner 15 mm (19/32")
    Opposing side 225 mm (9")
    Headphone end—125 mm (5")
    Latch end—2 short either side of latch—68 mm (2⅝")

A tablet computer was placed in each case and the case was assembled as described above. Specifically, the device was inserted into the bottom member 3. The top member 2 was then positioned over the device and the bottom member having either snap-tooth receptacles or wedge receiving hooks and the snap tooth members or interdigitating hooks were aligned with one another. The top 2 and bottom 3 members were then coupled together by pressing down on the perimeter portions of the top and bottom members to snap them in place or otherwise couple them. The snap tooth combs or wedges were then inserted sequentially and snapped into place or otherwise coupled therewith. The charger port door was closed. The bung was inserted into the bung receptacle and firmly tightened. Each housing containing the device was dropped six times on each surface with no observable physical or observable operational damage being done to the underlying device. Further, each case containing the device was submerged to a depth of 6 feet in water six times and left therein for one half hour with no water damage due to leakage being done to the underlying encased device. The housings described herein and presented with respect to the appended figures are therefore both water and shockproof.

The above figures may depict exemplary configurations for an apparatus of the disclosure, which is done to aid in understanding the features and functionality that can be included in the housings described herein. The apparatus is not restricted to the illustrated architectures or configurations, but can be implemented using a variety of alternative architectures and configurations. Additionally, although the apparatus is described above in terms of various exemplary embodiments and implementations, it should be understood that the various features and functionality described in one or more of the individual embodiments with which they are described, but instead can be applied, alone or in some combination, to one or more of the other embodiments of the disclosure, whether or not such embodiments are described and whether or not such features are presented as being a part of a described embodiment. Thus the breadth and scope of the present disclosure, especially in any following claims, should not be limited by any of the above-described exemplary embodiments.

Terms and phrases used in this document, and variations thereof, unless otherwise expressly stated, should be construed as open ended as opposed to limiting. As examples of the foregoing: the term "including" should be read to mean "including, without limitation" or the like; the term "example" is used to provide exemplary instances of the item in discussion, not an exhaustive or limiting list thereof; and adjectives such as "conventional," "traditional," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, a group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should also be read as "and/or" unless expressly stated otherwise. Furthermore, although item, elements or components of the disclosure may be described or claimed in the singular, the plural is contemplated to be within the scope thereof unless limitation to the singular is explicitly stated. The presence of broadening words and phrases such as "one or more," "at least," "but not limited to" or other like phrases in some instances shall not be read to mean that the narrower case is intended or required in instances where such broadening phrases may be absent. Additionally, where a range is set forth, the upper and lower limitations of the range are inclusive of all of the intermediary units therein.

The foregoing description is intended to illustrate but not to limit the scope of the disclosure, which is defined by the scope of the appended claims. Other embodiments are within the scope of the following claims.

What is claimed:

1. A protective encasement for a mobile computing device having a housing, the housing of the mobile computing device having a first portion and a second portion, the first portion including a touch-sensitive display affixed to the first portion of the housing, the protective encasement comprising:
 a bottom member to receive and encase the second portion of the housing for the mobile computing device, the mobile computing device being a separate unit from the protective encasement;
 a top member to receive and encase the first portion of the housing of the mobile computing device, the top member having an inner edge to frame at least a portion of the touch-sensitive display to allow direct touch access to the portion of the touch-sensitive display; and
 a coupling mechanism to couple the top member with the bottom member, to encase the first and second portions of the housing of the mobile computing device, to seal the top member with the bottom member, and to engage a sealing portion positioned proximate the inner edge of the top member directly with the first portion of the housing of the mobile computing device to form a waterproof seal proximate the portion of the touch-sensitive display, wherein the coupling mechanism includes a protrusion on the top member that extends, at least partially, into a first channel in the bottom member when the top member is coupled with the bottom member, the first channel including a first seal, the protrusion pressing against the first seal in the first channel of the bottom member to seal the top member to the bottom member when the top member is coupled with the bottom member.

2. The protective encasement in accordance with claim 1, wherein the first seal is a water resistant seal preventing water intrusion between an outer periphery of the top member and the bottom member when the top member is coupled with the bottom member.

3. The protective encasement in accordance with claim 1, wherein the first seal is a gasket.

4. The protective encasement in accordance with claim 3, wherein the coupling mechanism further includes one or more latching mechanisms to latch the top member with the bottom member when the top member is coupled with the bottom member.

5. The protective encasement in accordance with claim 4, wherein the one or more latching mechanisms comprise:
 a first latching mechanism at a periphery of the bottom member; and
 a second latching mechanism at a periphery of the top member and configured to latch with the first latching mechanism to latch the top member with the bottom member when the top member is coupled with the bottom member.

6. The protective encasement in accordance with claim 5, wherein the one or more latching mechanisms further comprise:
 a third latching mechanism on the bottom member near the first latching mechanism; and
 a fourth latching mechanism on the top member near the second latching mechanism and configured to latch with the third latching mechanism to further latch the top member with the bottom member when the top member is coupled with the bottom member.

7. The protective encasement in accordance with claim 6, wherein the first latching mechanism includes a first wall extending up from the periphery of the bottom member and a first ridge that protrudes inwardly along at least a portion of an inner face of the first wall.

8. The protective encasement in accordance with claim 7, wherein the second latching mechanism includes a second wall extending down from the periphery of the top member and a second ridge that protrudes along at least a portion of an outer face of the second wall to engage with the first ridge of the first latching mechanism when the top member is latched with the bottom member.

9. The protective encasement in accordance with claim 8, wherein the third latching mechanism includes a third wall extending up from the bottom member and spaced apart from the first wall to form the first channel along at least a portion of the periphery of the bottom member, the third latching mechanism further including a plurality of detents spaced apart in the third wall, and
 wherein the fourth latching mechanism includes a plurality of tabs protruding from an inward face of the second wall of the top member, each of the plurality of tabs to engage with a corresponding one of the plurality of detents of the third latching mechanism when the top member is latched with the bottom member.

10. The protective encasement in accordance with claim 9 wherein the first gasket provides a first water resistant seal between the top member and the bottom member when the top member is coupled with the bottom member.

11. The protective encasement in accordance with claim 10, wherein the top member includes a second channel proximate the inner edge and a second gasket disposed in the second channel abuts the region proximate the portion of the touch-sensitive display when the top member is coupled with the bottom member, the second gasket providing a second water resistant seal between the top member and the region proximate the portion of the touch-sensitive display when the top member is coupled with the bottom member.

12. The protective encasement in accordance with claim 1, wherein the sealing portion of the inner edge of the top member includes a second seal between the inner edge of the top member and a region proximate the portion of the touch-sensitive display when the top member is coupled with the bottom member.

13. The protective encasement in accordance with claim 12, wherein the second seal is a water resistant seal preventing water intrusion between the inner edge of the top member and the region proximate the portion of the touch-sensitive display when the top member is coupled with the bottom member.

14. The protective encasement in accordance with claim 1, further comprising a flexible ridge proximate the inner edge of the top member, the flexible ridge to interface with a surface of the mobile computing device proximate the touch-sensitive display to prevent liquid or particulate matter from substantially intruding past the inner edge of the top member.

15. The protective encasement in accordance with claim 1, wherein the coupling mechanism further includes one or more of a screw, a ratchet, a bolt, a snap, a detent, a ball-and-socket connector, a ridge, a hole and an associated tang, and a mushroom snap.

16. The protective encasement in accordance with claim 1, wherein each of the top member and the bottom member include a rigid frame member.

17. The protective encasement in accordance with claim 1, further comprising one or more electrical interconnection ports.

18. The protective encasement in accordance with claim 17, wherein each of the one or more electrical interconnection ports includes a sealing member.

19. The protective encasement in accordance with claim 18, wherein the one or more electrical interconnection ports includes a data and charge port, and wherein the sealing member includes a latching door.

20. The protective encasement in accordance with claim 19, wherein the data and charge port is through the top member, and wherein the latching door is coupled to the bottom member by a pivot and configured to latch over the data and charge port.

21. The protective encasement in accordance with claim 18, wherein the one or more electrical interconnection ports includes a threaded earphone jack aperture, and wherein the sealing member includes a threaded bung to occupy and seal the threaded earphone jack aperture.

22. The protective encasement in accordance with claim 17, wherein each of the sealing members includes one or more of: a latching door, a plug, a screw with a gasket, a bayonet, a sliding door, and a latching door with a sealable aperture.

23. The protective encasement in accordance with claim 1, wherein the bottom member further includes one or more external accessory physical interconnections on an outer surface of the bottom member for connecting the bottom member with an external accessory.

24. The protective encasement in accordance with claim 1, further comprising a speaker grille having a sound passable and water-impermeable membrane that overlays the speaker grille.

25. The protective encasement in accordance with claim 1, further comprising a camera lens provided in the top member and/or bottom member.

26. The protective encasement in accordance with claim 1, wherein the top member further comprises one or more aligning members extending from an inner surface of the top member, the one or more aligning members to receive and position the mobile computing device relative to the top member.

27. The protective encasement in accordance with claim 1, further comprising one or more sealed button features to each operate a corresponding one or more buttons of the mobile computing device.

28. The protective encasement in accordance with claim 1, further comprising a sealed actuator to operate a corresponding linear switch of the mobile computing device.

29. The protective encasement in accordance with claim 1, further comprising a mobile computing device housing simulant having a plurality of dimensions corresponding with dimensions of the first portion and the second portion of the housing of the mobile computing device, and to simulate the first portion and the second portion of the housing of the mobile computing device being encased and sealed by the top member and the bottom member when the top member is coupled with the bottom member.

30. The protective encasement in accordance with claim 1, wherein the bottom member further includes an inner edge to frame at least a portion of a back surface of the second portion of the housing of the mobile computing device opposite the touch-sensitive display to allow direct touch access to the portion of the back surface, and wherein the coupling mechanism is configured to seal an inner edge of the bottom member with a region proximate at least the portion of the back surface of the second portion of the housing of the mobile computing device.

31. The protective encasement in accordance with claim 30, wherein the coupling mechanism includes a second seal between the inner edge of the bottom member and the region proximate at least the portion of the back surface of the second portion of the housing of the mobile computing device.

32. A method comprising:
providing a mobile computing device having a housing, the housing having a first portion and a second portion, the first portion including a touch-sensitive display;
providing a protective encasement for the mobile computing device, the protective encasement having a top member and a bottom member, each of the top and the bottom members including a respective clasping mechanism;
receiving the second portion of the housing of the mobile computing device in the bottom member of the protective encasement, the housing being a separate unit from the protective enclosure;
receiving the first portion of the mobile computing device in the top member of the protective encasement, the top member having an inner edge to frame at least a portion of the touch-sensitive display to allow direct touch access to a portion of the touch-sensitive display; and
coupling, via the respective coupling mechanisms, the top member with the bottom member to encase the first and second portions of the mobile computing device housing, to seal the top member with the bottom member, and to seal the inner edge of the top member with a region proximate at least the portion of the touch-sensitive display; wherein the coupling mechanisms include a protrusion on one of the top member and the bottom member that extends, at least partially, into a first channel in the other one of the top member and the bottom member when the top member is coupled with the bottom member, the protrusion pressing against and sealing against a first seal in the first channel when the top member is coupled with the bottom member.

33. A protective encasement for a mobile computing device having a housing, the housing having a first portion and a second portion, the first portion including a touch-sensitive display affixed to the first portion of the housing of the mobile computing device, the protective encasement comprising:
a bottom member to receive and encase the second portion of the housing for the mobile computing device, the housing of the mobile computing device being a separate unit from the protective encasement;
a top member to receive and encase the first portion of the housing of the mobile computing device, the top member having an inner edge to frame at least a portion of the touch-sensitive display to allow direct touch access to a portion of the touch-sensitive display, the top member further including a first seal to seal the inner edge of the top member and a region proximate the portion of the touch-sensitive display when the top member is coupled with the bottom member; and a coupling mechanism to couple the top member with the bottom member to encase the first and second portions of the housing of the mobile computing device, to seal the top member with the bottom member, and to seal the inner edge of the top member directly with the region proximate the portion of the touch-sensitive display, the coupling mechanism including a wall on the top member, a channel on the bottom member, and a seal, the wall of the top member configured to extend into the channel of the bottom member to compress the seal in the channel when the top member is coupled with the bottom member.

34. The protective encasement in accordance with claim 33, further comprising a flexible ridge proximate the inner edge of the top member, the flexible ridge to interface with the top surface of the mobile computing device proximate the touch-sensitive display, and to prevent liquid or particulate matter from substantially intruding past the inner edge of the top member.

35. A protective encasement for a mobile computing device having a housing, the housing having a first portion and a second portion, the first portion including a touch-sensitive display affixed to the first portion of the housing of the mobile computing device, the protective encasement comprising:
 a first member to receive and encase the second portion of the housing for the mobile computing device, the housing of the mobile computing device being a separate unit from the protective encasement;
 a second member to receive and encase the first portion of the housing of the mobile computing device, the second member having an inner edge to frame at least a portion of the touch-sensitive display to allow direct touch access to a portion of the touch-sensitive display;
 a seal; and
 a coupling mechanism to couple the second member with the first member to encase the first and second portions of the housing of the mobile computing device, to seal the second member with the first member, and to seal the inner edge of the second member directly with the first portion of the mobile computing device proximate the portion of the touch-sensitive display, wherein the coupling mechanism seals the inner edge of the second member and a region proximate the portion of the touch-sensitive display when the second member is coupled with the first member, and wherein the coupling mechanism includes a protrusion on the second member that extends, at least partially, into a channel in the first member when the second member is coupled with the first member, the channel including the seal, the protrusion pressing against the seal in the channel in the first member to seal the second member to the first member.

36. The protective encasement in accordance with claim 35, further comprising a flexible ridge proximate the inner edge of the second member, the flexible ridge to interface with a top surface of the mobile computing device proximate the touch-sensitive display, and to prevent liquid or particulate matter from substantially intruding past the inner edge of the second member.

* * * * *